(12) United States Patent
Partridge et al.

(10) Patent No.: US 9,758,371 B2
(45) Date of Patent: Sep. 12, 2017

(54) ENCAPSULATED MICROELECTROMECHANICAL STRUCTURE

(71) Applicant: SiTime Corporation, Sunnyvale, CA (US)

(72) Inventors: Aaron Partridge, Cupertino, CA (US); Markus Lutz, Mountain View, CA (US); Pavan Gupta, Belmont, CA (US)

(73) Assignee: SiTime Corporation, Santa Clara, CA (US)

( * ) Notice: Subject to any disclaimer, the term of this patent is extended or adjusted under 35 U.S.C. 154(b) by 0 days.

(21) Appl. No.: 15/242,437

(22) Filed: Aug. 19, 2016

(65) Prior Publication Data

US 2017/0101310 A1    Apr. 13, 2017

Related U.S. Application Data

(62) Division of application No. 14/961,760, filed on Dec. 7, 2015, now Pat. No. 9,440,845, and a division of application No. 14/524,986, filed on Oct. 27, 2014, now Pat. No. 9,434,608, which is a division of application No. 11/593,404, filed on Nov. 6, 2006, now Pat. No. 8,871,551, which is a division of (Continued)

(51) Int. Cl.
*H01L 23/051* (2006.01)
*B81C 1/00* (2006.01)
*B81B 7/00* (2006.01)
*H01L 41/113* (2006.01)

(52) U.S. Cl.
CPC ........ *B81C 1/00277* (2013.01); *B81B 7/0035* (2013.01); *B81B 2201/0271* (2013.01); *B81C 1/00301* (2013.01); *H01L 23/051* (2013.01); *H01L 41/1136* (2013.01)

(58) Field of Classification Search
CPC .............. H01L 41/1136; H01L 23/051; B81C 1/00277; B81C 1/00301
USPC ...................... 257/417, 684, 773; 438/52, 98
See application file for complete search history.

(56) References Cited

U.S. PATENT DOCUMENTS

| | | | |
|---|---|---|---|
| 4,665,610 A | 5/1987 | Barth | |
| 4,674,319 A | 6/1987 | Muller et al. | |

(Continued)

FOREIGN PATENT DOCUMENTS

| | | |
|---|---|---|
| EP | 0451992 B1 | 7/1995 |
| EP | 1217735 B1 | 11/2007 |

(Continued)

OTHER PUBLICATIONS

"A Hermetic Glass-Silicon Package Formed Using Localized Aluminum/Silicon-Glass Bonding", Cheng et al., Journal of Microelectromechanical Systems, vol. 10, No. 3, Sep. 2001, pp. 392-399.

(Continued)

*Primary Examiner* — George Fourson, III
(74) *Attorney, Agent, or Firm* — Charles Shemwell

(57) ABSTRACT

A semiconductor layer having an opening and a MEMS resonator formed in the opening is disposed between first and second substrates to encapsulate the MEMS resonator. An electrical contact that extends from the opening to an exterior of the MEMS device is formed at least in part within the semiconductor layer and at least in part within the first substrate.

10 Claims, 147 Drawing Sheets

Related U.S. Application Data application No. 11/336,521, filed on Jan. 20, 2006, now abandoned.

(56) References Cited

U.S. PATENT DOCUMENTS

| | | |
|---|---|---|
| 4,766,666 A | 8/1988 | Sugiyama et al. |
| 4,849,071 A | 7/1989 | Evans et al. |
| 4,945,769 A | 8/1990 | Sidner et al. |
| 4,990,462 A | 2/1991 | Sliwa, Jr. |
| 5,075,253 A | 12/1991 | Sliwa, Jr. |
| 5,139,624 A | 8/1992 | Searson et al. |
| 5,156,903 A | 10/1992 | Okumura et al. |
| 5,338,416 A | 8/1994 | Mlcak et al. |
| 5,445,991 A | 8/1995 | Lee |
| 5,455,547 A | 10/1995 | Lin et al. |
| 5,461,916 A | 10/1995 | Fujii et al. |
| 5,470,797 A | 11/1995 | Mastrangelo |
| 5,491,604 A | 2/1996 | Nguyen et al. |
| 5,504,026 A | 4/1996 | Kung |
| 5,510,156 A | 4/1996 | Zhao |
| 5,511,428 A | 4/1996 | Goldberg et al. |
| 5,517,123 A | 5/1996 | Zhao et al. |
| 5,537,083 A | 7/1996 | Lin et al. |
| 5,540,095 A | 7/1996 | Sherman et al. |
| 5,583,290 A | 12/1996 | Lewis |
| 5,589,082 A | 12/1996 | Lin et al. |
| 5,604,312 A | 2/1997 | Lutz |
| 5,613,611 A | 3/1997 | Johnson et al. |
| 5,616,514 A | 4/1997 | Muchow et al. |
| 5,620,931 A | 4/1997 | Tsang et al. |
| 5,627,317 A | 5/1997 | Offenberg et al. |
| 5,627,318 A | 5/1997 | Fujii et al. |
| 5,631,422 A | 5/1997 | Sulzberger et al. |
| 5,640,039 A | 6/1997 | Chau et al. |
| 5,668,033 A | 9/1997 | Ohara et al. |
| 5,679,436 A | 10/1997 | Zhao |
| 5,683,591 A | 11/1997 | Offenberg |
| 5,703,293 A | 12/1997 | Zabler et al. |
| 5,721,377 A | 2/1998 | Kurle et al. |
| 5,723,353 A | 3/1998 | Muenzel et al. |
| 5,728,936 A | 3/1998 | Lutz |
| 5,751,041 A | 5/1998 | Suzuki et al. |
| 5,760,455 A | 6/1998 | Hierold et al. |
| 5,761,957 A | 6/1998 | Oba et al. |
| 5,798,557 A | 8/1998 | Salatino et al. |
| 5,804,083 A | 9/1998 | Ishii et al. |
| 5,818,227 A | 10/1998 | Payne et al. |
| 5,839,062 A | 11/1998 | Nguyen et al. |
| 5,847,280 A | 12/1998 | Sherman et al. |
| 5,858,809 A | 1/1999 | Chau et al. |
| 5,872,024 A | 2/1999 | Fujii et al. |
| 5,880,369 A | 3/1999 | Samuels et al. |
| 5,889,207 A | 3/1999 | Lutz |
| 5,898,218 A | 4/1999 | Hirose et al. |
| 5,919,364 A | 7/1999 | Lebouitz et al. |
| 5,922,212 A | 7/1999 | Kano et al. |
| 5,937,275 A | 8/1999 | Munzel et al. |
| 5,948,991 A | 9/1999 | Nomura et al. |
| 5,955,932 A | 9/1999 | Nguyen et al. |
| 5,959,208 A | 9/1999 | Muenzel et al. |
| 5,969,249 A | 10/1999 | Roessig et al. |
| 5,985,688 A | 11/1999 | Bruel |
| 5,986,316 A | 11/1999 | Toyoda et al. |
| 5,987,989 A | 11/1999 | Yamamoto et al. |
| 5,992,233 A | 11/1999 | Clark |
| 6,009,753 A | 1/2000 | Tsang et al. |
| 6,010,461 A | 1/2000 | Haniff et al. |
| 6,012,336 A | 1/2000 | Eaton et al. |
| 6,028,332 A | 2/2000 | Kano et al. |
| 6,035,714 A | 3/2000 | Yazdi et al. |
| 6,048,774 A | 4/2000 | Yamamoto et al. |
| 6,055,858 A | 5/2000 | Muenzel et al. |
| 6,065,341 A | 5/2000 | Ishio et al. |
| 6,067,858 A | 5/2000 | Clark et al. |
| 6,090,718 A | 7/2000 | Soga et al. |
| 6,100,108 A | 8/2000 | Mizuno et al. |
| 6,106,735 A | 8/2000 | Kurle et al. |
| 6,117,701 A | 9/2000 | Buchan et al. |
| 6,119,518 A | 9/2000 | Itou et al. |
| 6,122,964 A | 9/2000 | Mohaupt et al. |
| 6,125,700 A | 10/2000 | Tsugai et al. |
| 6,140,709 A | 10/2000 | Muenzel et al. |
| 6,142,358 A | 11/2000 | Cohn et al. |
| 6,146,917 A | 11/2000 | Zhang et al. |
| 6,147,756 A | 11/2000 | Zavracky et al. |
| 6,149,190 A | 11/2000 | Galvin et al. |
| 6,151,966 A | 11/2000 | Sakai et al. |
| 6,153,839 A | 11/2000 | Zavracky et al. |
| 6,156,652 A | 12/2000 | Michalicek |
| 6,163,643 A | 12/2000 | Bergmann et al. |
| 6,170,332 B1 | 1/2001 | MacDonald et al. |
| 6,171,881 B1 | 1/2001 | Fujii |
| 6,187,210 B1 | 2/2001 | Lebouitz et al. |
| 6,187,607 B1 | 2/2001 | Offenberg et al. |
| 6,191,007 B1 | 2/2001 | Matsui et al. |
| 6,192,757 B1 | 2/2001 | Tsang et al. |
| 6,199,430 B1 | 3/2001 | Kano et al. |
| 6,199,874 B1 | 3/2001 | Galvin et al. |
| 6,204,085 B1 | 3/2001 | Strumpell et al. |
| 6,210,988 B1 | 4/2001 | Howe et al. |
| 6,214,243 B1 | 4/2001 | Muenzel et al. |
| 6,218,717 B1 | 4/2001 | Toyoda et al. |
| 6,227,049 B1 | 5/2001 | Fujii |
| 6,227,050 B1 | 5/2001 | Fujii et al. |
| 6,230,567 B1 | 5/2001 | Greiff |
| 6,233,811 B1 | 5/2001 | Payne et al. |
| 6,236,281 B1 | 5/2001 | Nguyen et al. |
| 6,239,473 B1 | 5/2001 | Adams et al. |
| 6,240,782 B1 | 6/2001 | Kato et al. |
| 6,244,112 B1 | 6/2001 | Fujii |
| 6,245,593 B1 | 6/2001 | Yoshihara et al. |
| 6,249,073 B1 | 6/2001 | Nguyen et al. |
| 6,250,156 B1 | 6/2001 | Seshia et al. |
| 6,250,165 B1 | 6/2001 | Sakai et al. |
| 6,251,754 B1 | 6/2001 | Ohshima et al. |
| 6,255,741 B1 | 7/2001 | Yoshihara et al. |
| 6,264,363 B1 | 7/2001 | Takahashi et al. |
| 6,274,452 B1 | 8/2001 | Miura et al. |
| 6,275,034 B1 | 8/2001 | Tran et al. |
| 6,276,207 B1 | 8/2001 | Sakai et al. |
| 6,279,585 B1 | 8/2001 | Shiraki et al. |
| 6,282,960 B1 | 9/2001 | Samuels et al. |
| 6,284,670 B1 | 9/2001 | Abe et al. |
| 6,287,885 B1 | 9/2001 | Muto et al. |
| 6,291,315 B1 | 9/2001 | Nakayama et al. |
| 6,291,875 B1 | 9/2001 | Clark et al. |
| 6,296,779 B1 | 10/2001 | Clark et al. |
| 6,297,072 B1 | 10/2001 | Tilmans et al. |
| 6,300,294 B1 | 10/2001 | Robbins et al. |
| 6,307,815 B1 | 10/2001 | Polosky et al. |
| 6,308,567 B1 | 10/2001 | Higuchi et al. |
| 6,311,555 B1 | 11/2001 | McCall et al. |
| 6,315,062 B1 | 11/2001 | Alft et al. |
| 6,316,840 B1 | 11/2001 | Otani |
| 6,318,175 B1 | 11/2001 | Muchow et al. |
| 6,323,550 B1 | 11/2001 | Martin et al. |
| 6,325,886 B1 | 12/2001 | Harris et al. |
| 6,352,935 B1 | 3/2002 | Collins et al. |
| 6,373,007 B1 | 4/2002 | Calcatera et al. |
| 6,378,989 B1 | 4/2002 | Silverbrook |
| 6,386,032 B1 | 5/2002 | Lemkin et al. |
| 6,388,279 B1 | 5/2002 | Sakai et al. |
| 6,389,899 B1 | 5/2002 | Partridge et al. |
| 6,389,903 B1 | 5/2002 | Oba et al. |
| 6,392,144 B1 | 5/2002 | Filter et al. |
| 6,396,711 B1 | 5/2002 | Degani et al. |
| 6,402,968 B1 | 6/2002 | Yazdi et al. |
| 6,416,831 B1 | 7/2002 | Hara et al. |
| 6,422,078 B2 | 7/2002 | Imai |
| 6,423,563 B2 | 7/2002 | Fukada et al. |
| 6,424,074 B2 | 7/2002 | Nguyen |
| 6,429,506 B1 | 8/2002 | Fujii et al. |
| 6,429,755 B2 | 8/2002 | Speidell et al. |
| 6,433,401 B1 | 8/2002 | Clark et al. |

(56) References Cited

U.S. PATENT DOCUMENTS

| | | |
|---|---|---|
| 6,433,411 B1 | 8/2002 | Degani et al. |
| 6,437,551 B1 | 8/2002 | Krulevitch et al. |
| 6,440,766 B1 | 8/2002 | Clark |
| 6,441,481 B1 | 8/2002 | Karpman |
| 6,443,008 B1 | 9/2002 | Funk et al. |
| 6,444,543 B2 | 9/2002 | Sakai et al. |
| 6,448,109 B1 | 9/2002 | Karpman |
| 6,448,604 B1 | 9/2002 | Funk et al. |
| 6,448,622 B1 | 9/2002 | Franke et al. |
| 6,449,406 B1 | 9/2002 | Fan et al. |
| 6,460,234 B1 | 10/2002 | Gianchandani |
| 6,462,566 B1 | 10/2002 | Schoefthaler et al. |
| 6,463,803 B2 | 10/2002 | Fujii et al. |
| 6,465,281 B1 | 10/2002 | Xu et al. |
| 6,472,290 B2 | 10/2002 | Cho et al. |
| 6,477,901 B1 | 11/2002 | Tadigadapa et al. |
| 6,478,974 B1 | 11/2002 | Lebouitz et al. |
| 6,483,957 B1 | 11/2002 | Hamerly et al. |
| 6,492,309 B1 | 12/2002 | Behr et al. |
| 6,495,389 B2 | 12/2002 | Ishio et al. |
| 6,500,348 B2 | 12/2002 | Chase et al. |
| 6,507,044 B1 | 1/2003 | Santana, Jr. et al. |
| 6,507,082 B2 | 1/2003 | Thomas |
| 6,508,124 B1 | 1/2003 | Zerbini et al. |
| 6,508,126 B2 | 1/2003 | Sakai et al. |
| 6,508,561 B1 | 1/2003 | Alie et al. |
| 6,512,255 B2 | 1/2003 | Aoki et al. |
| 6,516,671 B2 | 2/2003 | Romo et al. |
| 6,521,508 B1 | 2/2003 | Cheong et al. |
| 6,521,965 B1 | 2/2003 | Lutz |
| 6,522,052 B2 | 2/2003 | Kihara et al. |
| 6,524,890 B2 | 2/2003 | Ueda et al. |
| 6,531,767 B2 | 3/2003 | Shrauger |
| 6,534,340 B1 | 3/2003 | Karpman et al. |
| 6,550,331 B2 | 4/2003 | Fujii et al. |
| 6,550,339 B1 | 4/2003 | Toyoda et al. |
| 6,551,853 B2 | 4/2003 | Toyoda |
| 6,552,404 B1 | 4/2003 | Hynes et al. |
| 6,555,417 B2 | 4/2003 | Spooner et al. |
| 6,555,901 B1 | 4/2003 | Yoshihara et al. |
| 6,555,904 B1 | 4/2003 | Karpman |
| 6,558,976 B2 | 5/2003 | Shrauger |
| 6,590,267 B1 | 7/2003 | Goodwin-Johansson et al. |
| 6,602,351 B2 | 8/2003 | DeYoung et al. |
| 6,621,134 B1 | 9/2003 | Zurn |
| 6,621,392 B1 | 9/2003 | Volant et al. |
| 6,624,726 B2 | 9/2003 | Niu et al. |
| 6,625,047 B2 | 9/2003 | Coleman, Jr. |
| 6,625,342 B2 | 9/2003 | Staple et al. |
| 6,635,509 B1 | 10/2003 | Ouellet |
| 6,635,519 B2 | 10/2003 | Barber et al. |
| 6,716,275 B1 | 4/2004 | Reed et al. |
| 6,739,497 B2 | 5/2004 | Fortin et al. |
| 6,764,875 B2 | 7/2004 | Shook |
| 6,768,628 B2 | 7/2004 | Harris et al. |
| 6,808,954 B2 | 10/2004 | Ma et al. |
| 6,815,361 B1 | 11/2004 | Bae et al. |
| 6,818,464 B2 | 11/2004 | Heschel |
| 6,822,326 B2 | 11/2004 | Enquist et al. |
| 6,835,657 B2 | 12/2004 | Ong |
| 6,847,124 B2 | 1/2005 | Semi |
| 6,858,910 B2 | 2/2005 | Coyle et al. |
| 6,888,233 B2 | 5/2005 | Horning et al. |
| 6,929,974 B2 * | 8/2005 | Ding .................. B81B 7/007 257/659 |
| 6,930,367 B2 | 8/2005 | Lutz et al. |
| 6,936,491 B2 | 8/2005 | Partridge et al. |
| 6,951,824 B2 | 10/2005 | Fischer et al. |
| 7,098,117 B2 * | 8/2006 | Najafi .................. B81B 7/007 438/456 |
| 7,122,395 B2 | 10/2006 | Gogoi |
| 7,204,737 B2 * | 4/2007 | Ding .................. B81B 7/0038 445/23 |
| 7,221,033 B2 | 5/2007 | Lutz et al. |
| 7,393,758 B2 | 7/2008 | Sridhar et al. |
| 8,871,551 B2 * | 10/2014 | Partridge .............. B81B 7/007 438/456 |
| 2001/0001931 A1 | 5/2001 | Fujii et al. |
| 2001/0006248 A1 | 7/2001 | Allen et al. |
| 2001/0009110 A1 | 7/2001 | Tmai |
| 2001/0034076 A1 | 10/2001 | Martin |
| 2002/0016058 A1 | 2/2002 | Zhao |
| 2002/0043706 A1 | 4/2002 | Jerominek et al. |
| 2002/0117728 A1 | 8/2002 | Brisnihhan et al. |
| 2002/0132062 A1 | 9/2002 | Jacobs |
| 2002/0135047 A1 | 9/2002 | Funk et al. |
| 2002/0179126 A1 | 12/2002 | DeYoung et al. |
| 2002/0197002 A1 | 12/2002 | Lin |
| 2003/0002019 A1 | 1/2003 | Miller |
| 2003/0016337 A1 | 1/2003 | Duncan et al. |
| 2003/0038327 A1 | 2/2003 | Smith |
| 2003/0054588 A1 | 3/2003 | Patel et al. |
| 2003/0141561 A1 | 7/2003 | Fischer et al. |
| 2003/0146464 A1 | 8/2003 | Prophet |
| 2003/0151479 A1 | 8/2003 | Stafford et al. |
| 2003/0155643 A1 | 8/2003 | Freidhoff |
| 2003/0161949 A1 | 8/2003 | Ashurst et al. |
| 2003/0178635 A1 | 9/2003 | Volant et al. |
| 2003/0183916 A1 | 10/2003 | Heck et al. |
| 2003/0215974 A1 | 11/2003 | Kawasaki et al. |
| 2004/0016989 A1 | 1/2004 | Ma et al. |
| 2004/0065932 A1 | 4/2004 | Reichenbach et al. |
| 2004/0106294 A1 | 6/2004 | Lee et al. |
| 2004/0183214 A1 | 9/2004 | Partridge et al. |
| 2004/0248344 A1 | 12/2004 | Partridge et al. |
| 2005/0101059 A1 | 5/2005 | Yang |
| 2005/0156260 A1 | 7/2005 | Partridge et al. |
| 2005/0170656 A1 * | 8/2005 | Nasiri .................. B81C 1/00238 438/700 |
| 2005/0195050 A1 | 9/2005 | Lutz et al. |
| 2005/0253206 A1 | 11/2005 | Bureau et al. |
| 2005/0260828 A1 | 11/2005 | Yuasa |
| 2005/0262929 A1 | 12/2005 | Felton et al. |
| 2005/0285172 A1 | 12/2005 | Freeman et al. |
| 2006/0246631 A1 | 11/2006 | Lutz et al. |
| 2007/0195439 A1 | 8/2007 | DeNatale |
| 2008/0283990 A1 | 11/2008 | Nasiri et al. |
| 2010/0290199 A1 * | 11/2010 | Schmid .................. B81C 1/0023 361/752 |
| 2011/0013063 A1 | 1/2011 | Yamamoto |

FOREIGN PATENT DOCUMENTS

| | | |
|---|---|---|
| GB | 2198611 | 6/1988 |
| WO | WO9749475 | 12/1997 |
| WO | WO0146066 | 6/2001 |
| WO | WO0158803 | 8/2001 |
| WO | WO0158804 | 8/2001 |
| WO | WO0177008 | 10/2001 |
| WO | WO0177009 | 10/2001 |
| WO | WO2004018349 | 4/2004 |

OTHER PUBLICATIONS

"A Low Temperature Bi-CMOS Compatible Process for MEMS RF Resonators and Filters", Lund et el., Solid-State Sensor, Actuator and Microsystems Workshop, Hilton Head Island, South Carolina, Jun. 2-6, 2002, pp. 38-41.

"An Integrated Wafer-Scale Packaging Process for MEMS", Kenny et al., Proceedings of IMECE2002, ASME International Mechanical Engineering Congress & Exposition, Nov. 17-22, 2002, New Orleans, Louisiana, pp. 51-54.

"Chemical Vapor Deposition of Fluoroalkylsilane Monolayer Films for Adhesion Control in Microelectromechanical Systems", Mayer et al., J. Vac. Sci. Technol. B 18(5), Sep./Oct. 2000, pp. 2433-2440.

"Electrical and optical characteristics of vacuum-sealed polysilicon microlamps", Mastrangelo et al., IEEE Transactions on Electron Devices, v.39, No. 6, Jun. 1992, pp. 1363-1375.

"Laterally Grown Porous Polycrystalline Silicon: A New Material for Transducer Applications", Anderson et al., 1991 IEEE, pp. 747-750.

(56) References Cited

OTHER PUBLICATIONS

"Localized Bonding with PSG or Indium Solder as Intermediate Layer", Cheng at al., MEMS 1999, 12.sup.th IEEE International Conference, pp. 285-289.
"Localized Silicon Fusion and Eutectic Bonding for MEMS Fabrication and Packaging", Cheng et al., Journal of Microelectromechanical Systems, vol. 9, No. 1, Mar. 2000, pp. 3-8.
"MEMS Post-Packaging by Localized Heating and Bonding", Lin, IEEE Transactions on Advanced Packaging, vol. 23, No. 4, Nov. 2000, pp. 608-616.
"New Thin Film Epitaxial Polysilicon Encapsulation for Piezoresistive Accelerometers", Partridge et al., IEEE, 2001. pp. 54-59.
"Novel Process for a Monolithic Integrated Accelerometer". Offenberg et al., The 8.sup.th International Conference on Solid-State Sensors and Actuators, and Eurosensors IX, Stockholm, Sweden, Jun. 25-29, 1995, pp. 589-592.
"Permeable Polysilicon Etch-Access Windows for Microshell Fabrication", Lebovitz K S et al., International Conference on Solid-State Sensors and Actuators and Eurosensors, Jun. 25, 1995, pp. 224-227.
"Polysilicon Vibrating Gyroscope Vacuum-Encapsulated in an on-chip Micro Chamber", Tsuchiya et al., Sensors and Actuators A 90 (2001), pp. 49-55.
"Porous Polycrystaline Silicon: A New Material for MEMS", Anderson R C et al., Journal of Microelectromechanical Systems, Mar. 1984, USA, vol. 3, No. 1, pp. 10-18.
"Sealed Vacuum Electronic Devices by Surface Micromachining", Zum et al., IEEE IEDM 91, Sep. 1991, pp. 205-208.
"Sealing of Micromachined Cavities Using Chemical Vapor Deposition Methods: Characterization and Optimization", Liu and Tai, IEEE Journal of Microelectromechanical Systems, vol. 8, No. 2, Jun. 1999. pp. 135-145.
"Vacuum encapsulation of resonant device; using permeable polysilicon", Lebouitz et al., Micro Electro Mechanical Systems, IEEE International Conference, Jan. 1999, pp. 470-475.
"Vacuum Packaging Technology Using Localized Aluminum/Silicon-to-Glass Bonding", Cheng et al., IEEE Journal of Microelectromechanical Systems, vol. 11, No. 5, Oct. 2002, pp. 556-565.
"Vacuum Packaging Technology Using Localized Aluminum/Silicon-to-Glass Bonding", Cheng et al., MEMS 2001, 14.sup.th IEEE International Conference, pp. 18-21.
"Vacuum Sealing of Microcavities Using Metal Evaporation", Bartek et al., Sensors and Actuators A 61, 1997, pp. 364-368.
"Vacuum-sealed silicon micromachined incandescent light source", Mastrengelo et al., IEDM, 1989, pp. 503-506.
"Wafer Scale Encapsulation of a High-Q Micromechanical Resonator", Candler et al., Hilton Head, Open Poster, 2002.
Applicant Response to Jan. 18, 2008 Office Action in U.S. Appl. No. 11/336,521, filed Mar. 28, 2008, 16 pages.
Applicant Response to Dec. 5, 2008 Office Action in U.S. Appl. No. 11/336,521, filed Mar. 4, 2009, 14 pages.
Applicant Response to Aug. 4, 2008 Office Action in U.S. Appl. No. 11/336,521, filed Sep. 4, 2008, 10 pages.
United States Patent and Trademark Office, Office Action issued in U.S. Appl. No. 11/336,521, filed Aug. 4, 2008, 7 pages.
United States Patent and Trademark Office, Office Action issued in U.S. Appl. No. 11/336,521, filed Dec. 5, 2008, 19 pages.
United States Patent and Trademark Office, Office Action issued in U.S. Appl. No. 11/336,521, filed Jan. 18, 2008, 35 pages.
United States Patent and Trademark Office, Office Action issued in U.S. Appl. No. 11/336,521, filed Jun. 4, 2009, 8 pages.
World Intellectual Property Organization, International Preliminary Report on Patentability regarding International Publication No. WO 2007/087021 (International Application No. PCT/US2006/047049), Jul. 22, 2008, 6 pages.
World Intellectual Property Organization, International Search Report regarding International Publication No. WO 2007/087021 (International Application No. PCT/US2006/047049), Nov. 29, 2007, 2 pages.

\* cited by examiner

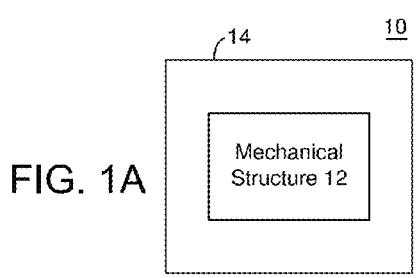
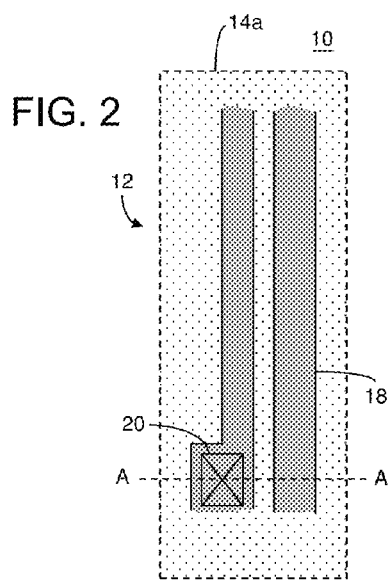
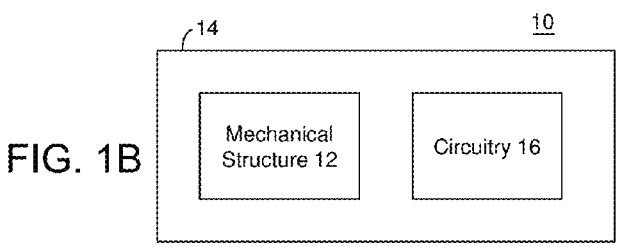
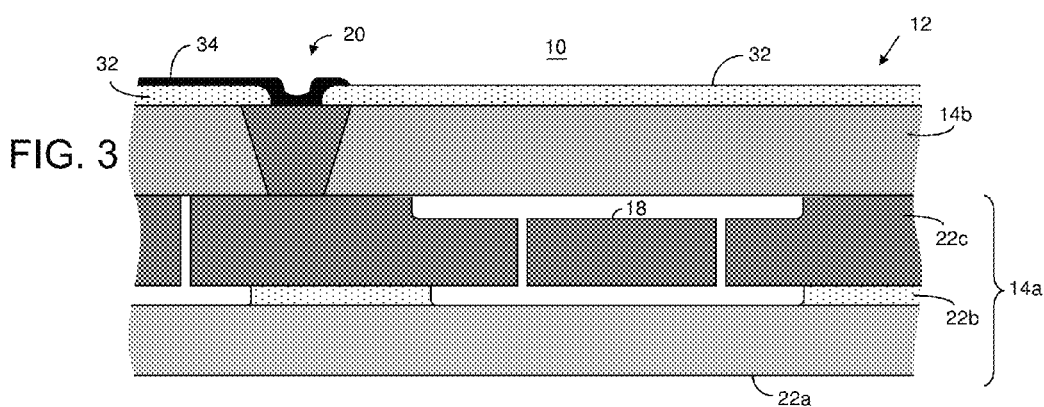
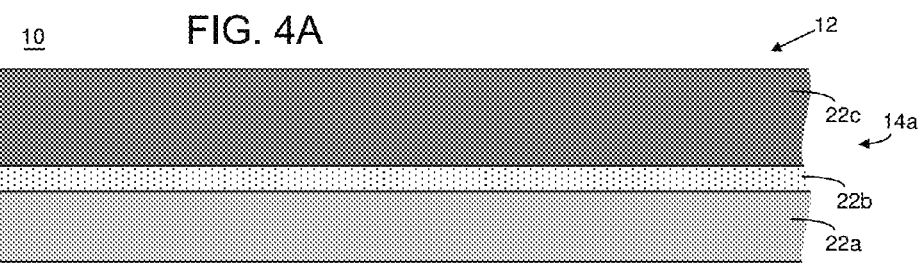
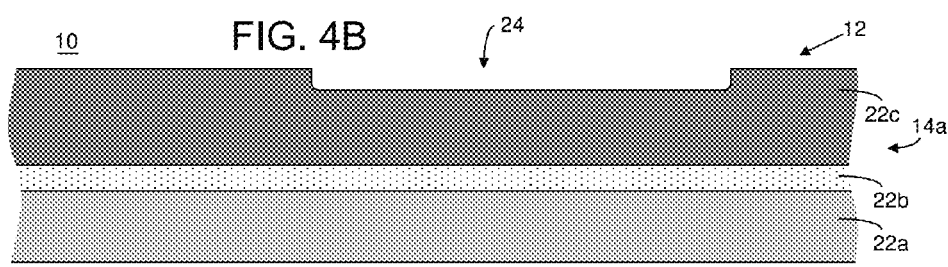

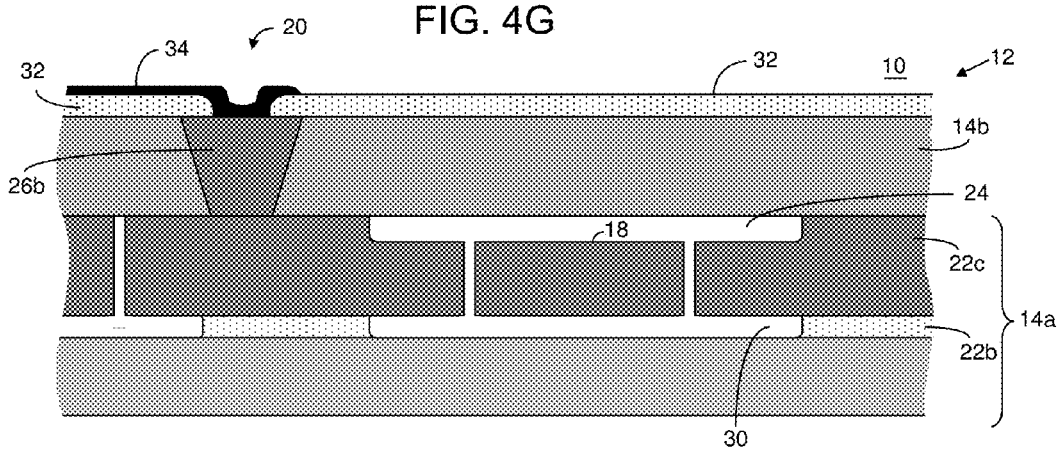
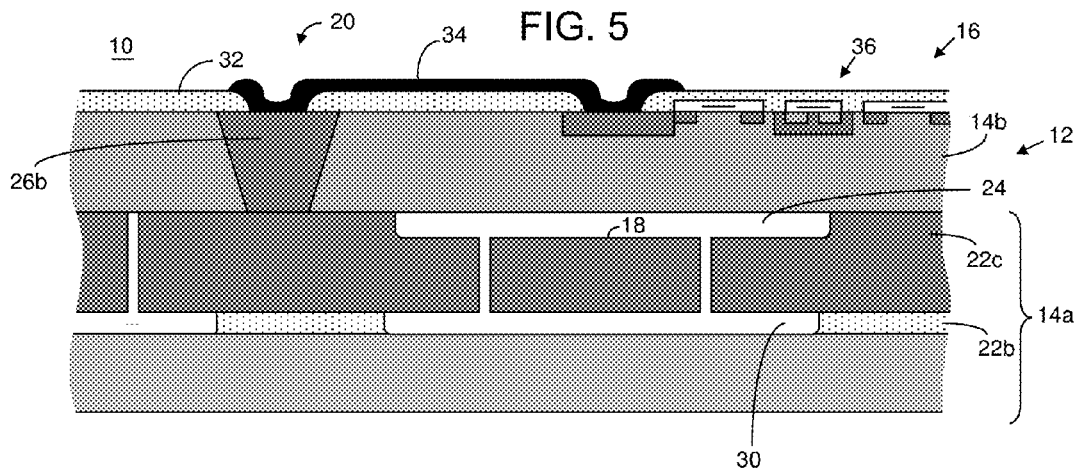
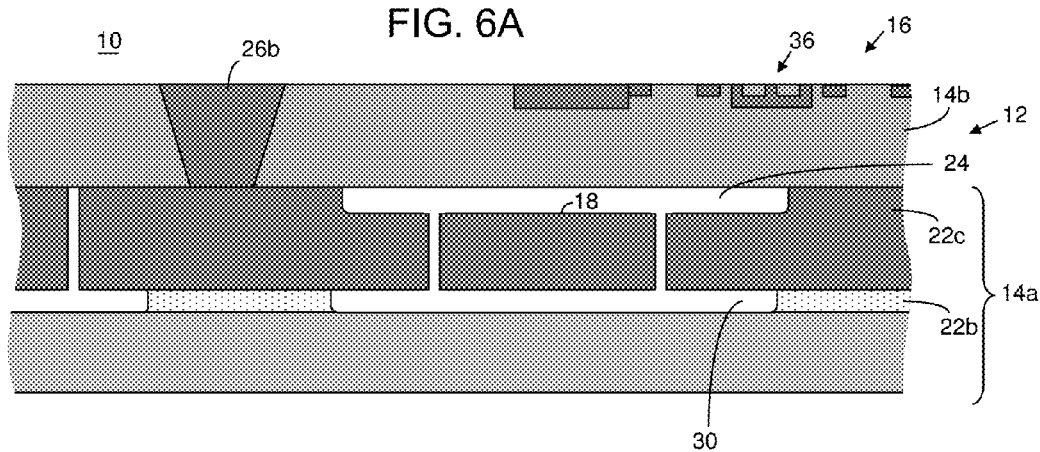

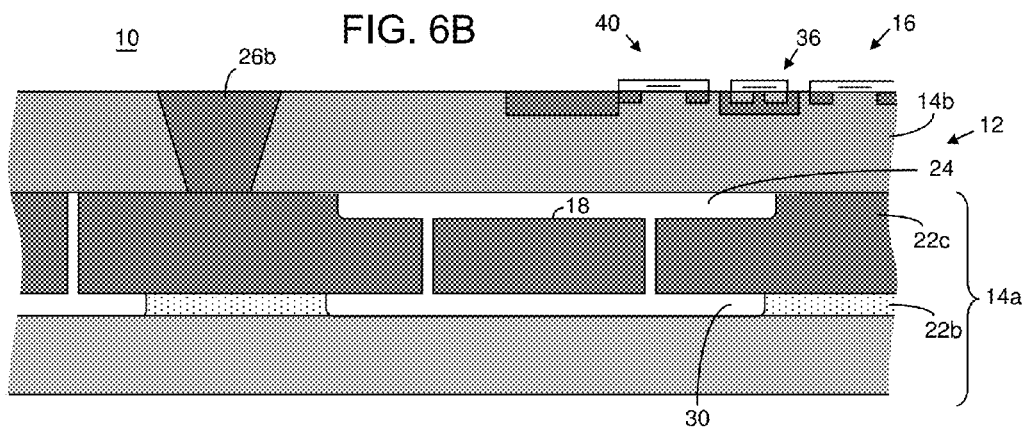
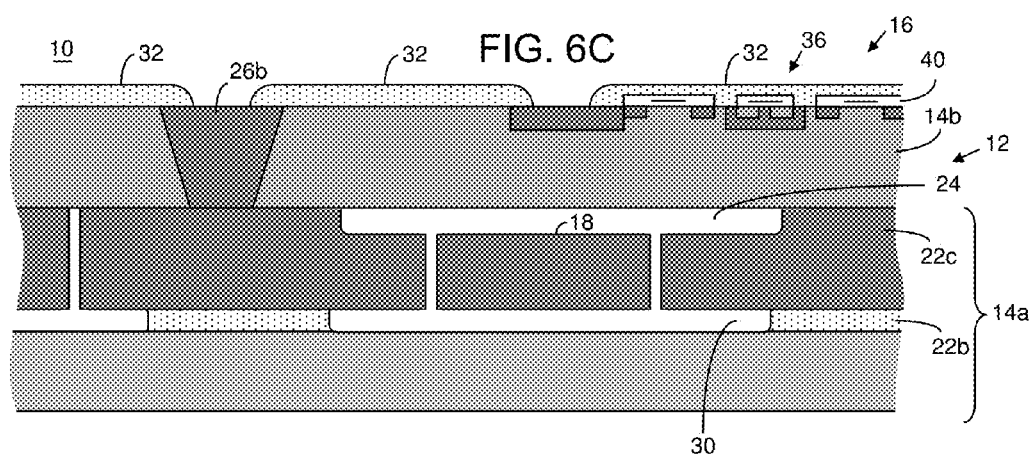
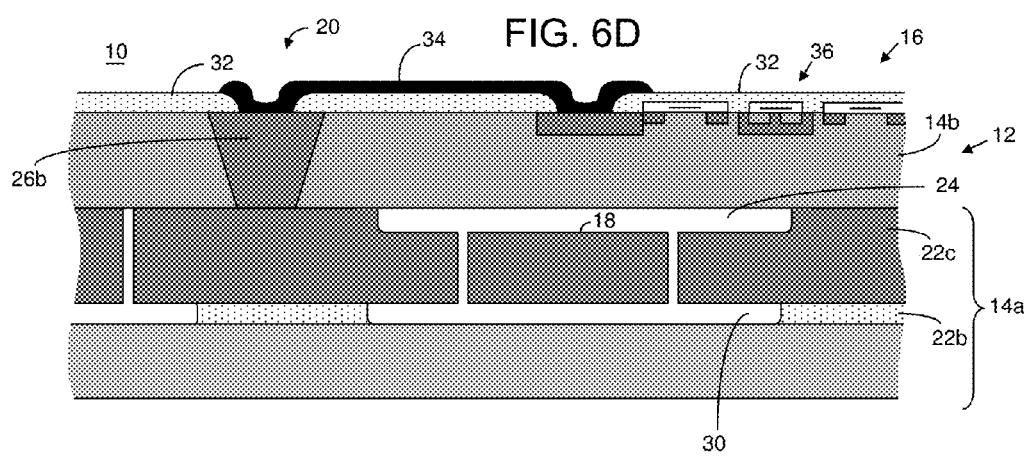

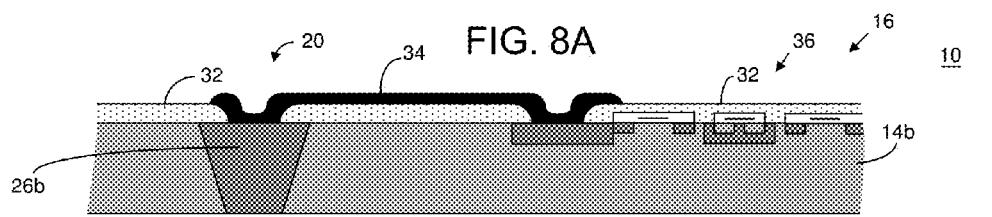
FIG. 8A
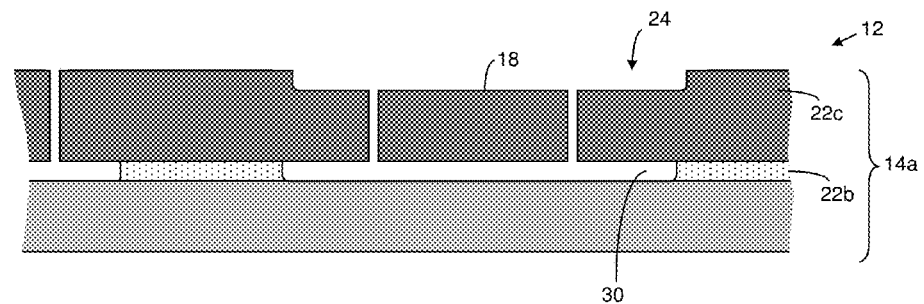
FIG. 8B
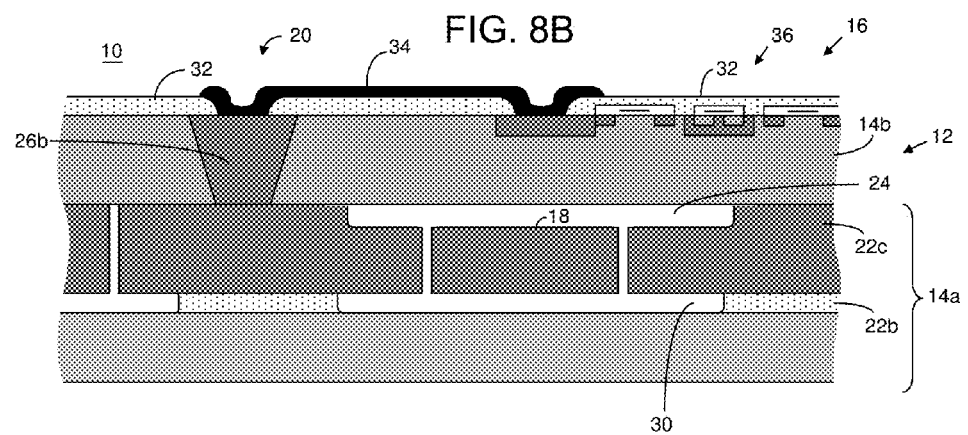
FIG. 9
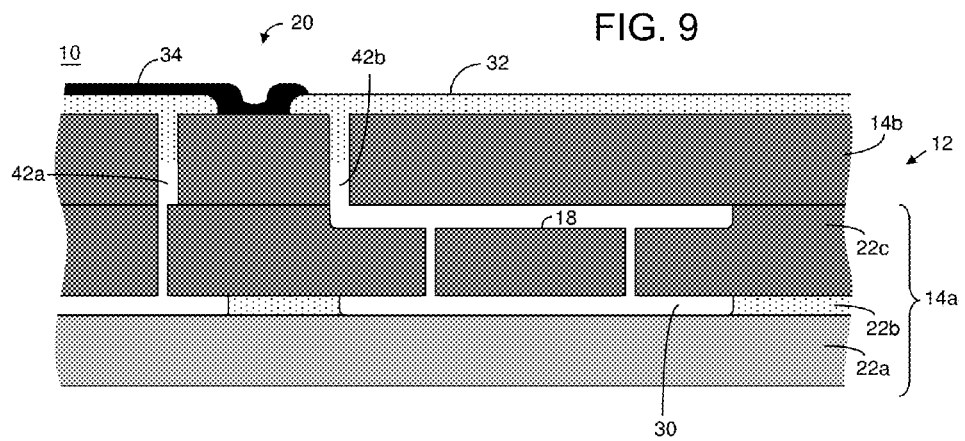

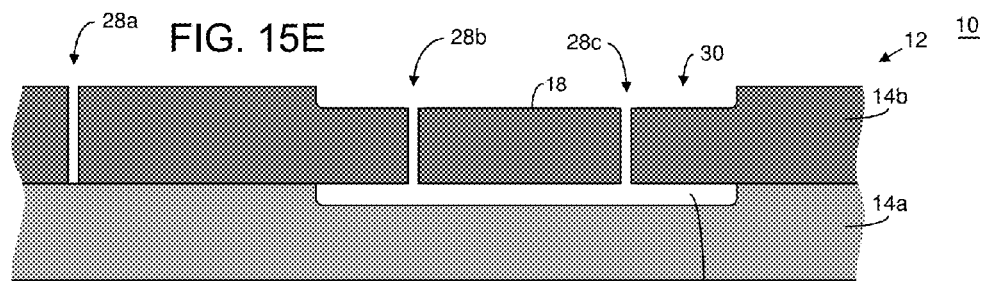
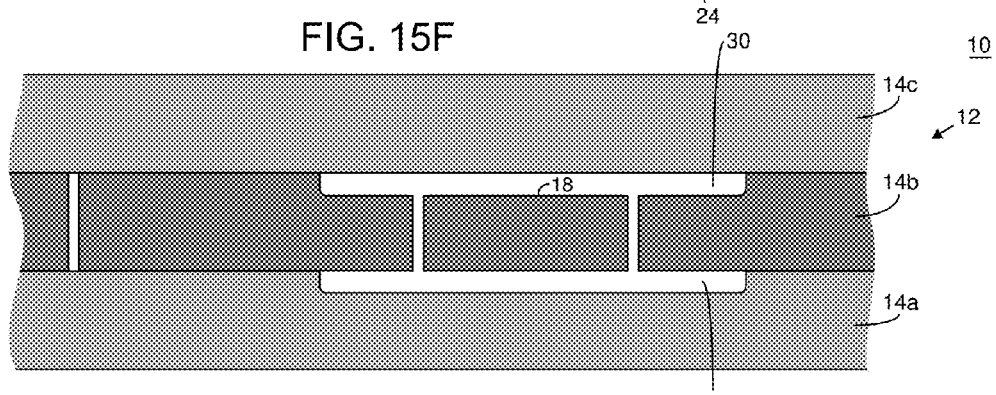
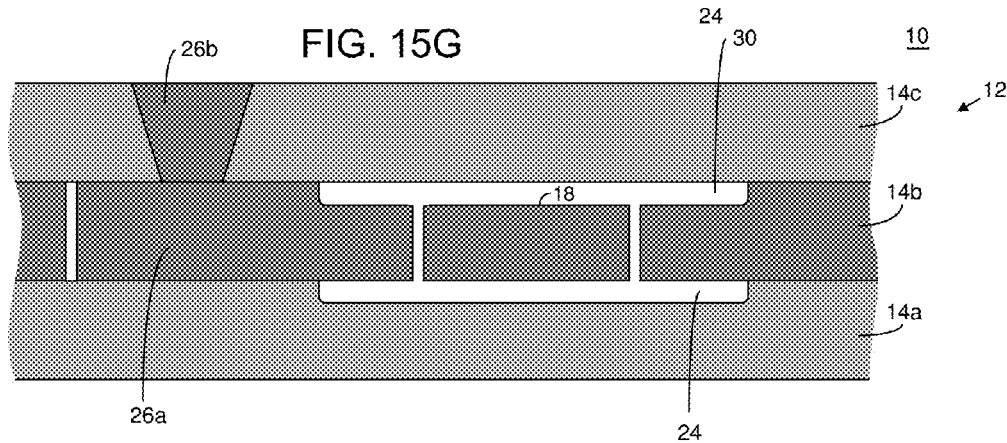
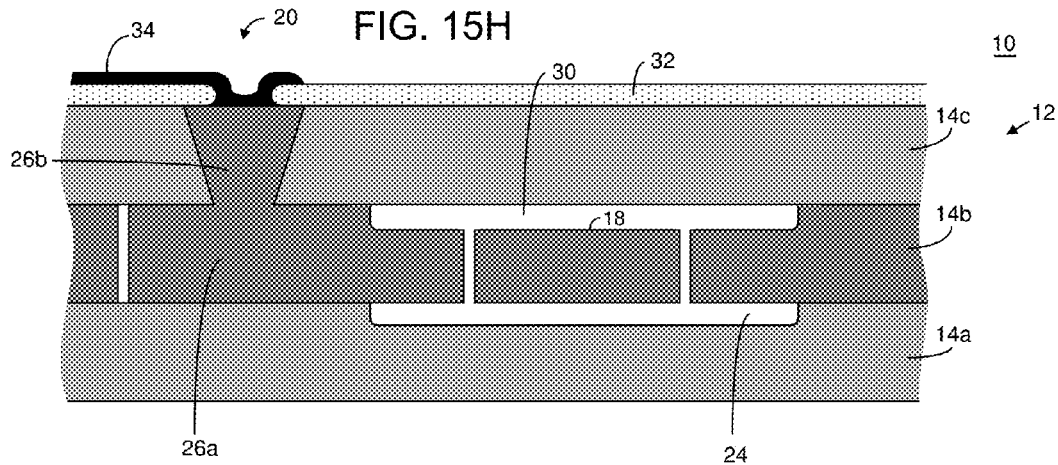

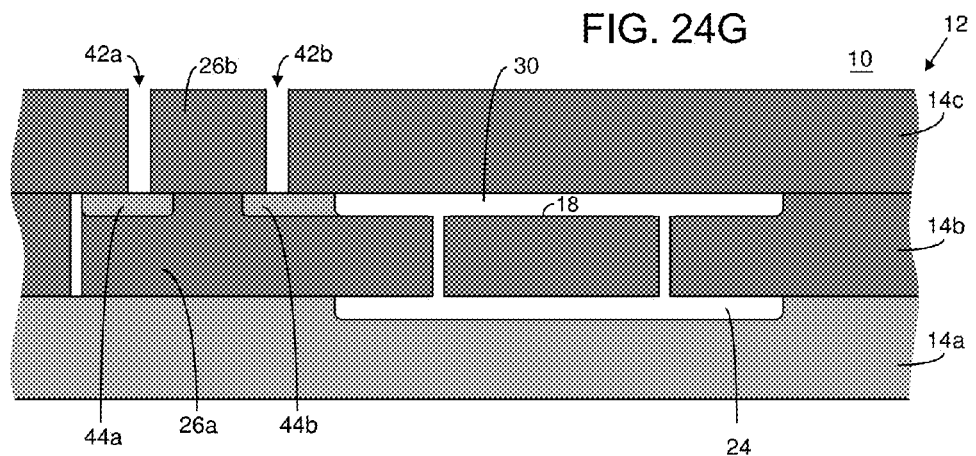
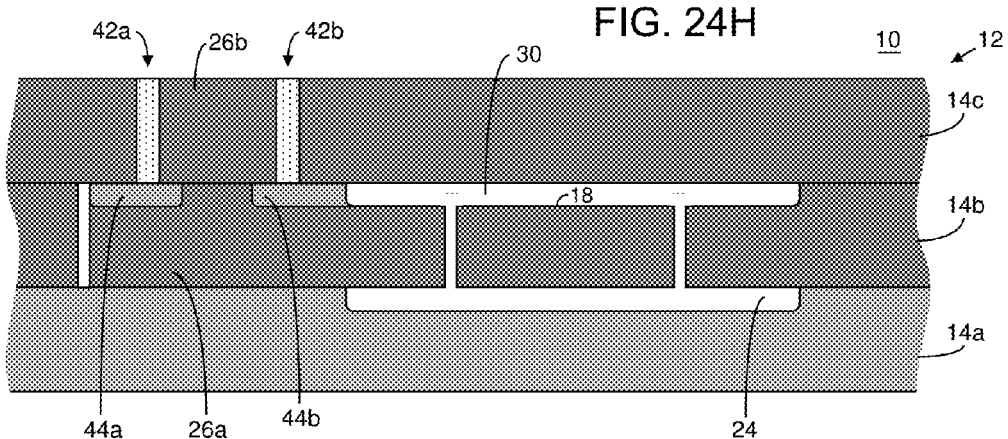
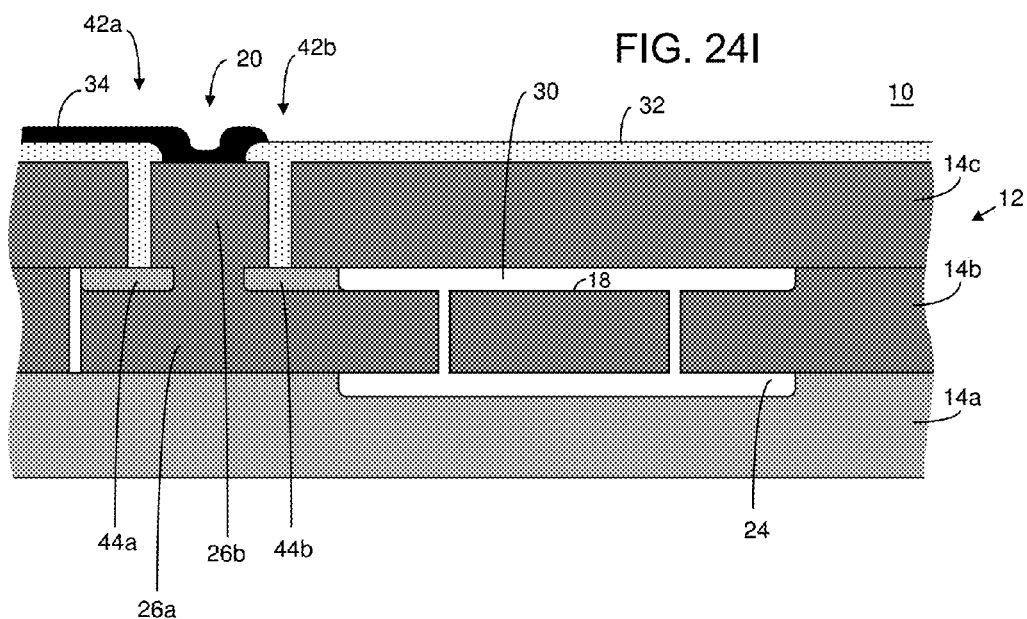

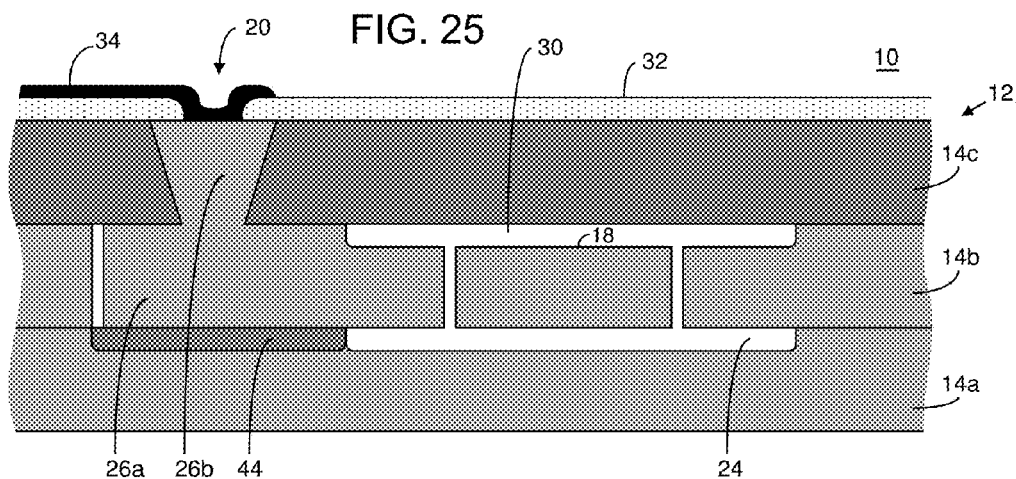
FIG. 25
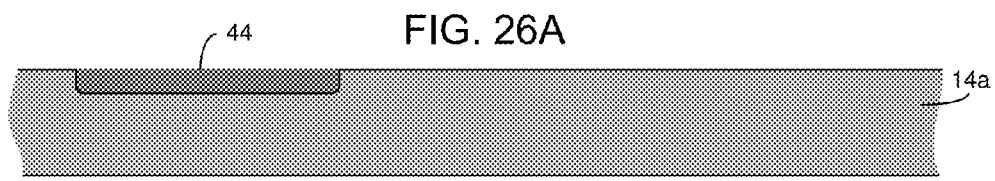
FIG. 26A
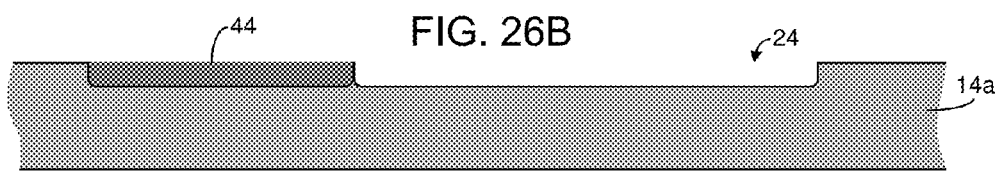
FIG. 26B
FIG. 26C
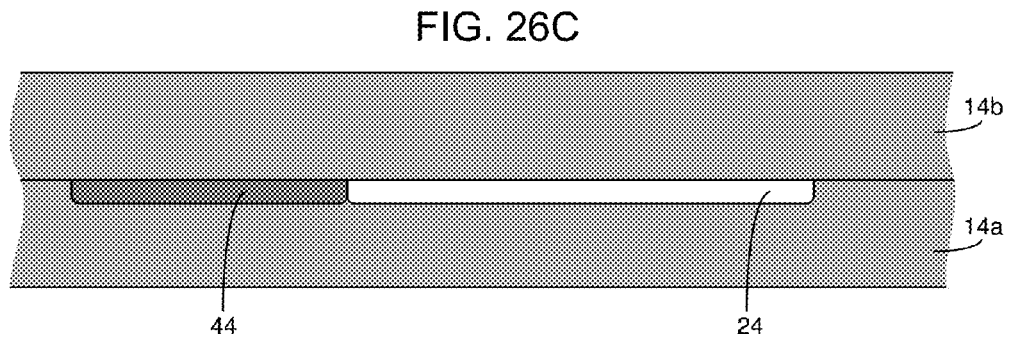
FIG. 26D
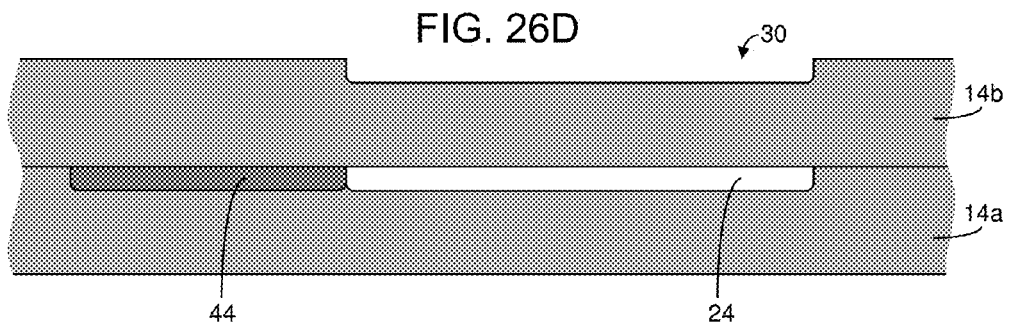

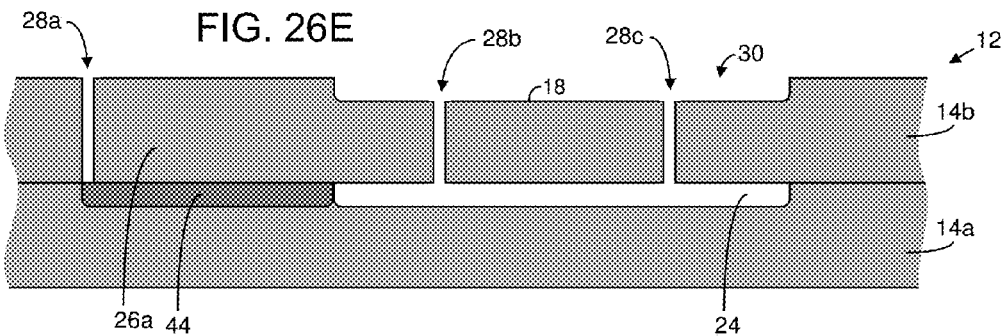
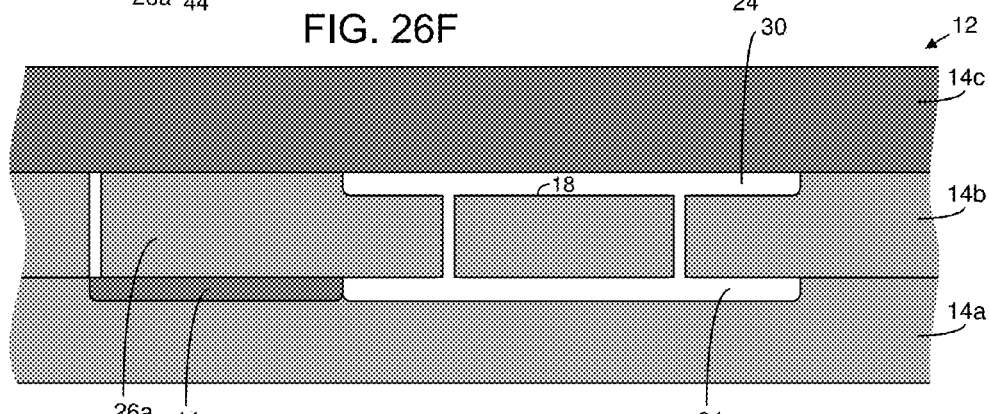
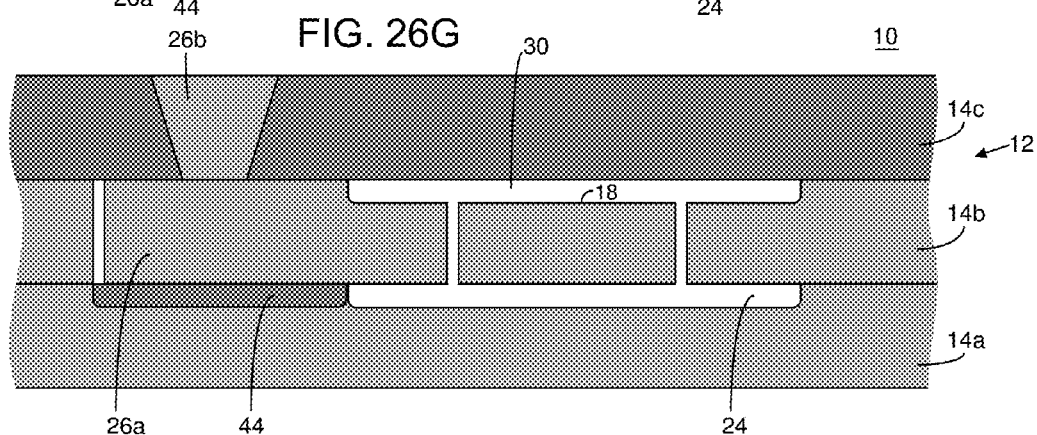
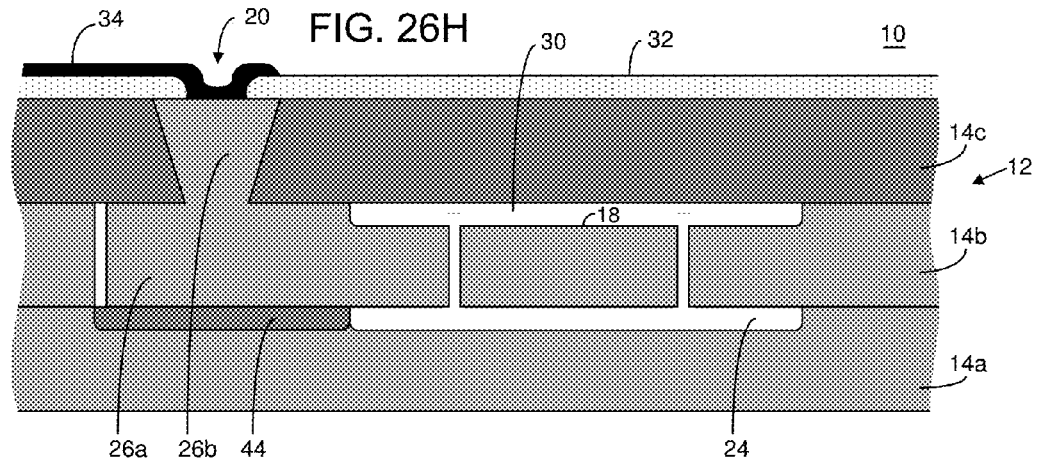

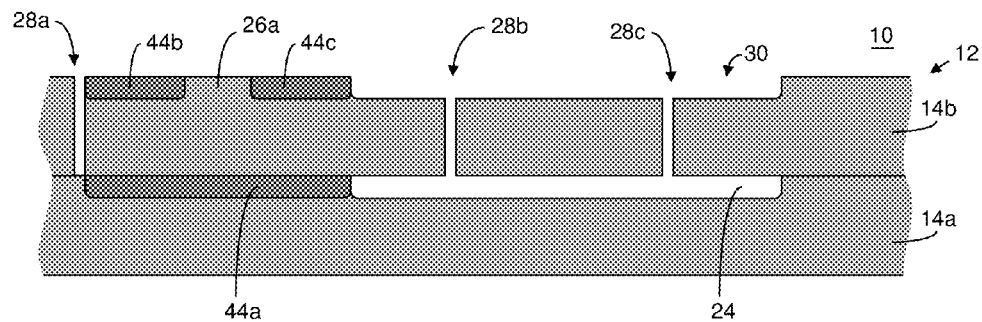
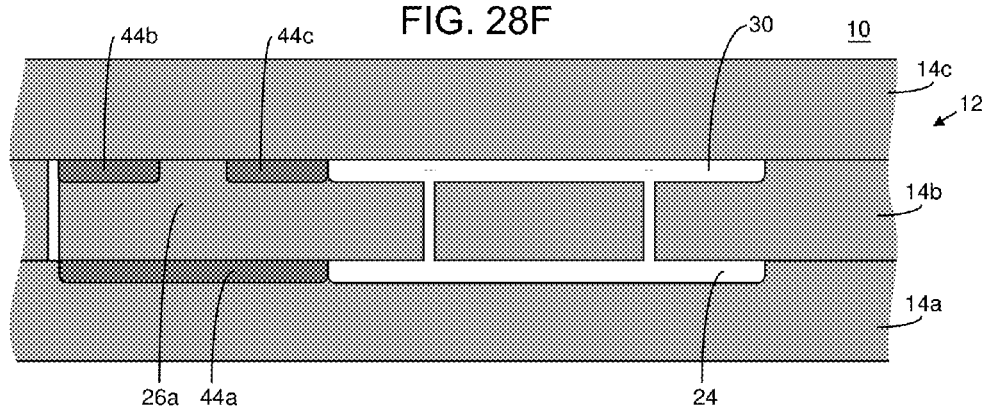
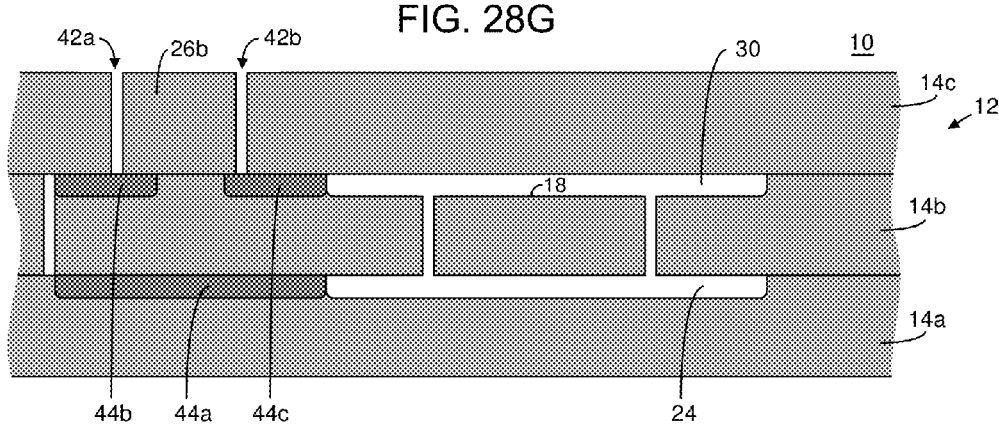

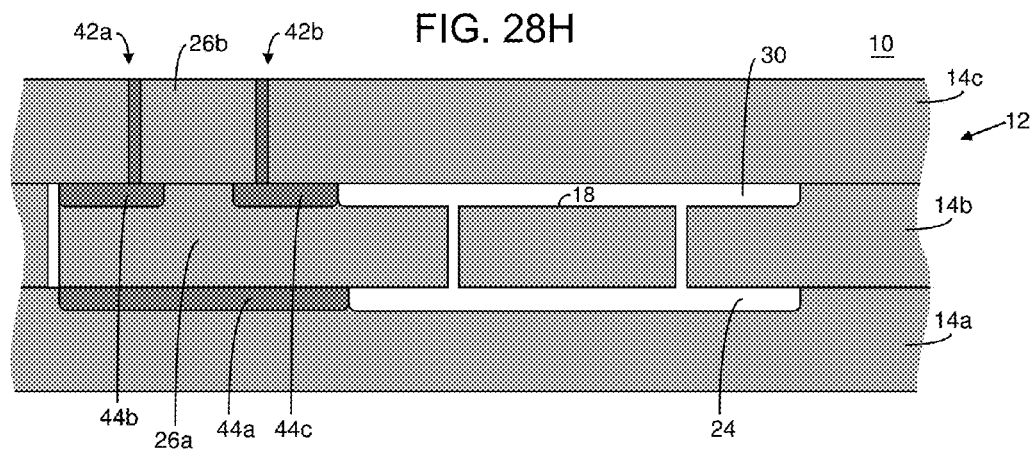
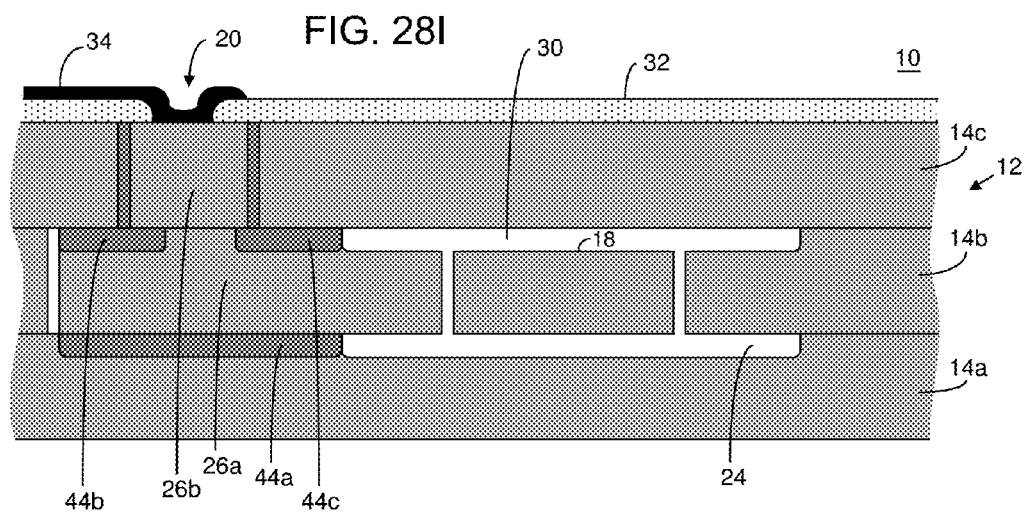
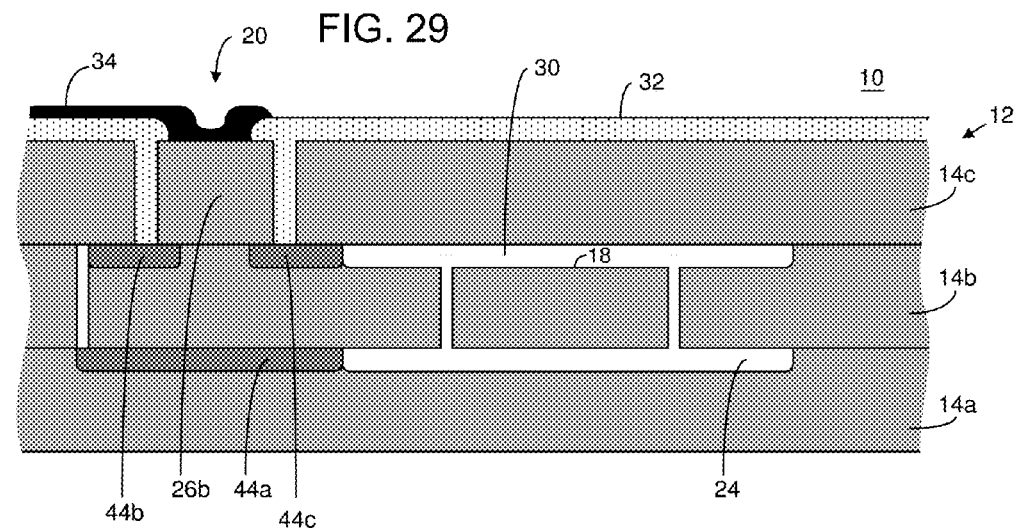

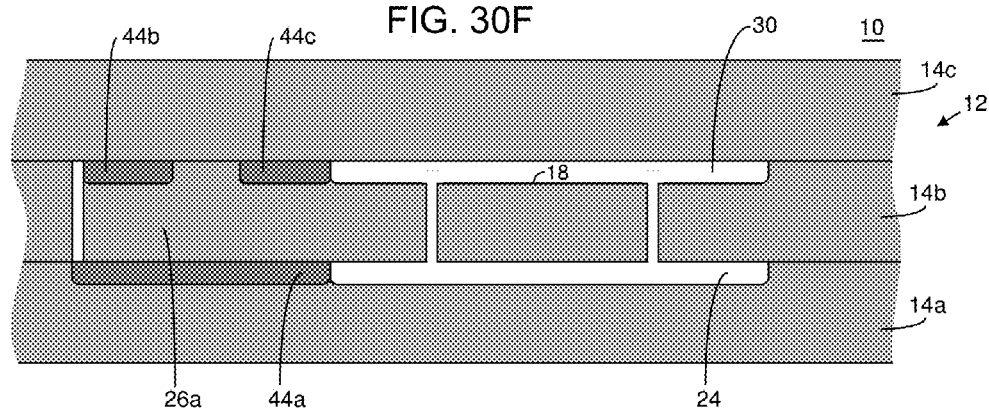
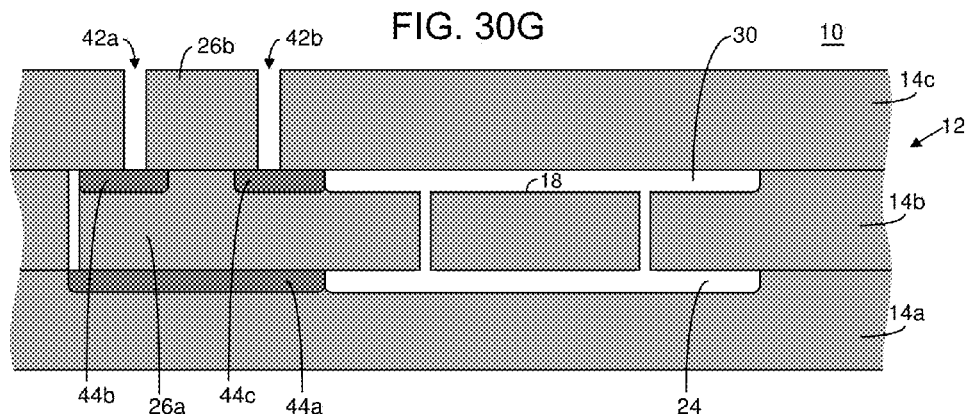
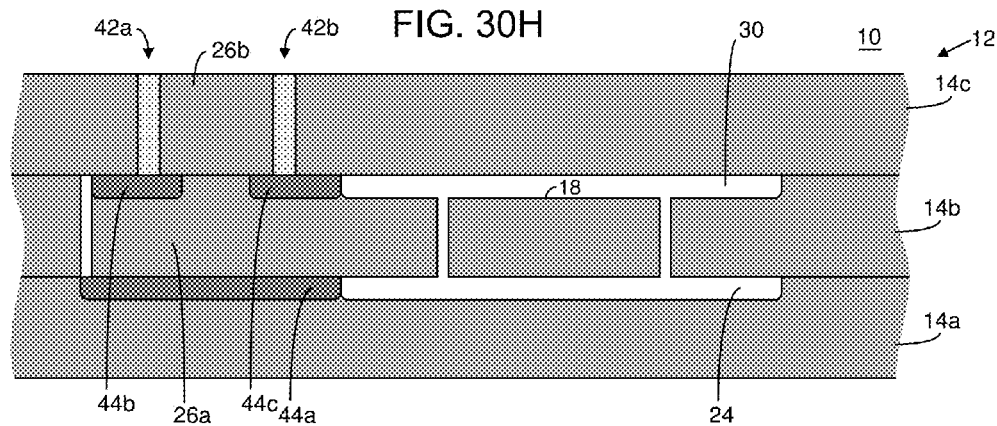

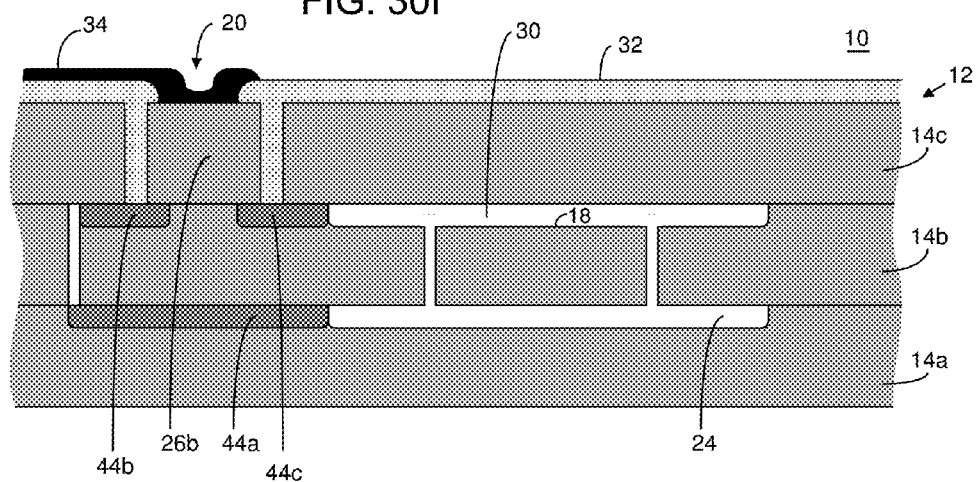
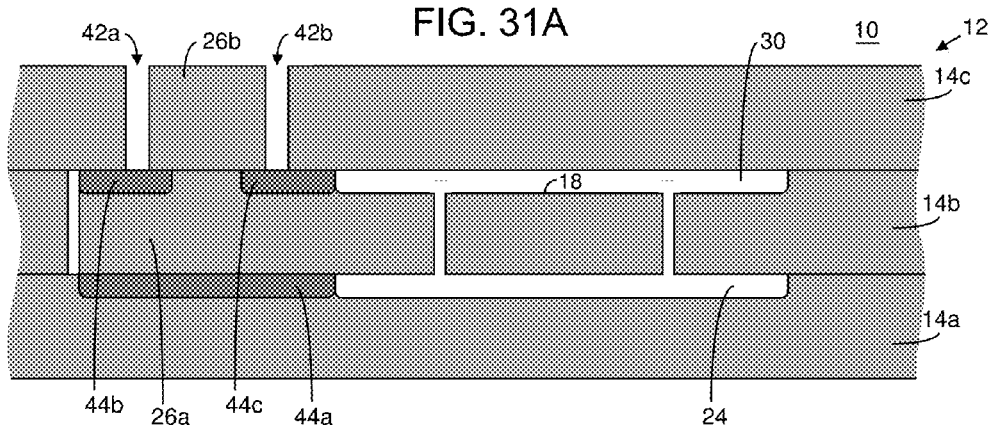
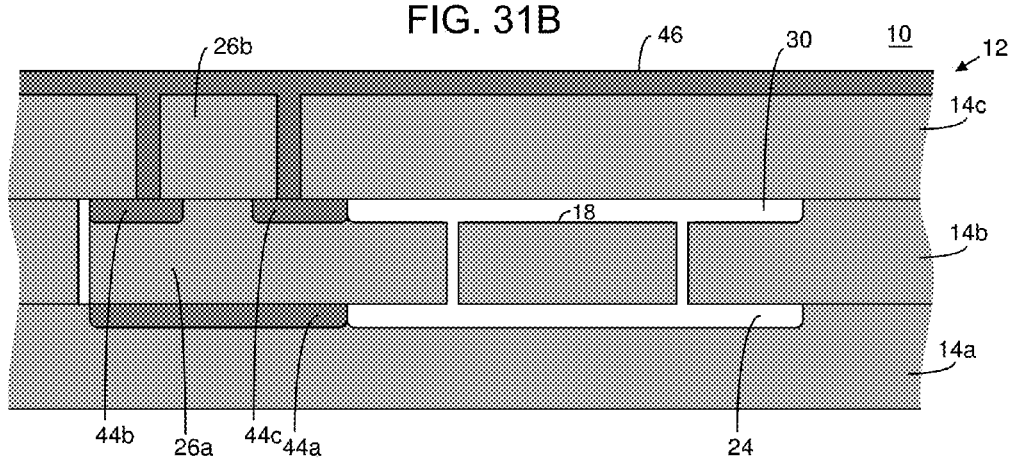

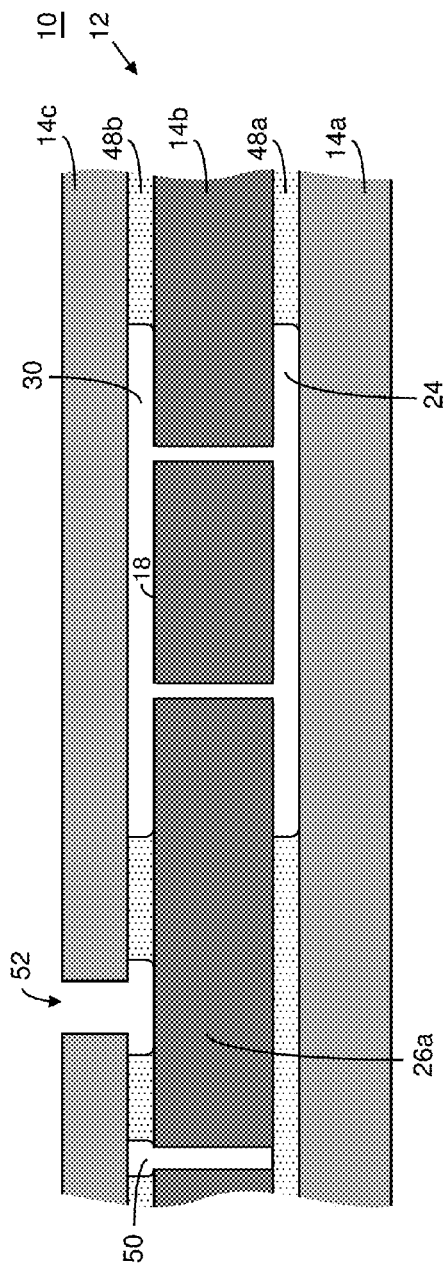
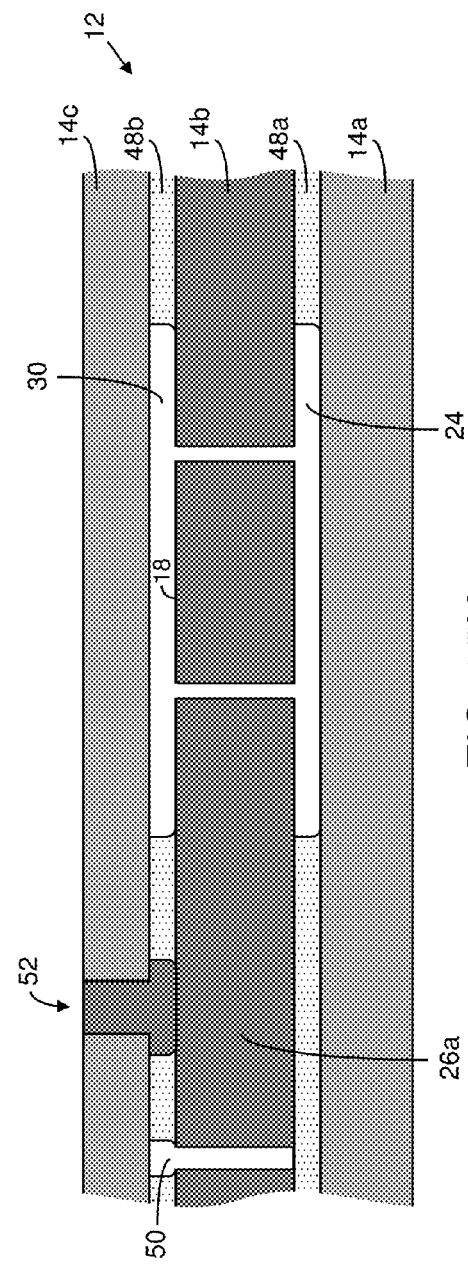
FIG. 35J
FIG. 35K

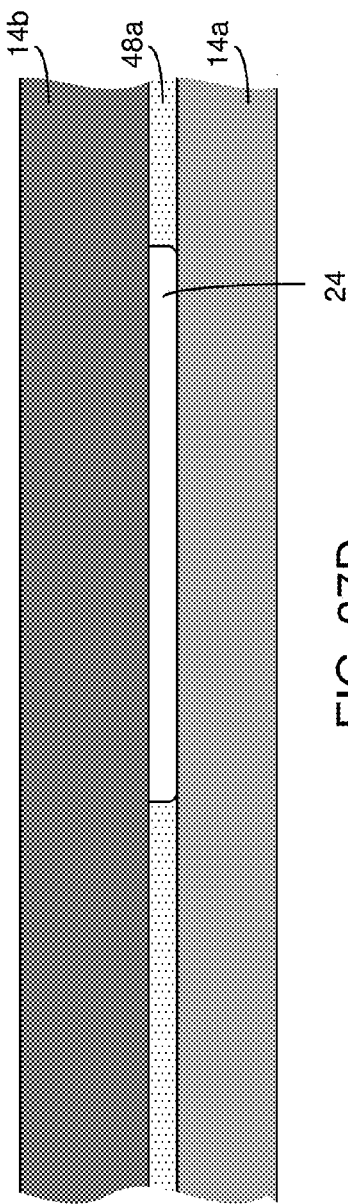
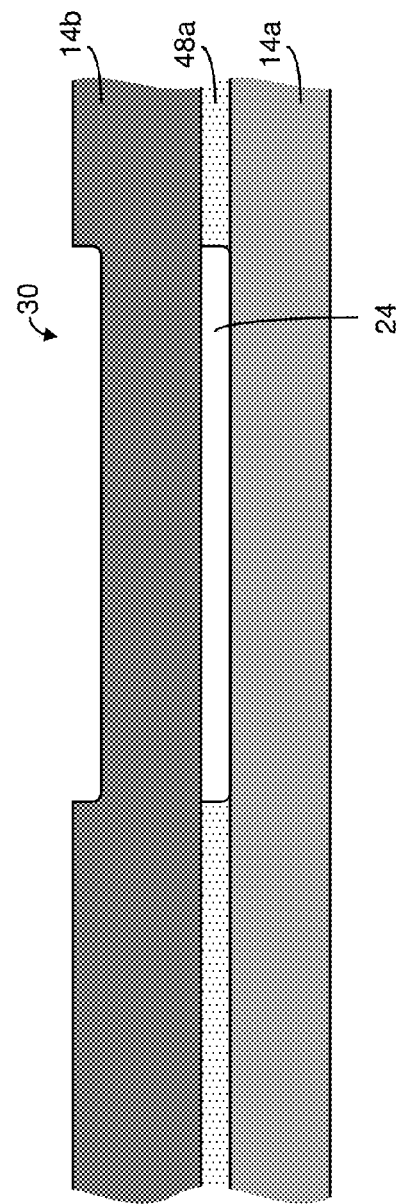
FIG. 37D
FIG. 37E

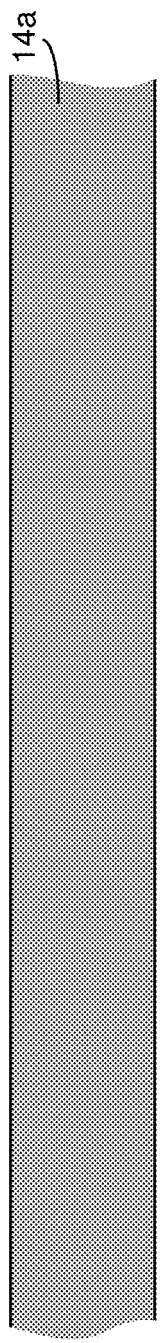
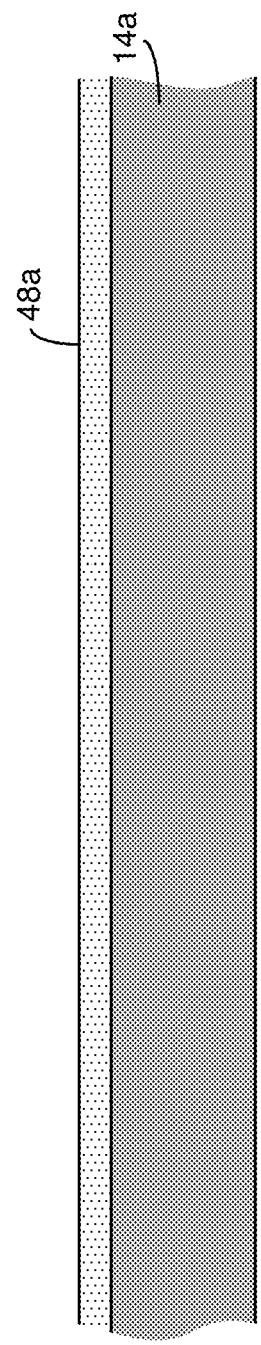
FIG. 39A
FIG. 39B

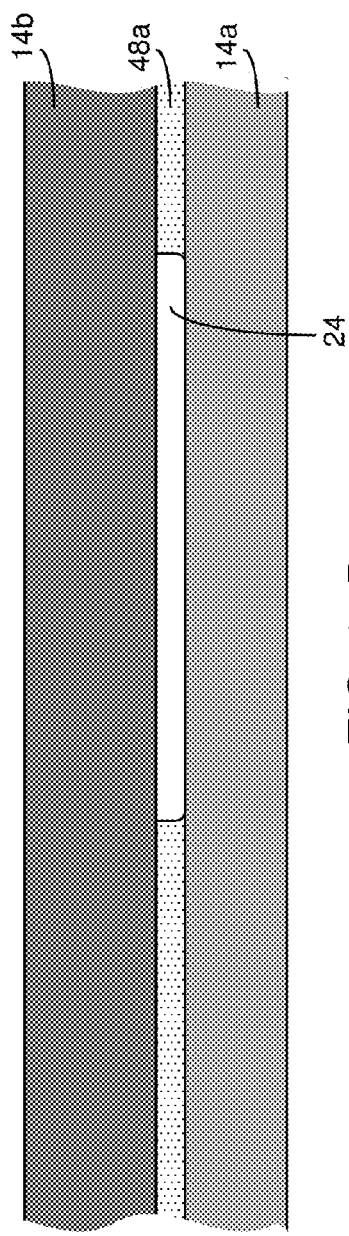
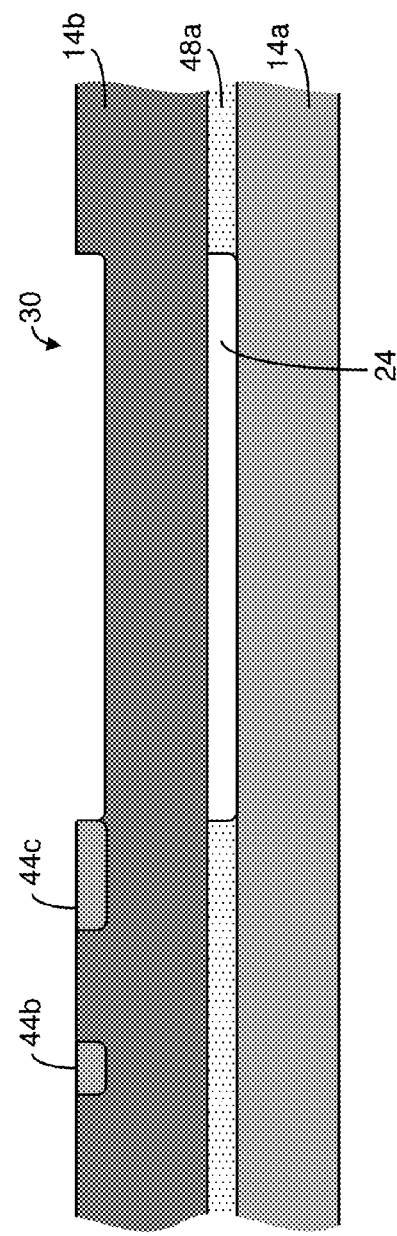
FIG. 39D
FIG. 39E

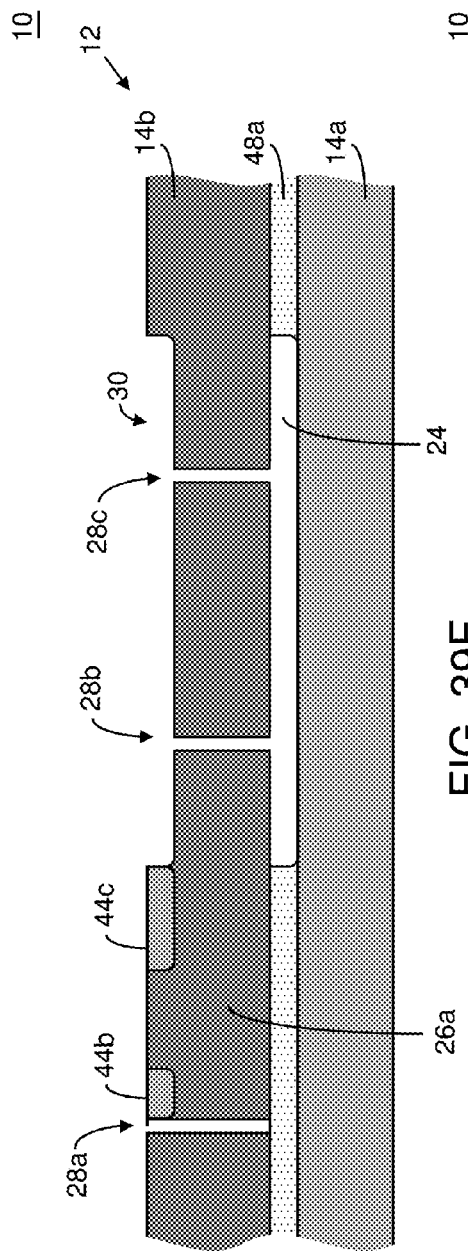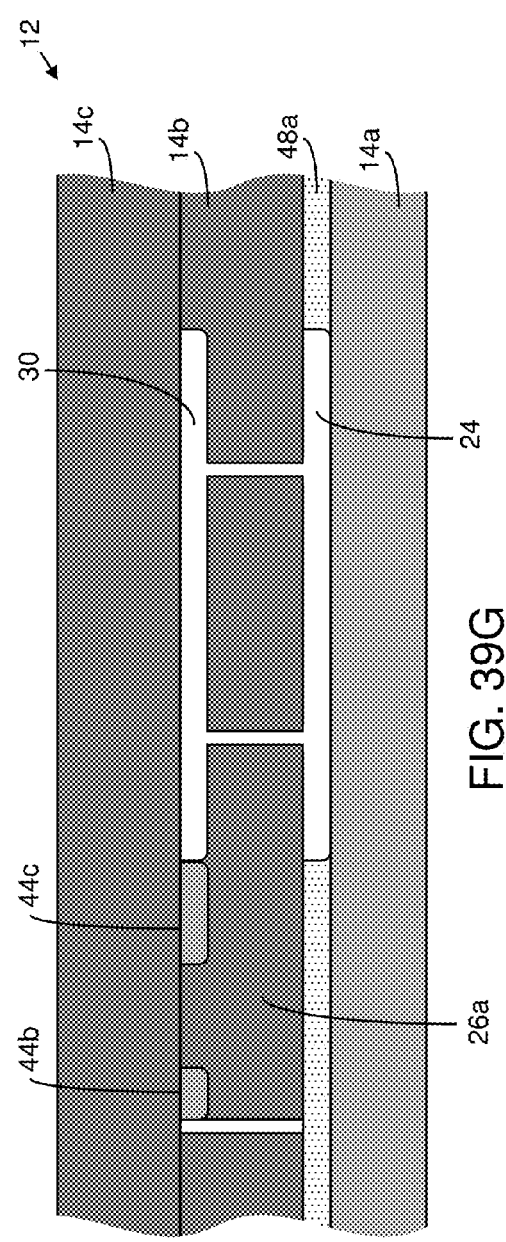

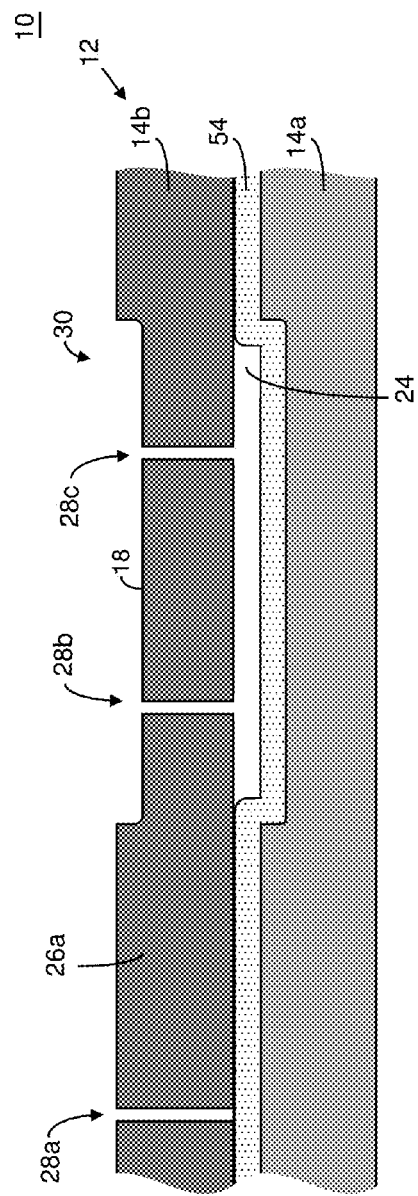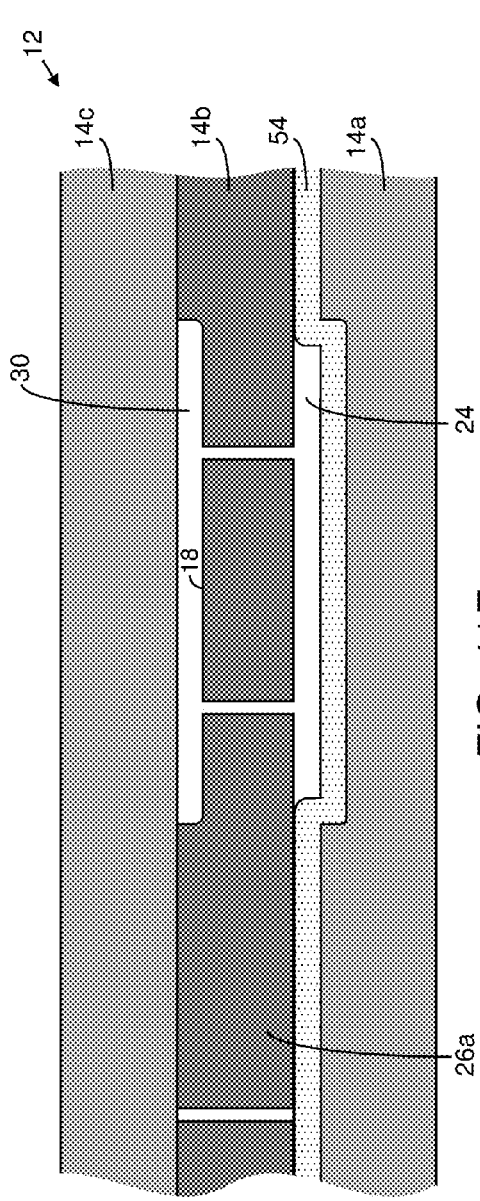
FIG. 41E
FIG. 41F

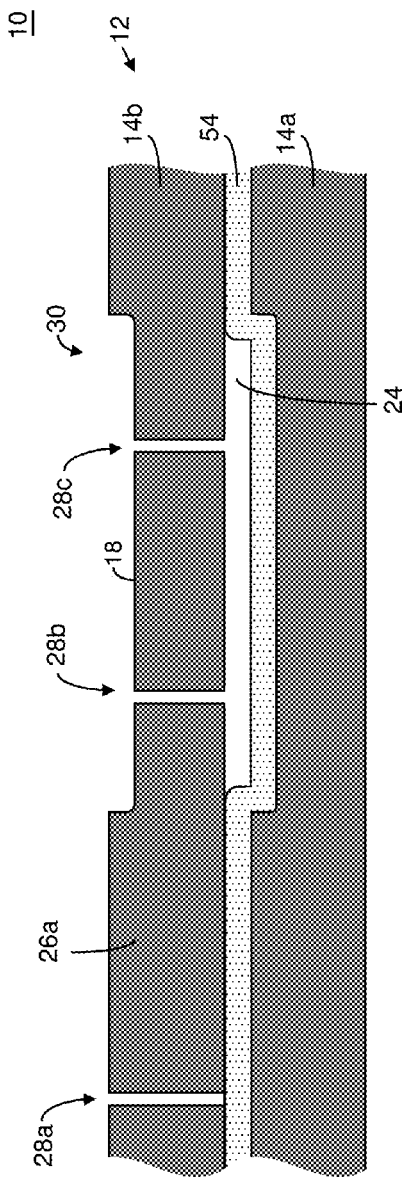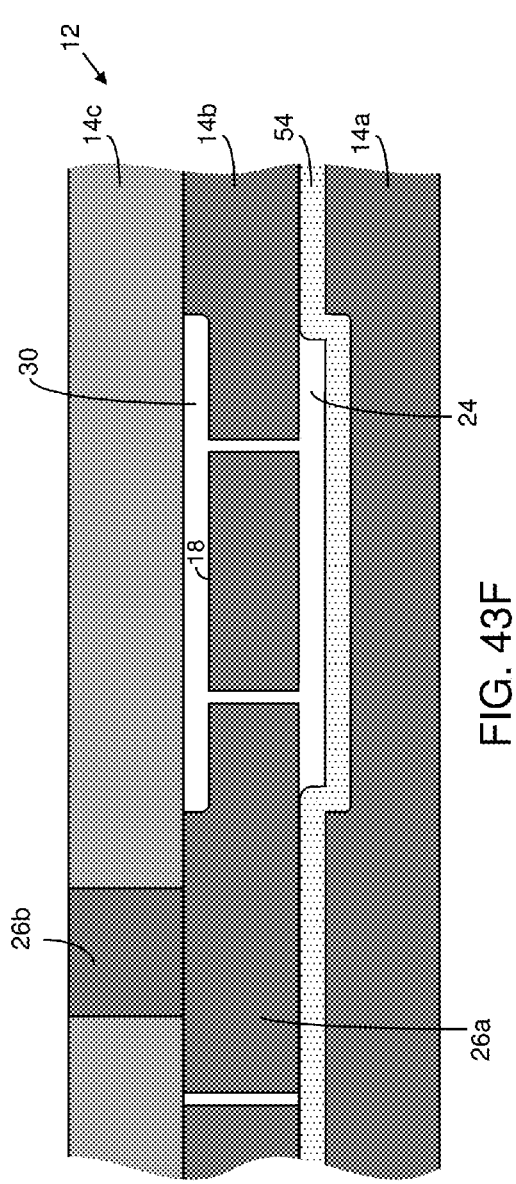
FIG. 43E
FIG. 43F

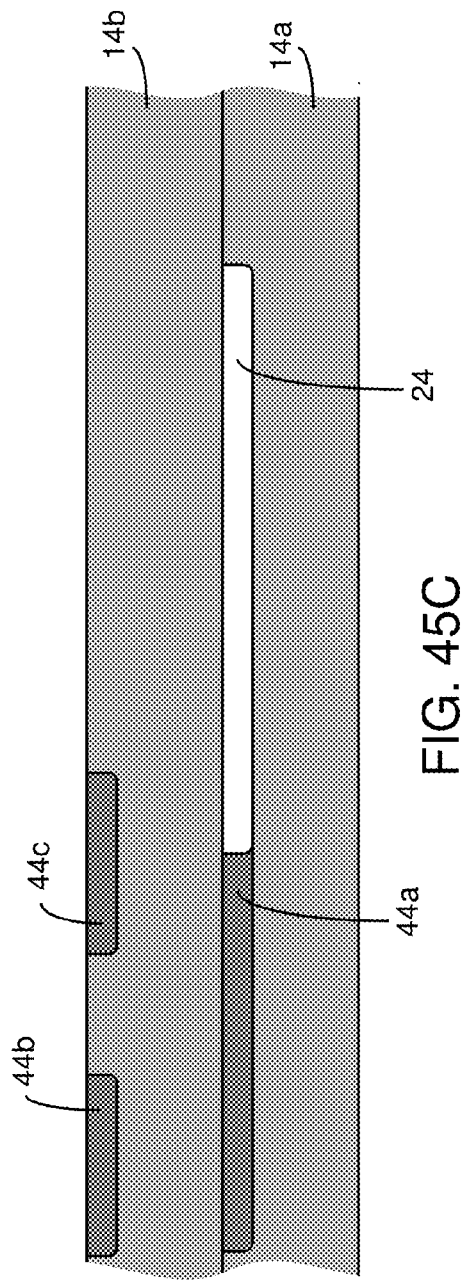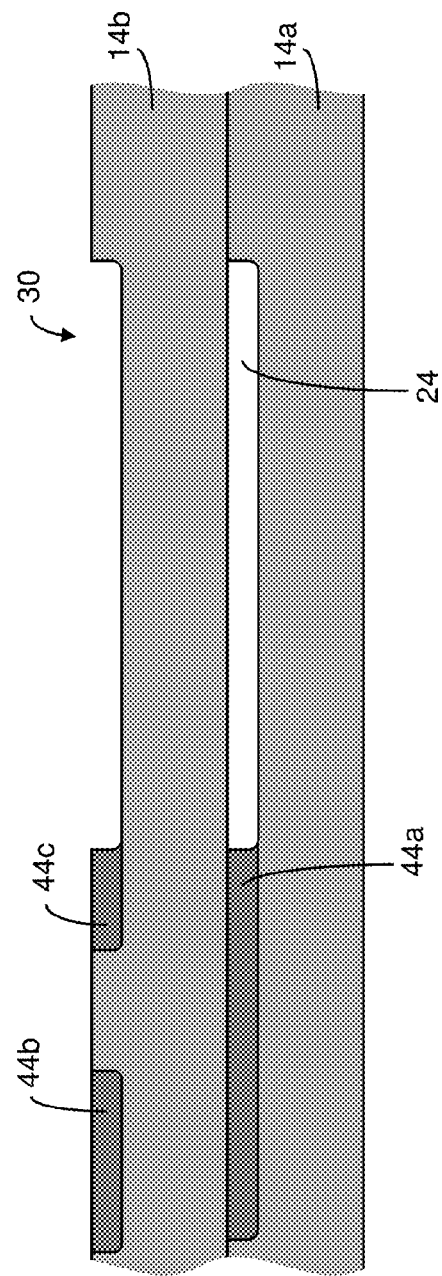

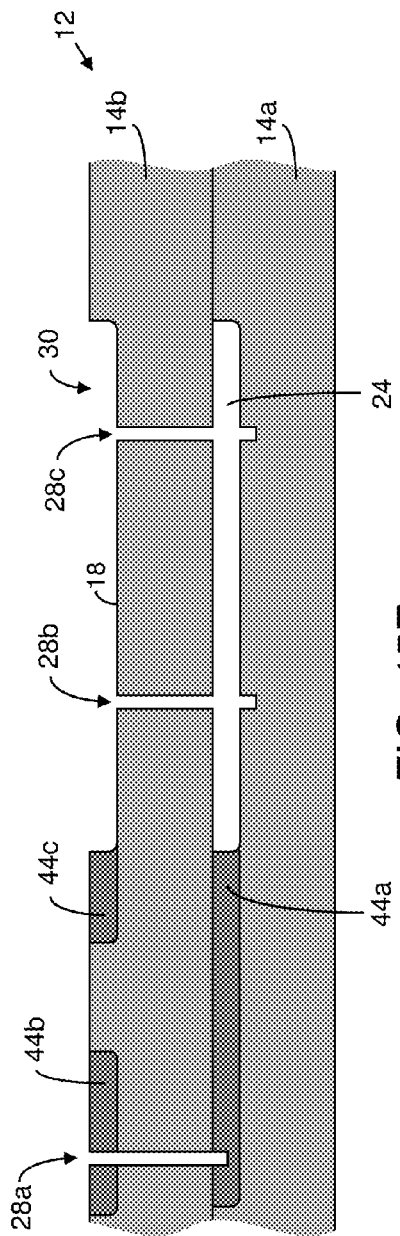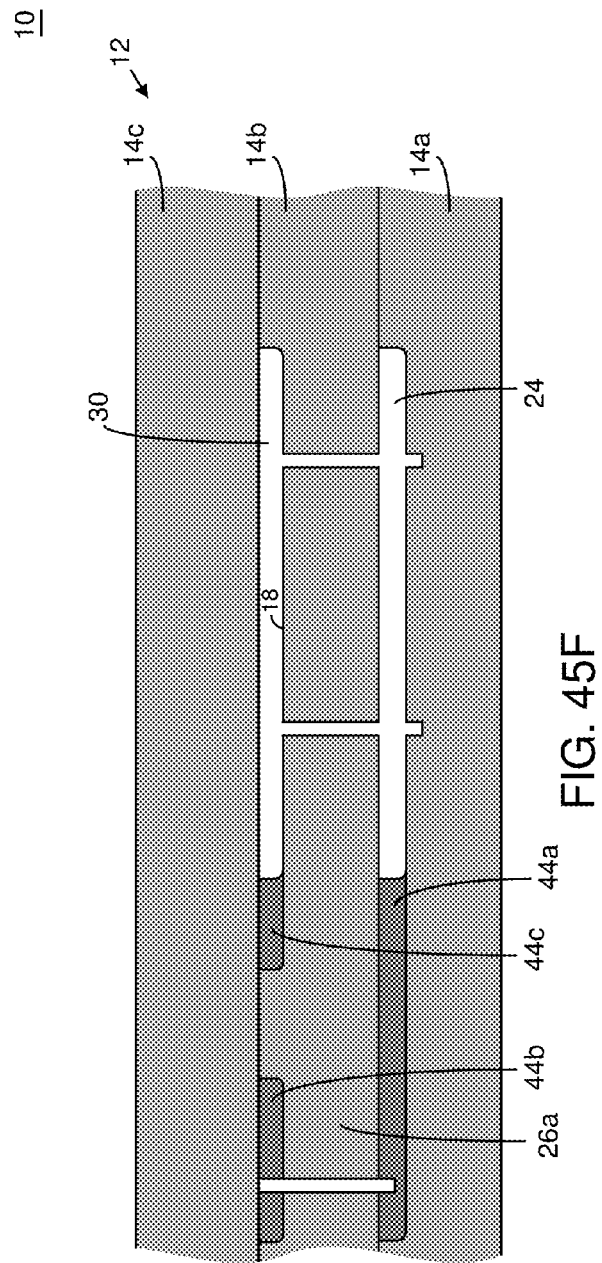

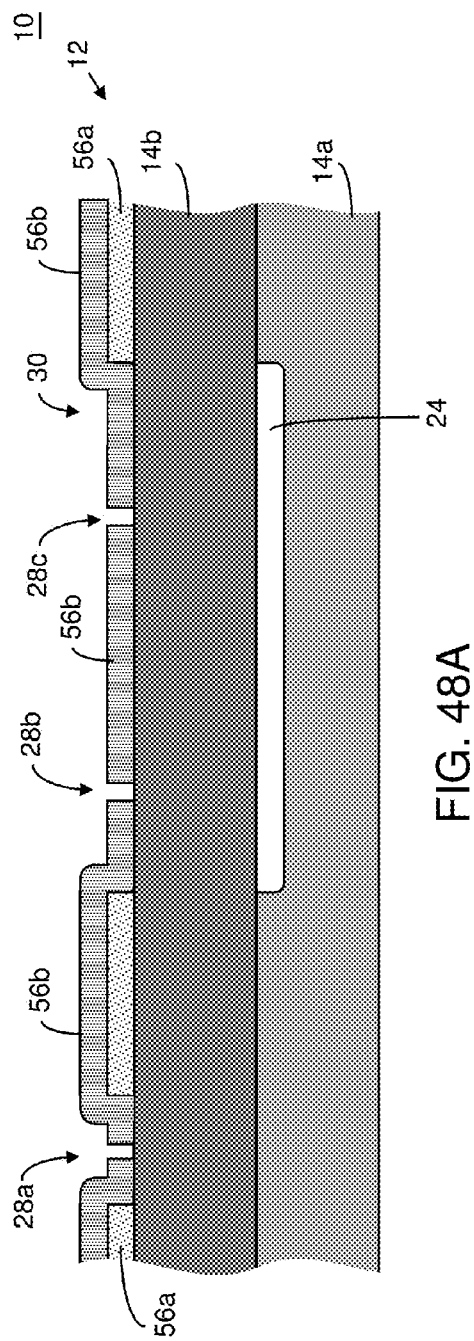
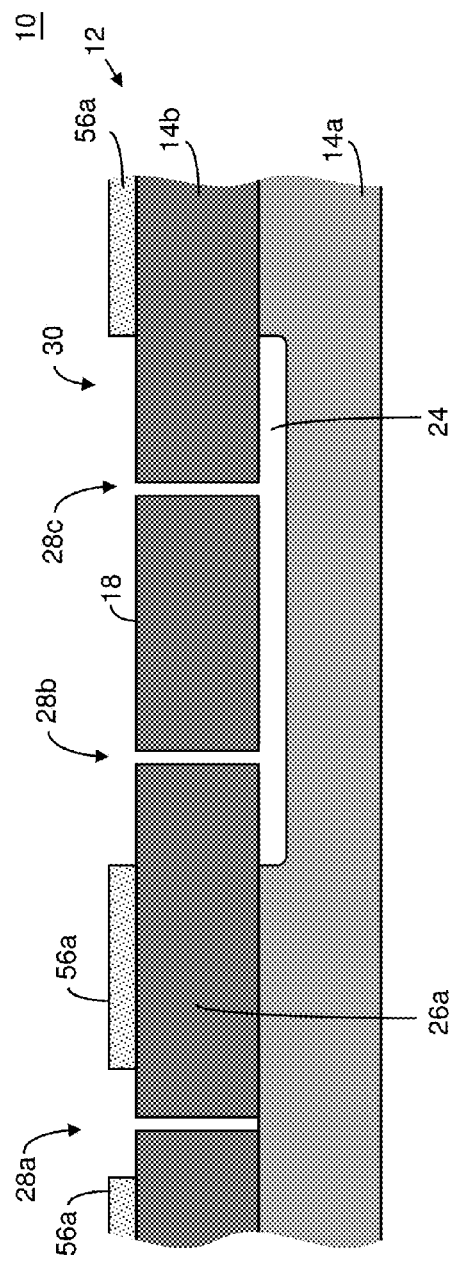

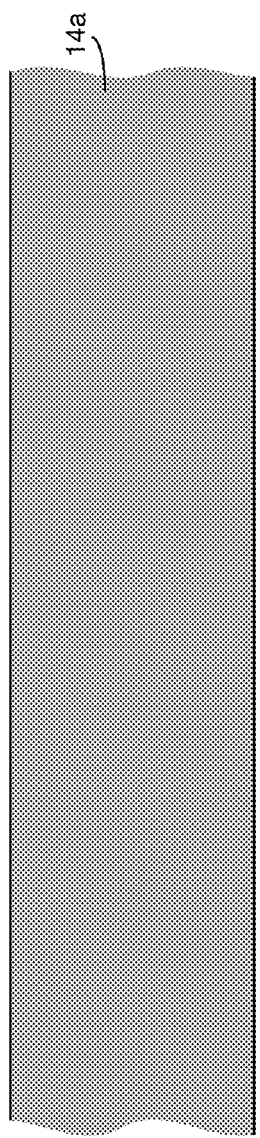
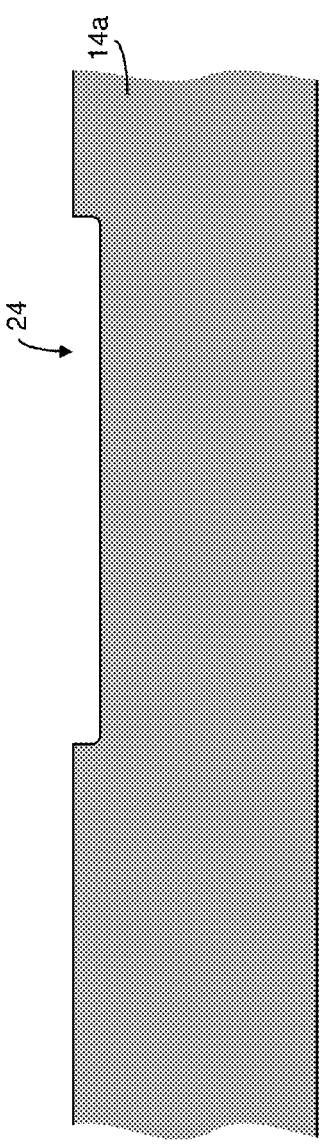
FIG. 51A
FIG. 51B

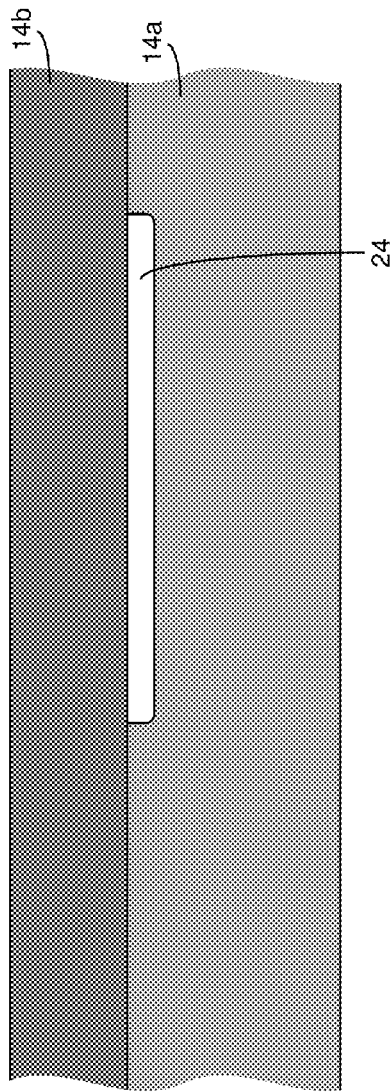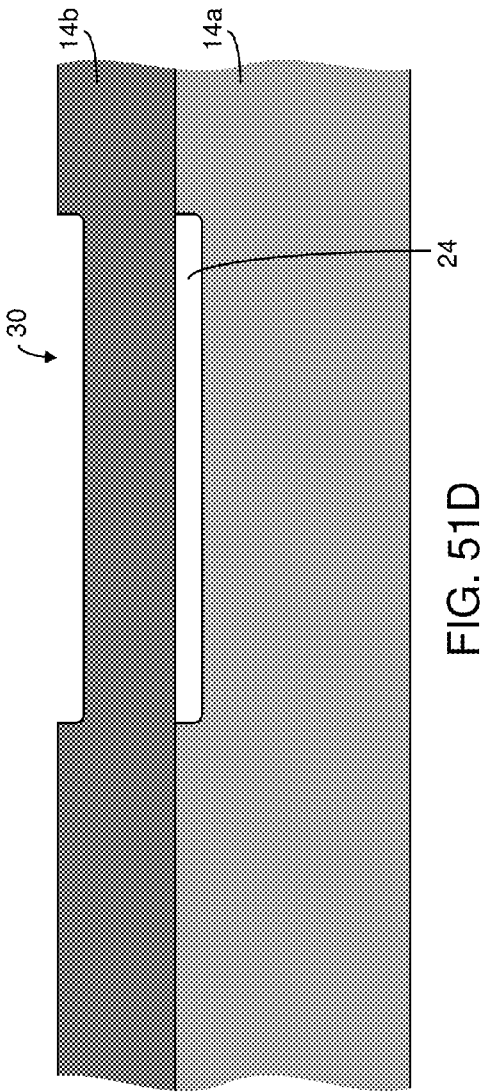

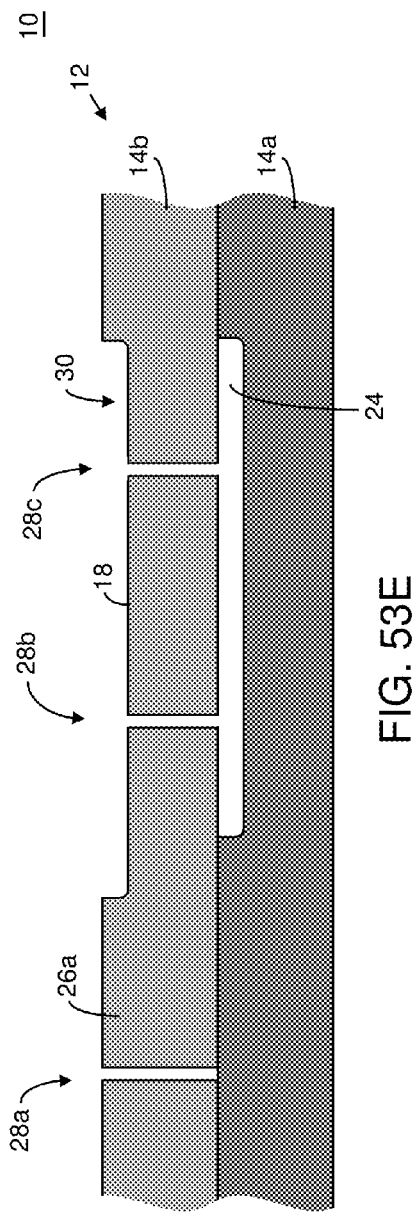
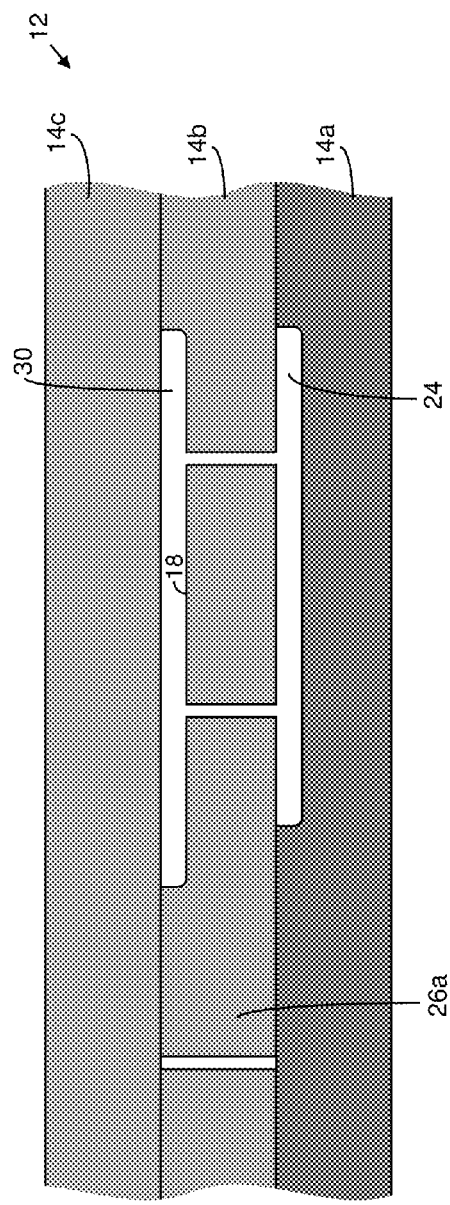
FIG. 53E
FIG. 53F

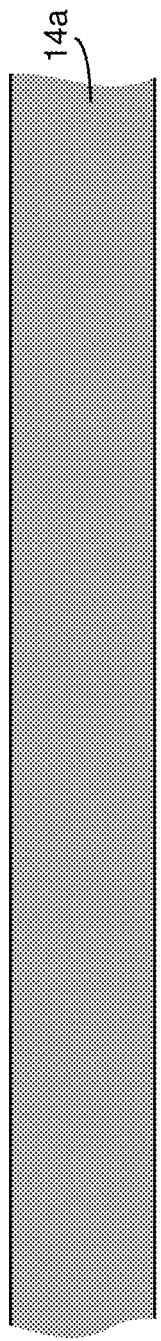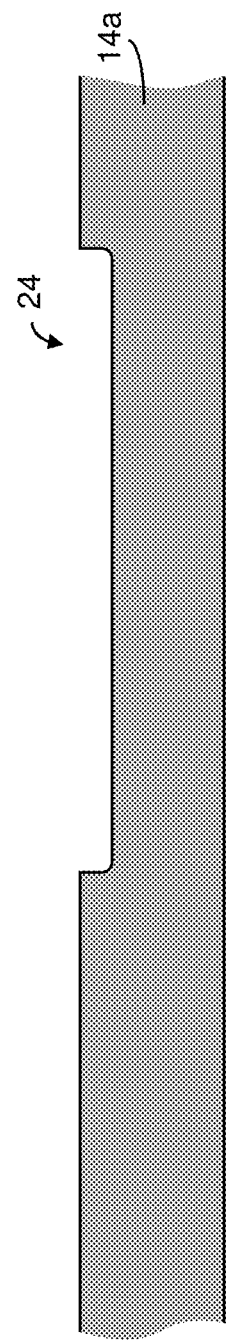
FIG. 55A
FIG. 55B

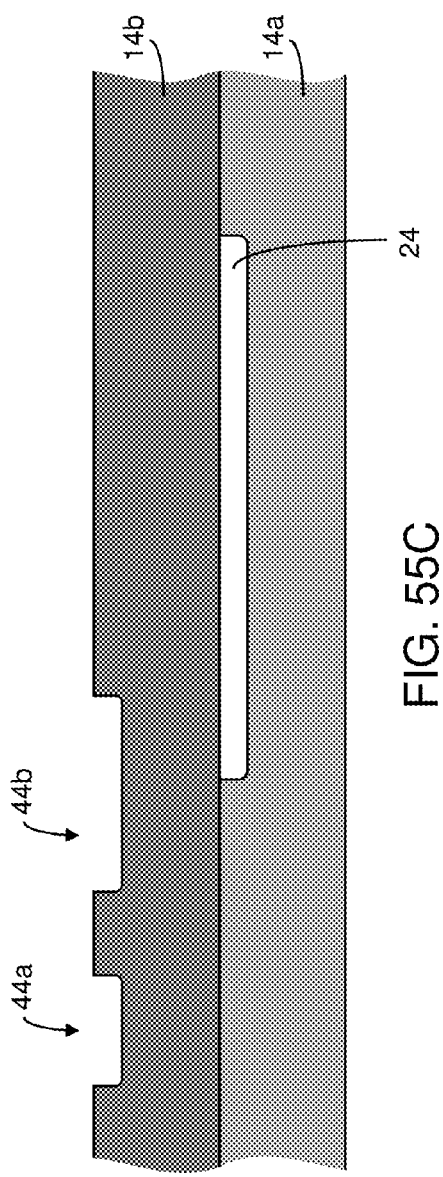
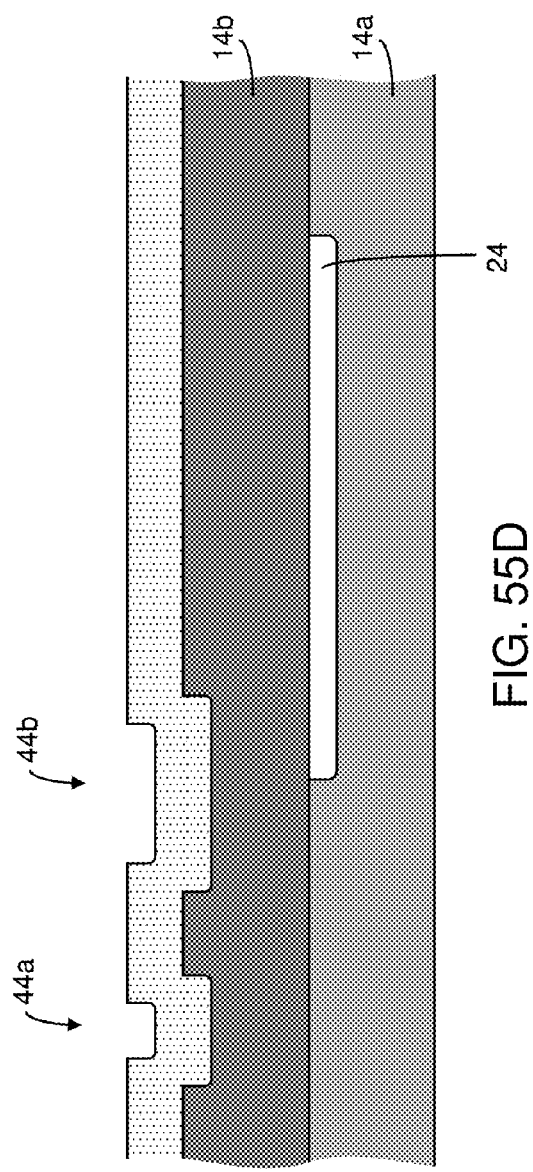
FIG. 55C
FIG. 55D

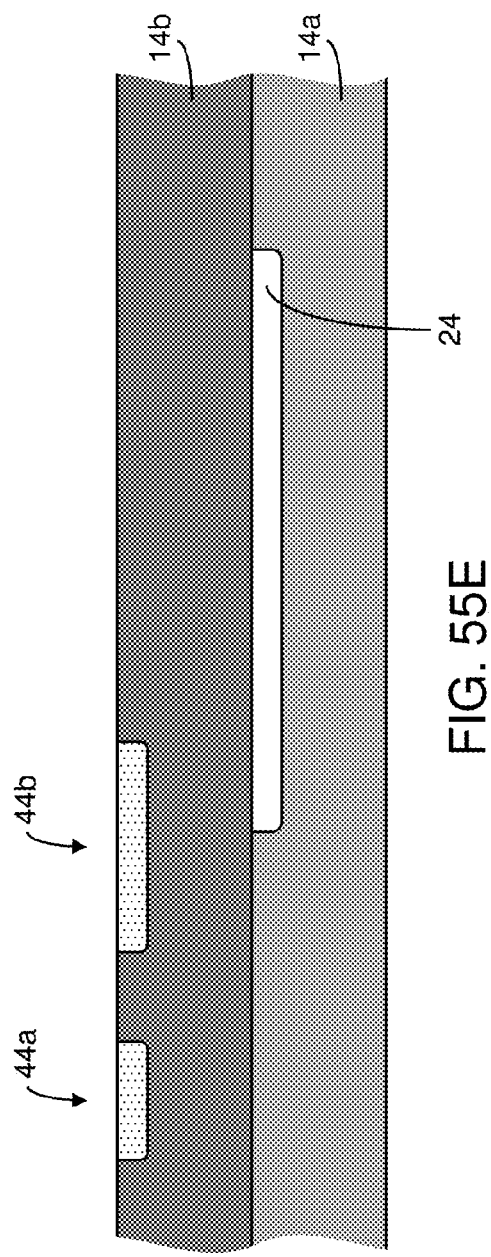
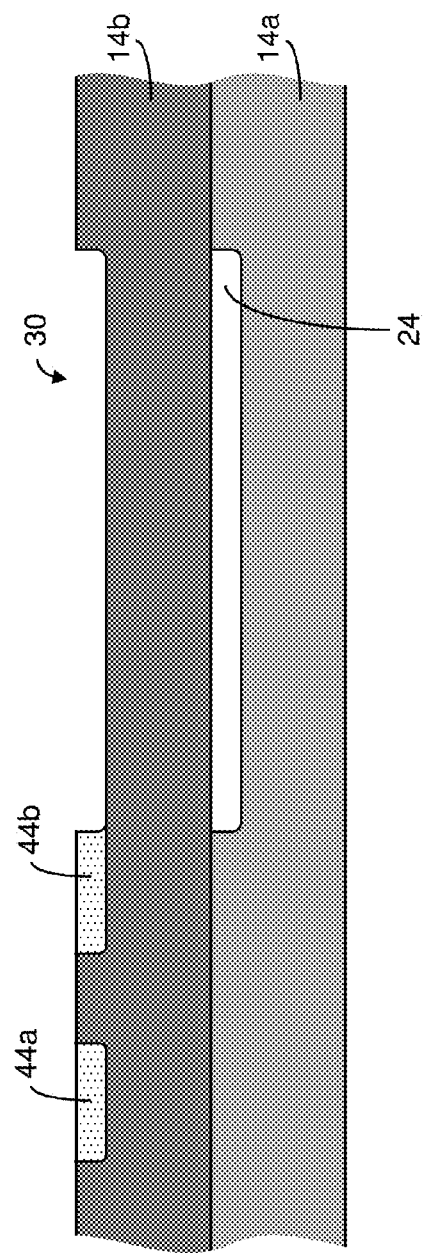
FIG. 55E
FIG. 55F

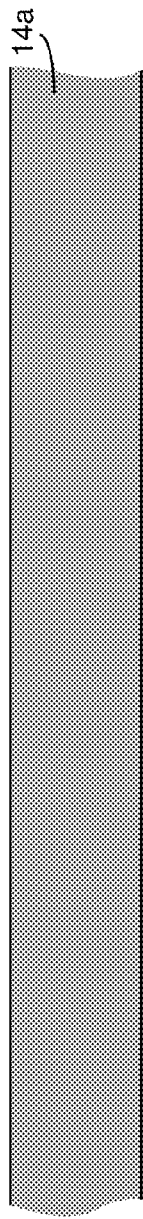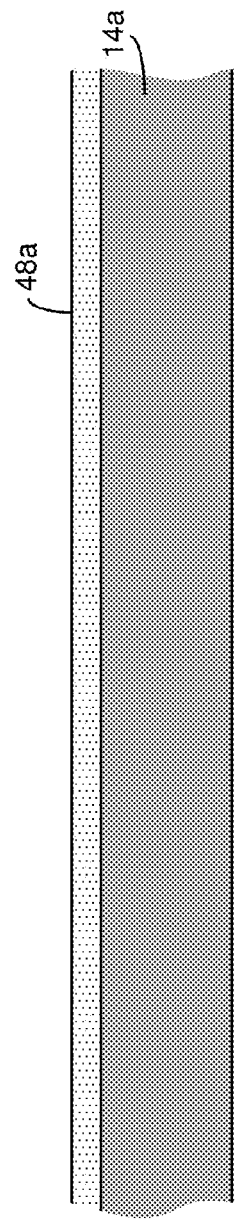

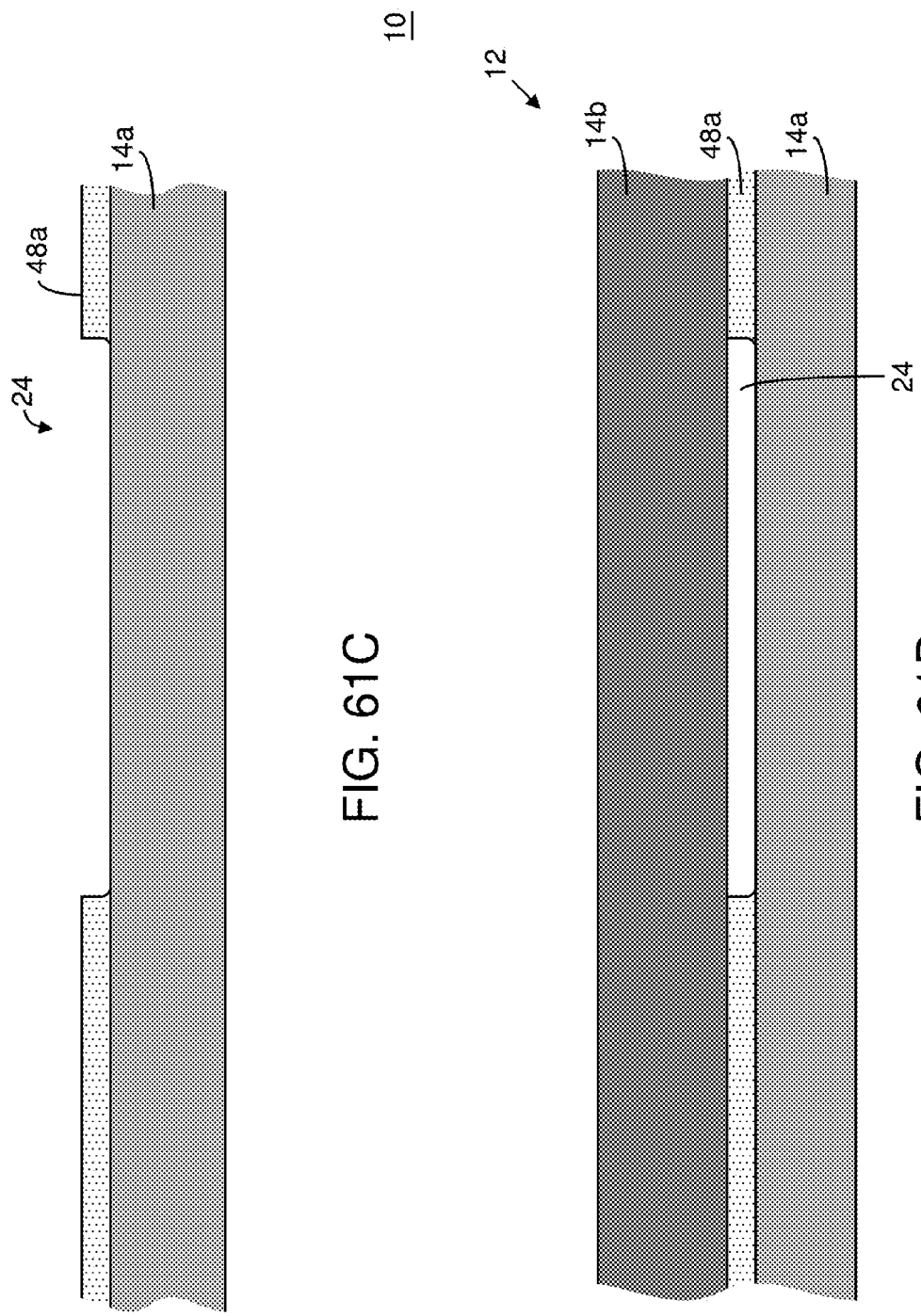

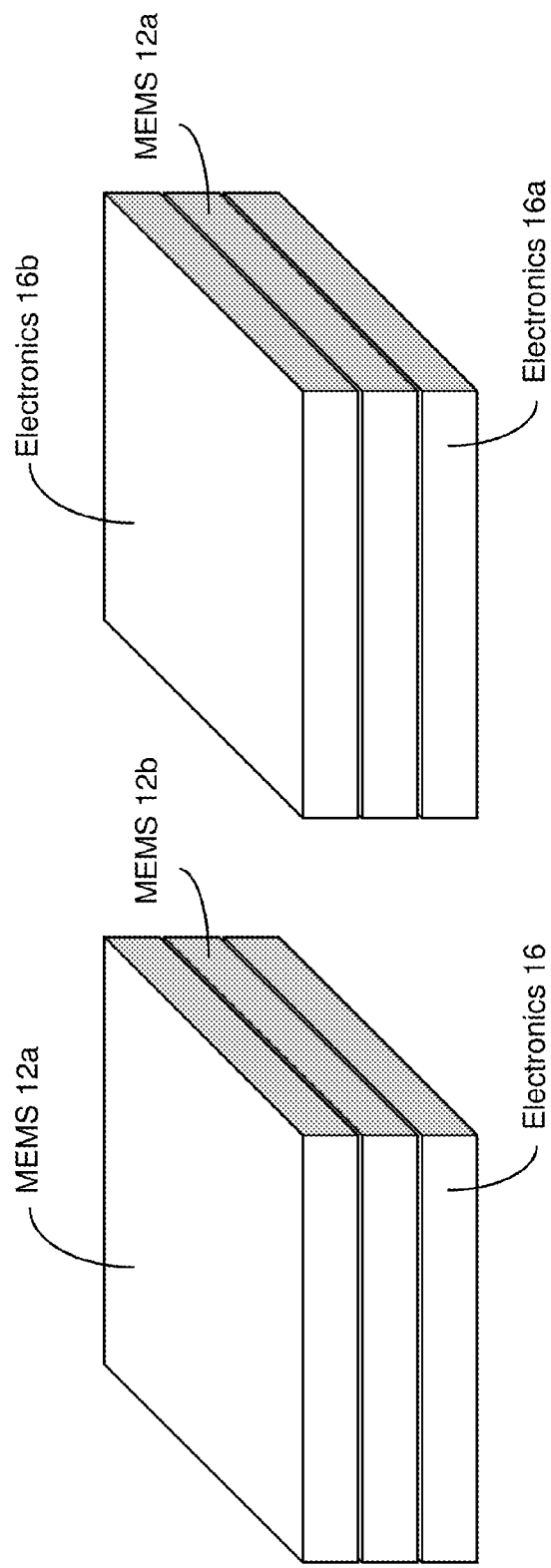

ENCAPSULATED MICROELECTROMECHANICAL STRUCTURE

CROSS-REFERENCE TO RELATED APPLICATIONS

This application is a divisional of U.S. patent application Ser. No. 14/961,760, filed Dec. 7, 2015, which is a divisional of U.S. patent application Ser. No. 14/524,986, filed Oct. 27, 2014, which is a divisional of U.S. patent application Ser. No. 11/593,404, filed Nov. 6, 2006 (now U.S. Pat. No. 8,871,551), which is a divisional of U.S. application Ser. No. 11/336,521, filed Jan. 20, 2006. Each of the foregoing applications is hereby incorporated by reference.

BACKGROUND

There are many inventions described and illustrated herein. The inventions relate to encapsulation electromechanical structures, for example, microelectromechanical and/or nanoelectromechanical structure (collectively hereinafter "microelectromechanical structures") and devices/systems including same; and more particularly, in one aspect, for fabricating or manufacturing microelectromechanical systems having mechanical structures that are encapsulated using wafer level encapsulation techniques, and devices/systems incorporated same.

Microelectromechanical systems, for example, gyroscopes, resonators and accelerometers, utilize micromachining techniques (i.e., lithographic and other precision fabrication techniques) to reduce mechanical components to a scale that is generally comparable to microelectronics. Microelectromechanical systems typically include a mechanical structure fabricated from or on, for example, a silicon substrate using micromachining techniques.

The mechanical structures are typically sealed in a chamber. The delicate mechanical structure may be sealed in, for example, a hermetically sealed metal or ceramic container or bonded to a semiconductor or glass-like substrate having a chamber to house, accommodate or cover the mechanical structure. In the context of the hermetically sealed metal or ceramic container, the substrate on, or in which, the mechanical structure resides may be disposed in and affixed to the metal or ceramic container. The hermetically sealed metal or ceramic container often also serves as a primary package as well.

In the context of the semiconductor or glass-like substrate packaging technique, the substrate of the mechanical structure may be bonded to another substrate (i.e., a "cover" wafer) whereby the bonded substrates form a chamber within which the mechanical structure resides. In this way, the operating environment of the mechanical structure may be controlled and the structure itself protected from, for example, inadvertent contact.

SUMMARY OF AT LEAST ONE OF MULTIPLE DISCLOSED EMBODIMENTS

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In one aspect, the present inventions are directed to a microelectromechanical device comprising a first substrate, a chamber, and a microelectromechanical structure, wherein the microelectromechanical structure is (i) formed from a portion of the first substrate and (ii) at least partially disposed in the chamber. In addition, in this aspect, the microelectromechanical device further includes a second substrate, bonded to the first substrate, wherein a surface of the second substrate forms a wall of the chamber, as well as a contact. The contact includes (1) a first portion of the contact is (i) formed from a portion of the first substrate and (ii) at least a portion thereof is disposed outside the chamber, and (2) a second portion of the contact is formed from a portion of the second substrate.

In one embodiment, the second substrate includes polycrystalline silicon, porous polycrystalline silicon, amorphous silicon, silicon carbide, silicon/germanium, germanium, or gallium arsenide. The first substrate may include polycrystalline silicon, porous polycrystalline silicon, amorphous silicon, silicon carbide, silicon/germanium, germanium, or gallium arsenide.

In addition, in one embodiment, the first portion of the contact is a semiconductor material having a first conductivity, the second substrate is a semiconductor material having a second conductivity, and the second portion of the contact is a semiconductor material having the first conductivity. Notably, the second portion of the contact may be a polycrystalline or monocrystalline silicon that is counter-doped to include the first conductivity.

The microelectromechanical device may further include a trench, disposed in the second substrate and around at least a portion of the second portion of the contact. The trench may include a first material (for example, an insulation material) disposed therein to electrically isolate the second portion of the contact from the second substrate.

Notably, the first substrate is a semiconductor on insulator substrate.

In another principle aspect, the present inventions are directed to a microelectromechanical device comprising a first substrate, a second substrate, wherein the second substrate is bonded to the first substrate, a chamber, and a microelectromechanical structure, wherein the microelectromechanical structure is (i) formed from a portion of the second substrate and (ii) at least partially disposed in the chamber. The microelectromechanical device may further include a third substrate, bonded to the second substrate, wherein a surface of the third substrate forms a wall of the chamber. The microelectromechanical device may also include a contact having (1) a first portion of the contact is (i) formed from a portion of the second substrate and (ii) at least a portion thereof is disposed outside the chamber, and (2) a second portion of the contact is formed from a portion of the third substrate.

The second substrate may include polycrystalline silicon, porous polycrystalline silicon, amorphous silicon, silicon carbide, silicon/germanium, germanium, or gallium arsenide. The third substrate may include polycrystalline silicon, porous polycrystalline silicon, amorphous silicon, silicon carbide, silicon/germanium, germanium, or gallium arsenide.

In one embodiment, the first portion of the contact is a semiconductor material having a first conductivity, the third substrate is a semiconductor material having a second conductivity, and the second portion of the contact is a semiconductor material having the first conductivity. Notably, in one embodiment, the second portion of the contact may be a polycrystalline or monocrystalline silicon that is counter-doped to include the first conductivity.

The microelectromechanical device may further include a trench, disposed in the third substrate and around at least a portion of the second portion of the contact. The trench may include a first material (for example, an insulation material) disposed therein to electrically isolate the second portion of the contact from the third substrate.

The microelectromechanical device may also include an isolation region disposed in the second substrate such that the trench is aligned with and juxtaposed to the isolation region. In this embodiment, the first portion of the contact may be a semiconductor material having a first conductivity, the isolation region may be a semiconductor material having a second conductivity, and the second portion of the contact may be a semiconductor material having the first conductivity. A trench may be included to electrically isolate the second portion of the contact from the second substrate. The trench may include a semiconductor material, disposed therein, having the second conductivity.

In another embodiment, the microelectromechanical device may include an isolation region disposed in the first substrate such that the first portion of the contact is aligned with and juxtaposed to the isolation region.

In yet another embodiment, the microelectromechanical device may include a first isolation region and a second isolation region. The first isolation region may be disposed in the first substrate such that the first portion of the contact is aligned with and juxtaposed to the first isolation region. The second isolation region may be disposed in the second substrate such that the second portion of the contact is aligned with and juxtaposed to the second isolation region. In this embodiment, the first and second portions of the contact may be semiconductor materials having a first conductivity, and the first and second isolation regions may be semiconductor materials having the second conductivity.

The microelectromechanical device of this embodiment may also include a trench, disposed in the third substrate and around at least a portion of the second portion of the contact. The trench may include a first material (for example, an insulator material) disposed therein to electrically isolate the second portion of the contact from the third substrate. The trench may be aligned with and juxtaposed to the second isolation region.

Notably, all forms of bonding, whether now known or later developed, are intended to fall within the scope of the present invention. For example, bonding techniques such as fusion bonding, anodic-like bonding, silicon direct bonding, soldering (for example, eutectic soldering), thermo compression, thermo-sonic bonding, laser bonding and/or glass reflow bonding, and/or combinations thereof.

Moreover, any of the embodiments described and illustrated herein may employ a bonding material and/or a bonding facilitator material (disposed between substrates, for example, the second and third substrates) to, for example, enhance the attachment of or the "seal" between the substrates (for example, the first and second, and/or the second and third), address/compensate for planarity considerations between substrates to be bonded (for example, compensate for differences in planarity between bonded substrates), and/or to reduce and/or minimize differences in thermal expansion (that is materials having different coefficients of thermal expansion) of the substrates and materials therebetween (if any). Such materials may be, for example, solder, metals, frit, adhesives, BPSG, PSG, or SOG, or combinations thereof.

Again, there are many inventions, and aspects of the inventions, described and illustrated herein. This Summary of the Inventions is not exhaustive of the scope of the present inventions. Moreover, this Summary of the Inventions is not intended to be limiting of the inventions and should not be interpreted in that manner. While certain embodiments have been described and/or outlined in this Summary of the Inventions, it should be understood that the present inventions are not limited to such embodiments, description and/or outline, nor are the claims limited in such a manner. Indeed, many others embodiments, which may be different from and/or similar to, the embodiments presented in this Summary, will be apparent from the description, illustrations and claims, which follow. In addition, although various features, attributes and advantages have been described in this Summary of the Inventions and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

FIG. 1A is a block diagram representation of a mechanical structure disposed on a substrate and encapsulated via at least a second substrate;

FIG. 1B is a block diagram representation of a mechanical structure and circuitry, each disposed on one or more substrates and encapsulated via a substrate;

FIG. 2 illustrates a top view of a portion of a mechanical structure of a conventional resonator, including moveable electrode, fixed electrode, and a contact;

FIG. 3 is a cross-sectional view (sectioned along dotted line A-A' of FIG. 2) of a portion of the moveable electrode, fixed electrode, and the contact of FIG. 2 of an exemplary embodiment of the present inventions wherein the first substrate employs an SOI wafer;

FIGS. 4A-4G illustrate cross-sectional views (sectioned along dotted line A-A' of FIG. 2) of the fabrication of the mechanical structure of FIGS. 2 and 3 at various stages of an exemplary process that employs an encapsulation technique according to certain aspects of the present inventions;

FIGS. 6A-6D illustrate cross-sectional views of the fabrication of the portion of the microelectromechanical system of FIG. 5 at various stages of an exemplary process that employs an encapsulation technique according to certain aspects of the present inventions;

FIGS. 7A-7C, and 8A and 8B illustrate cross-sectional views of two exemplary embodiments of the fabrication of the portion of the microelectromechanical system of FIG. 5 using processing techniques wherein electronic or electrical circuitry (at various stages of completeness) is formed in the second substrate prior to encapsulating the mechanical structure via securing the second substrate to the first substrate;

Figure 11:
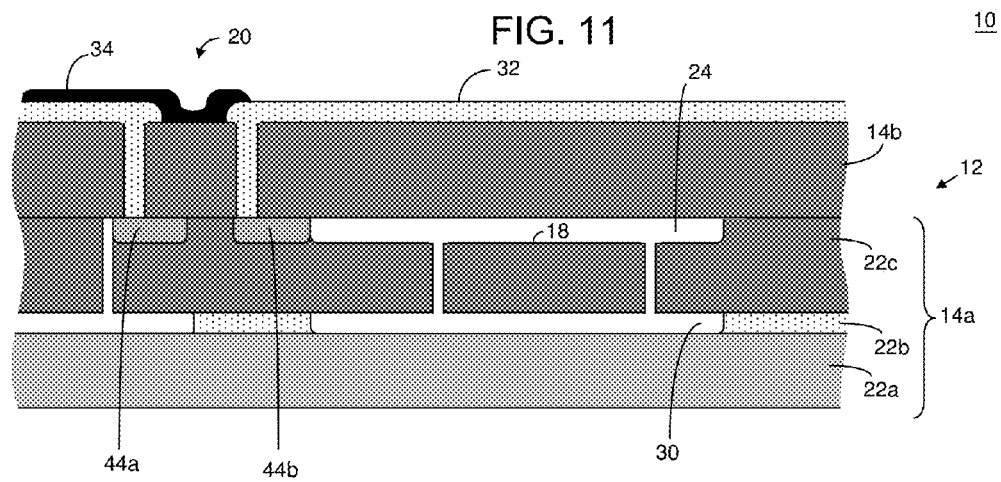
Figure 12A:
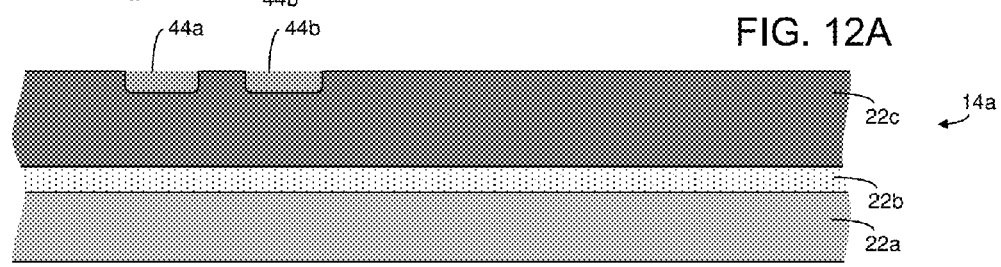
Figure 12B:
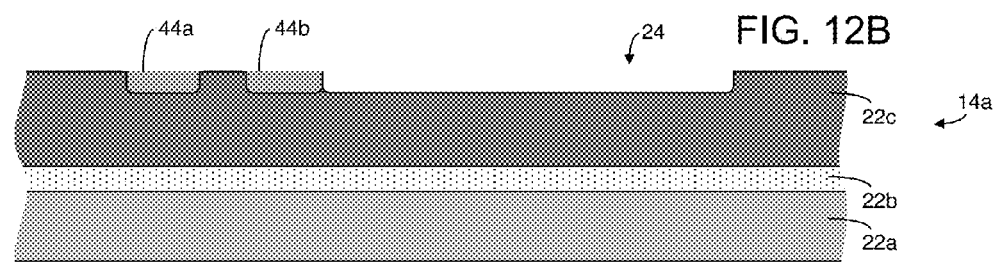
Figure 12C:
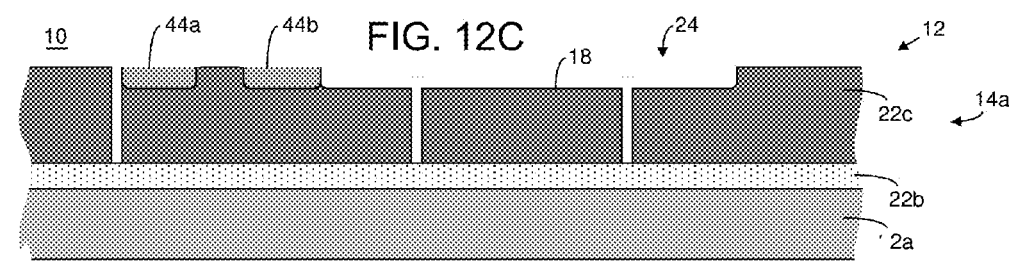
Figure 12D:
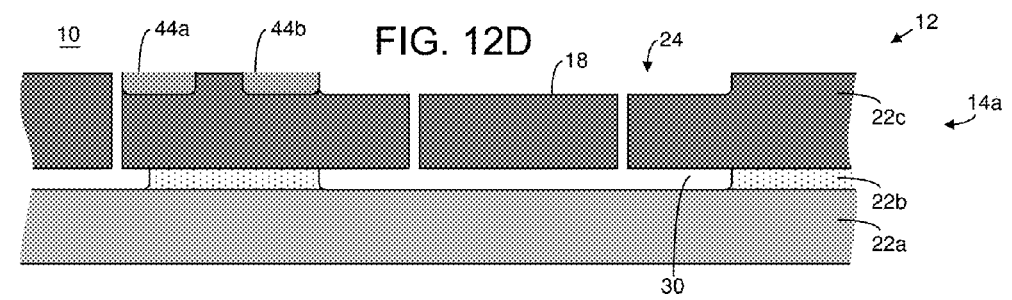
Figure 12E:
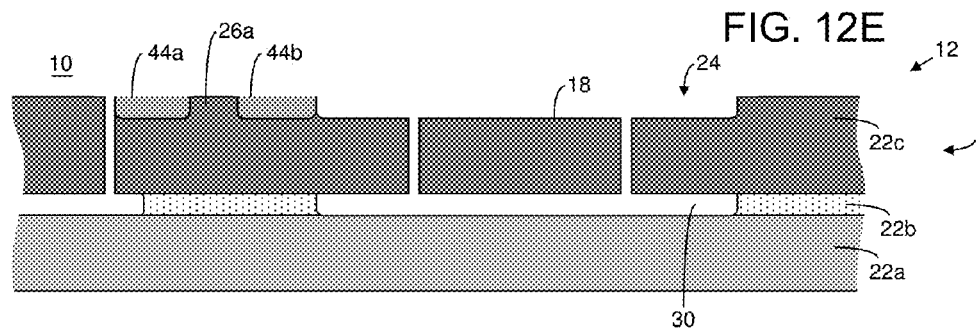
Figure 12F:
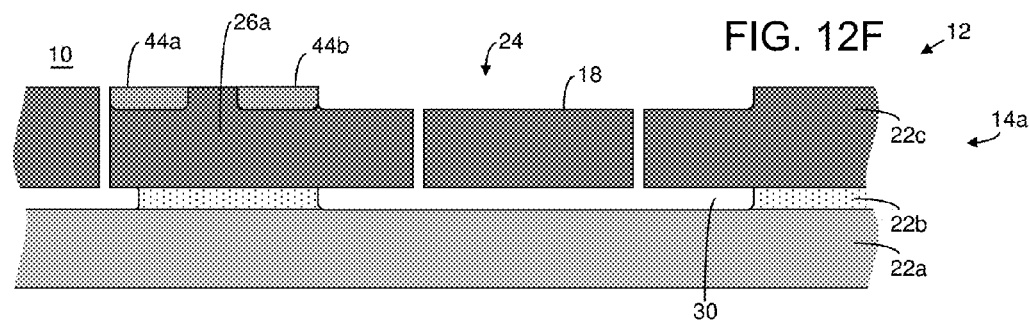
Figure 12G:
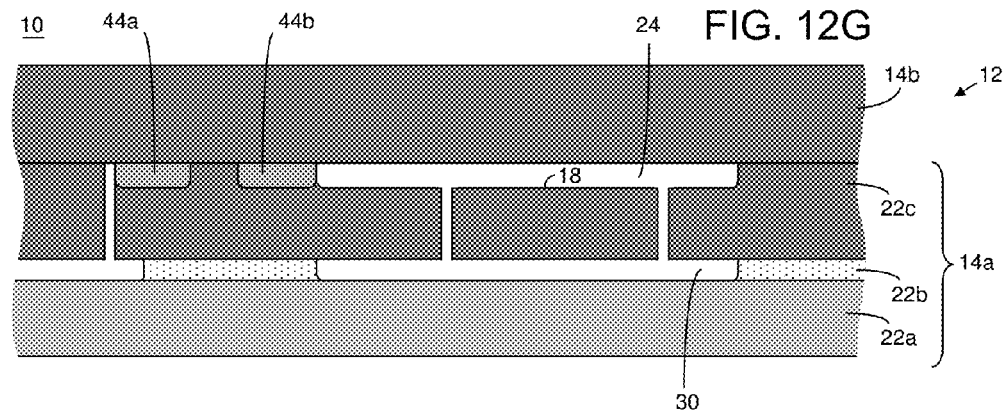
Figure 12H:
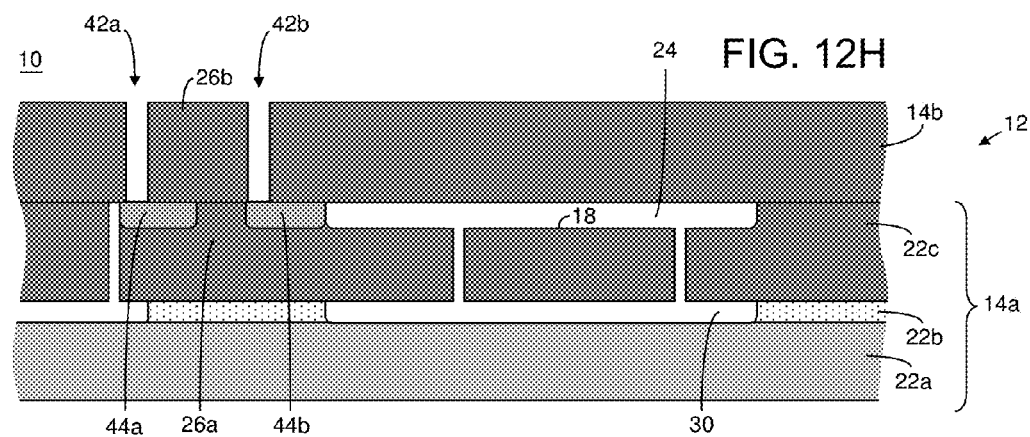
Figure 12I:
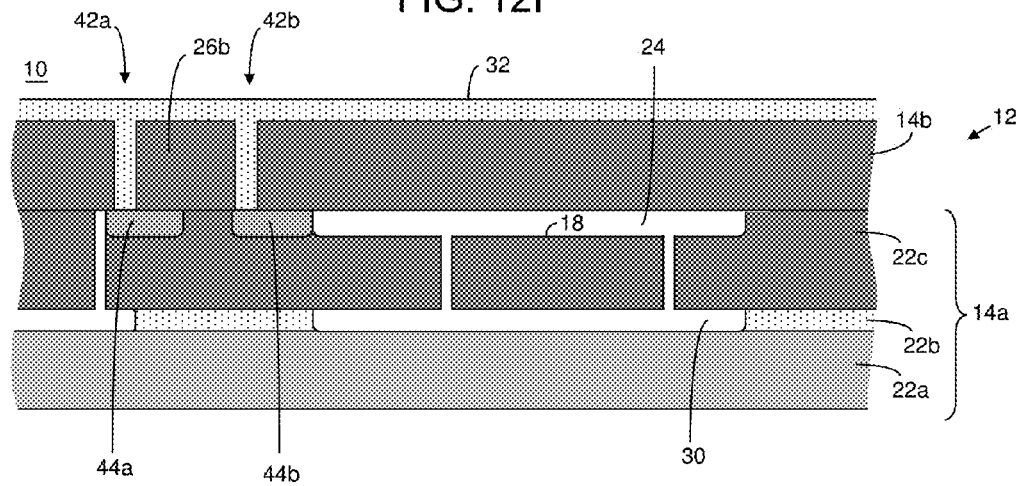
Figure 12J:
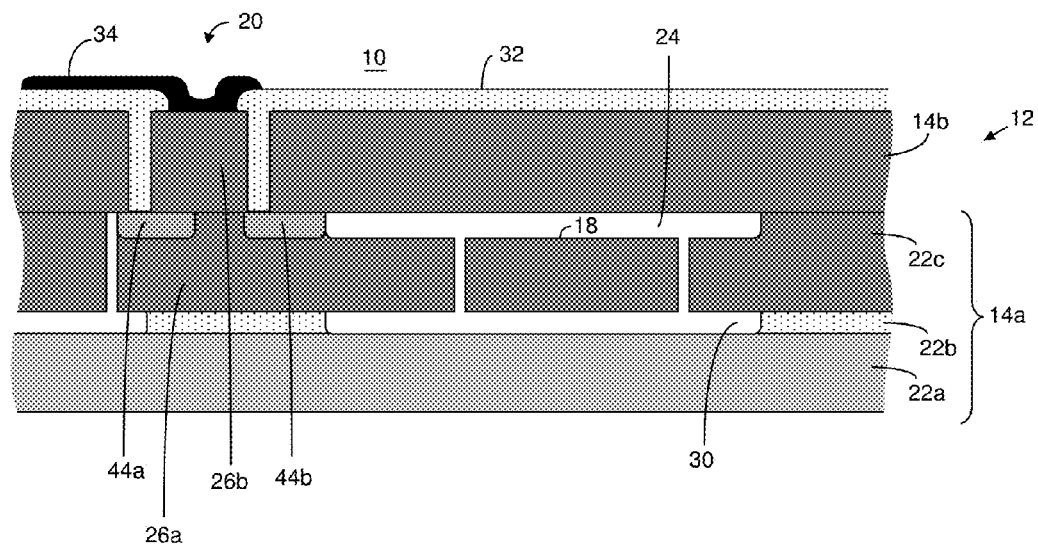
Figure 13A:
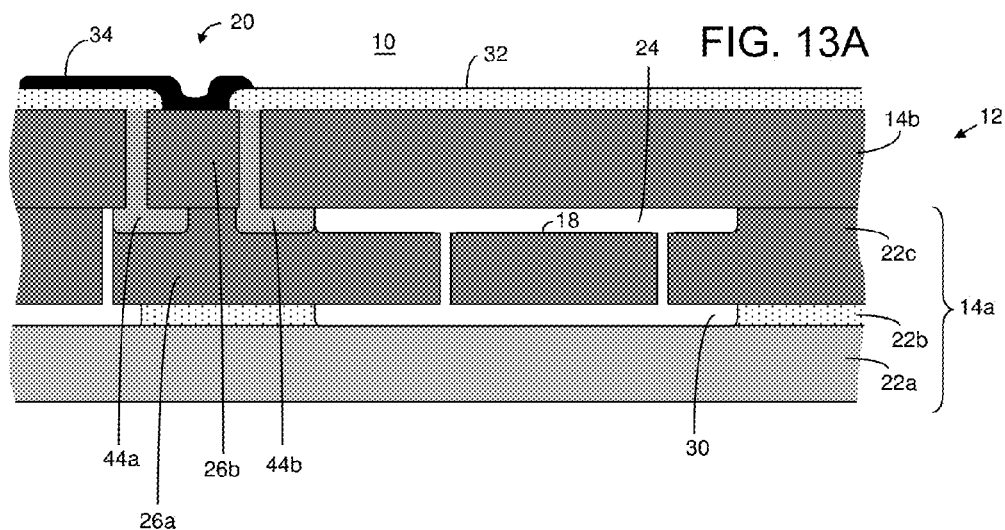
Figure 13B:
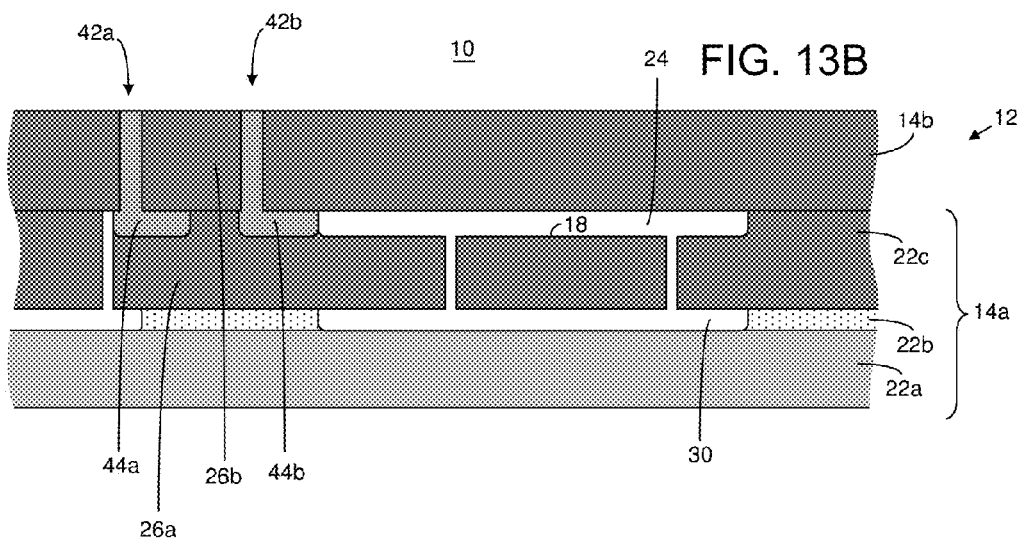
Figure 13C:
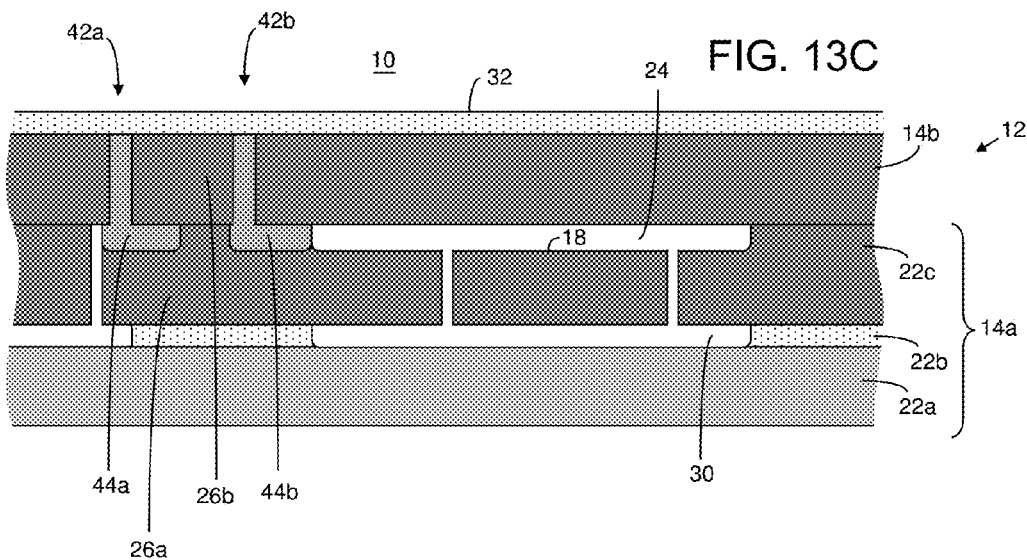
Figure 14:
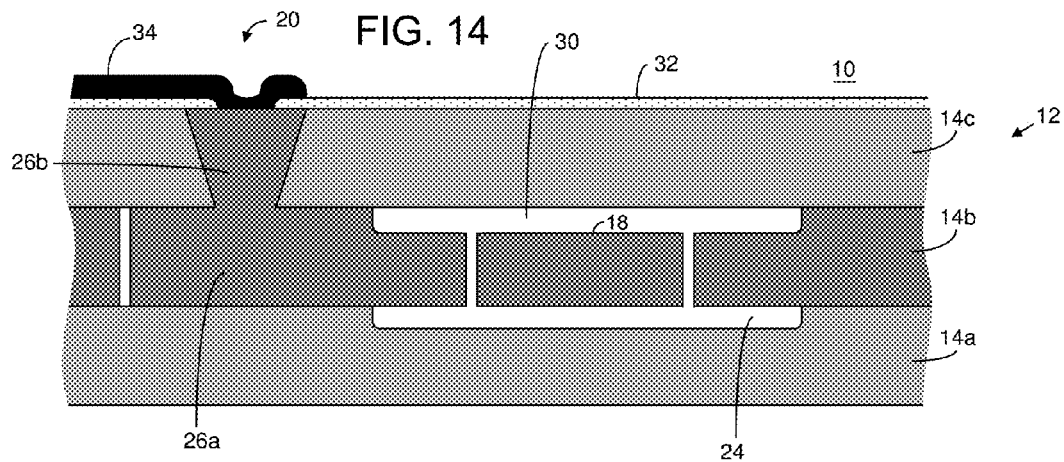
Figure 16:
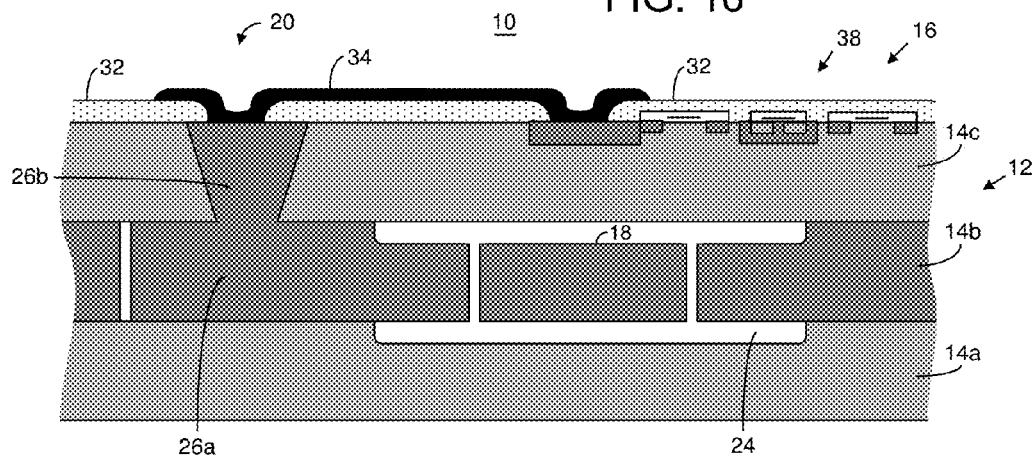
Figure 17:
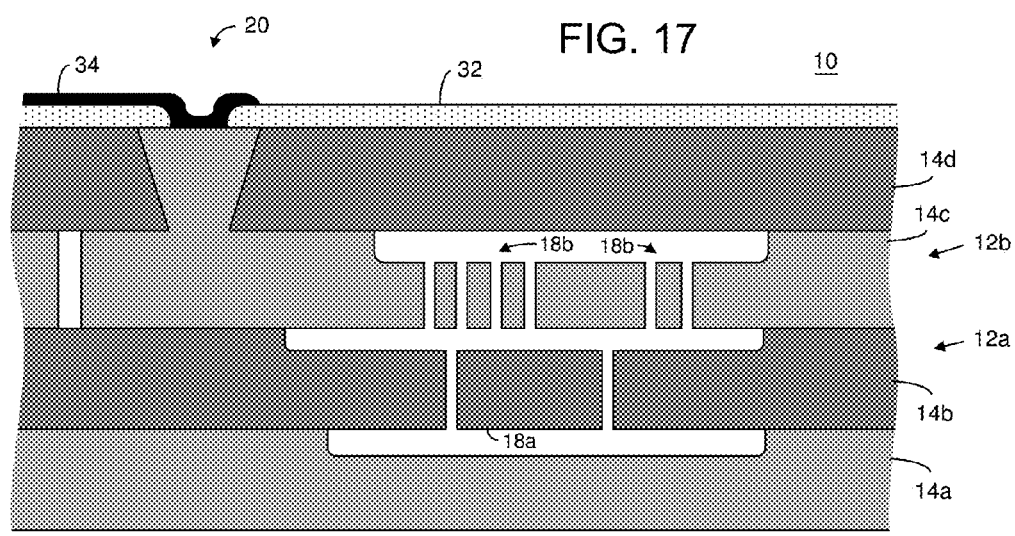
Figure 18:
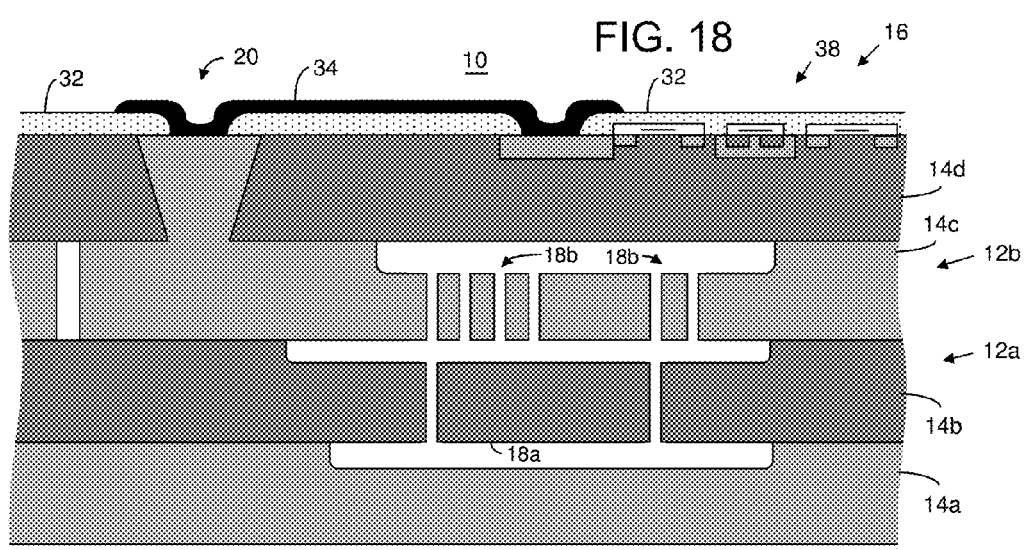
Figure 19:
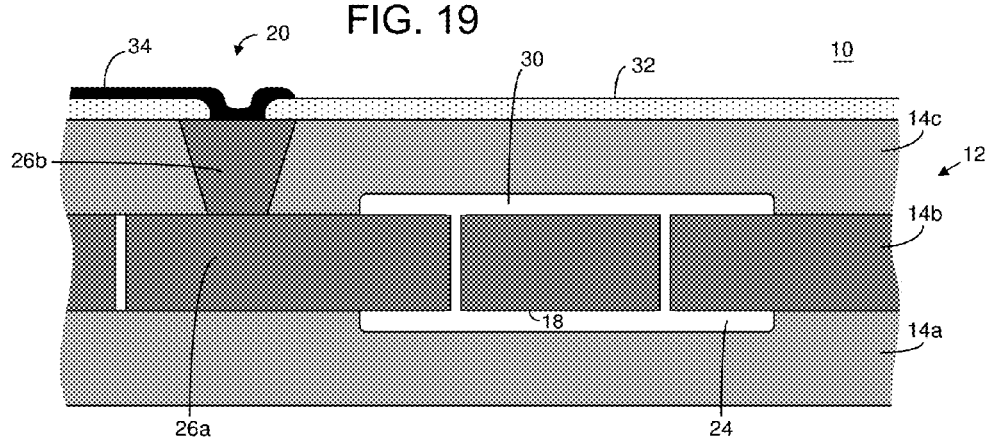
Figure 20A:
Figure 20B:
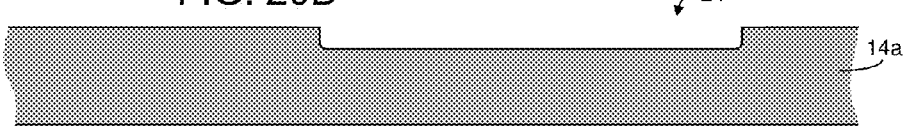
Figure 20C:
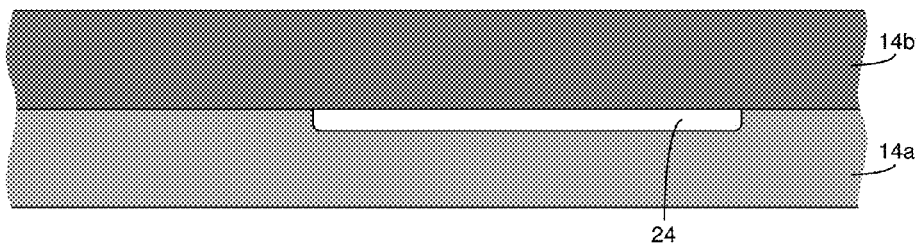
Figure 20D:
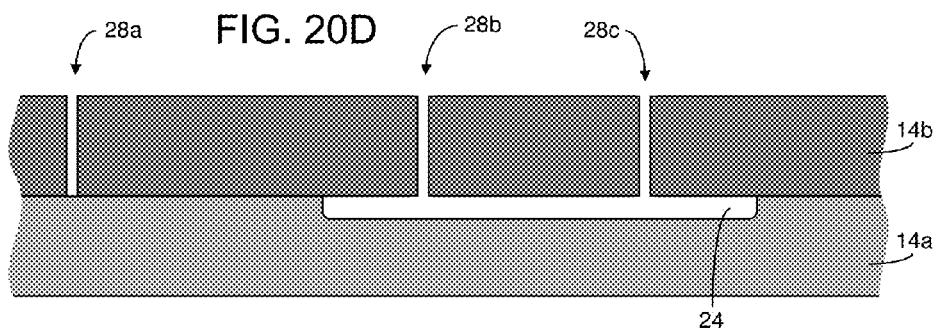
Figure 20E:
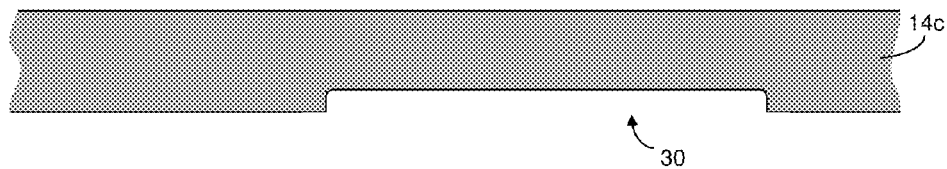
Figure 20F:
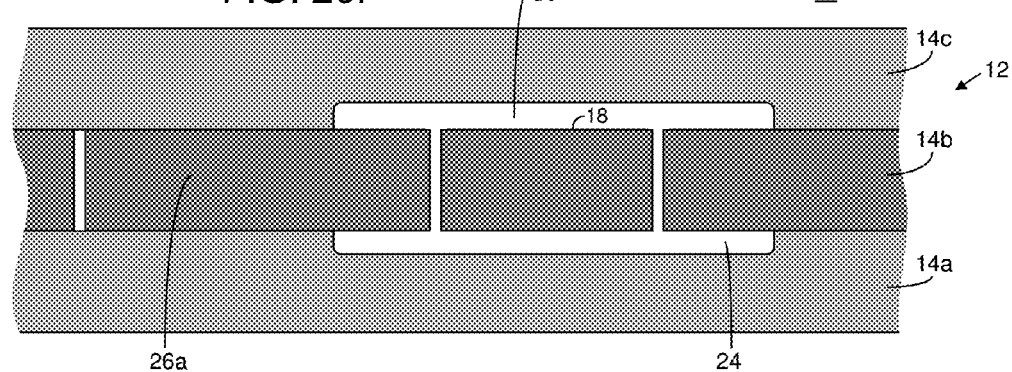
Figure 20G:
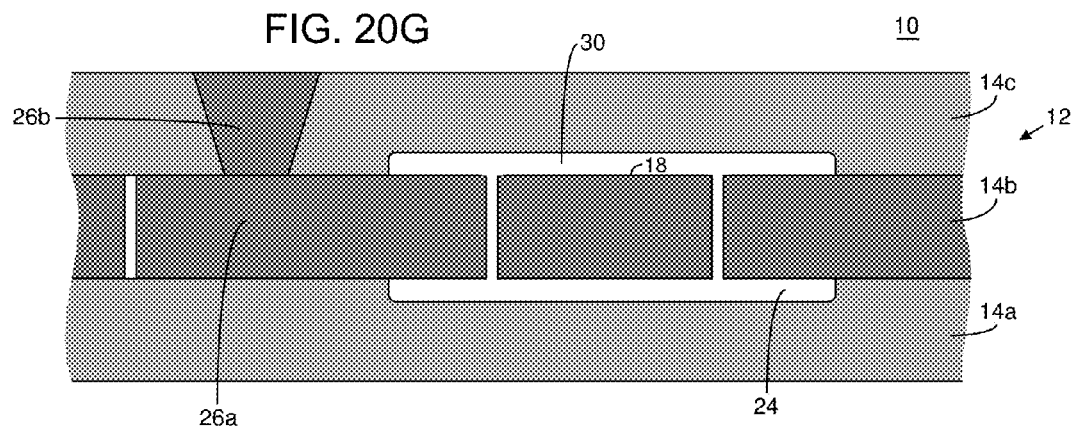
Figure 20H:
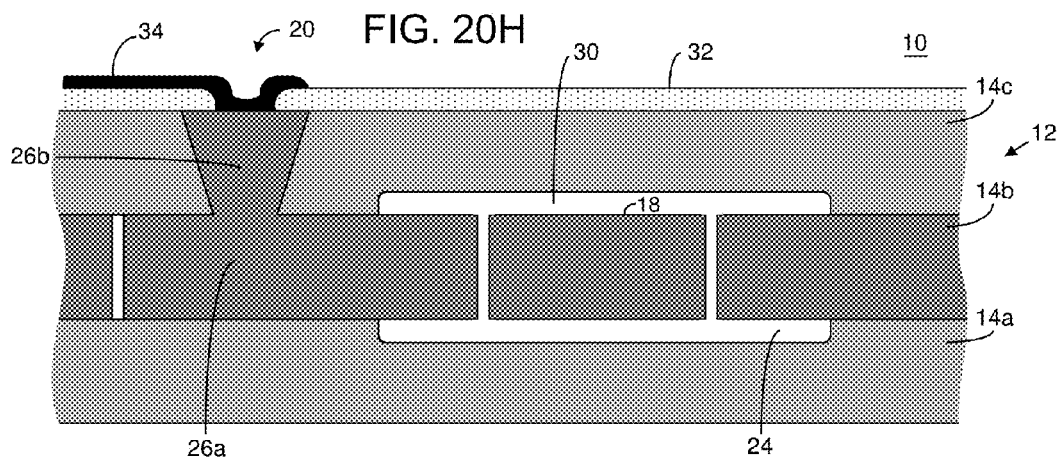
Figure 21:
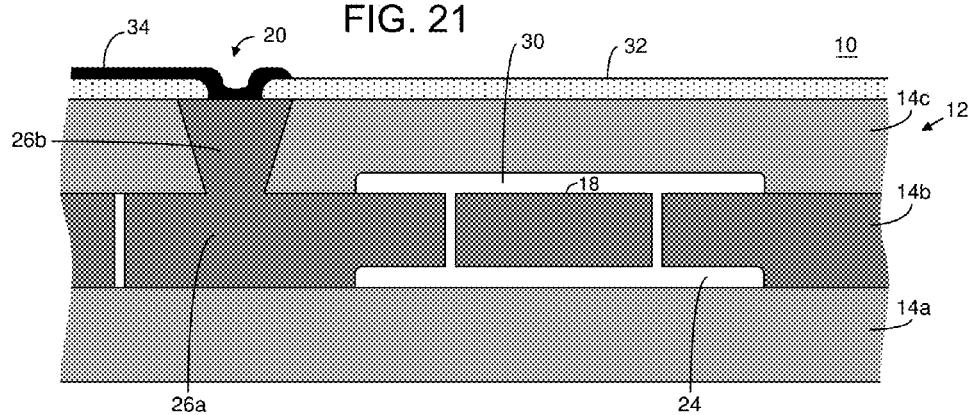
Figure 22:
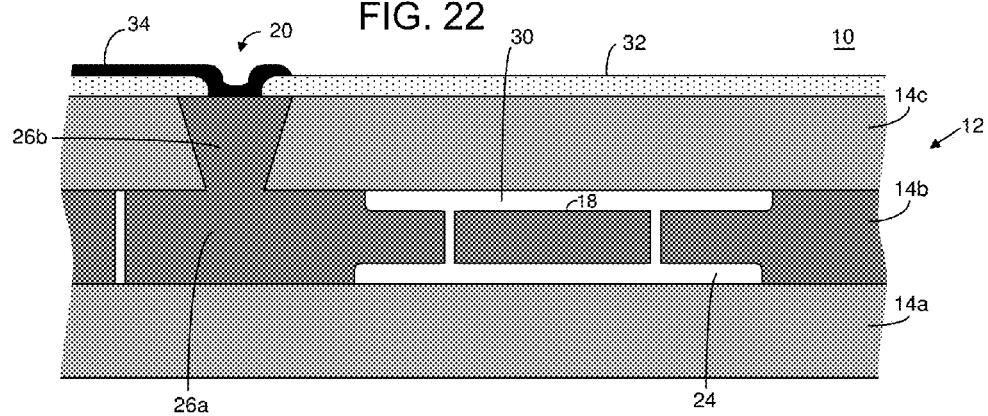
Figure 23:
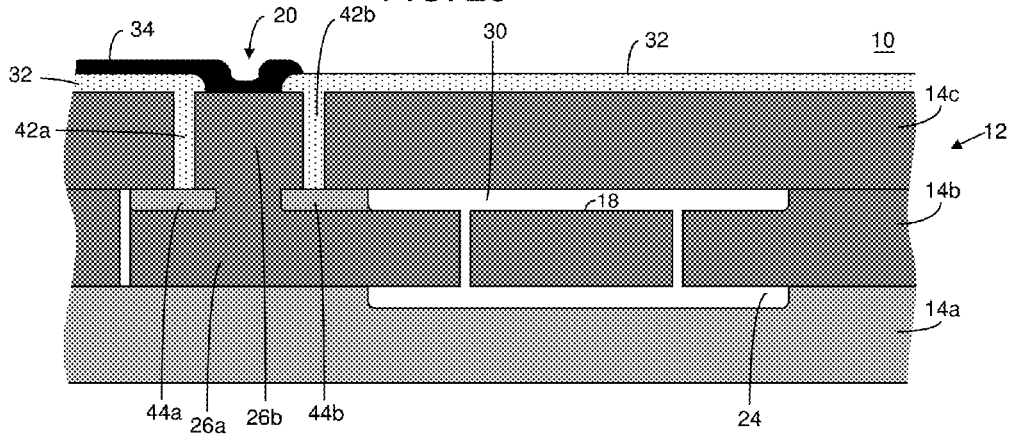
Figure 24A:
Figure 24B:
Figure 24C:
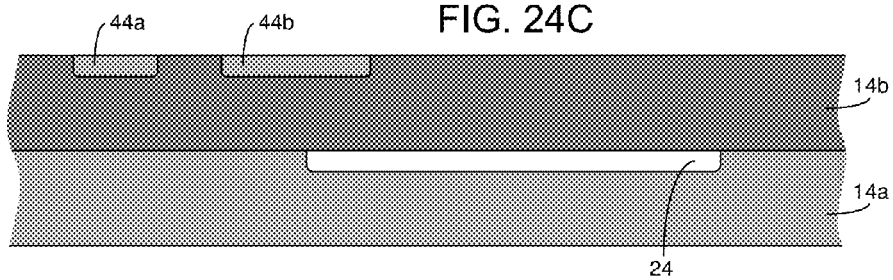
Figure 24D:
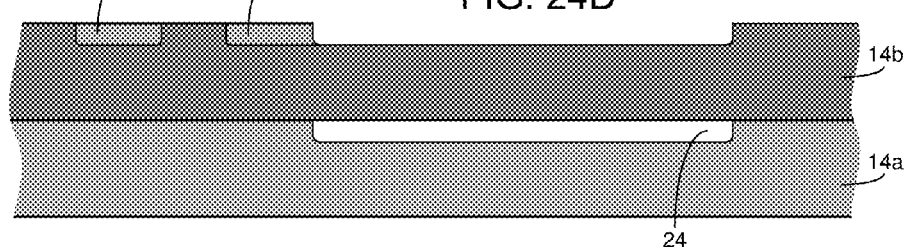
Figure 24E:
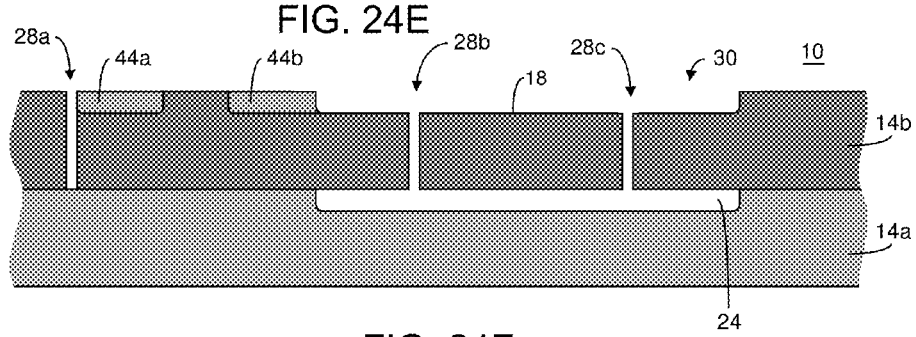
Figure 24F:
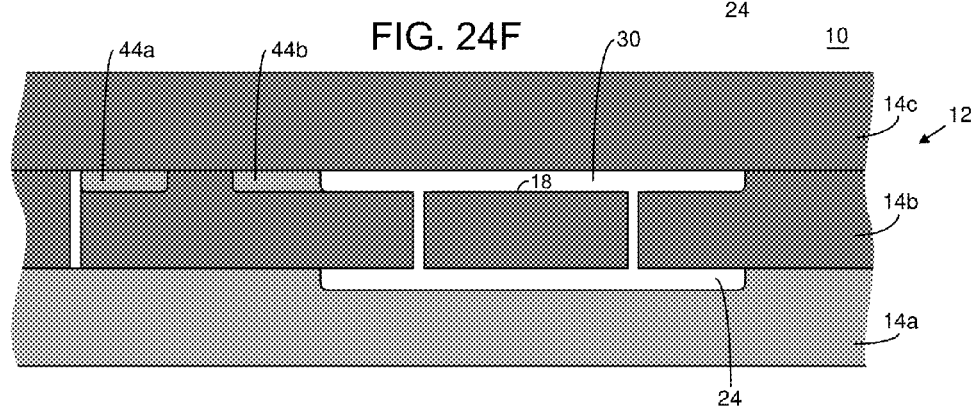
Figure 27:
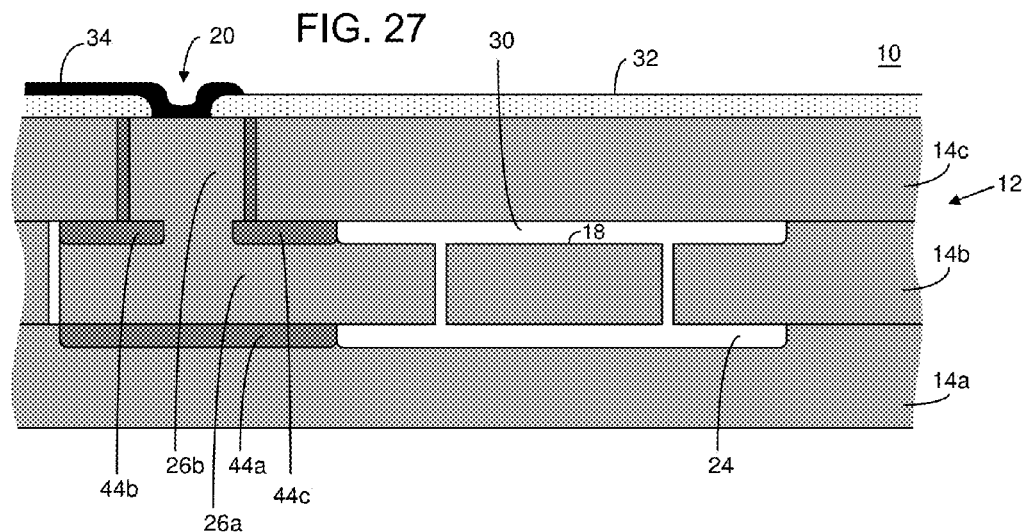
Figure 28A:
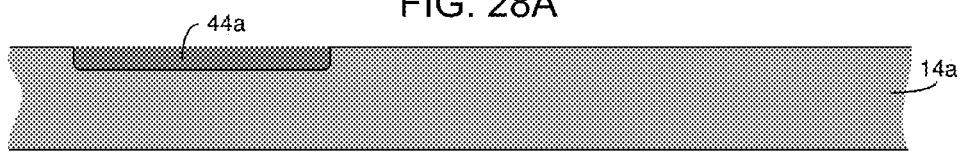
Figure 28B:
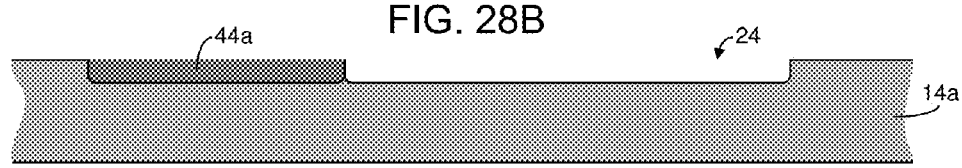
Figure 28C:
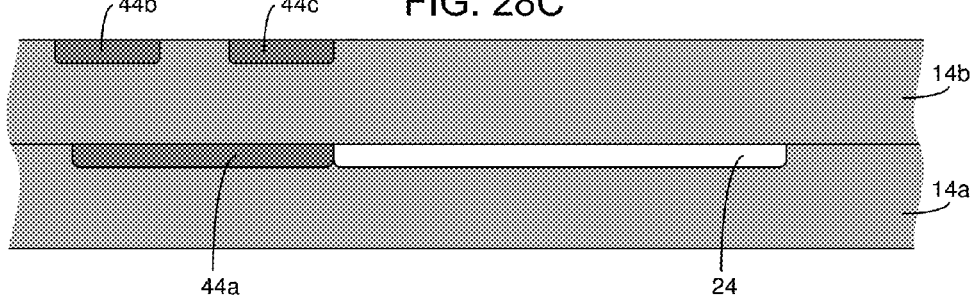
Figure 28D:
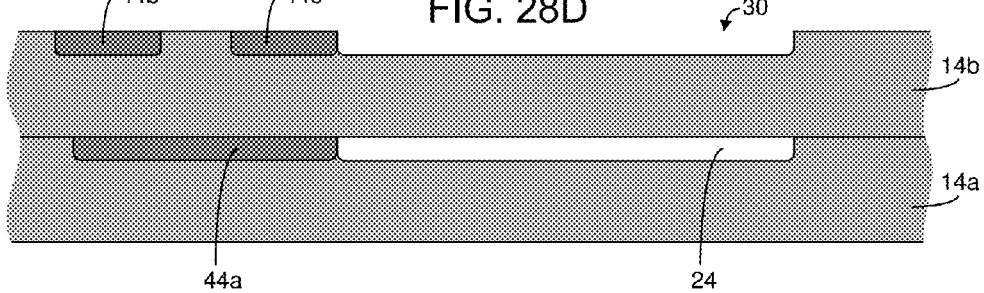
Figure 30A:
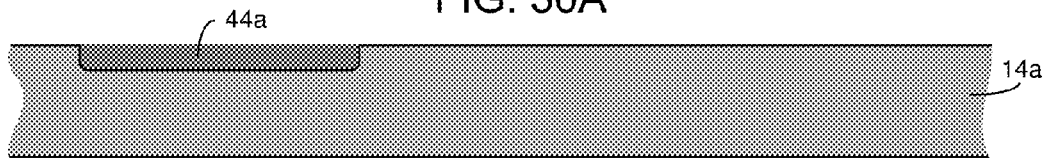
Figure 30B:
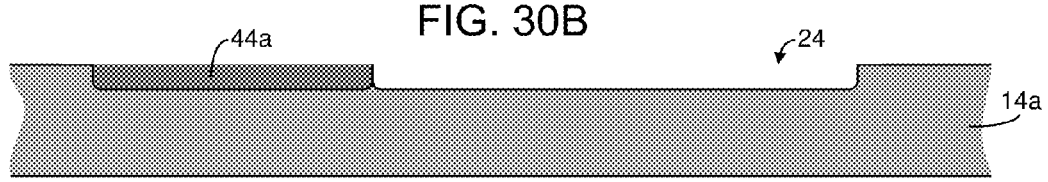
Figure 30C:
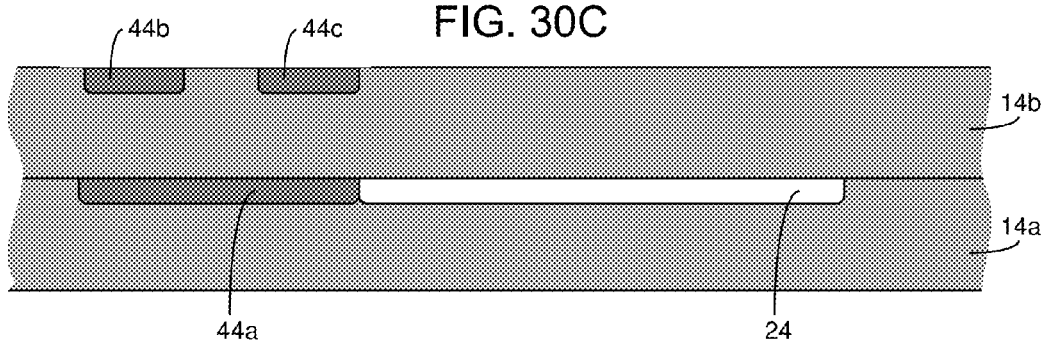
Figure 30D:
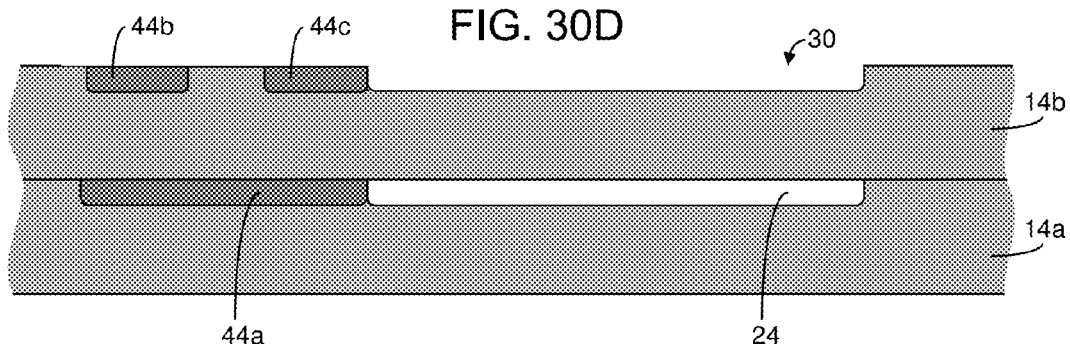
Figure 30E:
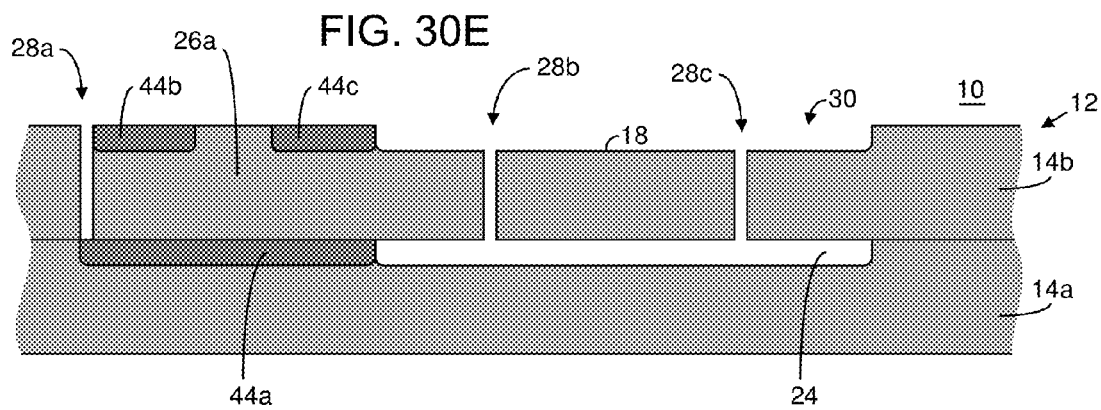
Figure 32:
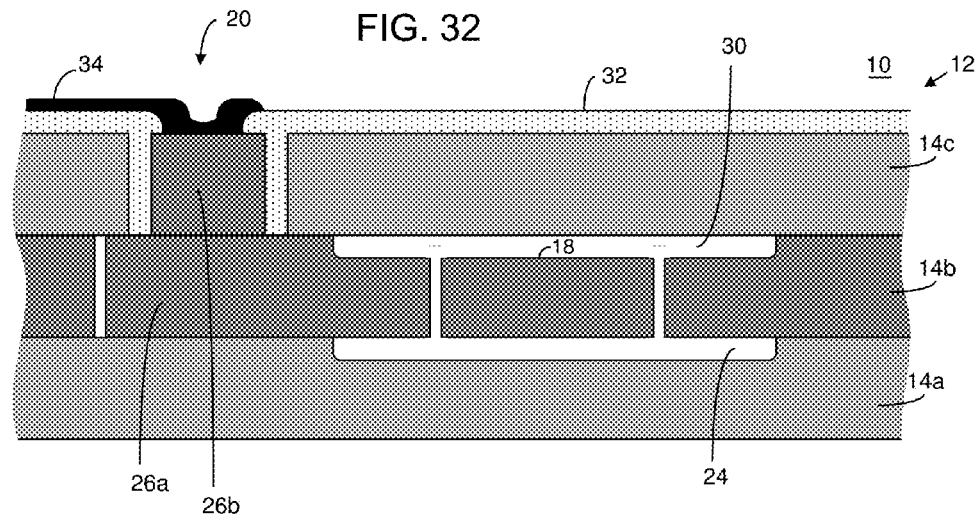
Figure 33A:
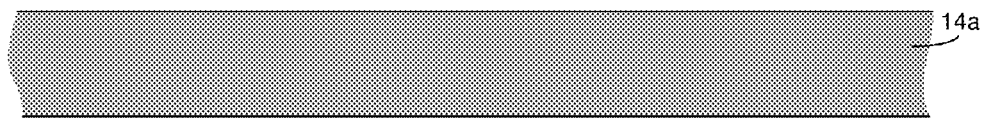
Figure 33B:
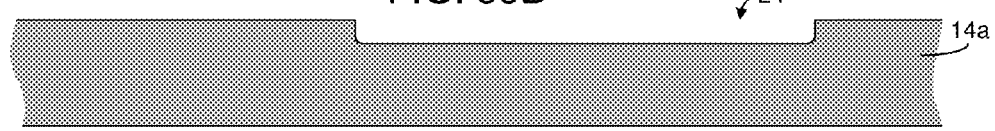
Figure 33C:
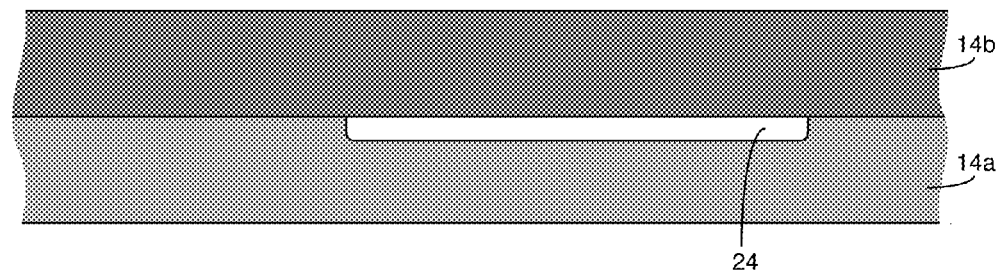
Figure 33D:
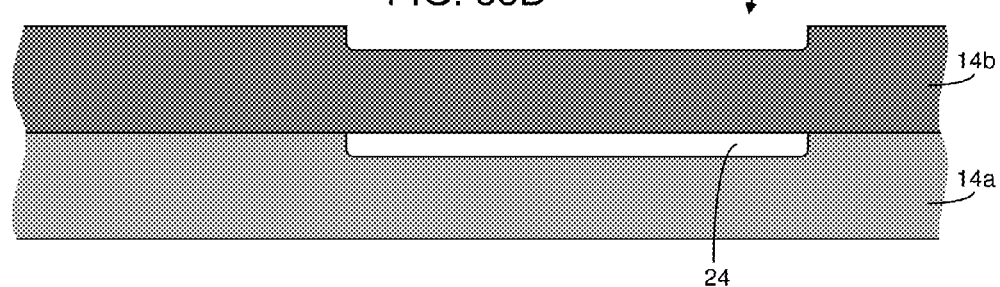
Figure 33E:
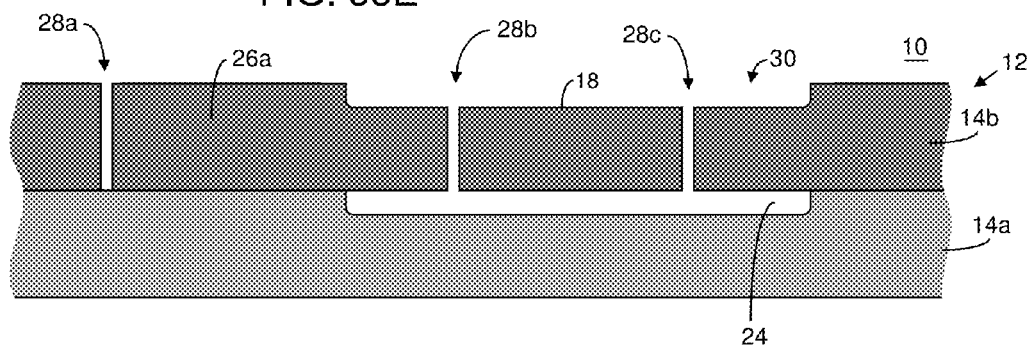
Figure 33F:
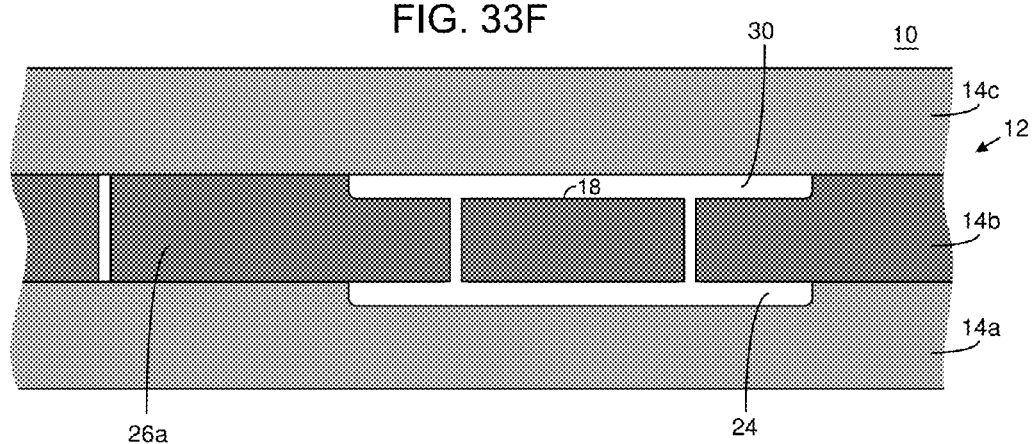
Figure 33G:
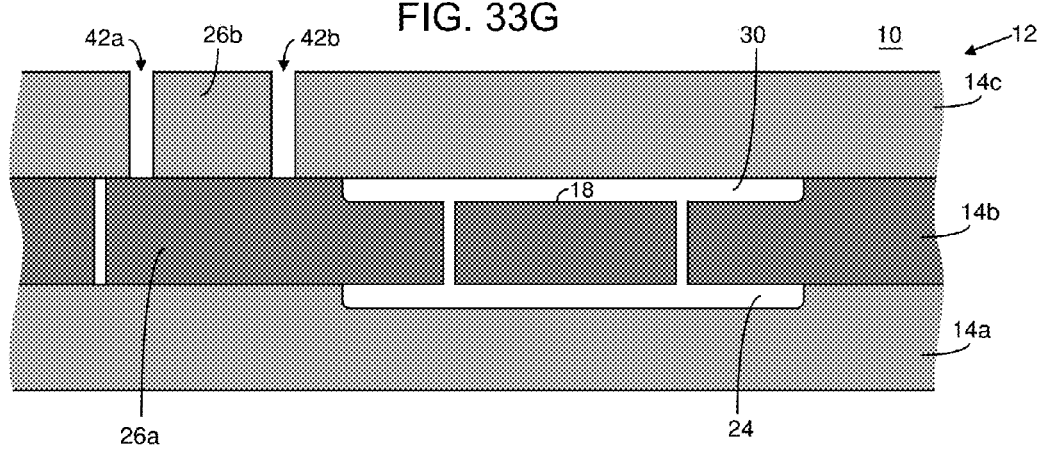
Figure 33H:
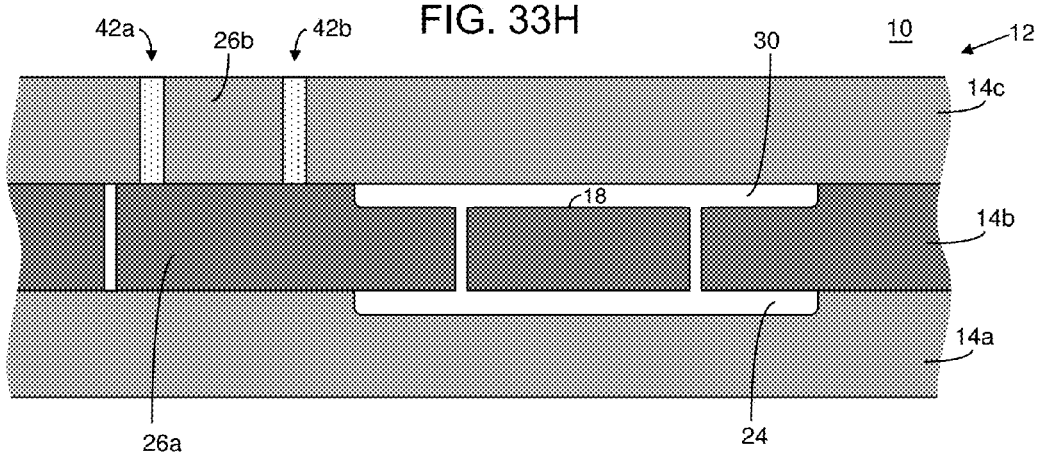
Figure 33I:
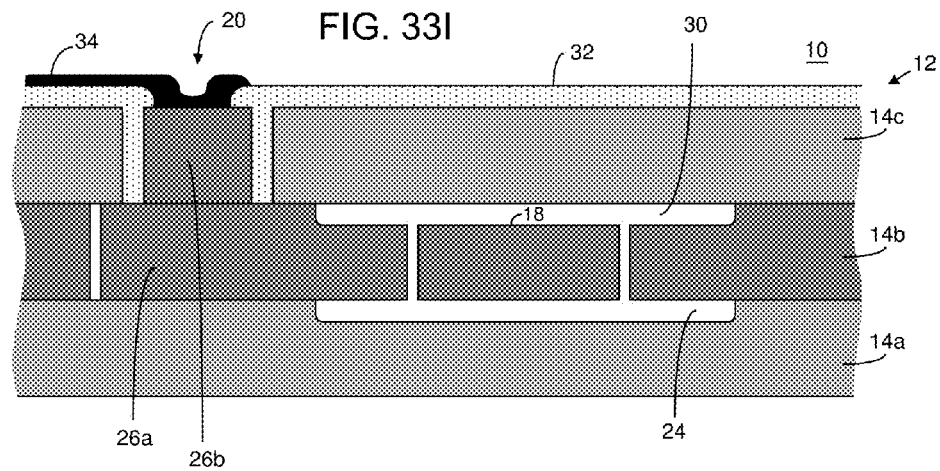
Figure 34:
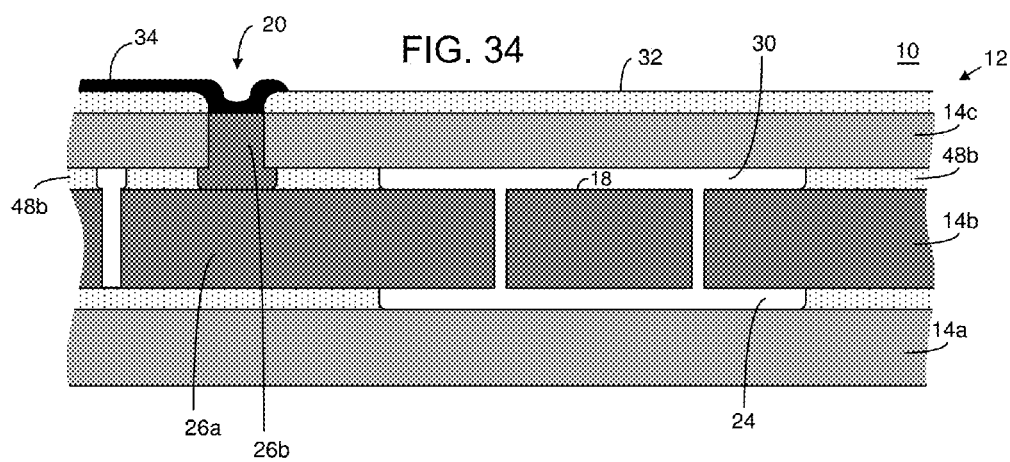
Figure 36:
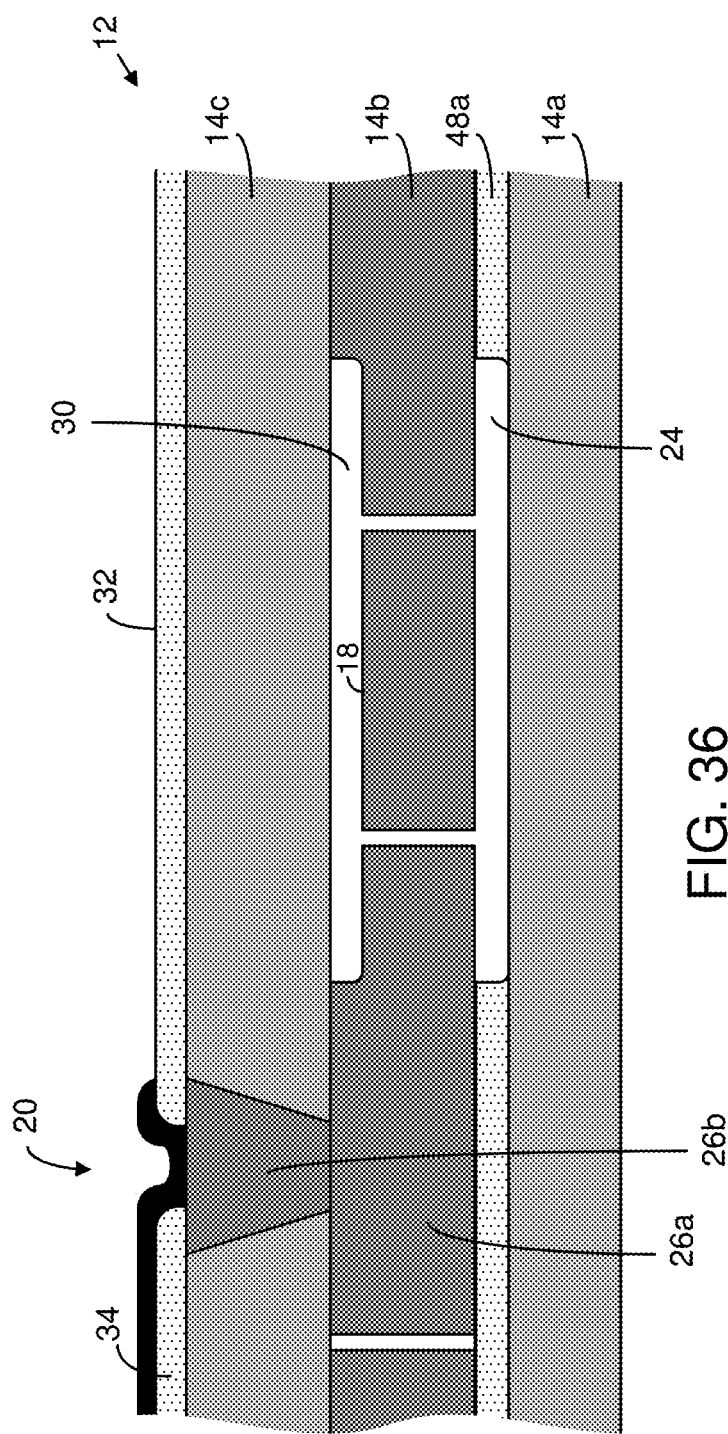
Figure 38:
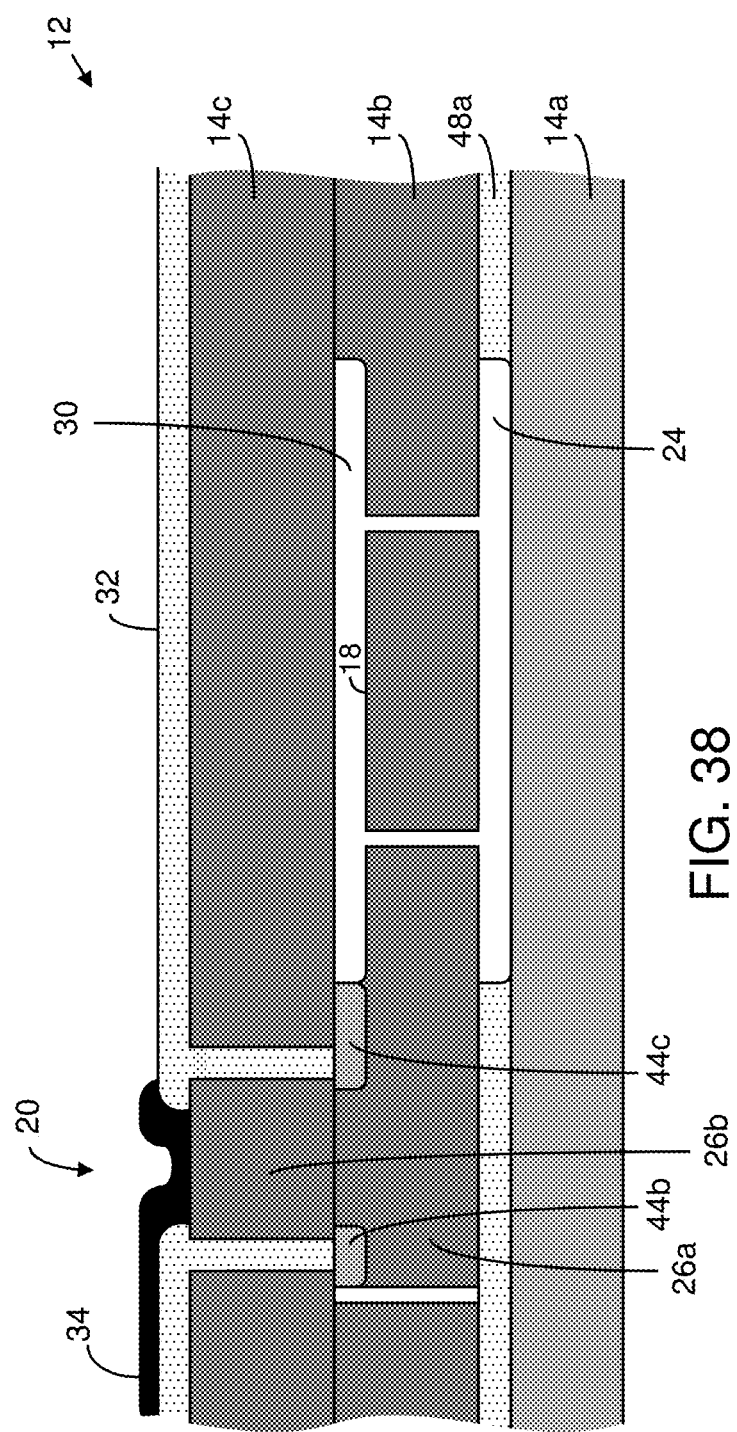
Figure 40:
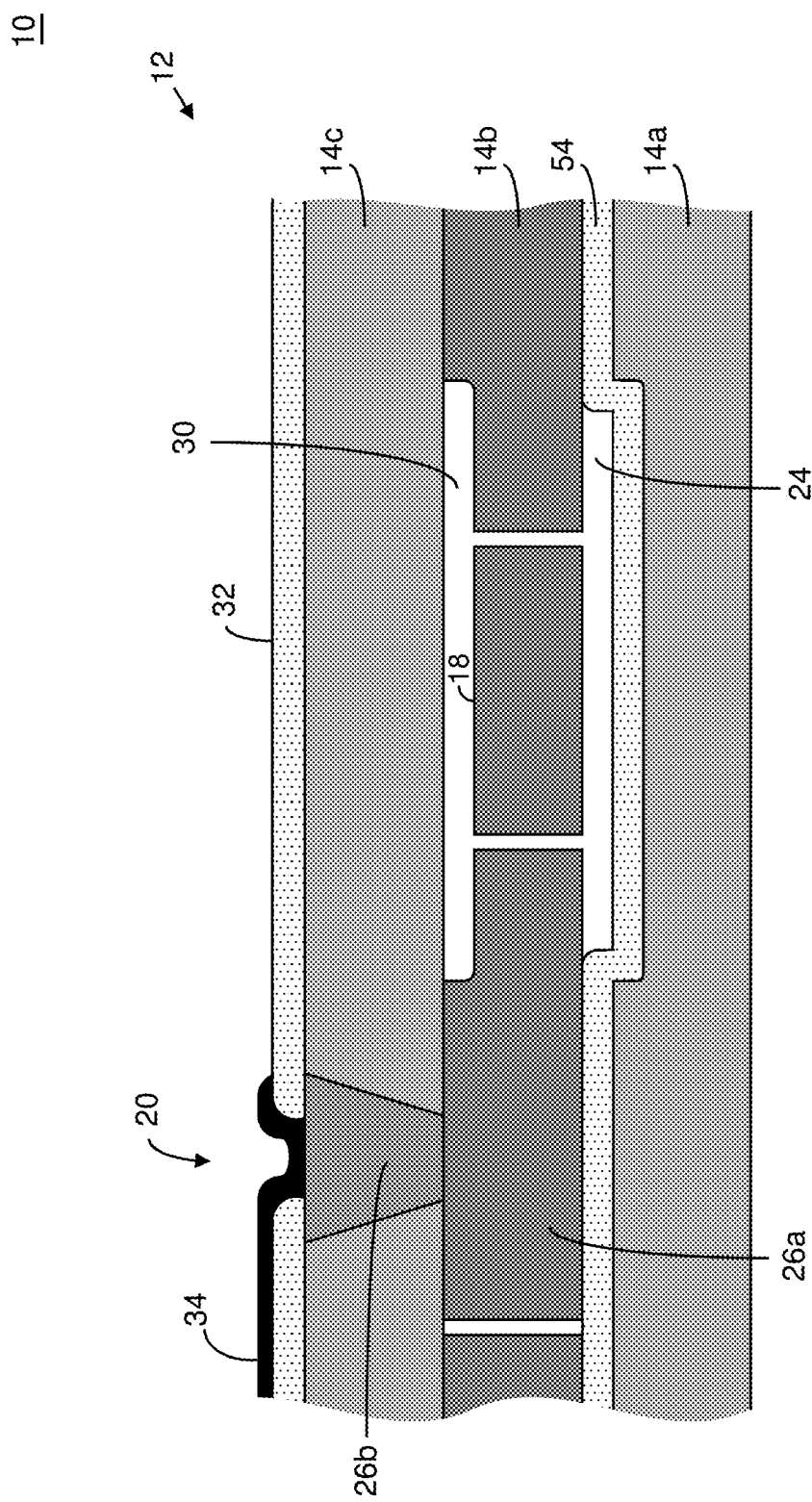
Figure 41A:
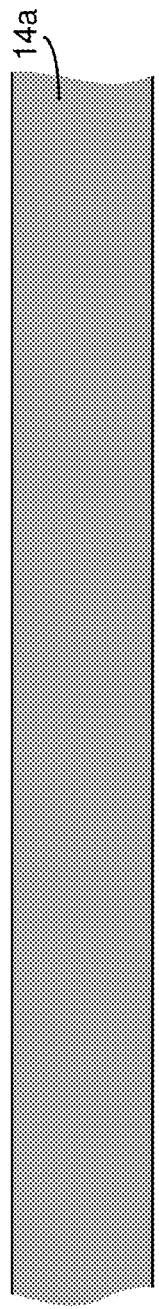
Figure 41B:
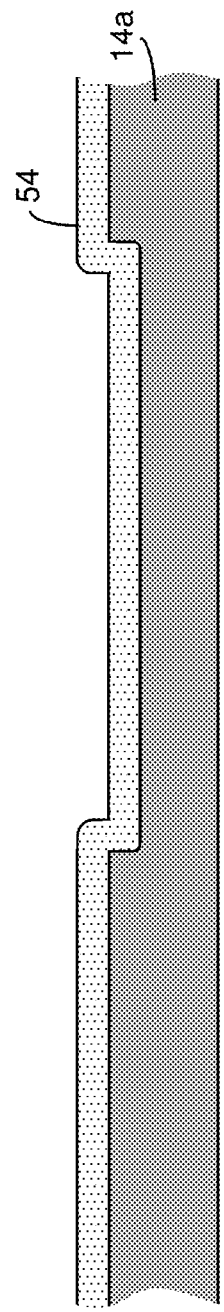
Figure 41C:
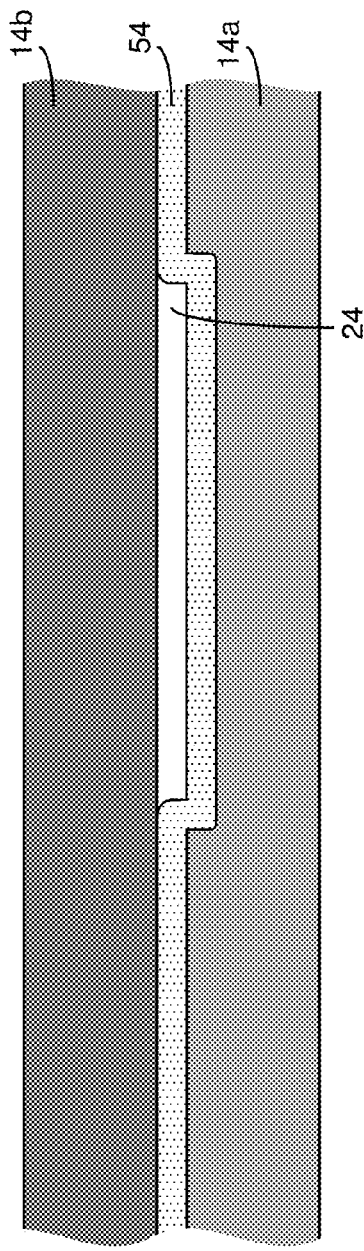
Figure 41D:
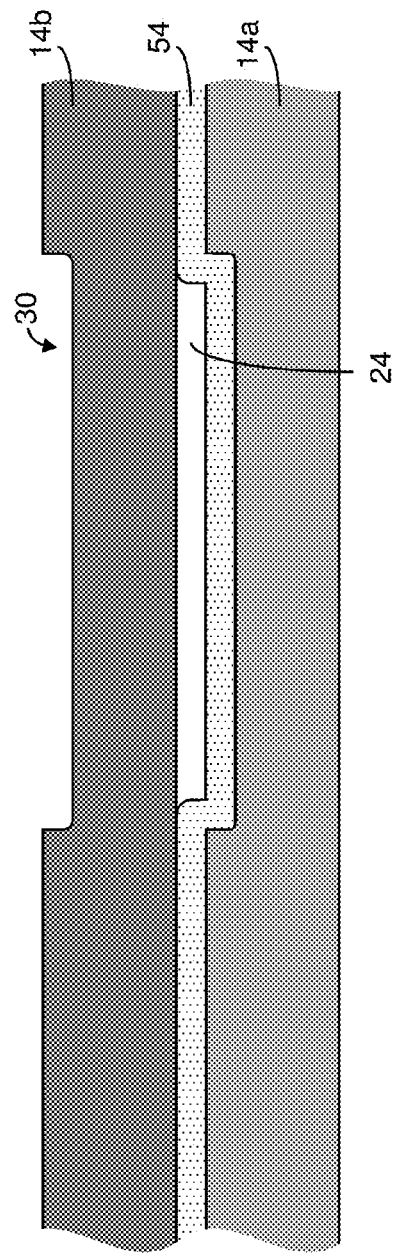
Figure 41G:
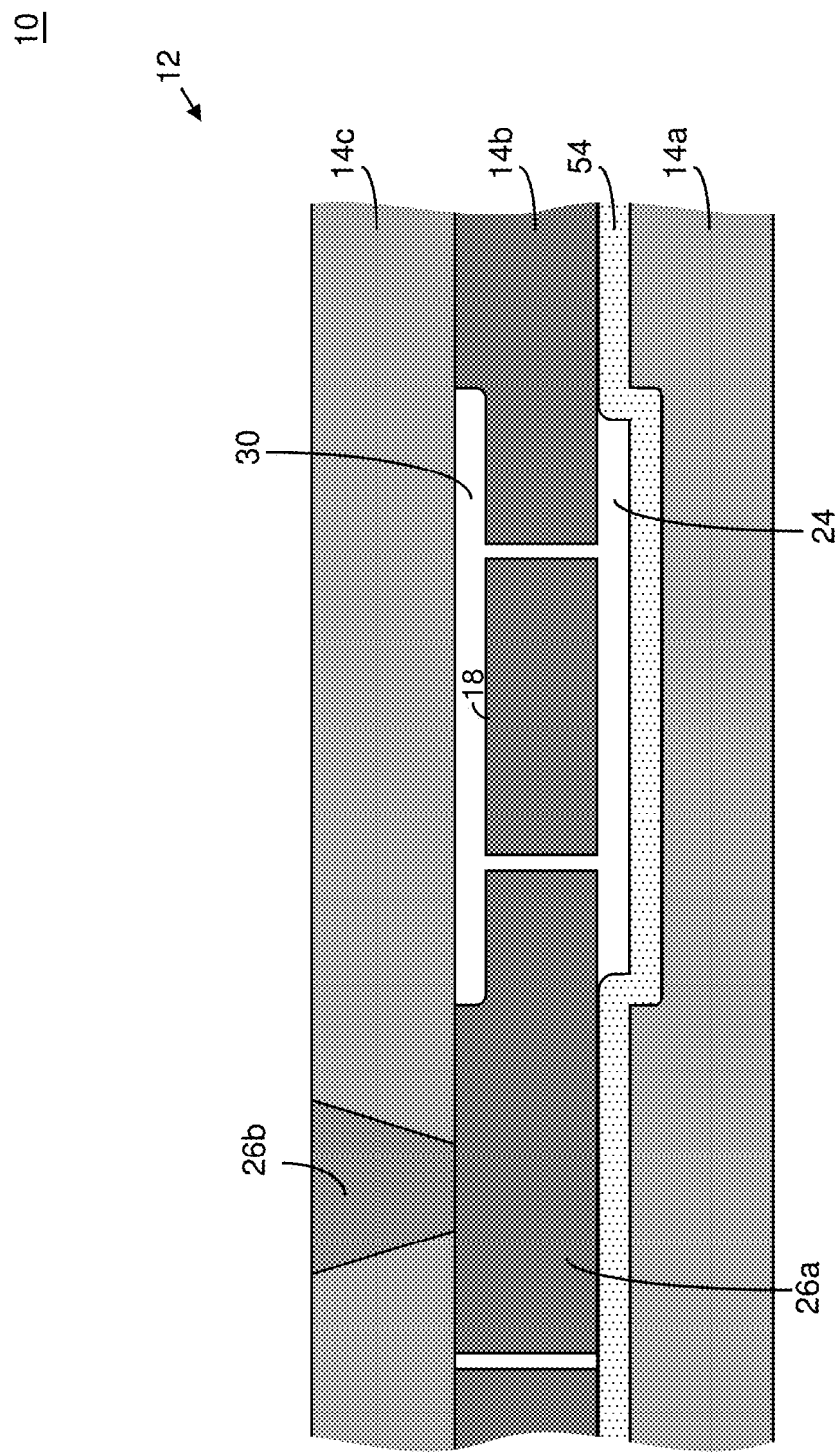
Figure 41H:
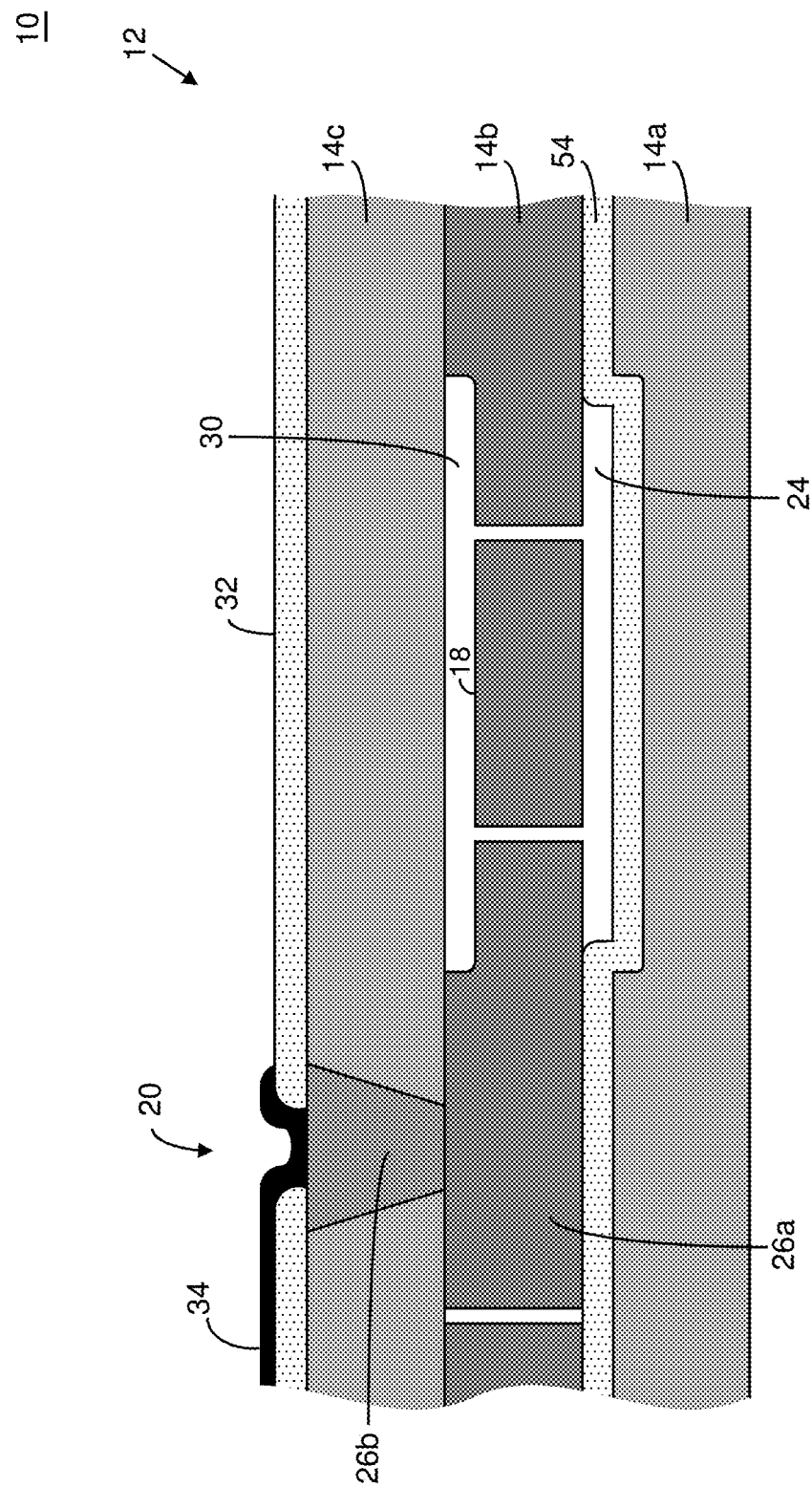
Figure 42A:
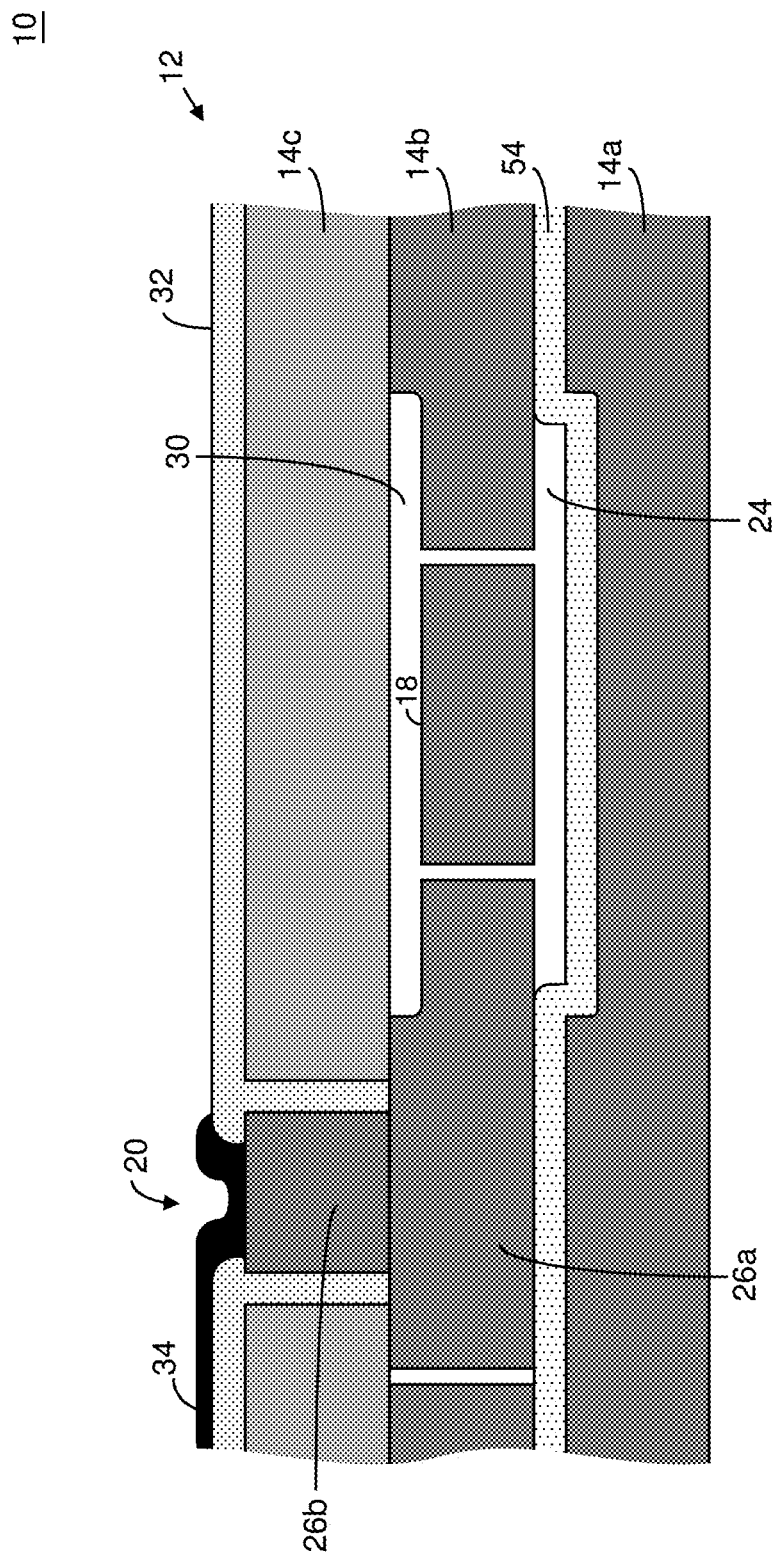
Figure 42B:
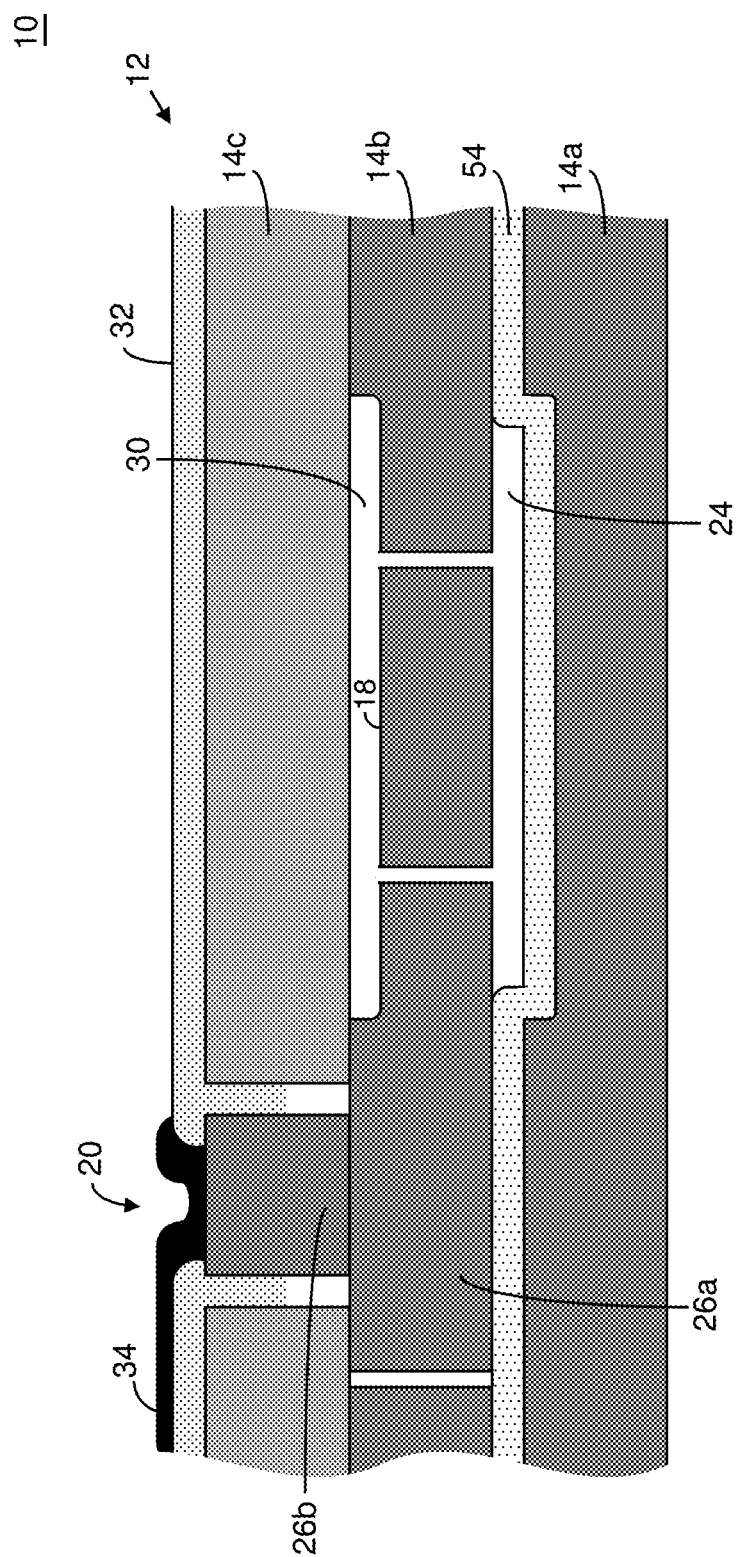
Figure 43A:
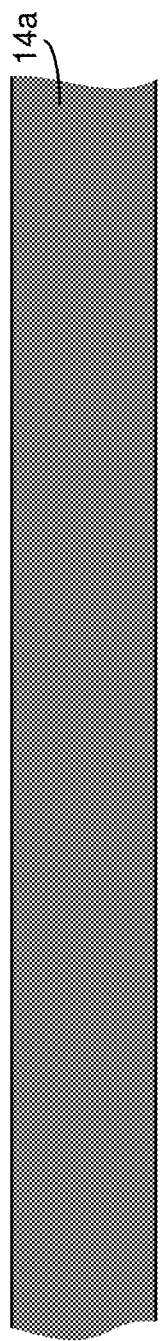
Figure 43B:
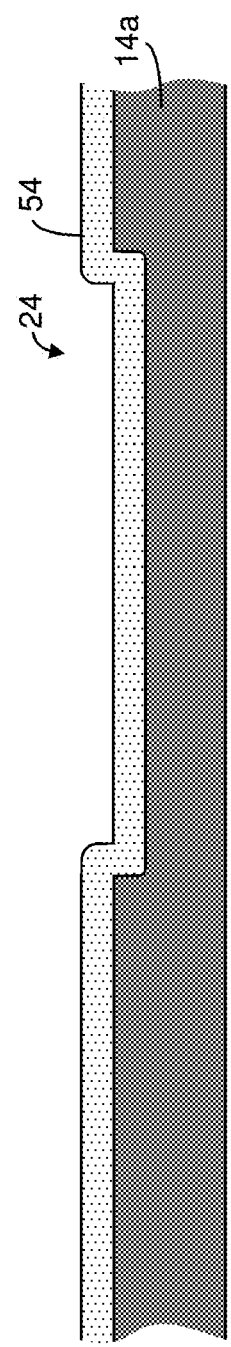
Figure 43C:
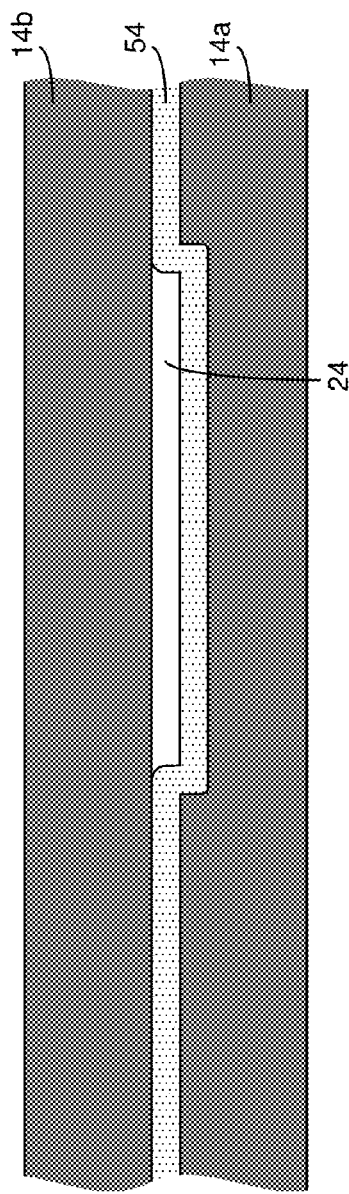
Figure 43D:
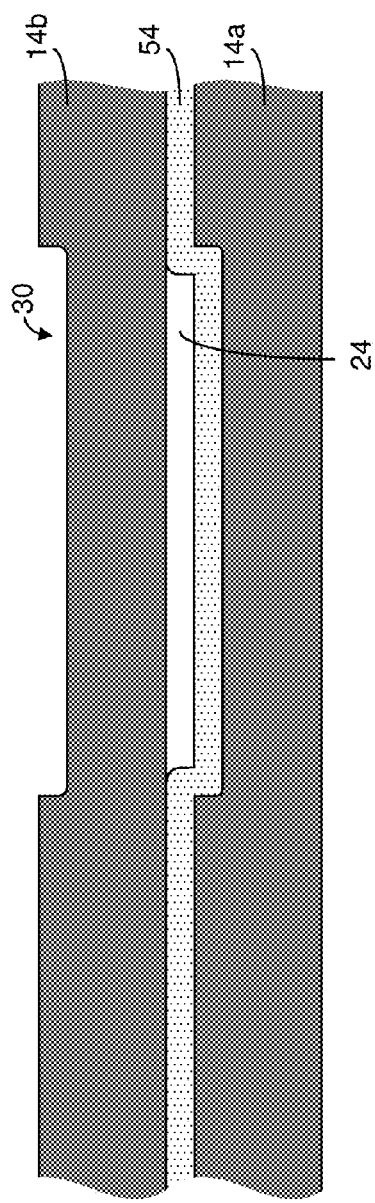
Figure 43G:
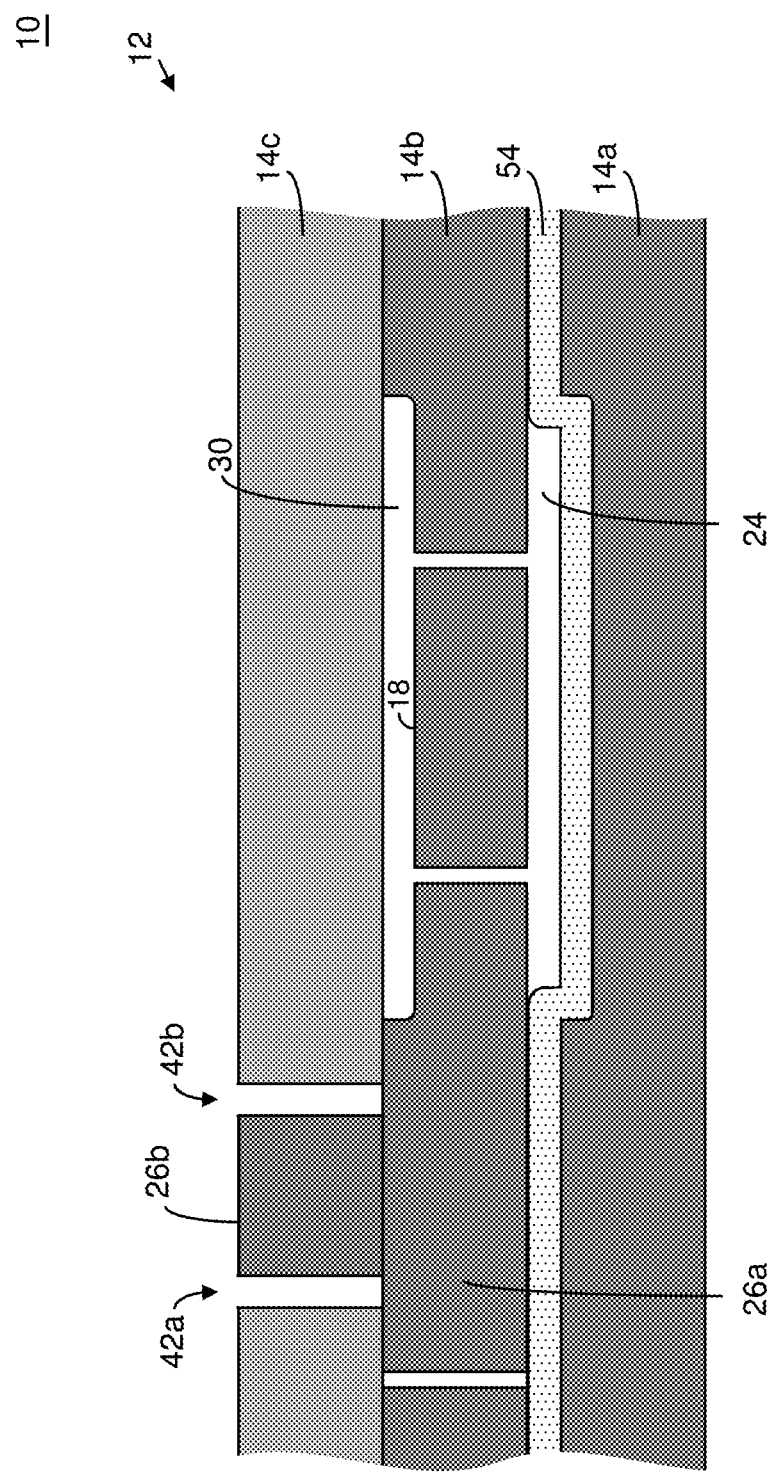
Figure 43H:
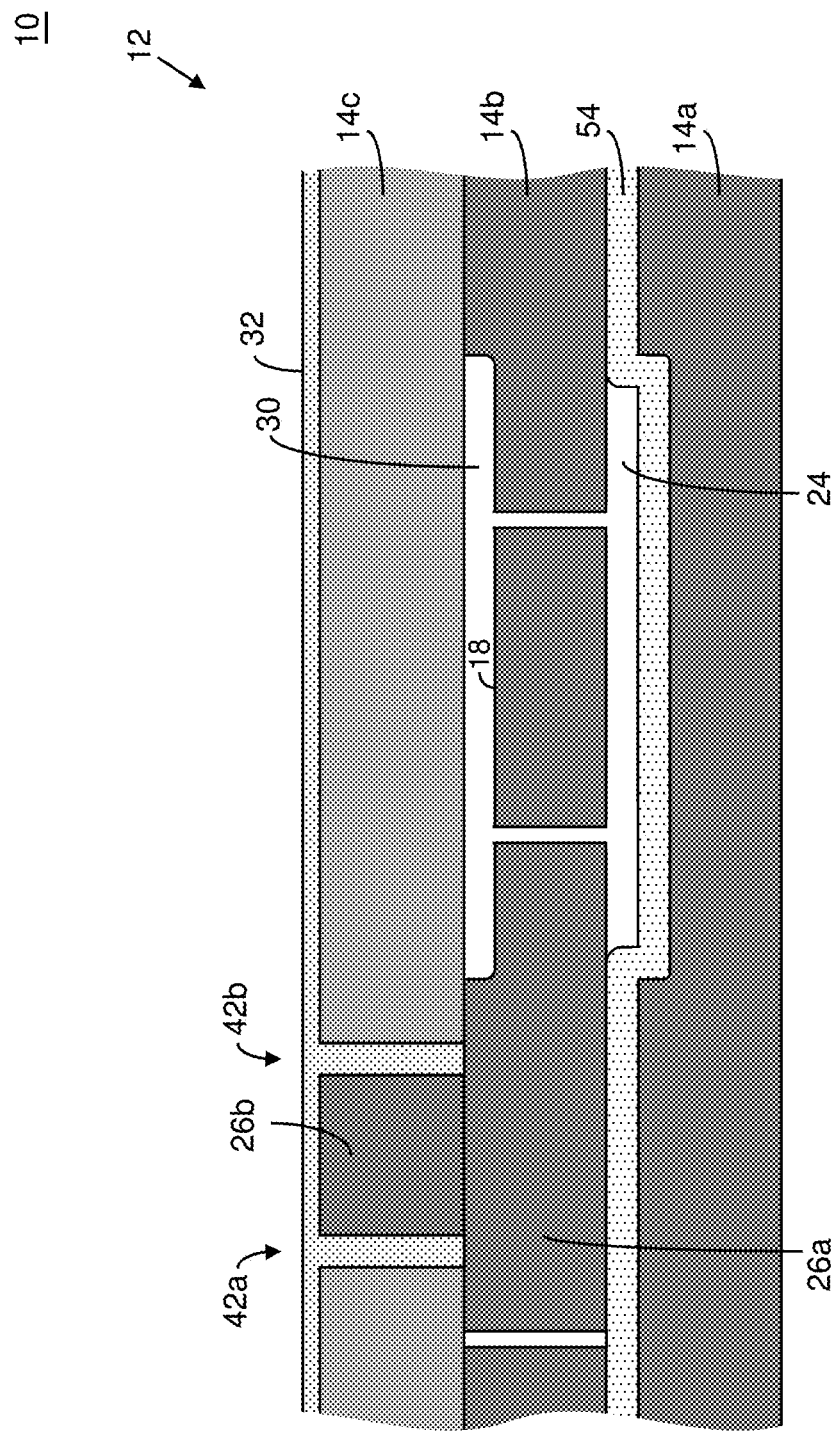
Figure 43I:
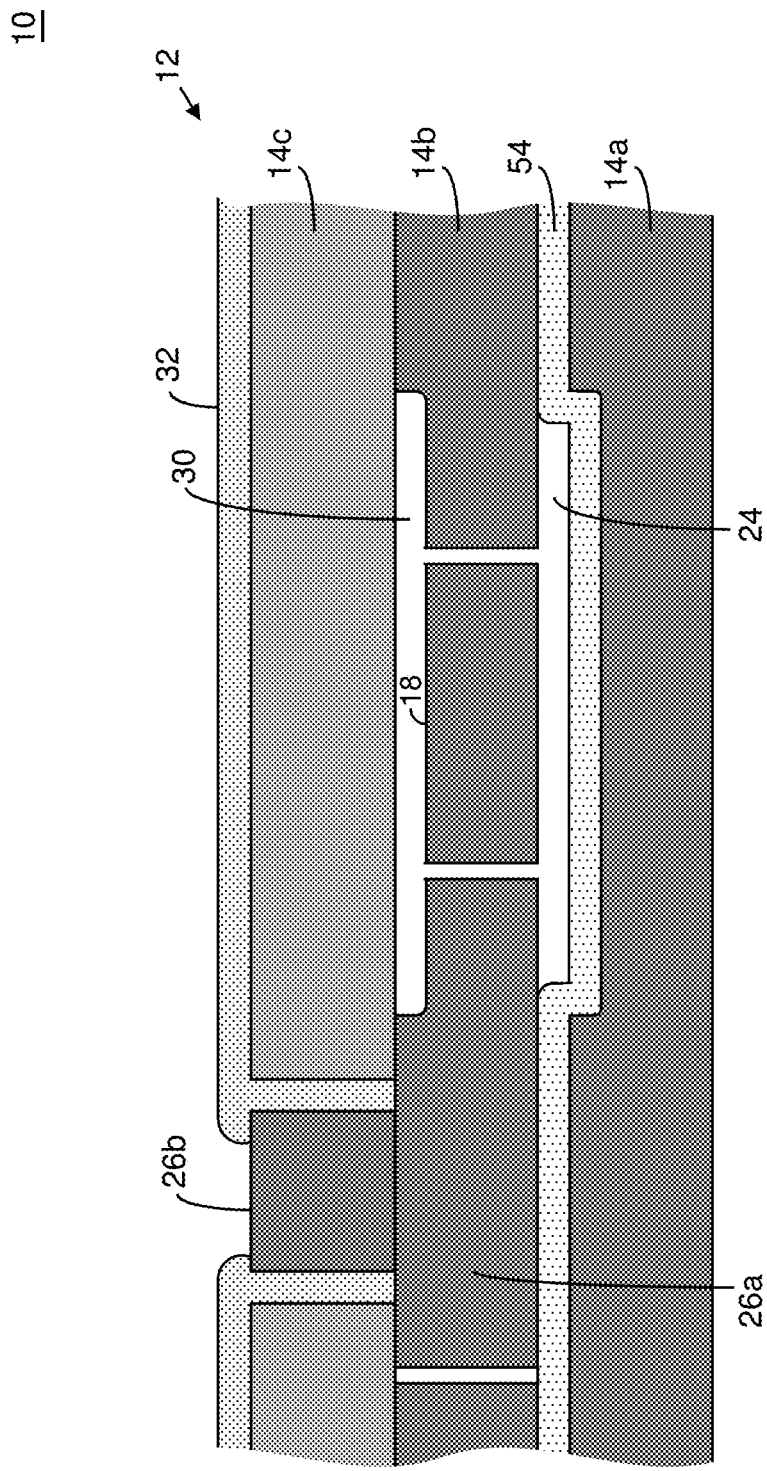
Figure 43J:
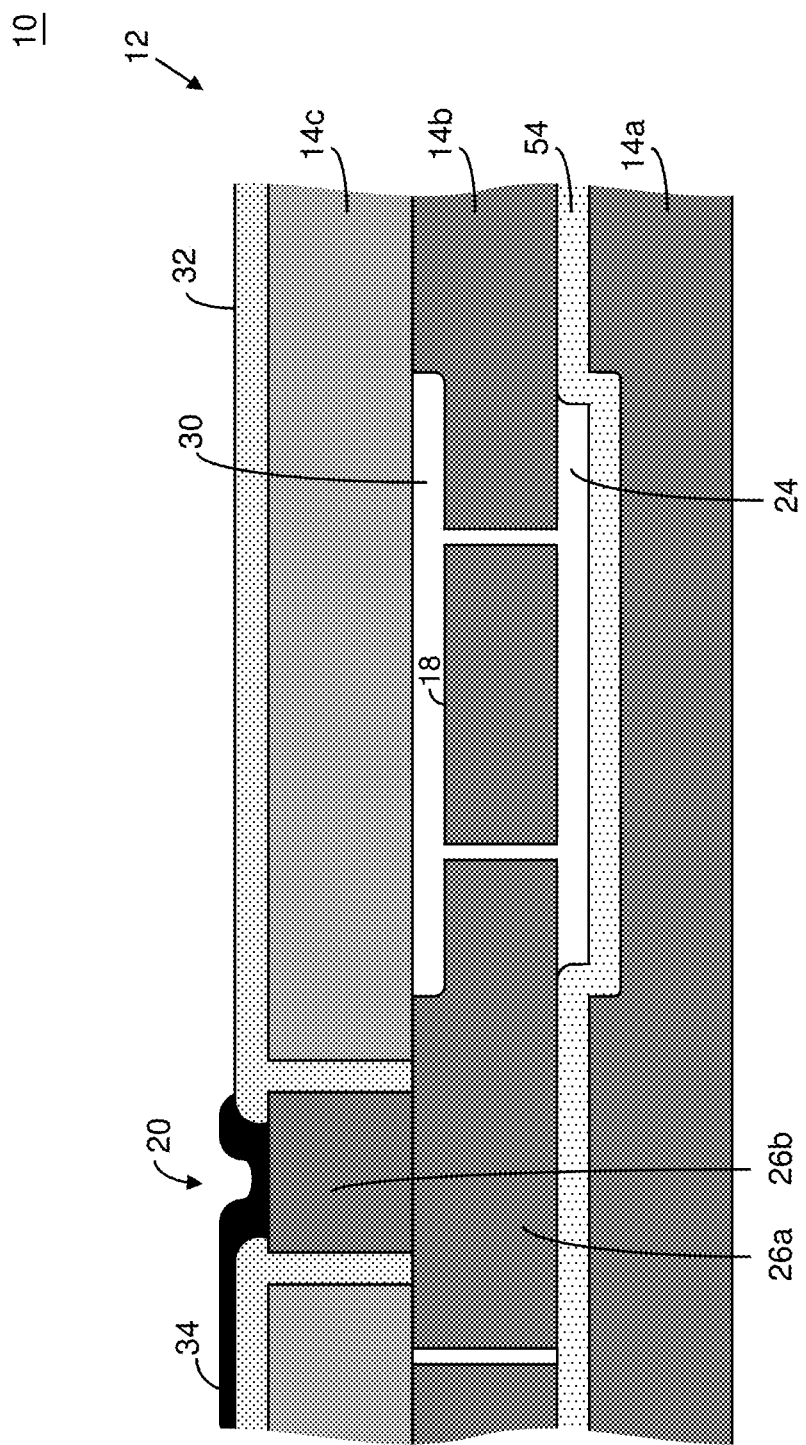
Figure 43K:
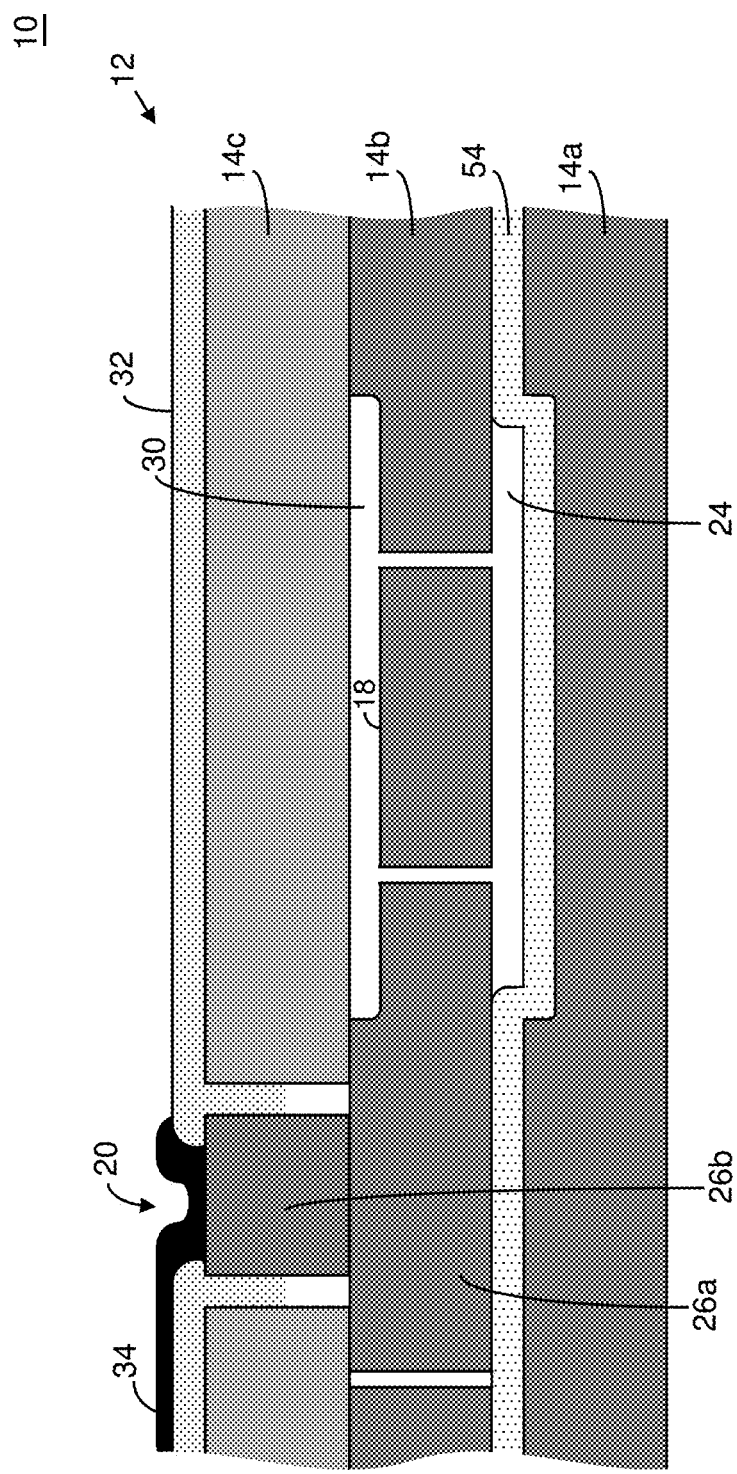
Figure 44:
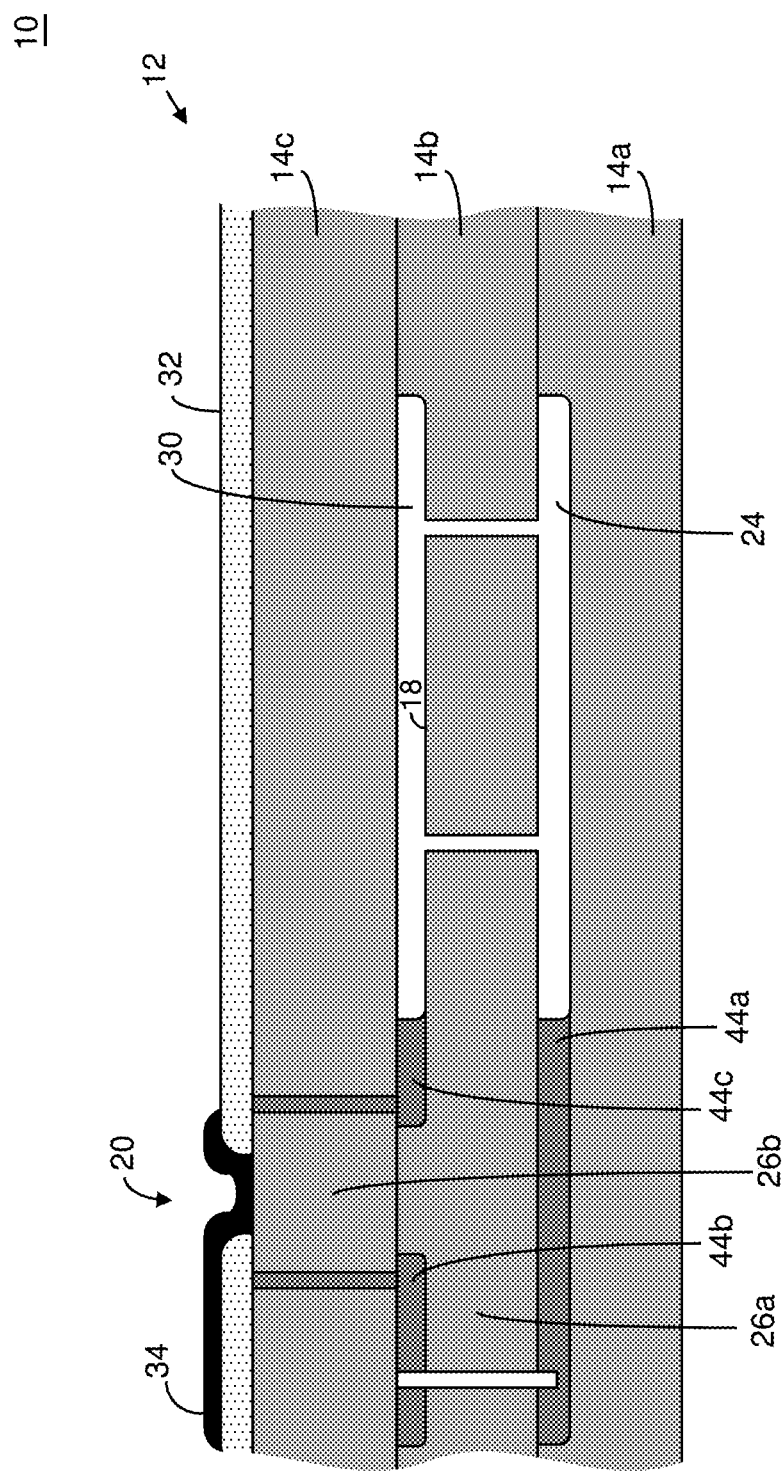
Figure 45A:
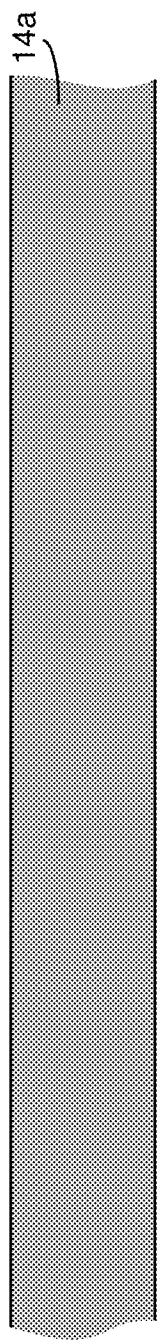
Figure 45B:
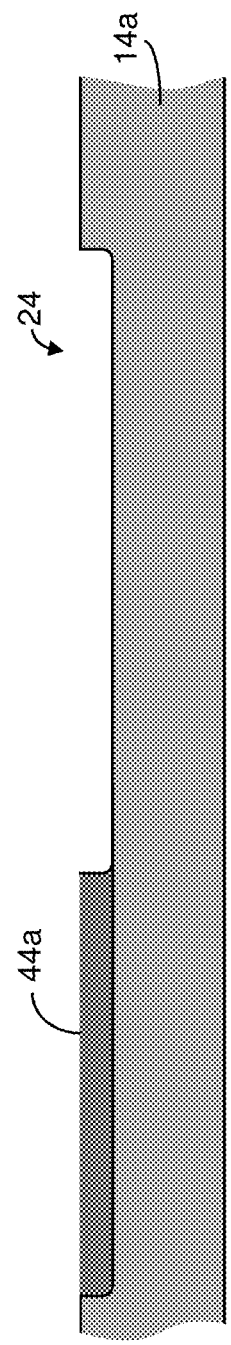
Figure 45G:
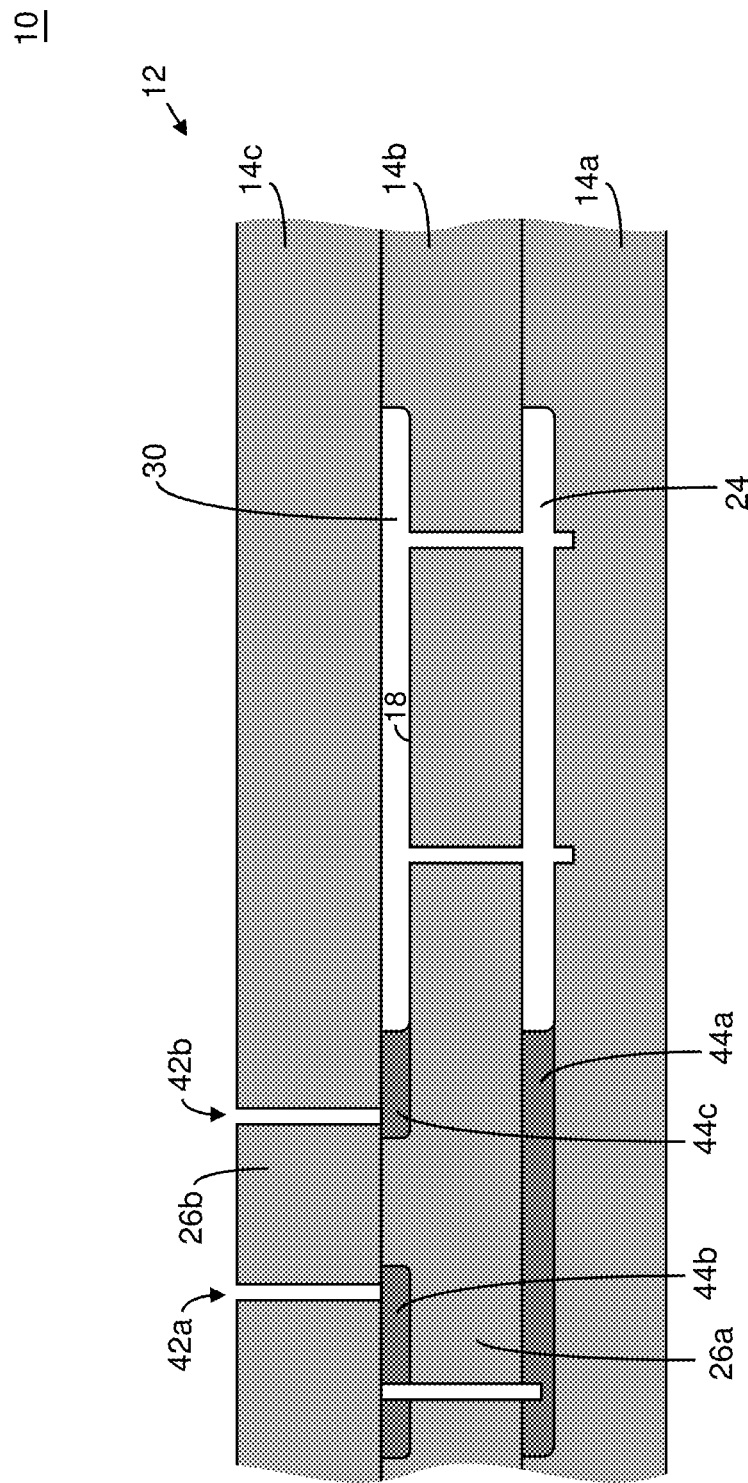
Figure 45H:
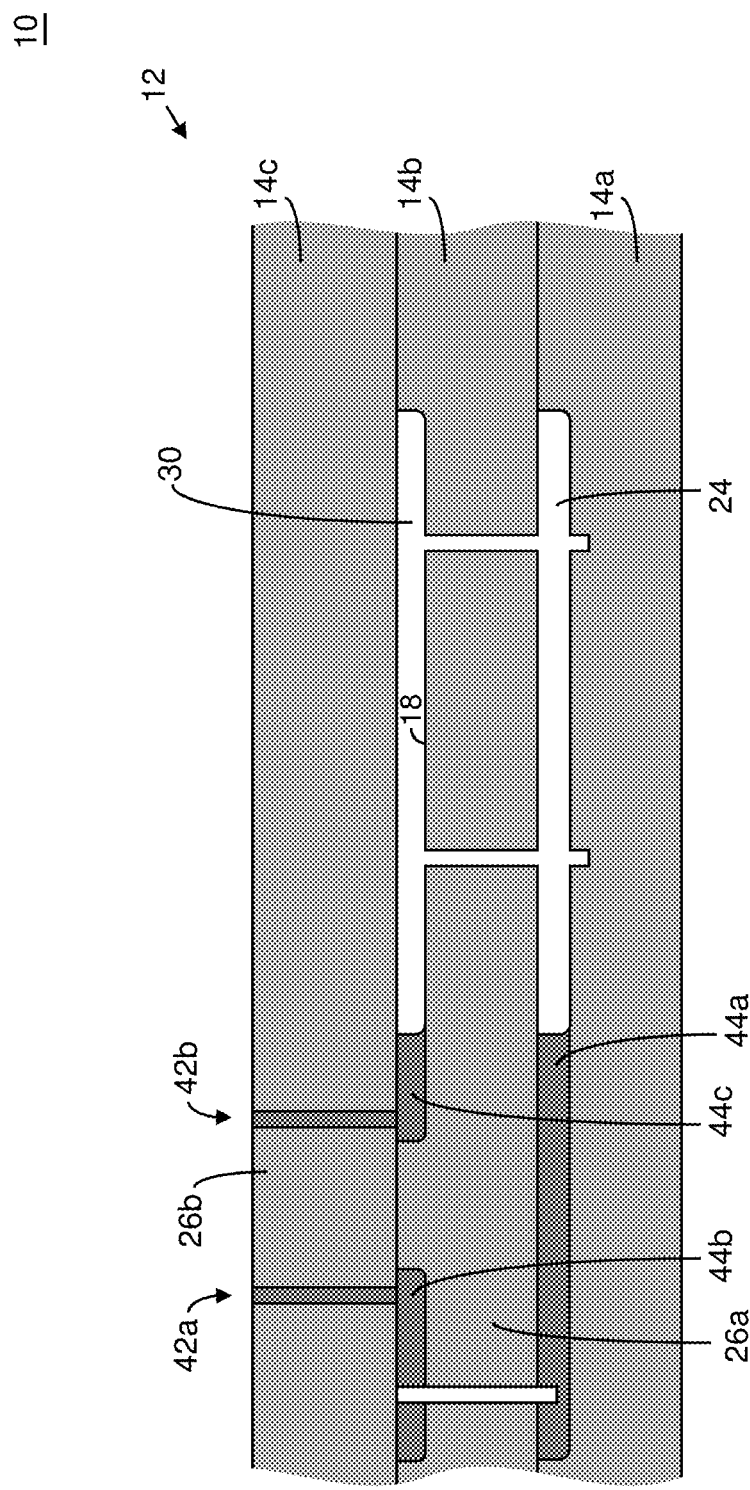
Figure 45I:
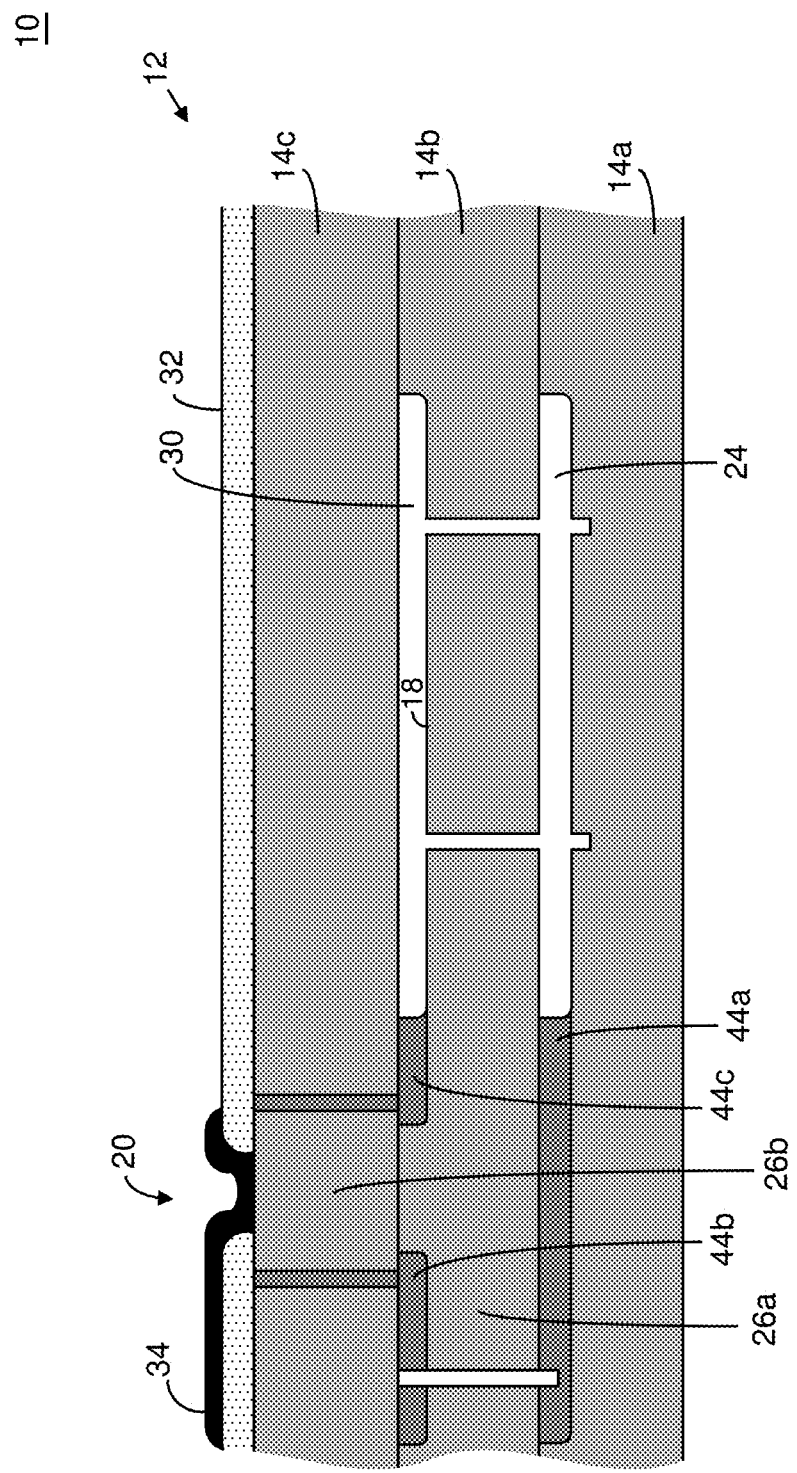
Figure 46A:
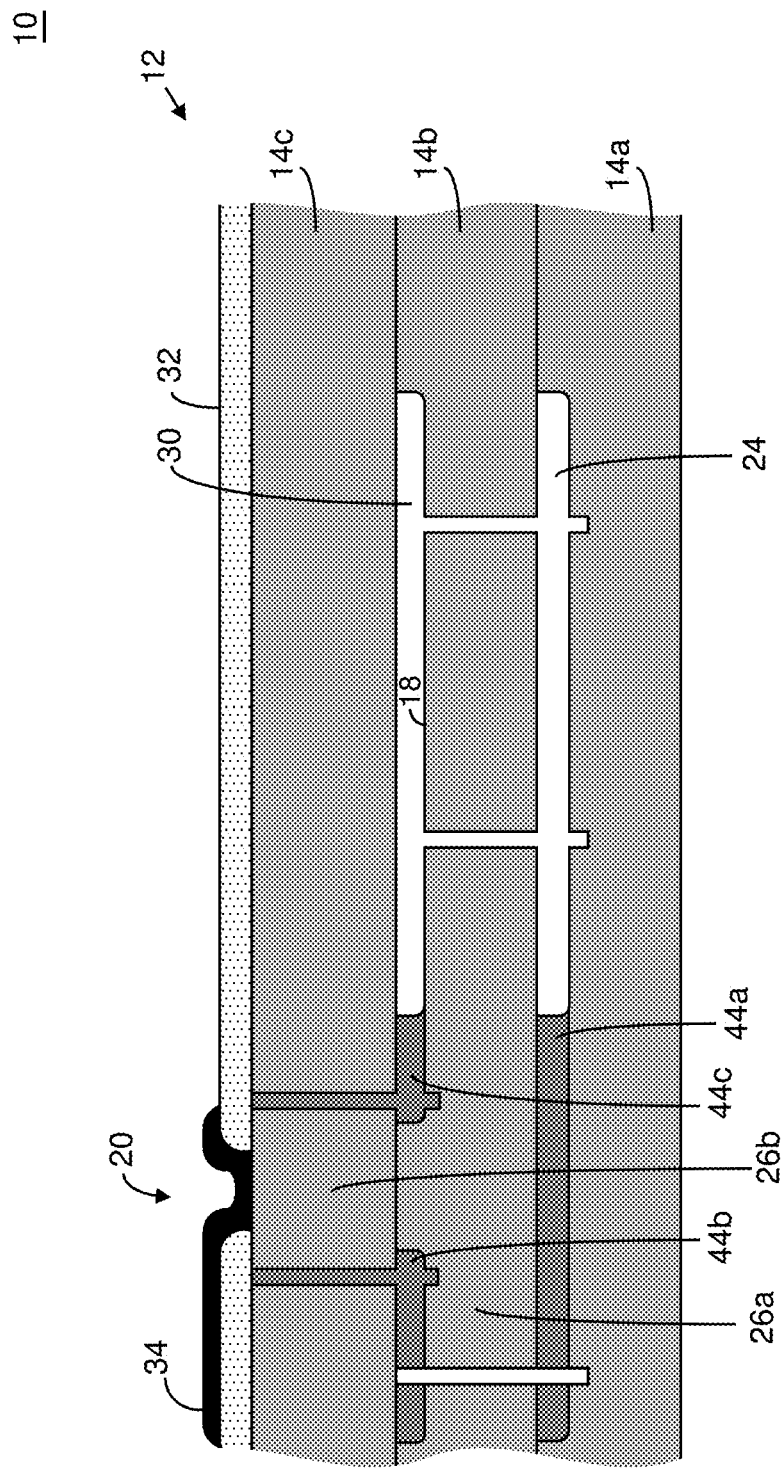
Figure 46B:
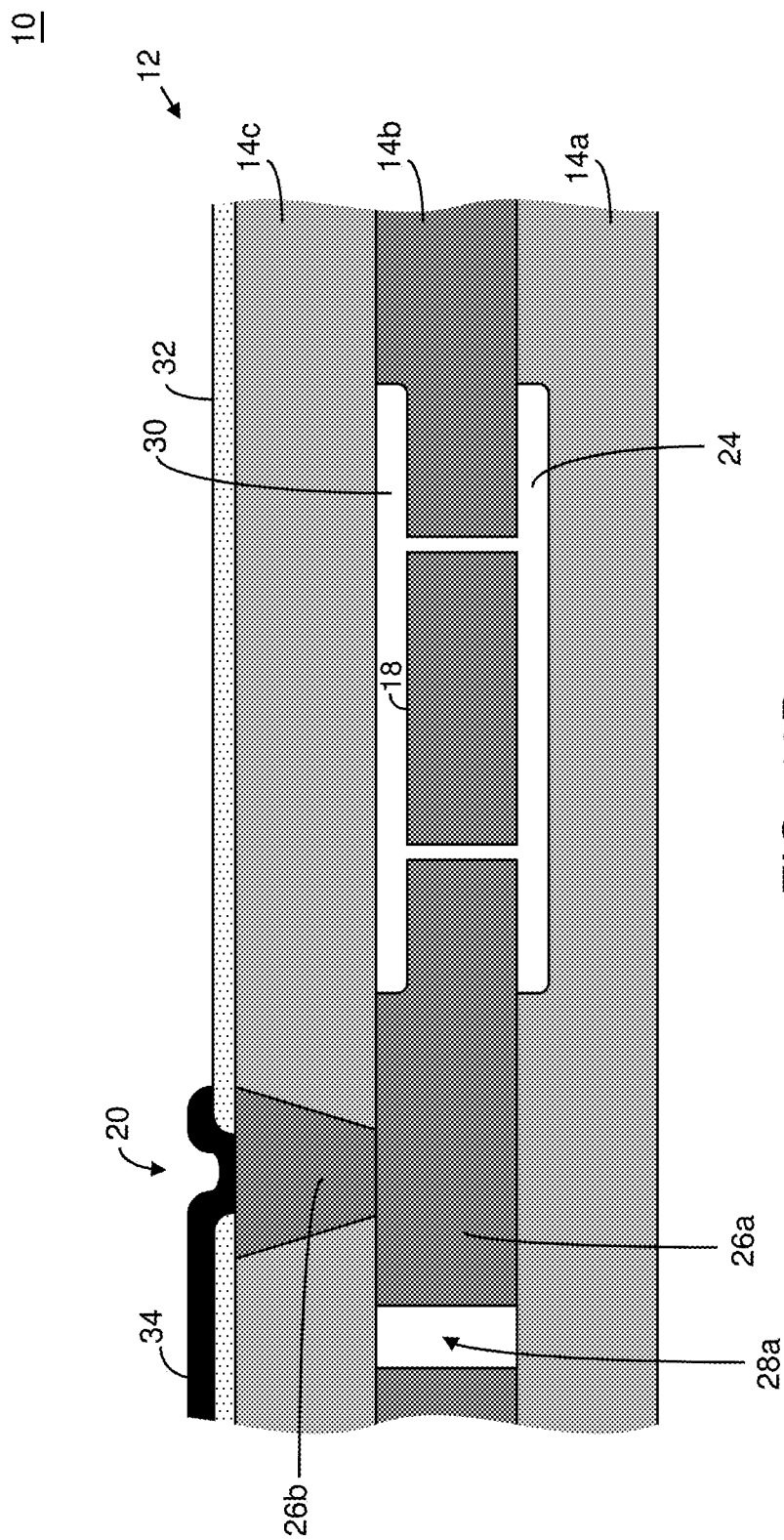
Figure 47A:
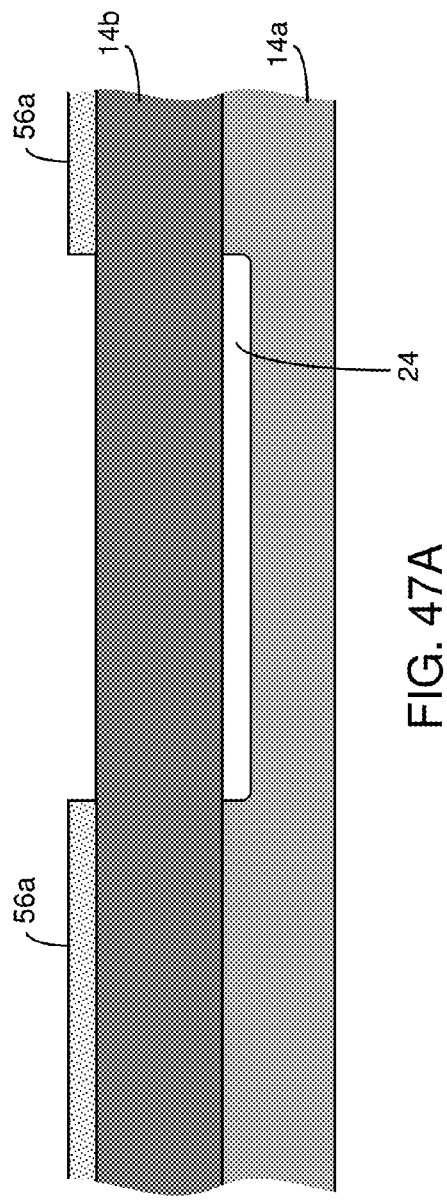
Figure 47B:
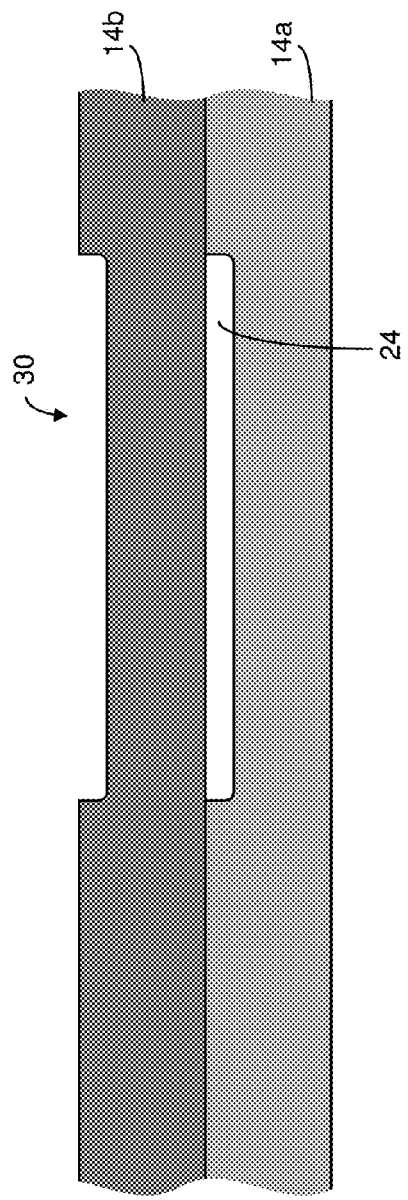
Figure 47C:
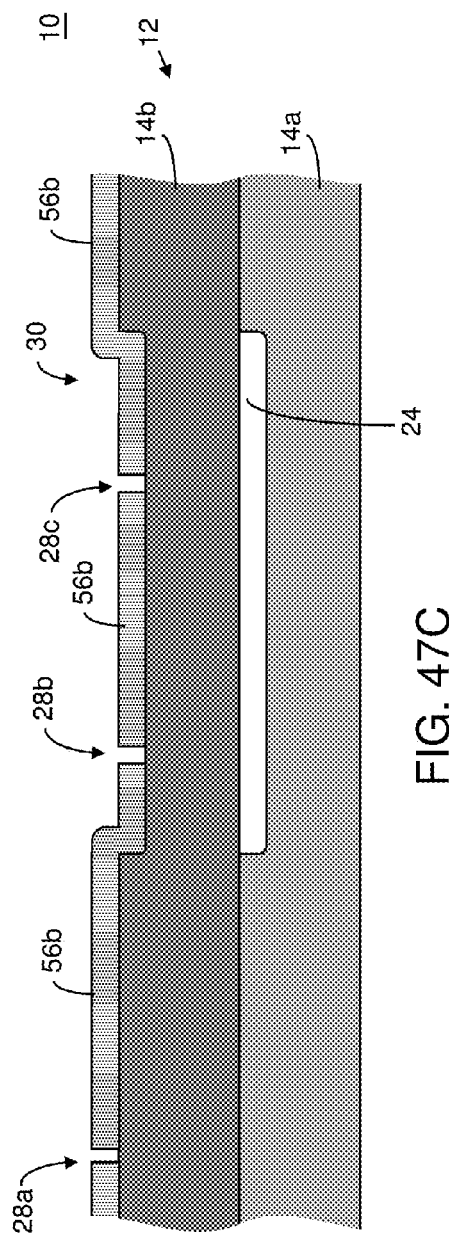
Figure 47D:
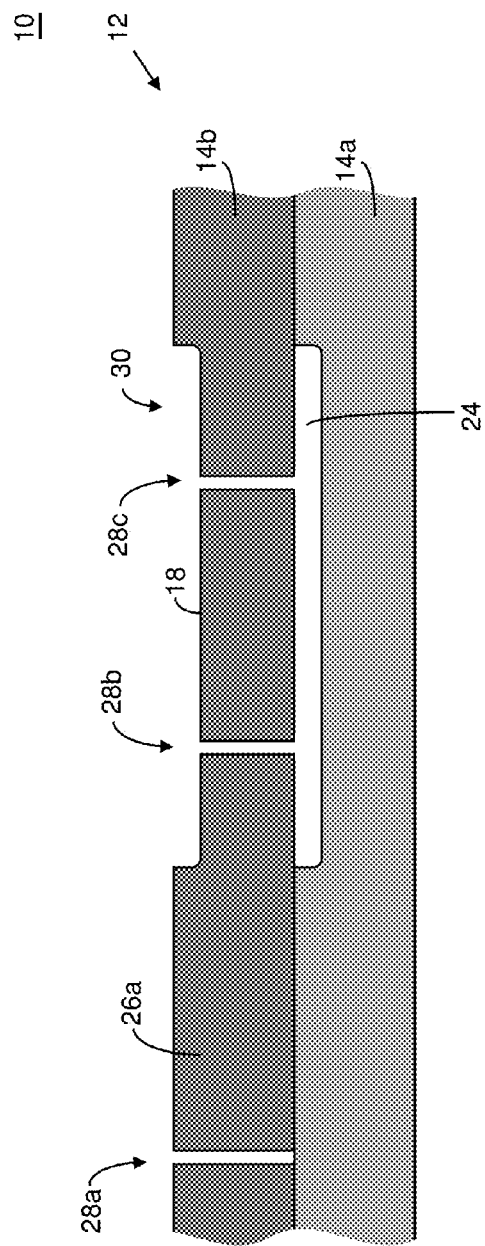
Figure 52:
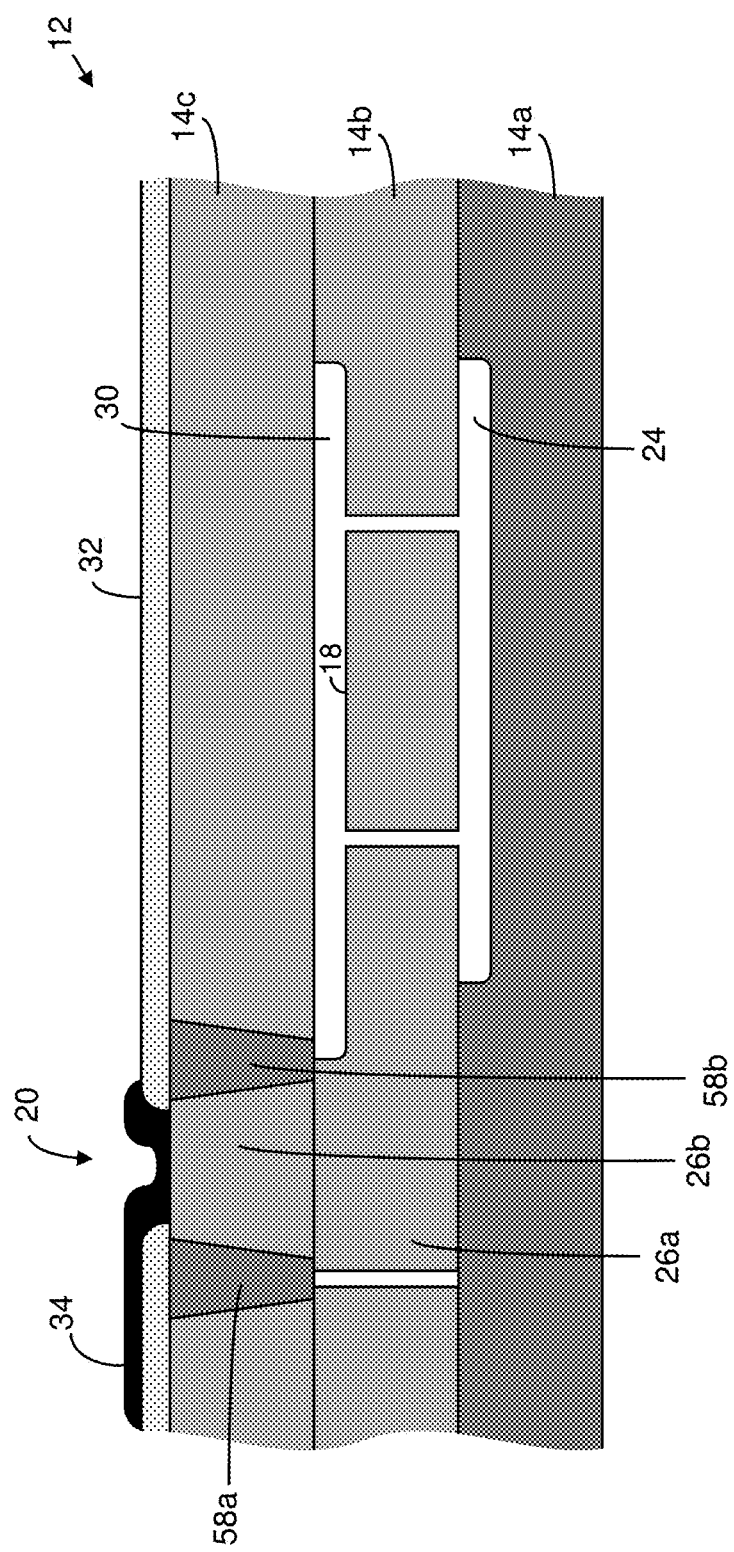
Figure 53A:
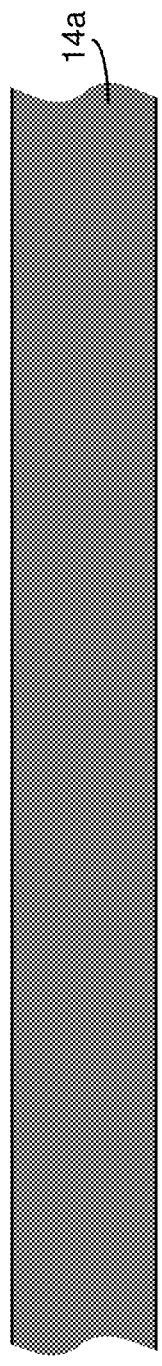
Figure 53B:
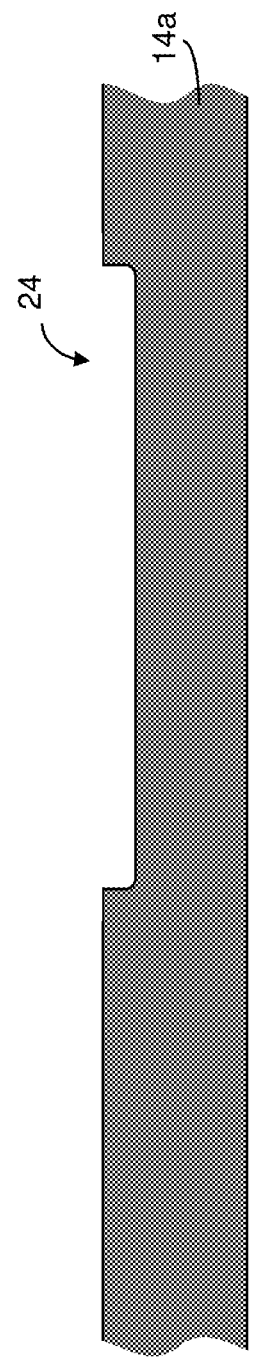
Figure 53C:
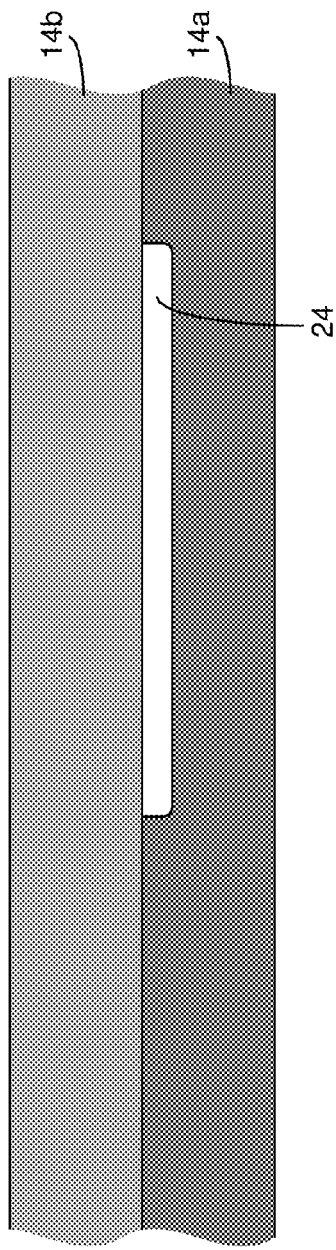
Figure 53D:
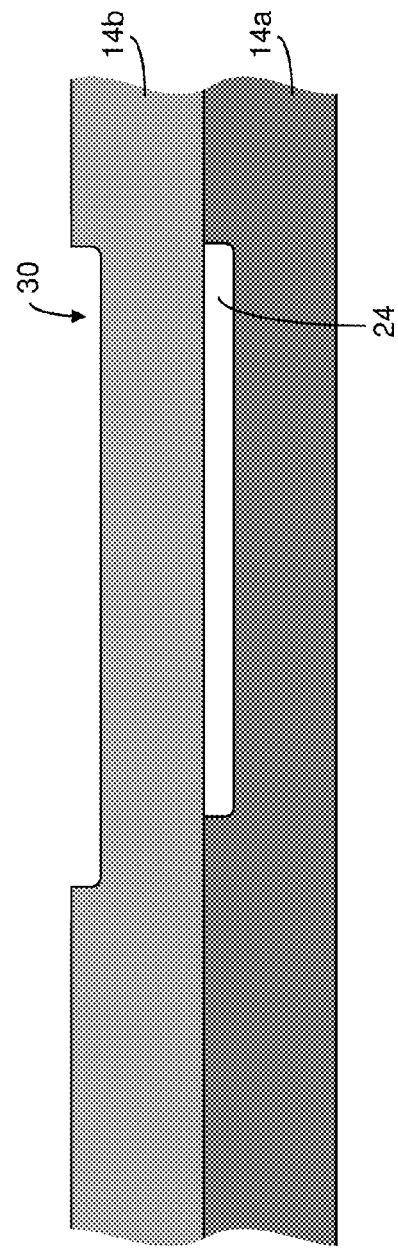
Figure 53G:
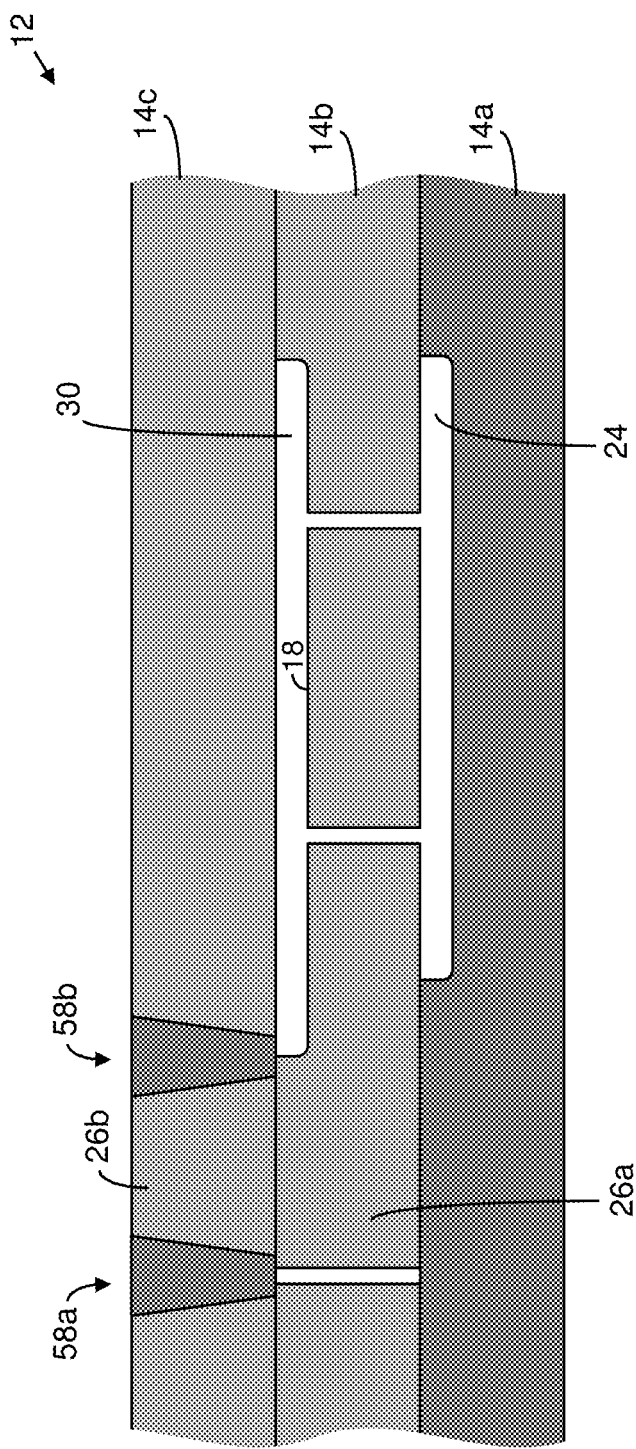
Figure 53H:
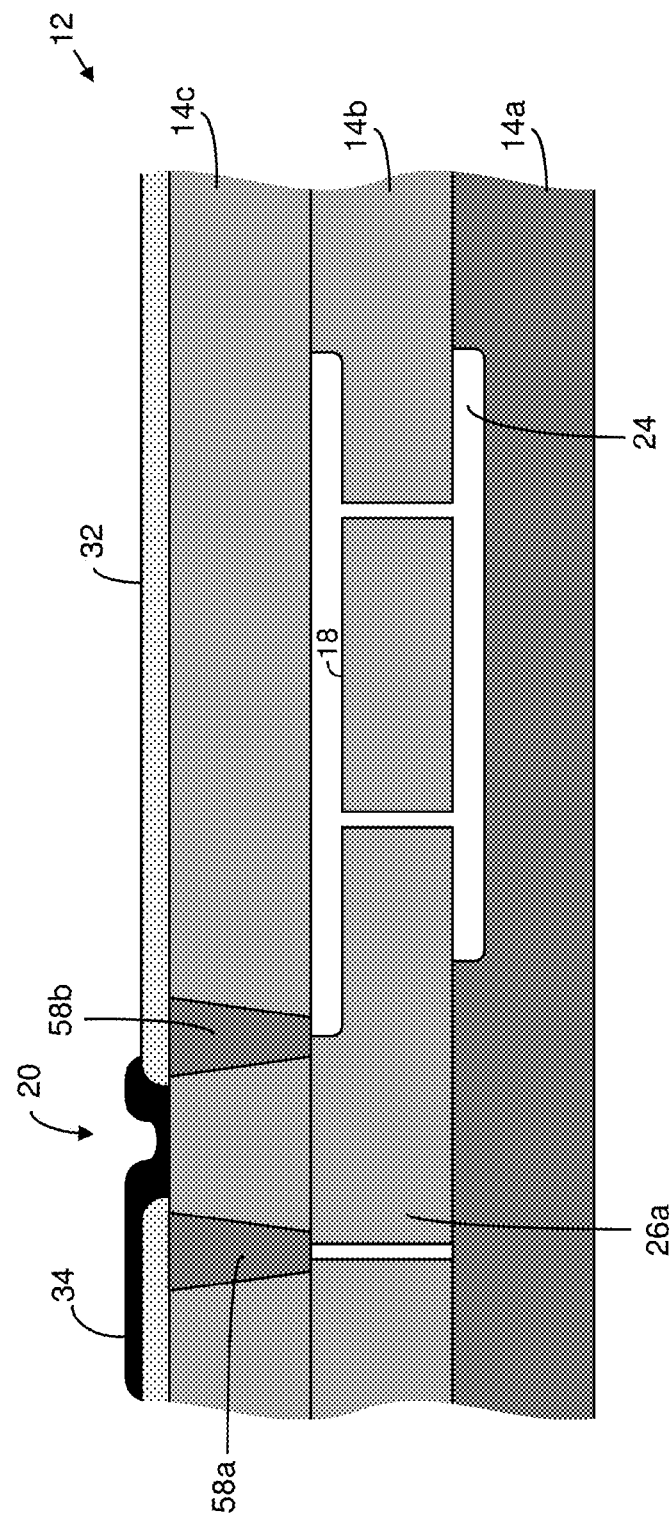
Figure 54:
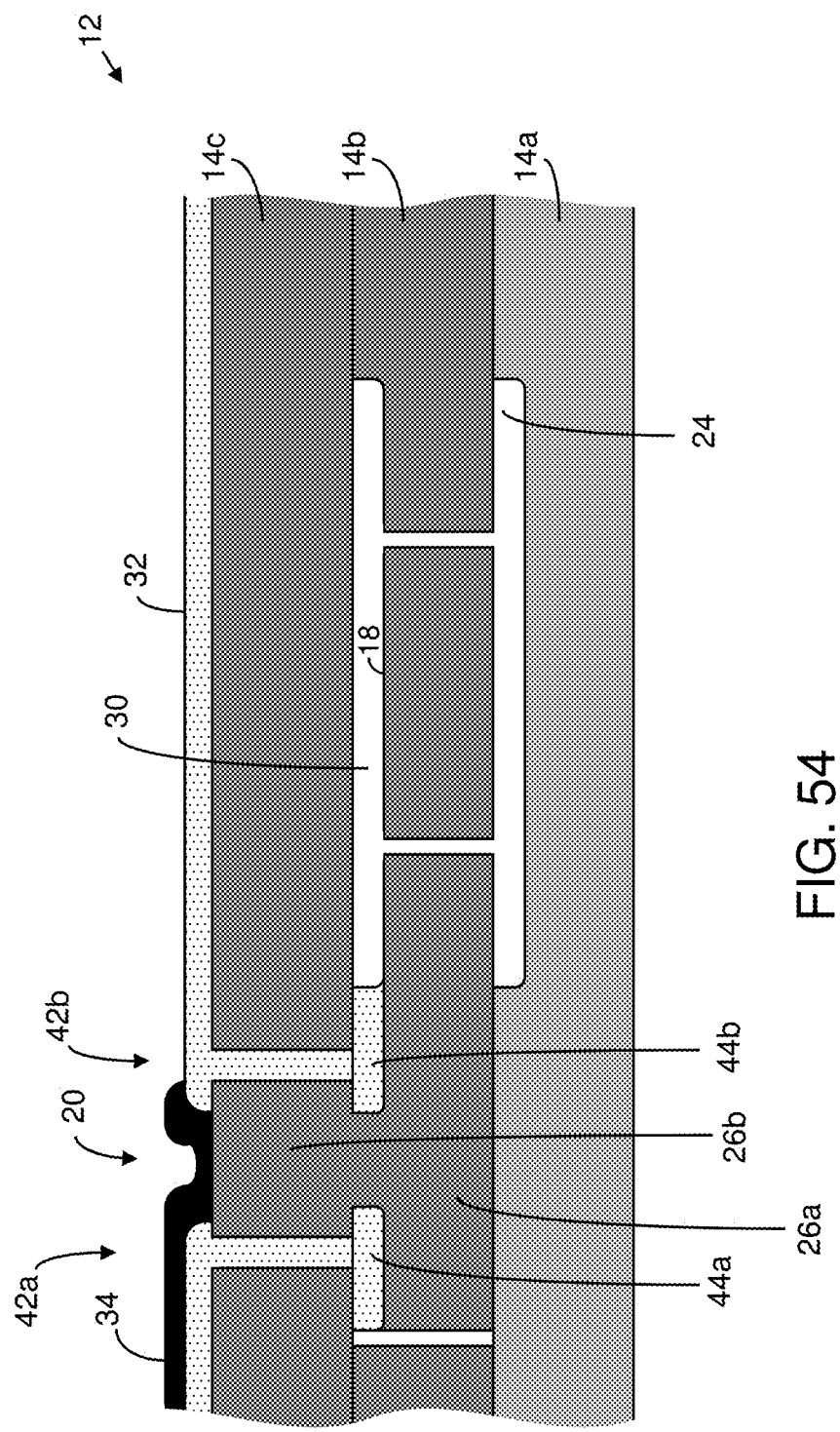
Figure 55G:
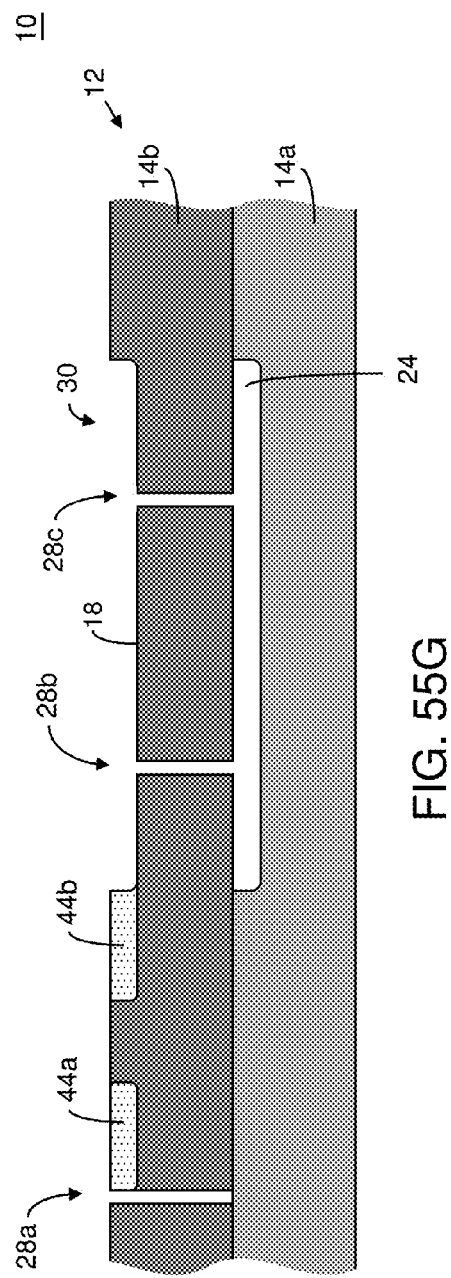
Figure 55H:
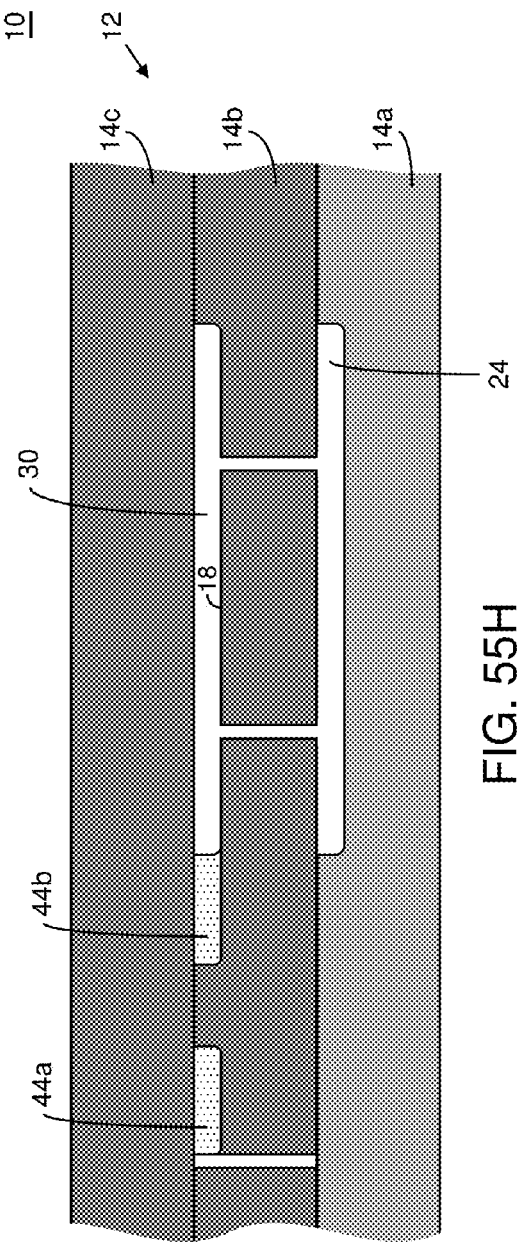
Figure 55I:
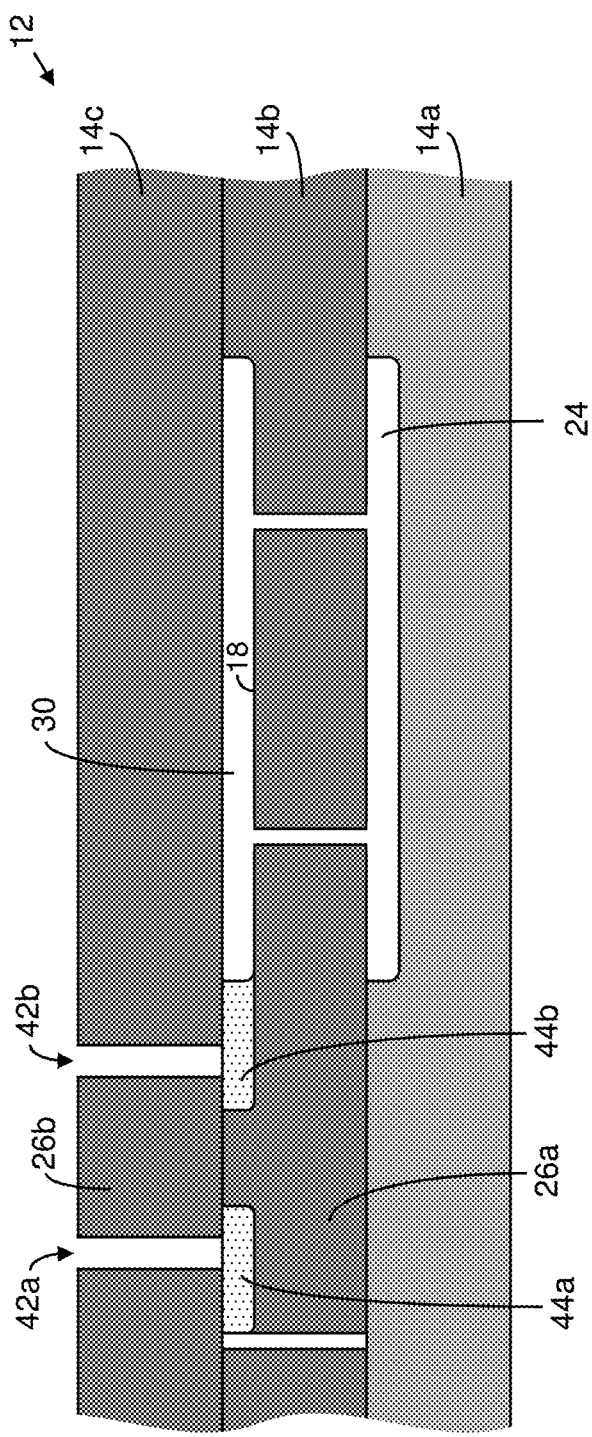
Figure 55J:
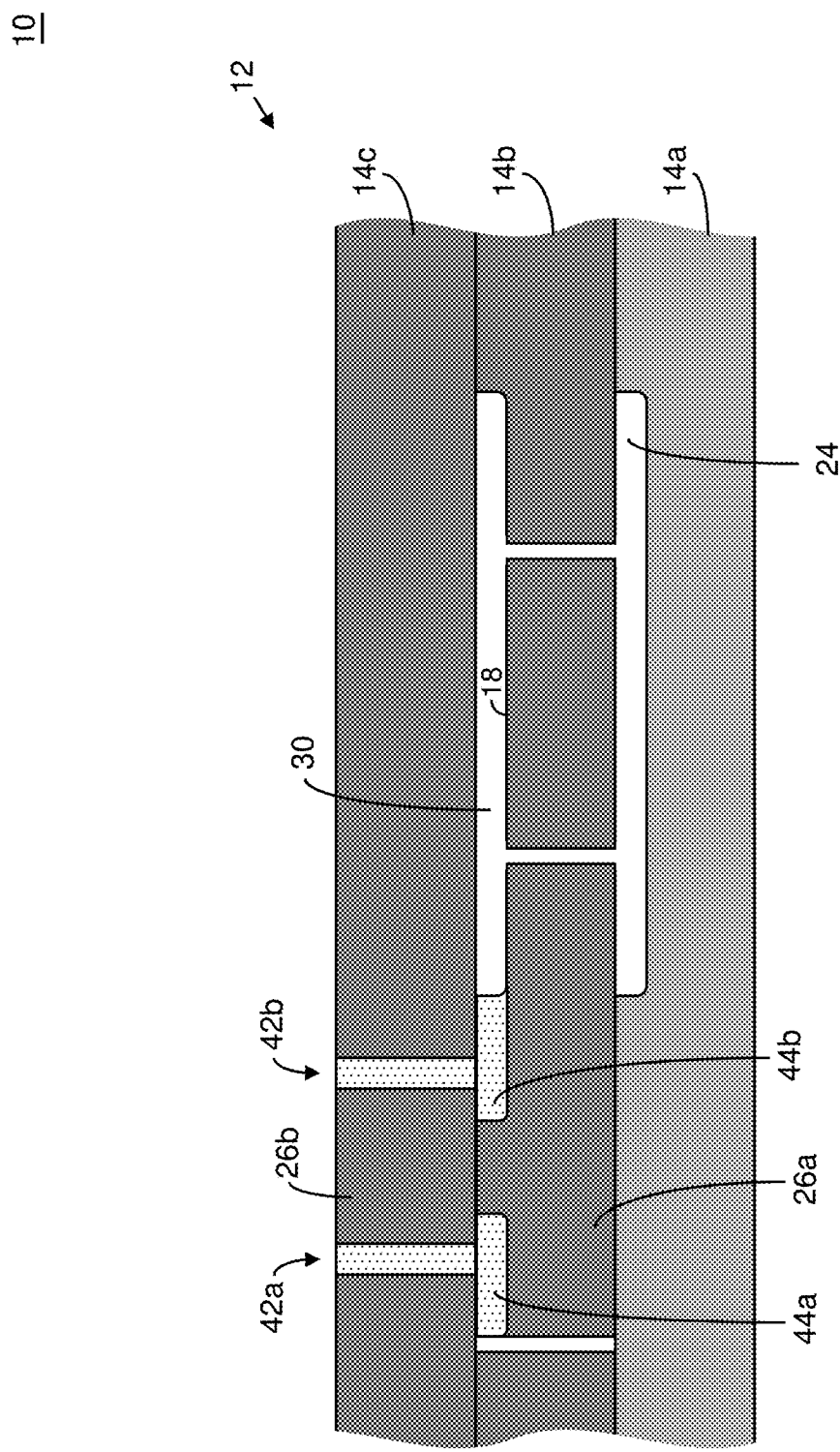
Figure 55K:
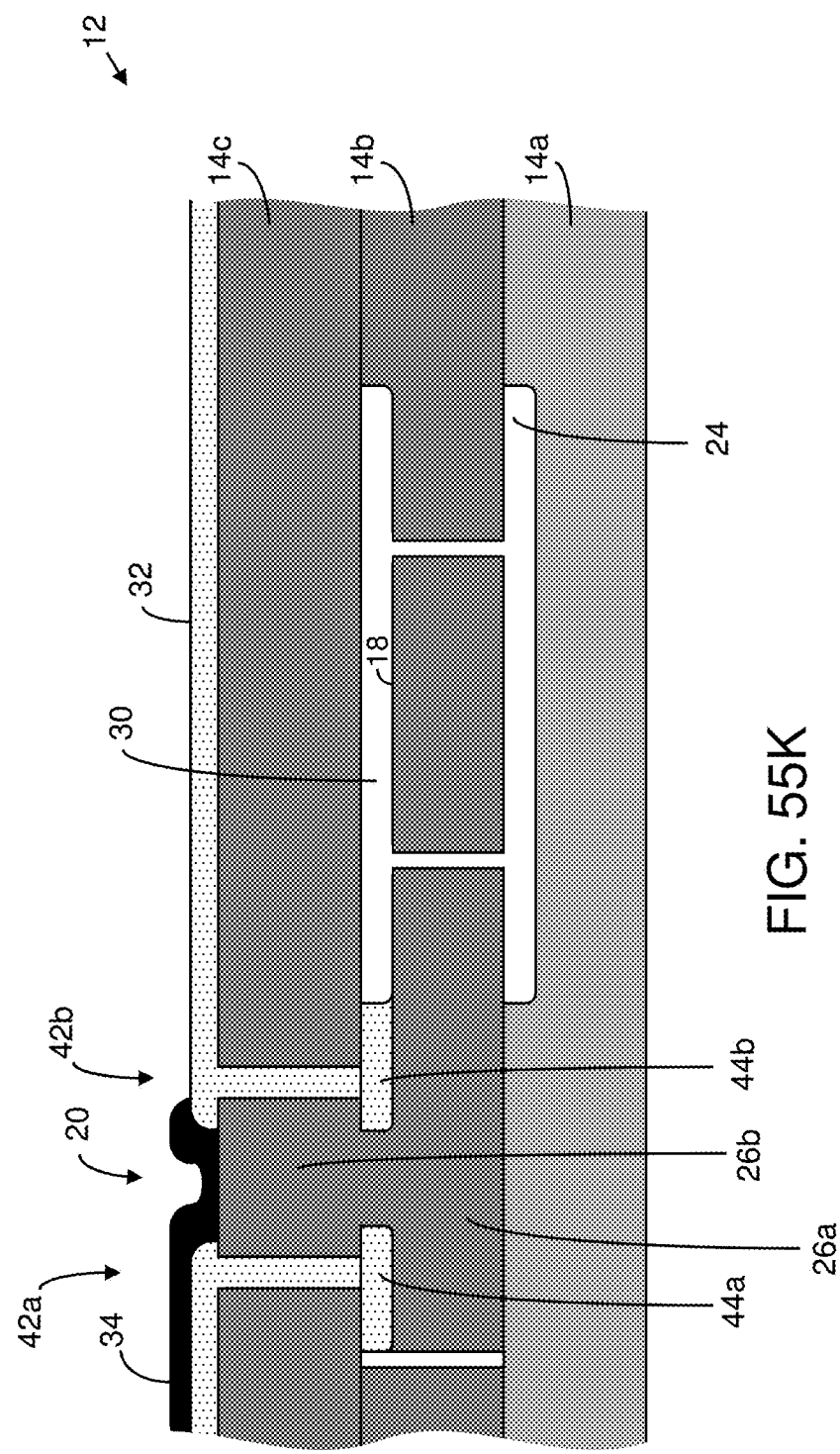
Figure 56:
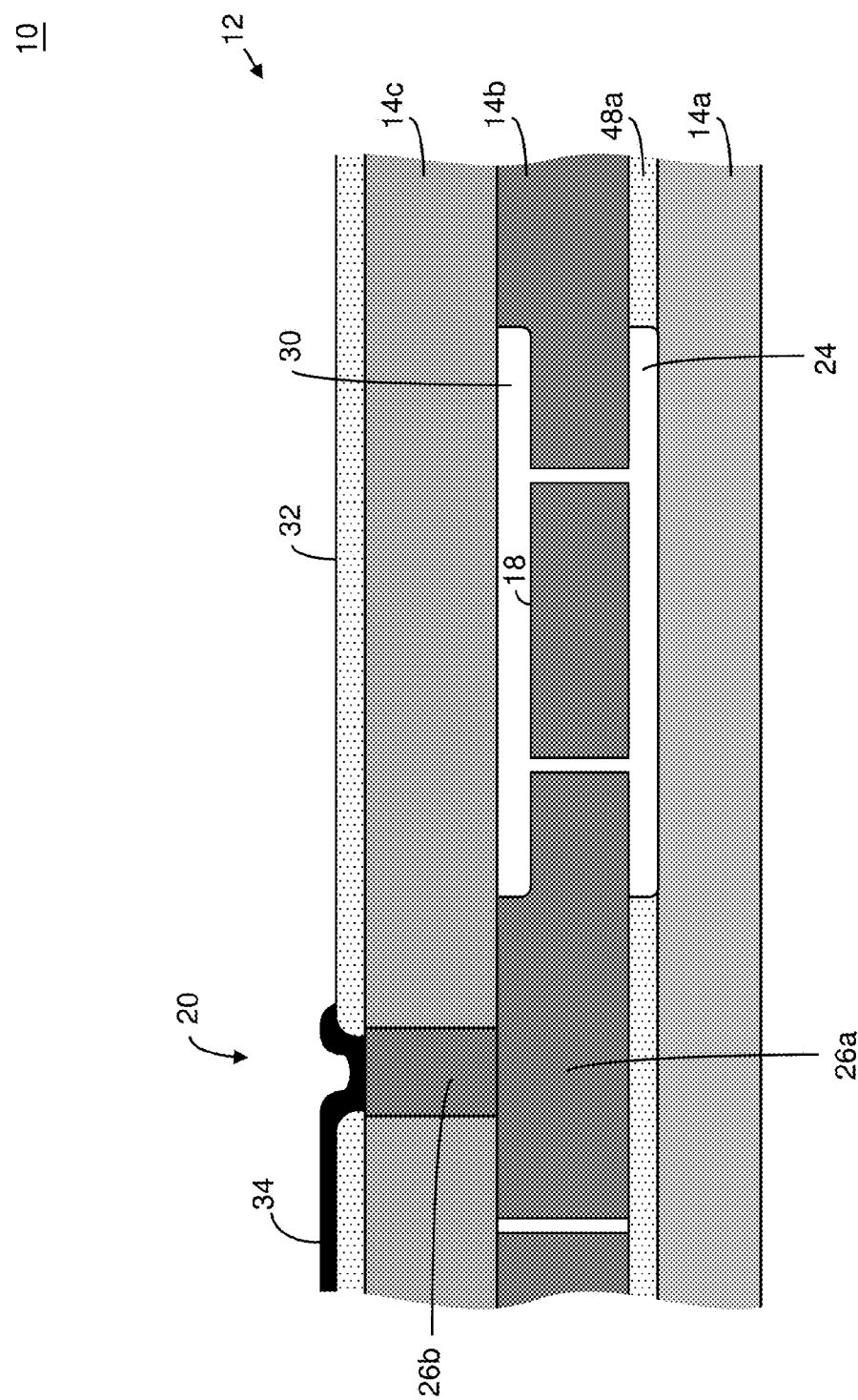
Figure 58:
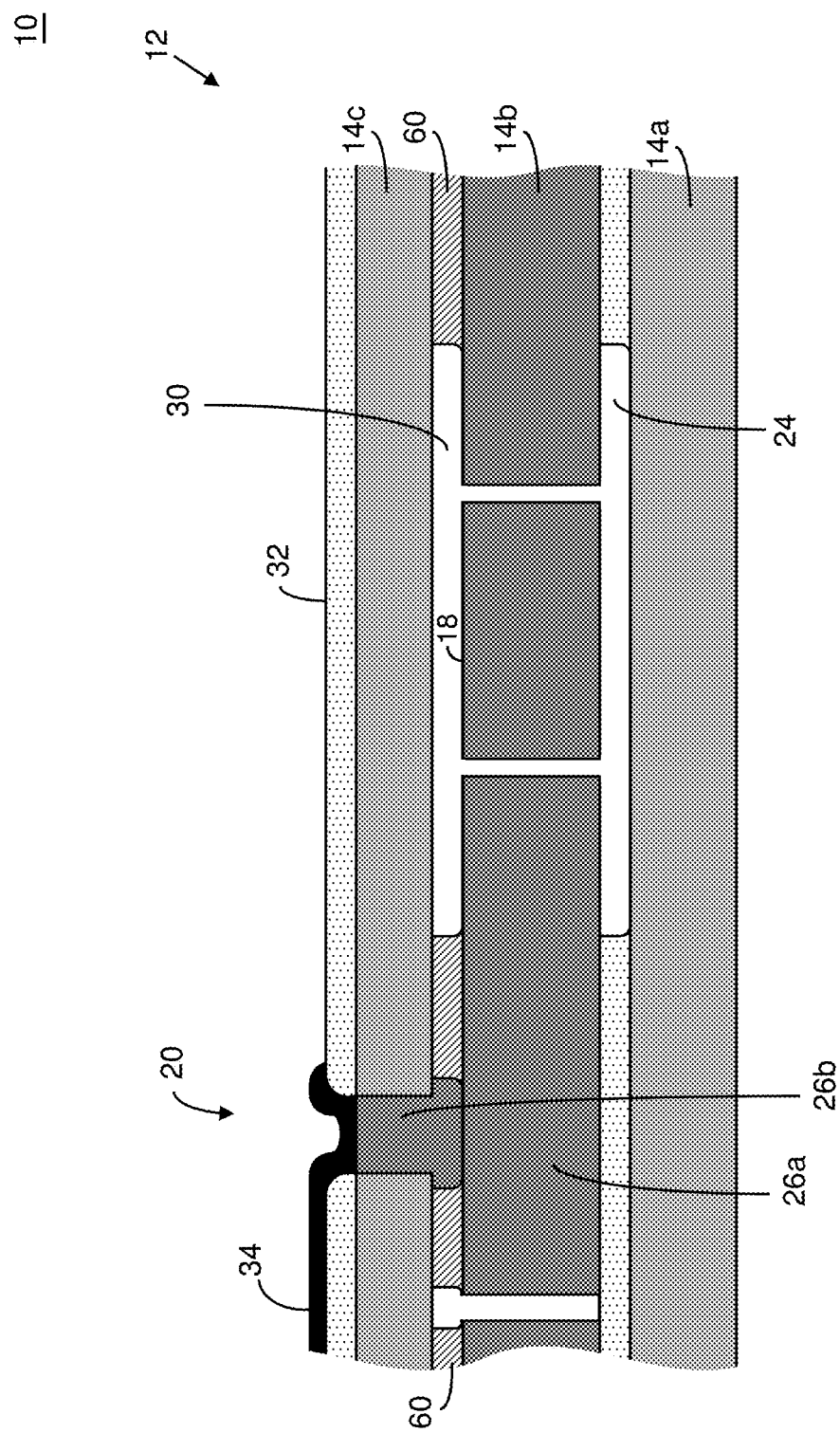
Figure 59A:
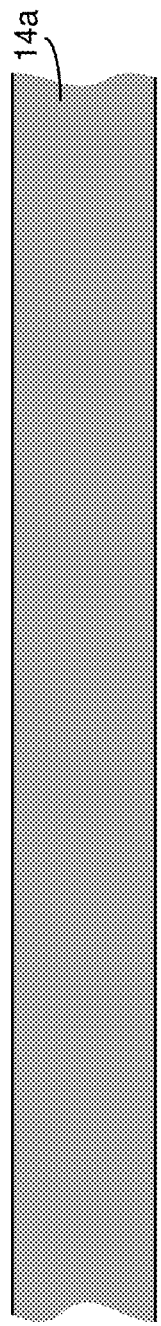
Figure 59B:
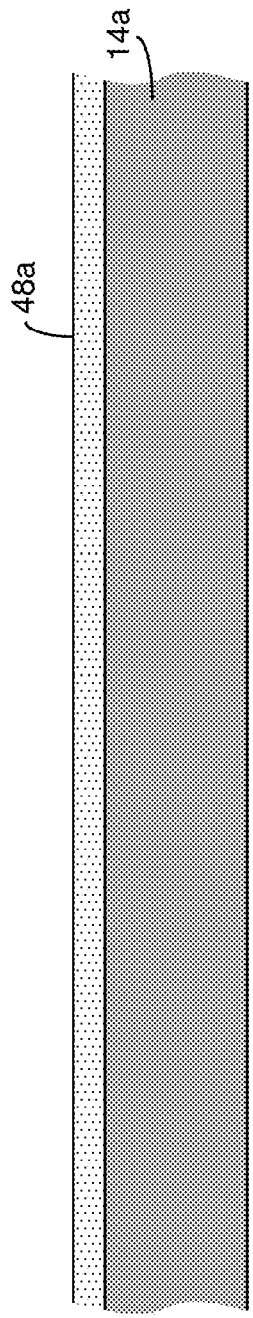
Figure 59C:
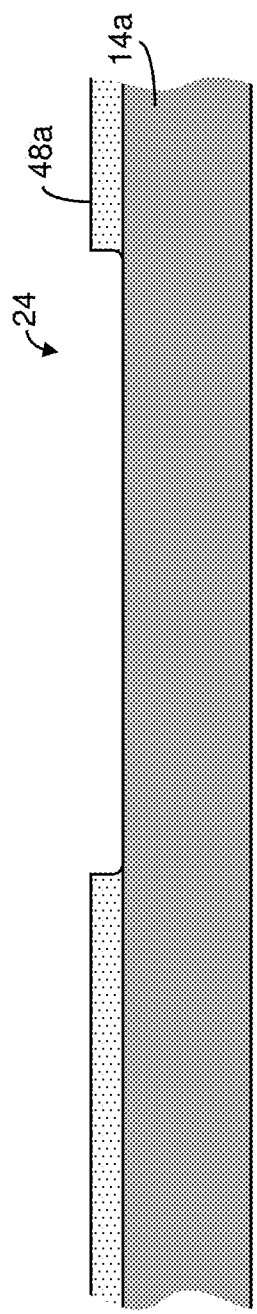
Figure 59D:
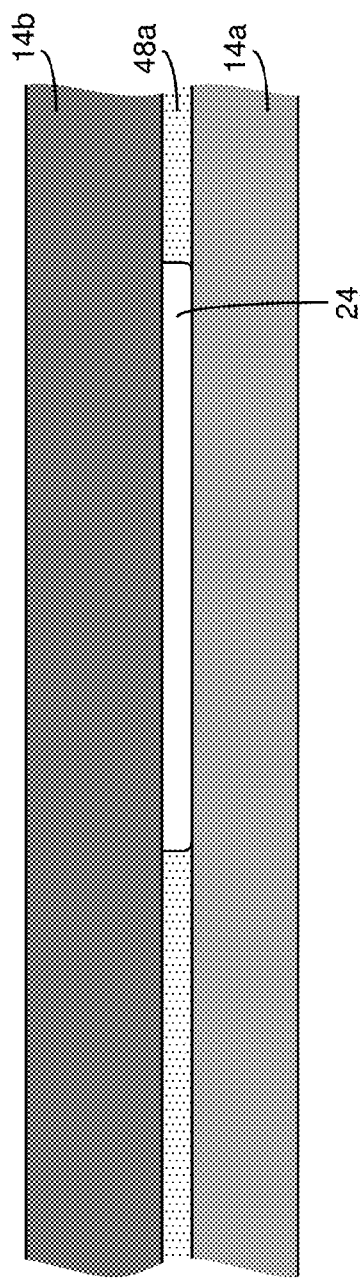
Figure 59E:
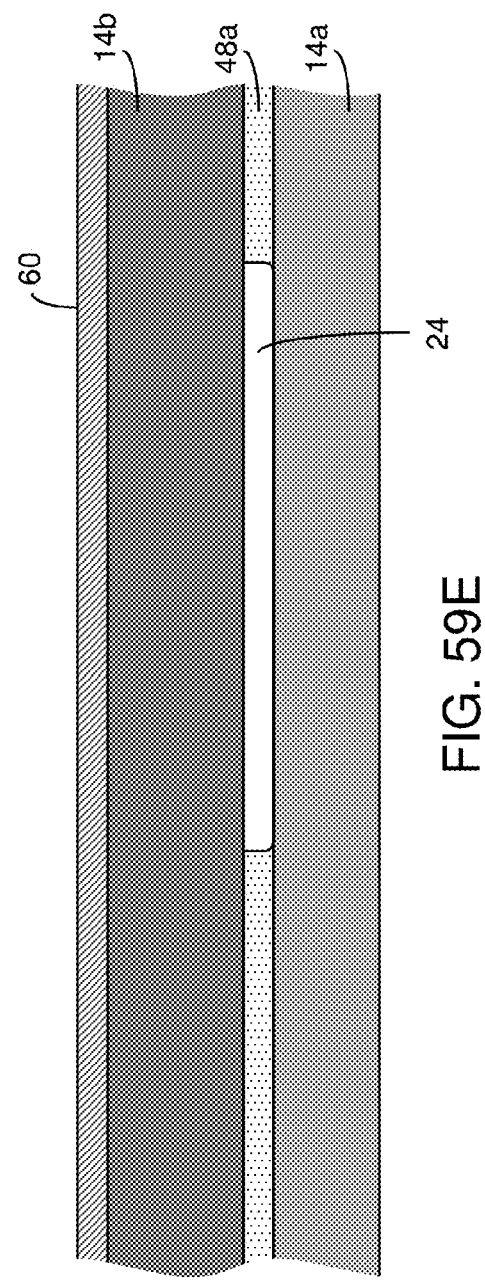
Figure 59F:
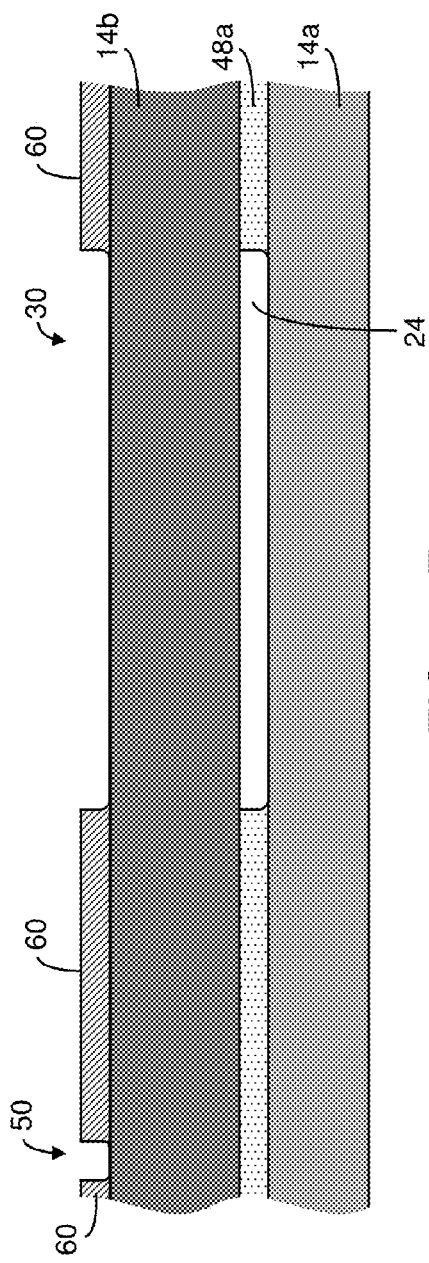
Figure 59G:
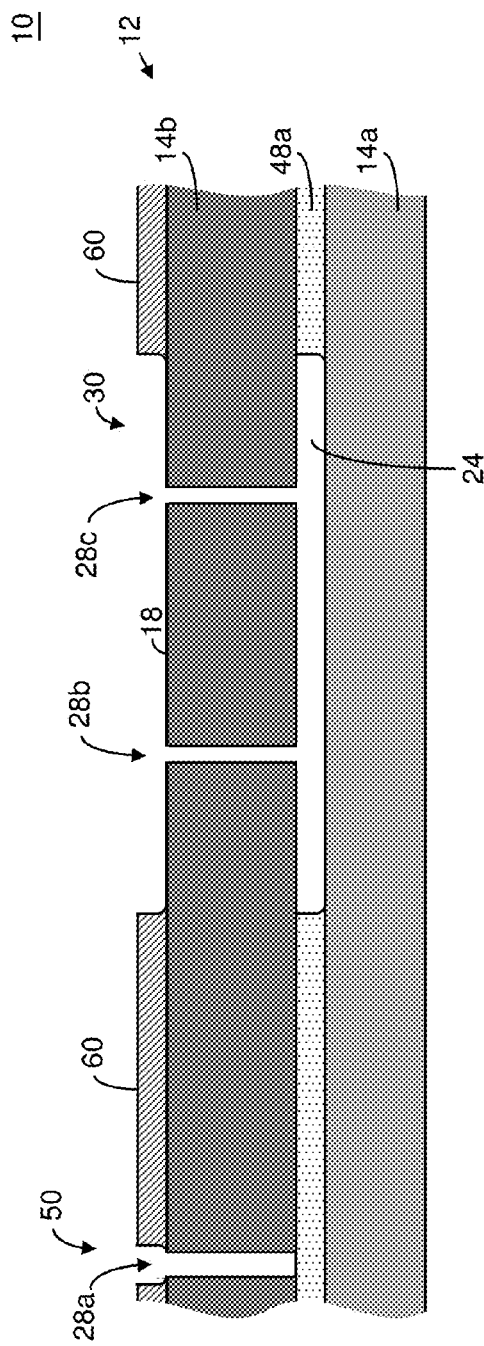
Figure 59H:
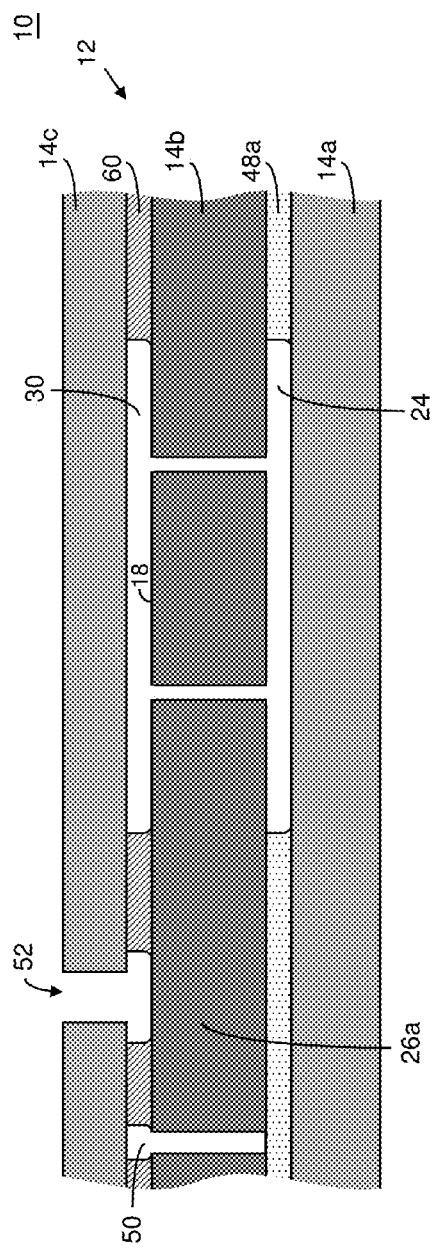
Figure 59I:
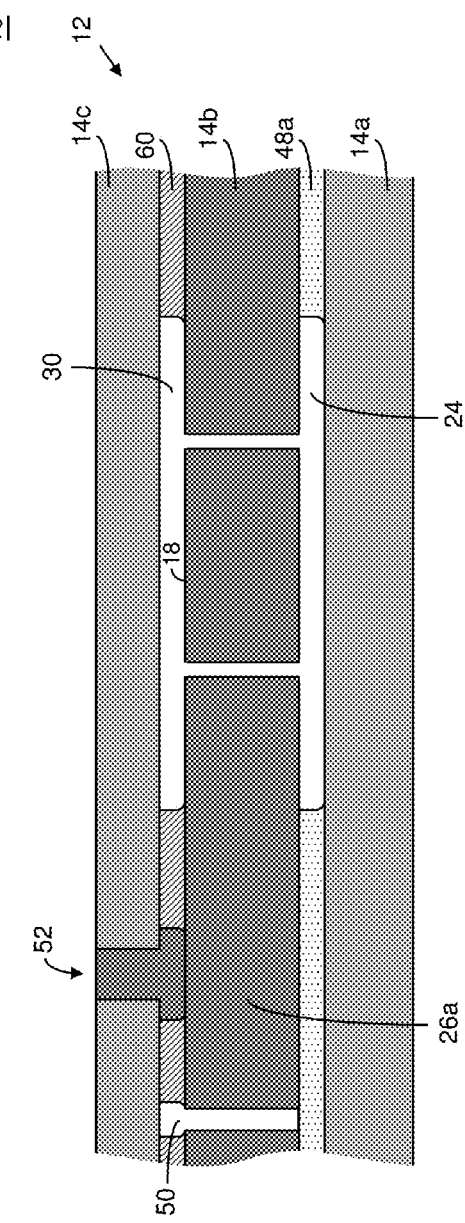
Figure 59J:
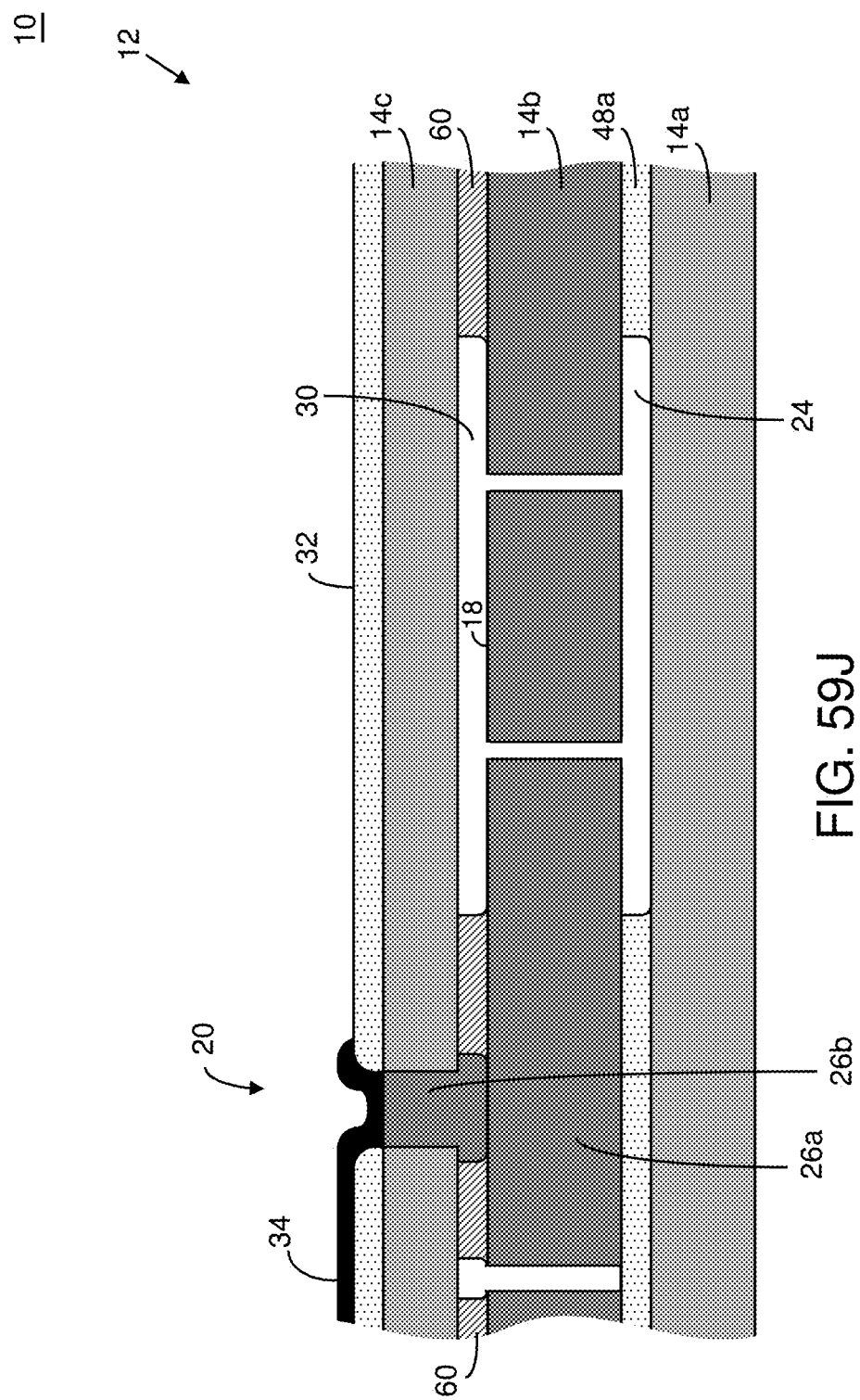
Figure 60:
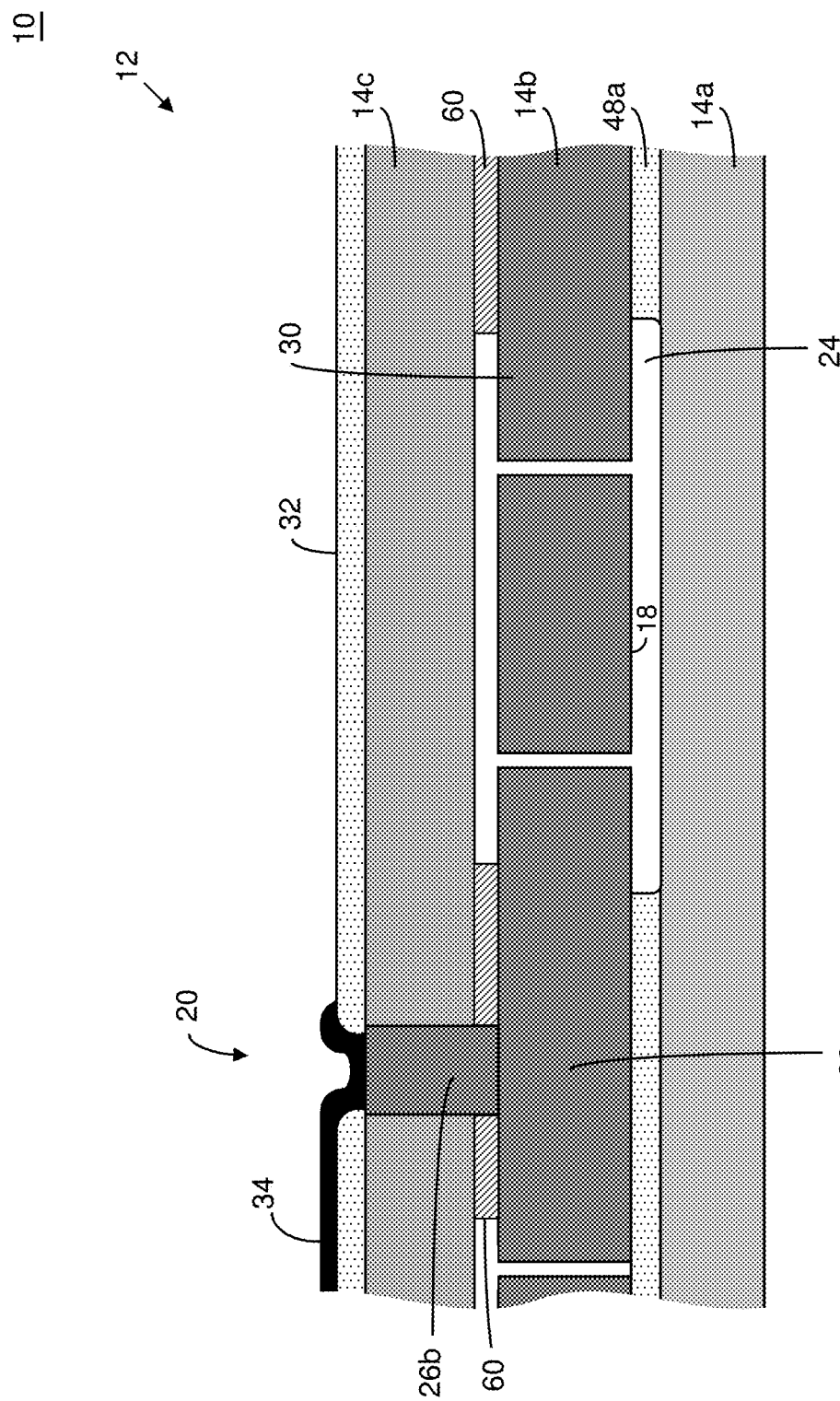
Figure 61A:
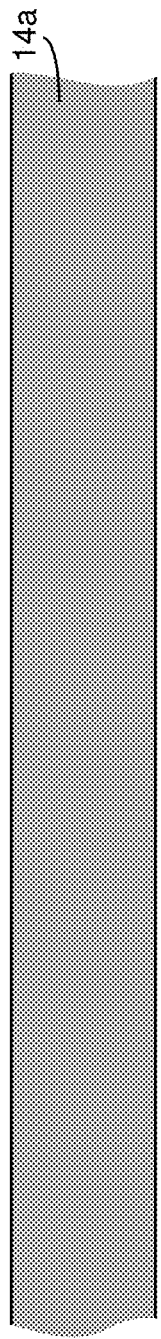
Figure 61B:
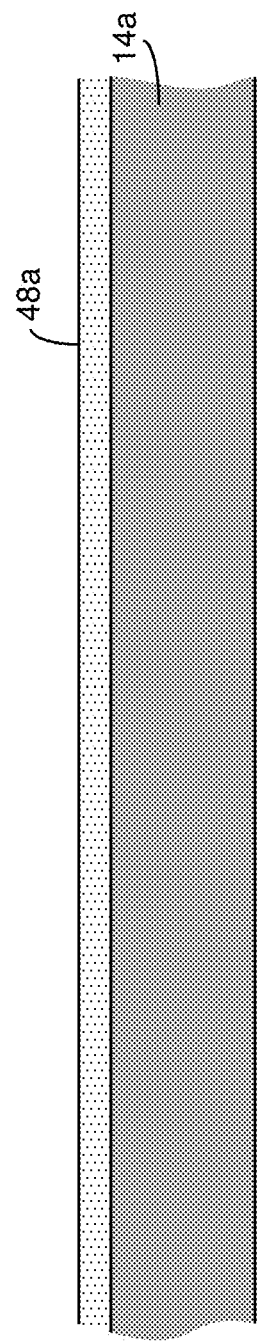
Figure 61E:
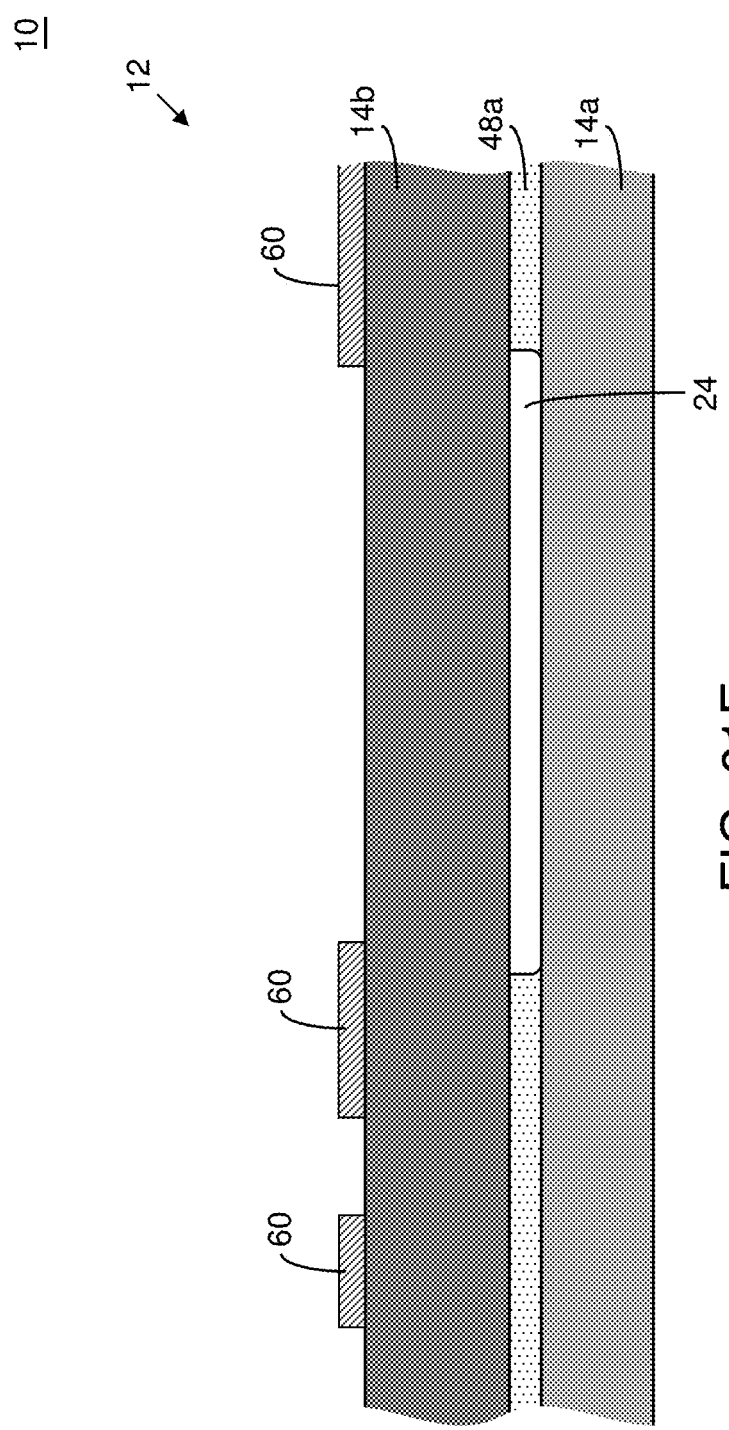
Figure 61F:
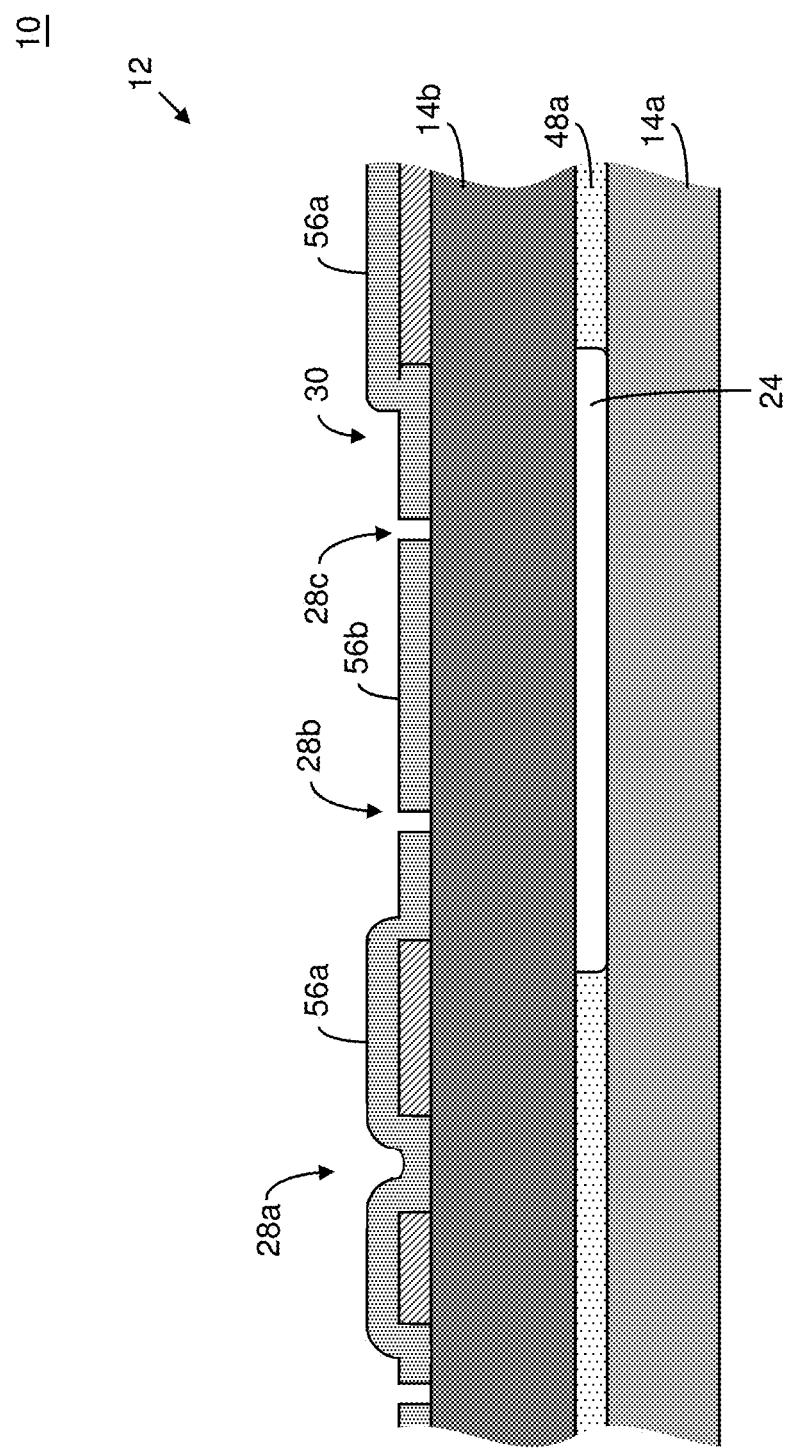
Figure 61G:
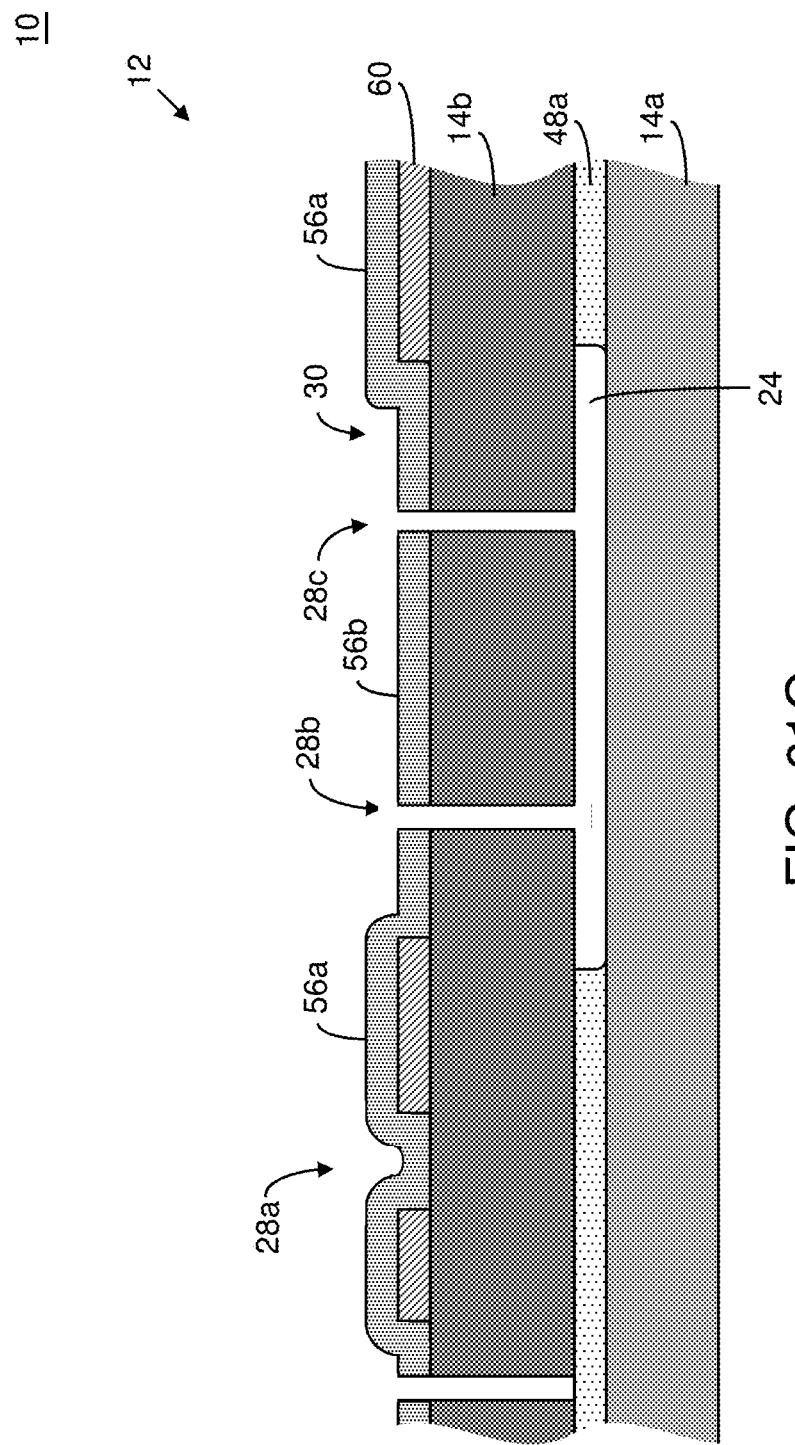
Figure 61H:
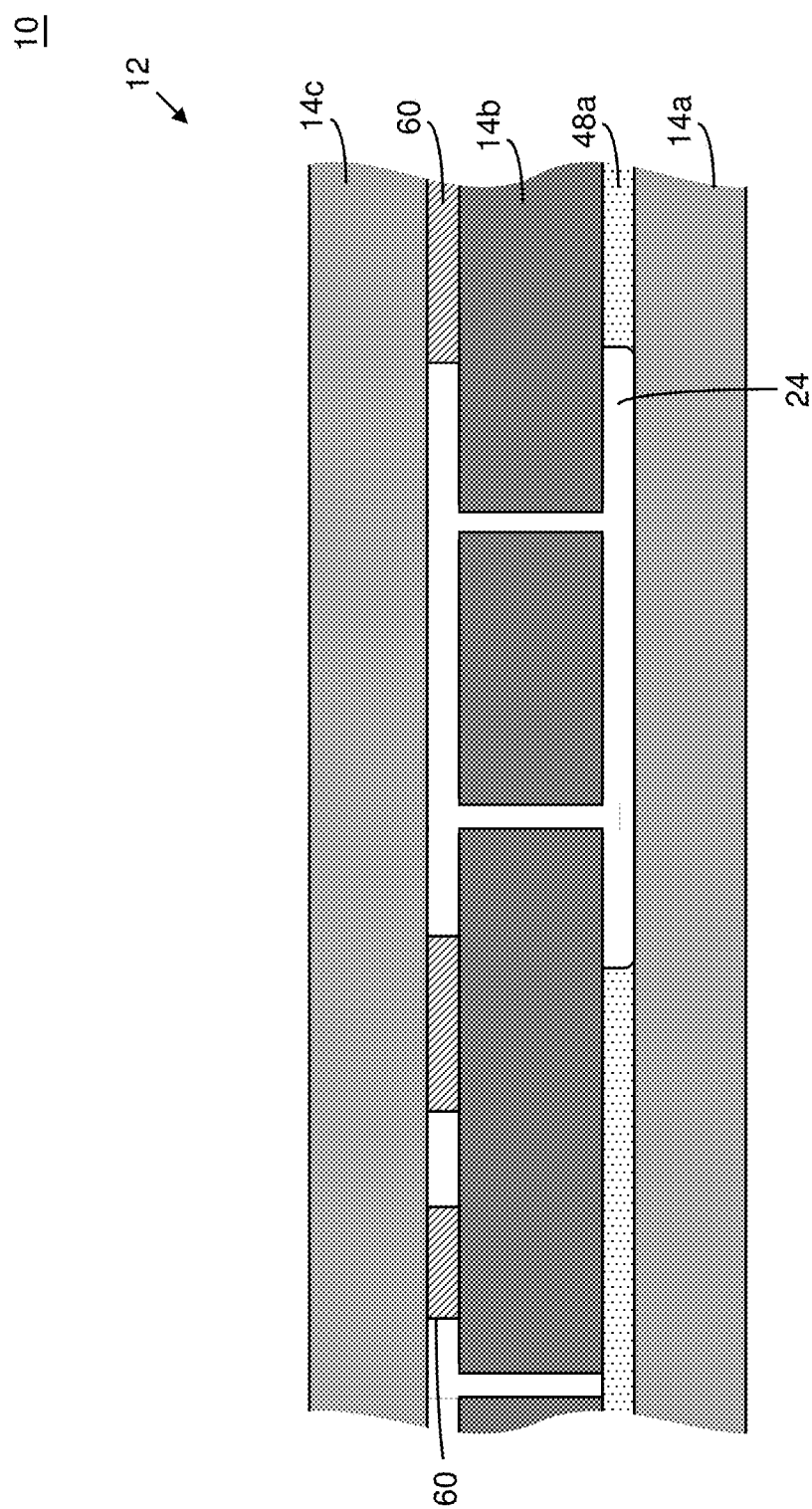
Figure 61I:
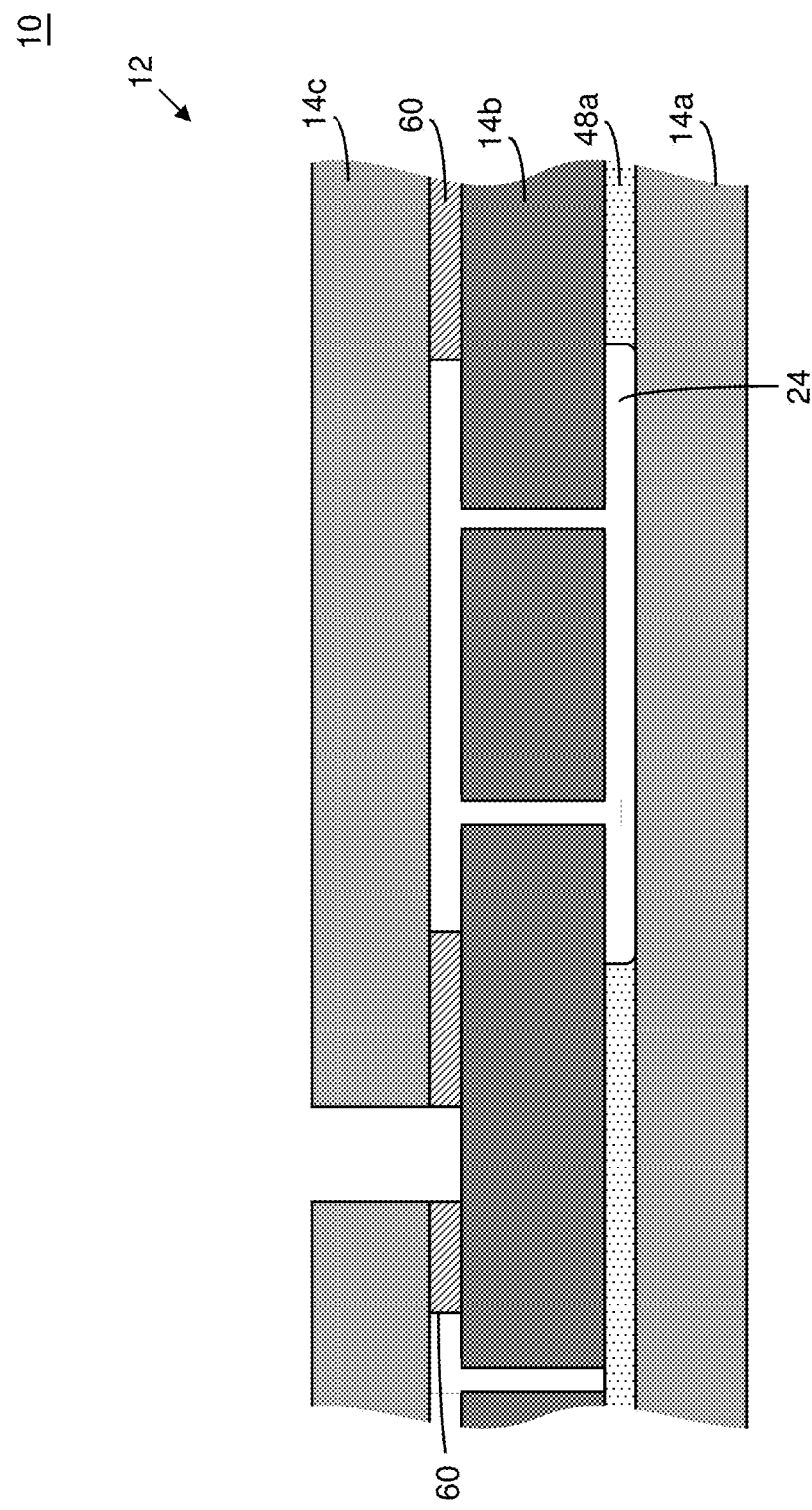
Figure 61J:
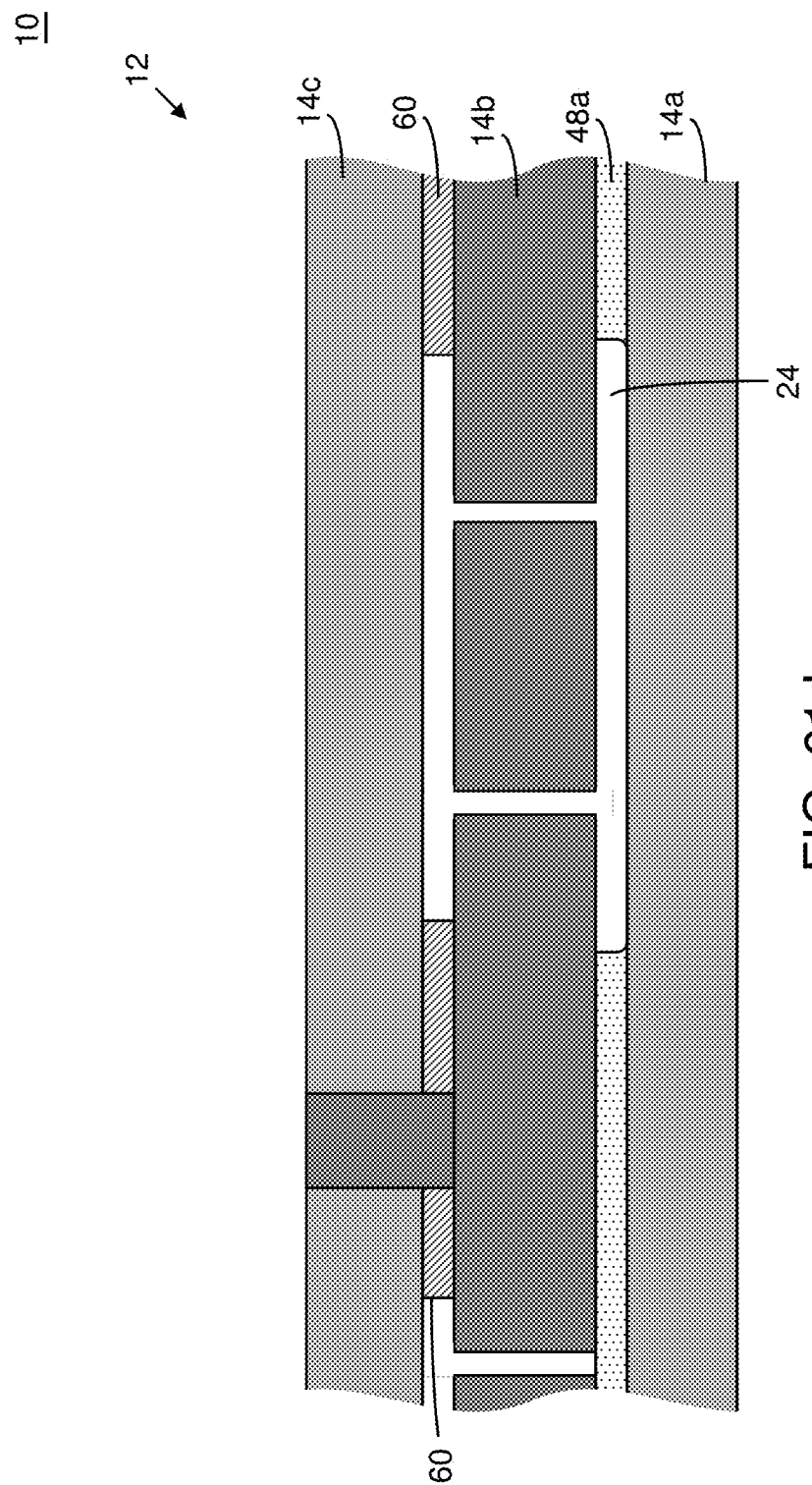
Figure 61K:
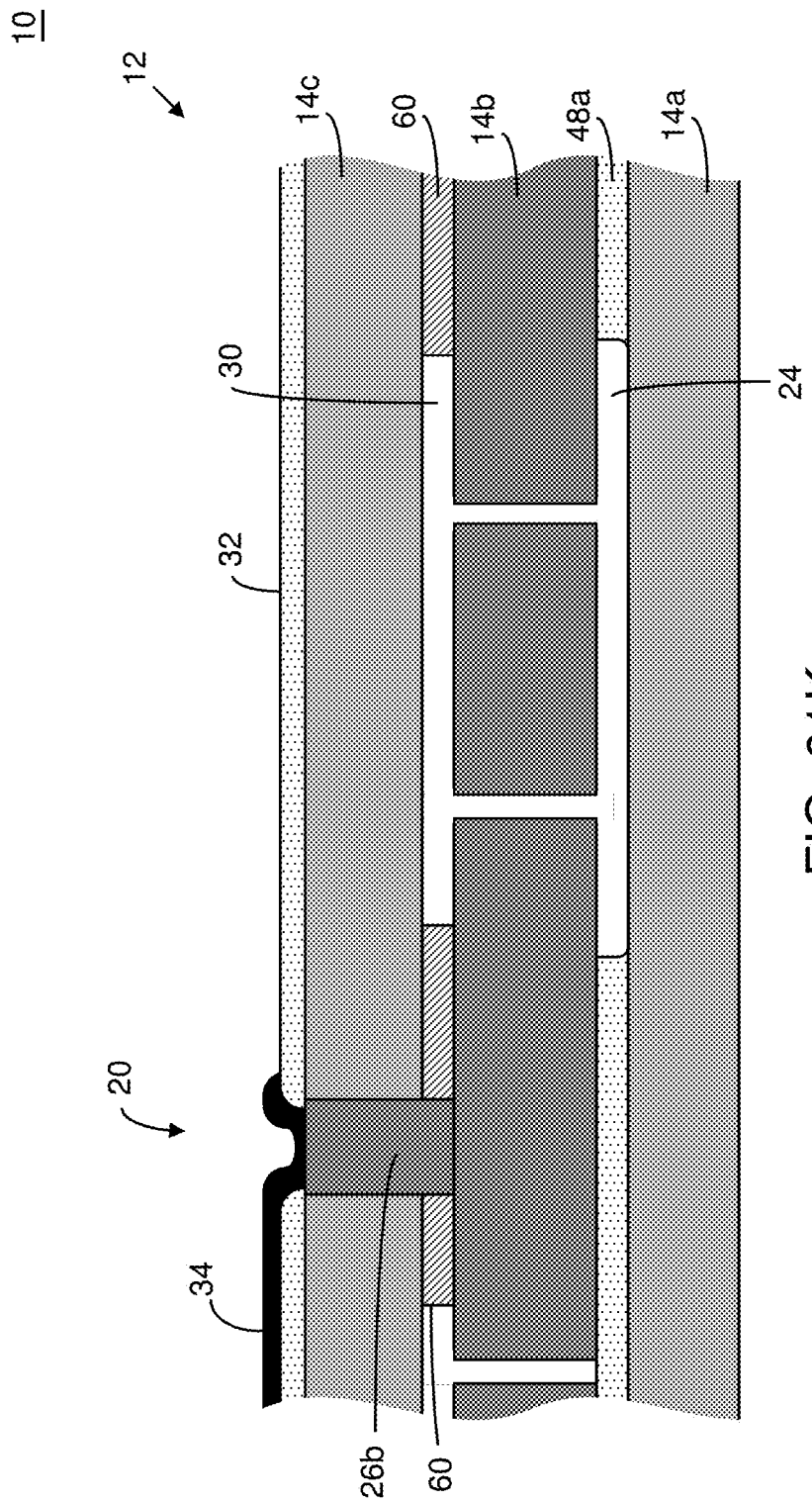
Figure 62:
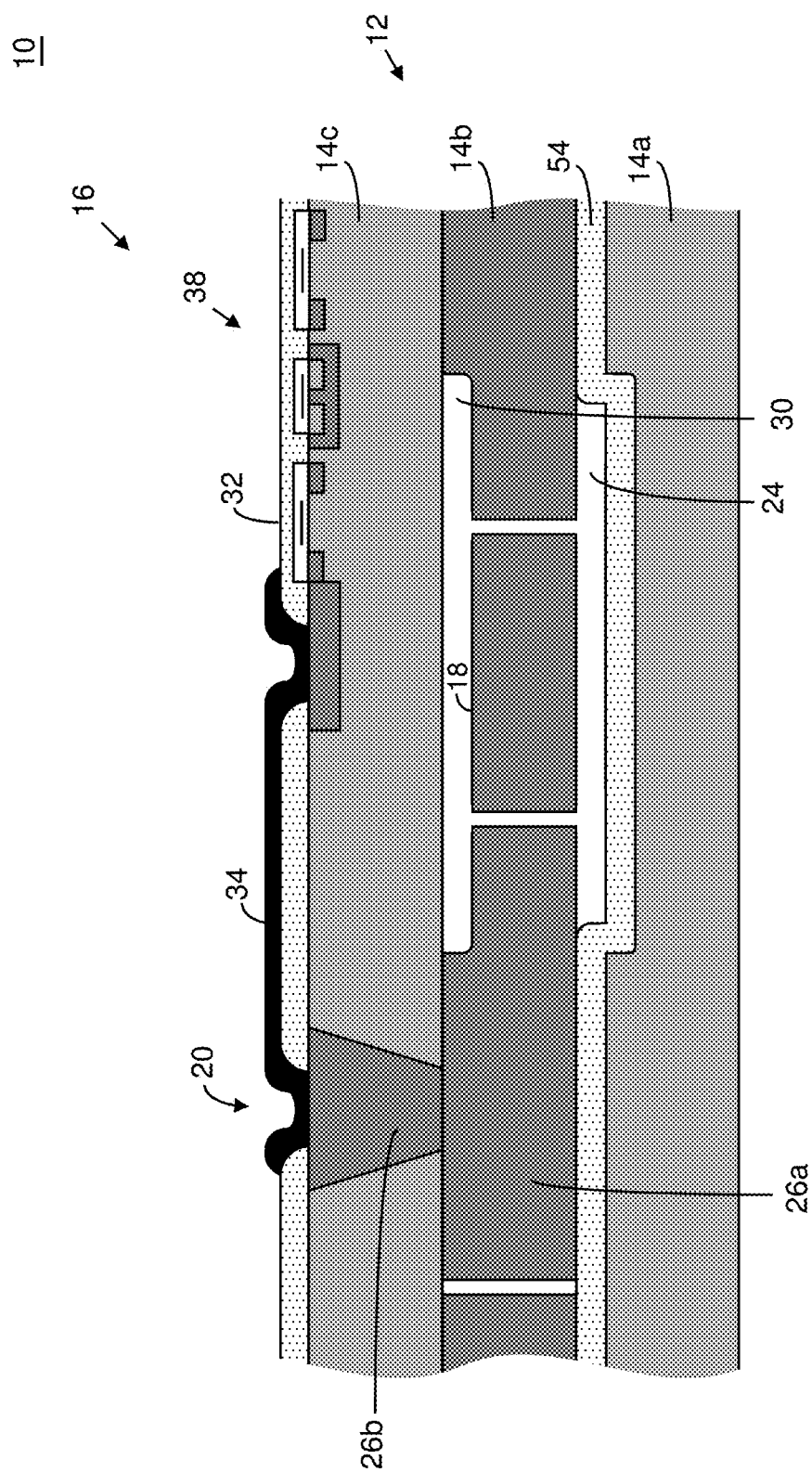
Figure 63:
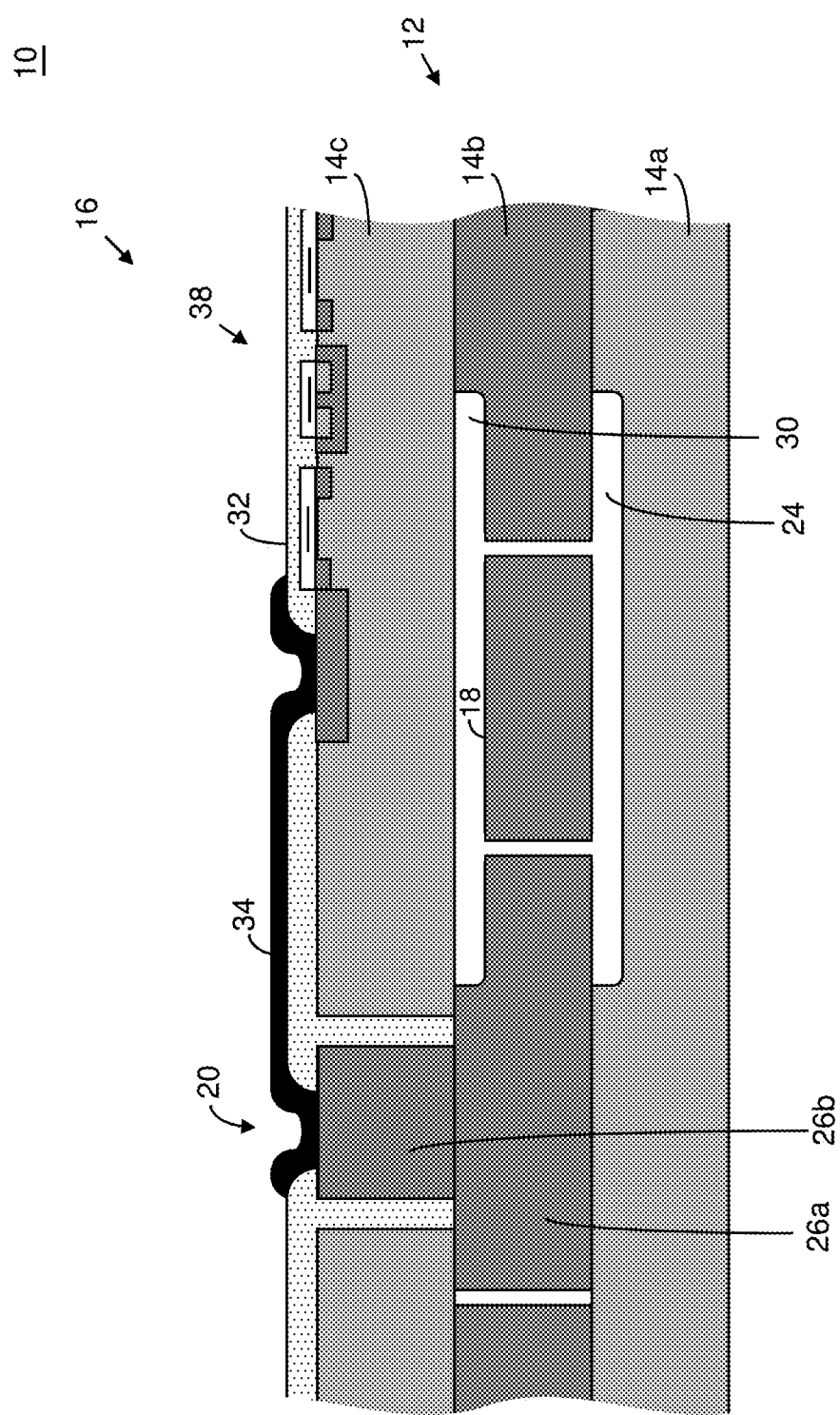
Figure 64:
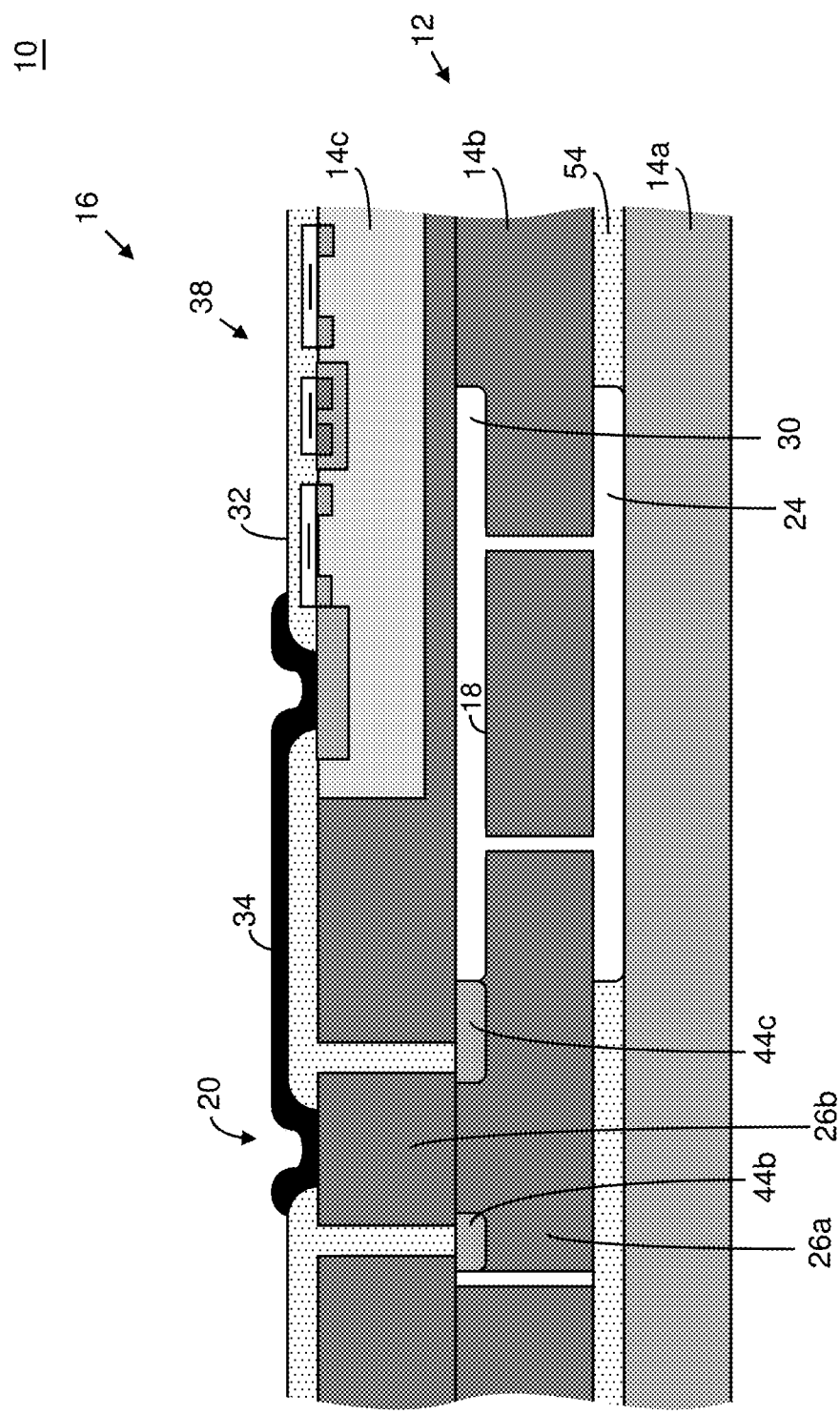
Figure 66A:
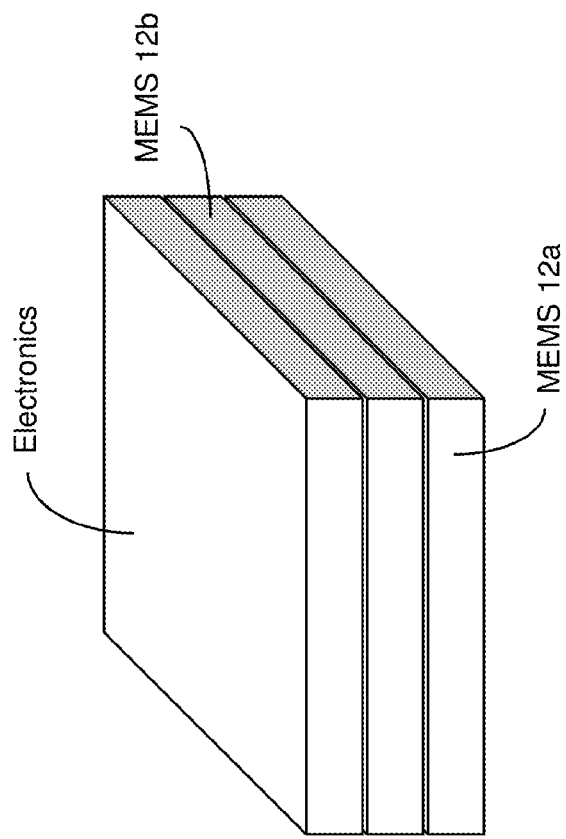
Figure 65:
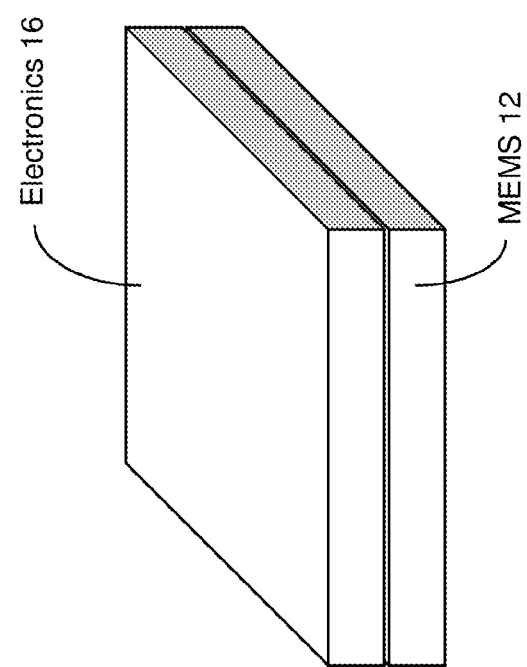
Figures 66D, 66E:
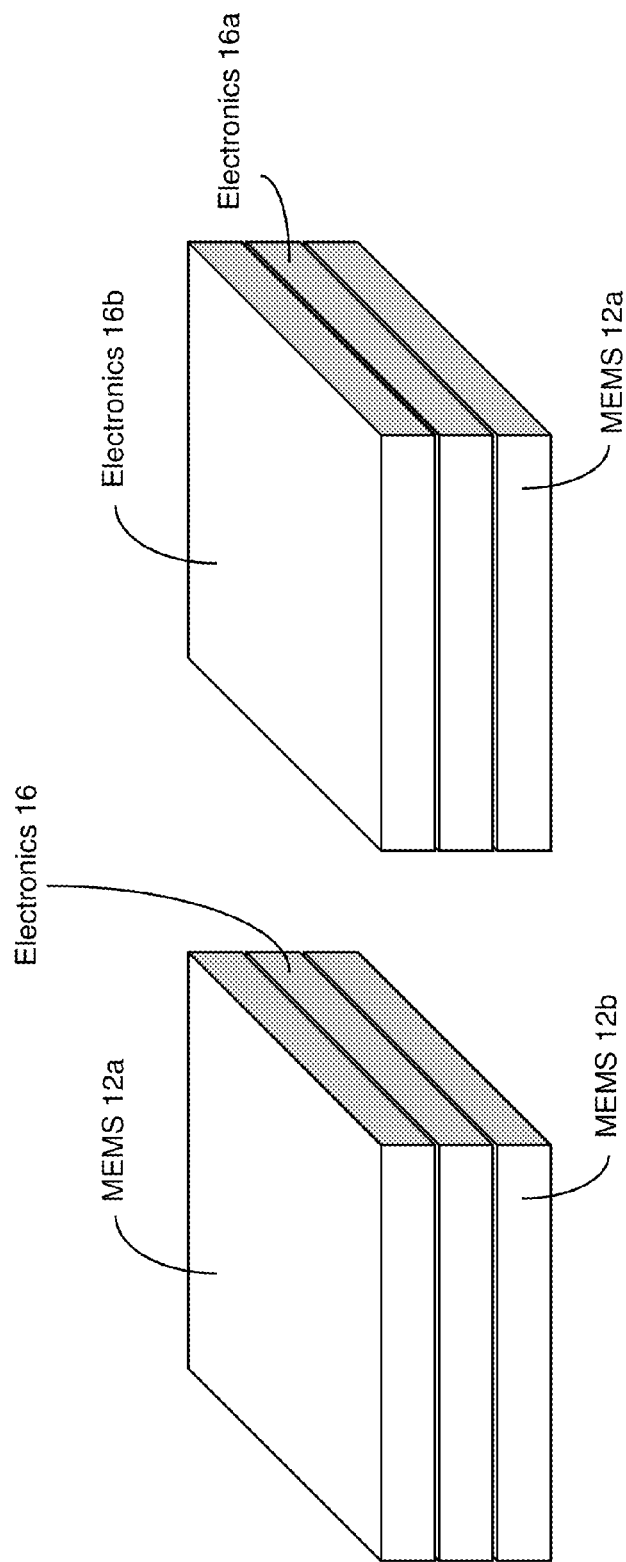
Figure 66F:
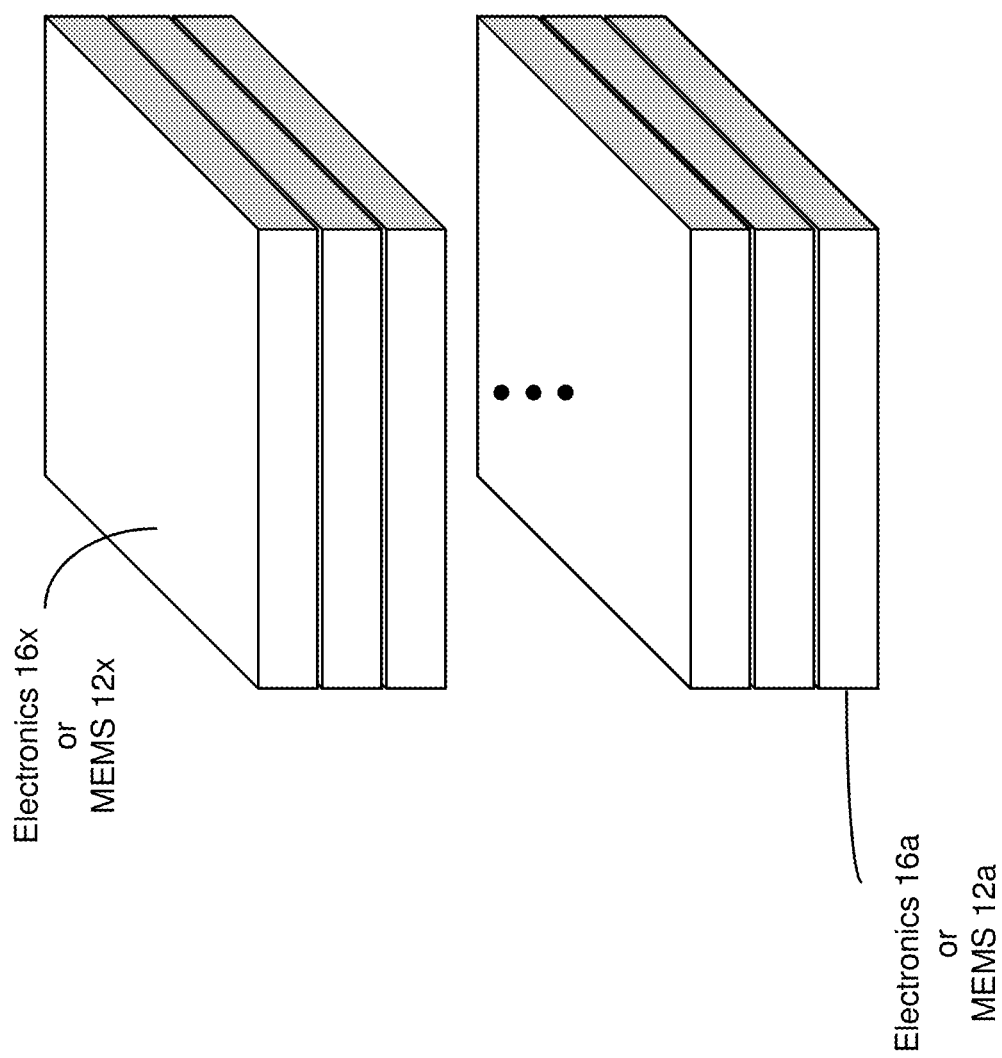

FIG. 9 illustrates a cross-sectional view (sectioned along dotted line A-A' of FIG. 2) of a portion of the moveable electrode, fixed electrode, and the contact of FIG. 2, wherein micromachined mechanical structure of FIG. 2 includes an isolation trench to electrically isolate the contact, in accordance with an exemplary embodiment of the present inventions;

FIGS. 10A-10I illustrate cross-sectional views of the fabrication of the portion of the microelectromechanical system of FIG. 9 at various stages of an exemplary process that employs an encapsulation technique according to certain aspects of the present inventions;

FIG. 11 illustrates a cross-sectional view (sectioned along dotted line A-A' of FIG. 2) of a portion of the moveable electrode, fixed electrode, and the contact of FIG. 2, wherein micromachined mechanical structure of FIG. 2 includes isolation regions and an isolation trench (aligned therewith) to electrically isolate the contact, in accordance with an exemplary embodiment of the present inventions;

FIGS. 12A-12J illustrate cross-sectional views of the fabrication of the portion of the microelectromechanical system of FIG. 11 at various stages of an exemplary process that employs an encapsulation technique according to certain aspects of the present inventions;

FIG. 13A illustrates a cross-sectional view (sectioned along dotted line A-A' of FIG. 2) of a portion of the moveable electrode, fixed electrode, and the contact of FIG. 2, wherein micromachined mechanical structure of FIG. 2 includes isolation regions and an isolation trench (aligned therewith), including an oppositely doped semiconductor (relative to the conductivity of second substrate 14b), to electrically isolate the contact, in accordance with an exemplary embodiment of the present inventions;

FIGS. 13B and 13C illustrate cross-sectional views of the fabrication of the portion of the microelectromechanical system of FIG. 13A at various stages of an exemplary process that employs an encapsulation technique according to certain aspects of the present inventions;

FIG. 14 is a cross-sectional view (sectioned along dotted line A-A' of FIG. 2) of a portion of the moveable electrode, fixed electrode, and the contact of FIG. 2 of an embodiment of the present inventions wherein the microelectromechanical system employs three substrates;

FIGS. 15A-15H illustrate cross-sectional views (sectioned along dotted line A-A' of FIG. 2) of the fabrication of the mechanical structure of FIGS. 2 and 14 at various stages of a process that employs an encapsulation technique according to certain aspects of the present inventions;

FIG. 16 illustrates a cross-sectional view of an embodiment of the fabrication of the microelectromechanical system of FIG. 14 wherein electronic or electrical circuitry (after fabrication) is formed in the third substrate according to certain aspects of the present inventions;

FIG. 17 illustrates a cross-sectional view of an exemplary embodiment of the present inventions of the microelectromechanical system including a plurality of micromachined mechanical structures wherein a first micromachined mechanical structure is formed in the second substrate and a second micromachined mechanical structure is formed in the third substrate wherein a fourth substrate encapsulates one or more of the micromachined mechanical structures according to certain aspects of the present inventions;

FIG. 18 illustrates a cross-sectional view of an exemplary embodiment of the present inventions of the microelectromechanical system including a plurality of micromachined mechanical structures wherein a first micromachined mechanical structure is formed in the second substrate and a second micromachined mechanical structure is formed in the third substrate wherein a fourth substrate encapsulates one or more of the micromachined mechanical structures and includes electronic or electrical circuitry according to certain aspects of the present inventions;

FIG. 19 is a cross-sectional view (sectioned along dotted line A-A' of FIG. 2) of a portion of the moveable electrode, fixed electrode, and the contact of FIG. 2 of an exemplary embodiment of the present inventions wherein the microelectromechanical system employs three substrates and cavities are formed in the first and third substrates;

FIGS. 20A-20H illustrate cross-sectional views (sectioned along dotted line A-A' of FIG. 2) of the fabrication of the mechanical structure of FIGS. 2 and 19 at various stages of an exemplary process that employs an encapsulation technique according to certain aspects of the present inventions;

FIG. 21 illustrates a cross-sectional view (sectioned along dotted line A-A' of FIG. 2) of a portion of the moveable electrode, fixed electrode, and the contact of FIG. 2, wherein the first cavity is formed in the second substrate and a second cavity is formed in a third substrate according to certain aspects of the present inventions;

FIG. 22 illustrates a cross-sectional view (sectioned along dotted line A-A' of FIG. 2) of a portion of the moveable electrode, fixed electrode, and the contact of FIG. 2, wherein the first and second cavities are formed in the second substrate, according to certain aspects of the present inventions;

FIG. 23 is a cross-sectional view (sectioned along dotted line A-A' of FIG. 2) of a portion of the moveable electrode, fixed electrode, and the contact of FIG. 2 of an exemplary embodiment of the present inventions wherein the microelectromechanical system employs three substrates and the second and third substrates include the same conductivity types;

FIGS. 24A-24I illustrate cross-sectional views of the fabrication of the portion of the microelectromechanical system of FIG. 23 at various stages of an exemplary process that employs an encapsulation technique according to certain aspects of the present inventions;

FIG. 25 is a cross-sectional view (sectioned along dotted line A-A' of FIG. 2) of a portion of the moveable electrode, fixed electrode, and the contact of FIG. 2 of an exemplary embodiment of the present inventions wherein the microelectromechanical system employs three substrates and the first and second substrates include the same conductivity types;

FIGS. 26A-26H illustrate cross-sectional views of the fabrication of the portion of the microelectromechanical system of FIG. 25 at various stages of an exemplary process that employs an encapsulation technique according to certain aspects of the present inventions;

FIG. 27 is a cross-sectional view (sectioned along dotted line A-A' of FIG. 2) of a portion of the moveable electrode, fixed electrode, and the contact of FIG. 2 of an exemplary embodiment of the present inventions wherein the microelectromechanical system employs three substrates which include the same conductivity types;

FIGS. 28A-28I illustrate cross-sectional views of the fabrication of the portion of the microelectromechanical system of FIG. 27 at various stages of an exemplary process that employs an encapsulation technique according to certain aspects of the present inventions;

FIG. 29 is a cross-sectional view (sectioned along dotted line A-A' of FIG. 2) of a portion of the moveable electrode, fixed electrode, and the contact of FIG. 2 of an exemplary embodiment of the present inventions wherein the microelectromechanical system employs three substrates which include the same conductivity types;

FIGS. 30A-30I illustrate cross-sectional views of the fabrication of the portion of the microelectromechanical system of FIG. 29 at various stages of an exemplary process that employs an encapsulation technique according to certain aspects of the present inventions;

FIGS. 31A-31D illustrate cross-sectional views of the fabrication of the portion of the microelectromechanical system of FIG. 27 at various stages of an exemplary process that employs grinding and/or polishing to provide a desired surface, according to certain aspects of the present inventions;

FIG. 32 is a cross-sectional view (sectioned along dotted line A-A' of FIG. 2) of a portion of the moveable electrode, fixed electrode, and the contact of FIG. 2 of an exemplary embodiment of the present inventions wherein the microelectromechanical system employs three substrates;

FIGS. 33A-33I illustrate cross-sectional views of the fabrication of the portion of the microelectromechanical system of FIG. 32 at various stages of an exemplary process that employs an encapsulation technique according to certain aspects of the present inventions;

FIG. 34 is a cross-sectional view (sectioned along dotted line A-A' of FIG. 2) of a portion of the moveable electrode, fixed electrode, and the contact of FIG. 2 of an exemplary embodiment of the present inventions wherein the microelectromechanical system employs three substrates wherein an insulative layer is disposed between each of the substrates;

FIGS. 35A-35L illustrate cross-sectional views of the fabrication of the portion of the microelectromechanical system of FIG. 34 at various stages of an exemplary process that employs an encapsulation technique according to certain aspects of the present inventions;

FIG. 36 is a cross-sectional view (sectioned along dotted line A-A' of FIG. 2) of a portion of the moveable electrode, fixed electrode, and the contact of FIG. 2 of an exemplary embodiment of the present inventions wherein the microelectromechanical system employs three substrates wherein an insulative layer is disposed between two of the substrates;

FIGS. 37A-37I illustrate cross-sectional views of the fabrication of the portion of the microelectromechanical system of FIG. 36 at various stages of an exemplary process that employs an encapsulation technique according to certain aspects of the present inventions;

FIG. 38 is a cross-sectional view (sectioned along dotted line A-A' of FIG. 2) of a portion of the moveable electrode, fixed electrode, and the contact of FIG. 2 of an exemplary embodiment of the present inventions wherein the microelectromechanical system employs three substrates wherein an insulative layer is disposed between two of the substrates and isolation trenches and regions electrically isolate the contact;

FIGS. 39A-39K illustrate cross-sectional views of the fabrication of the portion of the microelectromechanical system of FIG. 38 at various stages of an exemplary process that employs an encapsulation technique according to certain aspects of the present inventions;

FIG. 40 is a cross-sectional view (sectioned along dotted line A-A' of FIG. 2) of a portion of the moveable electrode, fixed electrode, and the contact of FIG. 2 of an exemplary embodiment of the present inventions wherein the microelectromechanical system employs three substrates wherein an intermediate layer (for example, a native oxide layer) is disposed between two of the substrates;

FIGS. 41A-41H illustrate cross-sectional views of the fabrication of the portion of the microelectromechanical system of FIG. 40 at various stages of an exemplary process that employs an encapsulation technique according to certain aspects of the present inventions;

FIGS. 42A and 42B are cross-sectional views (sectioned along dotted line A-A' of FIG. 2) of a portion of the moveable electrode, fixed electrode, and the contact of FIG. 2 of exemplary embodiments of the present inventions wherein the microelectromechanical system employs three substrates wherein an intermediate layer (for example, a native oxide layer) is disposed (for example, deposited or grown) between two of the substrates;

FIGS. 43A-43K illustrate cross-sectional views of the fabrication of the portion of the microelectromechanical systems of FIGS. 42A and 42B at various stages of an exemplary process that employs an encapsulation technique according to certain aspects of the present inventions;

FIG. 44 is a cross-sectional view (sectioned along dotted line A-A' of FIG. 2) of a portion of the moveable electrode, fixed electrode, and the contact of FIG. 2 of an exemplary embodiment of the present inventions wherein the microelectromechanical system employs three substrates and the processing techniques include alternative processing margins;

FIGS. 45A-45I illustrate cross-sectional views of the fabrication of the portion of the microelectromechanical system of FIG. 44 at various stages of an exemplary process that employs an encapsulation technique according to certain aspects of the present inventions;

FIG. 46A is a cross-sectional view (sectioned along dotted line A-A' of FIG. 2) of a portion of the moveable electrode, fixed electrode, and the contact of FIG. 2 of an exemplary embodiment of the present inventions wherein the microelectromechanical system employs three substrates and the processing techniques include alternative processing margins wherein the isolation trenches include an over etch;

FIG. 46B is a cross-sectional view (sectioned along dotted line A-A' of FIG. 2) of a portion of the moveable electrode, fixed electrode, and the contact of FIG. 2 of an exemplary embodiment of the present inventions wherein the microelectromechanical system employs three substrates and a selected trench includes alternative processing margins;

FIGS. 47A-47D and 48A-48C are cross-sectional view (sectioned along dotted line A-A' of FIG. 2) of a portion of the moveable electrode, fixed electrode, and the contact of FIG. 2 of an embodiment of the present inventions having alternative exemplary processing techniques, flows and orders thereof;

FIGS. 49A-49G, 50A-50G and 51A-51J are cross-sectional views (sectioned along dotted line A-A' of FIG. 2) of a portion of the moveable electrode, fixed electrode, and the contact of FIG. 2 of exemplary embodiments of the present inventions having alternative processing techniques, flows and orders thereof relative to one or more of substrates;

FIG. 52 is a cross-sectional view (sectioned along dotted line A-A' of FIG. 2) of a portion of the moveable electrode, fixed electrode, and the contact of FIG. 2 of an exemplary embodiment of the present inventions wherein the microelectromechanical system employs three substrates wherein isolation regions are implanted in a cover substrate to electrically isolate the contact;

FIGS. 53A-53H illustrate cross-sectional views of the fabrication of the portion of the microelectromechanical system of FIG. 52 at various stages of an exemplary process that employs an encapsulation technique according to certain aspects of the present inventions;

FIG. 54 is a cross-sectional view (sectioned along dotted line A-A' of FIG. 2) of a portion of the moveable electrode, fixed electrode, and the contact of FIG. 2 of an exemplary embodiment of the present inventions wherein the microelectromechanical system employs three substrates wherein isolation regions include an insulation material (for example, a silicon nitride or silicon dioxide);

FIGS. 55A-55K illustrate cross-sectional views of the fabrication of the portion of the microelectromechanical system of FIG. 54 at various stages of an exemplary process that employs an encapsulation technique according to certain aspects of the present inventions;

FIG. 56 is a cross-sectional view (sectioned along dotted line A-A' of FIG. 2) of a portion of the moveable electrode, fixed electrode, and the contact of FIG. 2 of an exemplary embodiment of the present inventions wherein a contact area is etched and formed in one of the "cover" substrate to provide for electrical conductivity with the an underlying contact area;

FIGS. 57A-57J illustrate cross-sectional views of an exemplary flow of the fabrication of the portion of the microelectromechanical system of FIG. 56 at various stages of an exemplary process that employs an encapsulation technique according to certain aspects of the present inventions;

FIG. 58 is a cross-sectional view (sectioned along dotted line A-A' of FIG. 2) of a portion of the moveable electrode, fixed electrode, and the contact of FIG. 2 of an exemplary embodiment of the present inventions wherein bonding material and/or a bonding facilitator material is employed between substrates;

FIGS. 59A-59J illustrate cross-sectional views of the fabrication of the portion of the microelectromechanical system of FIG. 58 at various stages of an exemplary process that employs an encapsulation technique according to certain aspects of the present inventions;

FIG. 60 is a cross-sectional view (sectioned along dotted line A-A' of FIG. 2) of a portion of the moveable electrode, fixed electrode, and the contact of FIG. 2 of another exemplary embodiment of the present inventions wherein bonding material and/or a bonding facilitator material is employed between substrates;

FIGS. 61A-61K illustrate cross-sectional views of the fabrication of the portion of the microelectromechanical system of FIG. 58 at various stages of an exemplary process that employs an encapsulation technique according to certain aspects of the present inventions;

FIGS. 62-64 illustrates cross-sectional views of several embodiments of the fabrication of microelectromechanical systems of the present inventions wherein the microelectromechanical systems include electronic or electrical circuitry formed in a substrate, according to certain aspects of the present inventions; and FIGS. 65 and 66A-66F are block diagram illustrations of various embodiments of the microelectromechanical systems of the present inventions wherein the microelectromechanical systems includes at least three substrates wherein one or more substrates include one or more micromachined mechanical structures and/or electronic or electrical circuitry, according to certain aspects of the present inventions.

DETAILED DESCRIPTION

There are many inventions described and illustrated herein. In one aspect, the present inventions relate to devices, systems and/or methods of encapsulating and fabricating electromechanical structures or elements, for example, accelerometer, gyroscope or other transducer (for example, pressure sensor, strain sensor, tactile sensor, magnetic sensor and/or temperature sensor), filter or resonator The fabricating or manufacturing microelectromechanical systems of the present invention, and the systems manufactured thereby, employ wafer bonding encapsulation techniques.

With reference to FIGS. 1A, 1B and 2, in one exemplary embodiment, microelectromechanical device 10 includes micromachined mechanical structure 12 that is disposed on substrate 14, for example, a semiconductor, a glass, or an insulator material. The microelectromechanical device 10 may include electronics or electrical circuitry 16 (hereinafter collectively "circuitry 16") to, for example, drive mechanical structure 12, sense information from mechanical structure 12, process or analyze information generated by, and/or control or monitor the operation of micromachined mechanical structure 12. In addition, circuitry 16 (for example, CMOS circuitry) may generate clock signals using, for example, an output signal of micromachined mechanical structure 12, which may be a resonator type electromechanical structure. Under these circumstances, circuitry 16 may include frequency and/or phase compensation circuitry (hereinafter "compensation circuitry 18"), which receives the output of the resonator and adjusts, compensates, corrects and/or controls the frequency and/or phase of the output of resonator. In this regard, compensation circuitry uses the output of resonator to provide an adjusted, corrected, compensated and/or controlled output having, for example, a desired, selected and/or predetermined frequency and/or phase.

Notably, circuitry 16 may include interface circuitry to provide information (from, for example, micromachined mechanical structure 12) to an external device (not illustrated), for example, a computer, indicator/display and/or sensor.

With continued reference to FIGS. 1A, 1B and 2, micromachined mechanical structure 12 may include and/or be fabricated from, for example, materials in column IV of the periodic table, for example silicon, germanium, carbon; also combinations of these, for example silicon germanium, or silicon carbide; also of III-V compounds for example gallium phosphide, aluminum gallium phosphide, or other III-V combinations; also combinations of III, IV, V, or VI materials, for example silicon nitride, silicon oxide, aluminum carbide, or aluminum oxide; also metallic silicides, germanides, and carbides, for example nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

As mentioned above, micromachined mechanical structure 12 illustrated in FIG. 2 may be a portion of an accelerometer, gyroscope or other transducer (for example, pressure sensor, strain sensor, tactile sensor, magnetic sensor and/or temperature sensor), filter or resonator. The micromachined mechanical structure 12 may also include mechanical structures of a plurality of transducers or sensors including one or more accelerometers, gyroscopes, pressure sensors, tactile sensors and temperature sensors. In the illustrated embodiment, micromachined mechanical structure 12 include moveable electrode 18.

With continued reference to FIG. 2, micromachined mechanical structure 12 may also include contact 20 disposed on or in substrate 14a. The contact 20 may provide an electrical path between micromachined mechanical structure 12 and circuitry 16 and/or an external device (not illustrated). The contact 20 may include and/or be fabricated from, for example, a semiconductor or conductive material, including, for example, silicon, (whether doped or undoped), germanium, silicon/germanium, silicon carbide, and gallium arsenide, and combinations and/or permutations thereof. Notably, micromachined mechanical structure 12 and circuitry 16 may include multiple contacts 20.

In one embodiment, the present inventions employ two or more substrates to form and encapsulate micromachined mechanical structure 12. For example, with reference to FIG. 3, in one embodiment, microelectromechanical system 10 includes semiconductor on insulator ("SOI") substrate 14a and cover substrate 14b. Briefly, by way of overview, in this embodiment, micromachined mechanical structure 12 (including moveable electrode 18 and contact 20) is formed in or on SOT substrate 14a and encapsulated via cover substrate 14b. In this regard, micromachined mechanical structure 12 is formed in the semiconductor portion of SOT substrate 14a that resides on the insulator portion of SOT substrate 14a. Thereafter, substrate 14b is secured (for example, bonded) to the exposed surface of the semiconductor portion of SOT substrate 14a to encapsulate micromachined mechanical structure 12.

In particular, with reference to FIG. 4A, microelectromechanical system 10 is formed in or on SOI substrate 14a. The SOI substrate 14a may include first substrate layer 22a (for example, a semiconductor (such as silicon), glass or sapphire), insulation layer 22b (for example, a silicon dioxide or silicon nitride layer) and first semiconductor layer 22c (for example, a materials in column IV of the periodic table, for example silicon, germanium, carbon, as well as combinations of such materials, for example silicon germanium, or silicon carbide). In one embodiment, SOI substrate 14a is a SIMOX wafer. Where SOI substrate 36 is a SIMOX wafer, such wafer may be fabricated using well-known techniques including those disclosed, mentioned or referenced in U.S. Pat. Nos. 5,053,627; 5,080,730; 5,196,355; 5,288,650; 6,248,642; 6,417,078; 6,423,975; and 6,433,342 and U.S. Published Patent Applications 2002/0081824 and 2002/0123211, the contents of which are hereby incorporated by reference.

In another embodiment, SOI substrate 14a may be a conventional SOI wafer having a relatively thin semiconductor layer 22c. In this regard, SOI substrate 36 having a relatively thin semiconductor layer 22c may be fabricated using a bulk silicon wafer which is implanted and oxidized by oxygen to thereby form a relatively thin silicon dioxide layer 22b on a monocrystalline wafer surface 22a. Thereafter, another wafer (illustrated as layer 22c) is bonded to layer 22b. In this exemplary embodiment, semiconductor layer 22c (i.e., monocrystalline silicon) is disposed on insulation layer 22b (i.e. silicon dioxide), having a thickness of approximately 350 nm, which is disposed on a first substrate layer 22a (for example, monocrystalline silicon), having a thickness of approximately 190 nm.

Notably, all techniques for providing or fabricating SOI substrate 14a, whether now known or later developed, are intended to be within the scope of the present inventions.

With reference to FIGS. 4A and 4B, an exemplary method of fabricating or forming micromachined mechanical structure 12 according to this embodiment of the present inventions may begin with forming first cavity 24 in semiconductor layer 22c using well-known lithographic and etching techniques. In this way, a selected portion of semiconductor layer 22c (for example, 1 µm) is removed to form first cavity 24 (which forms a portion of the chamber in which the mechanical structure, for example, moveable electrode 18, resides).

Figure 4C:
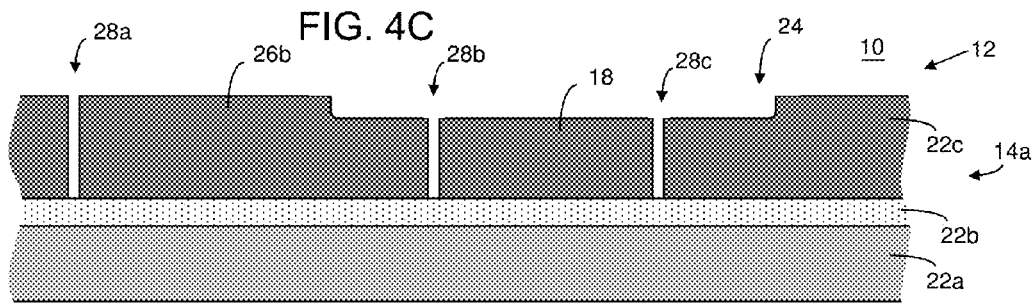
Figure 4D:
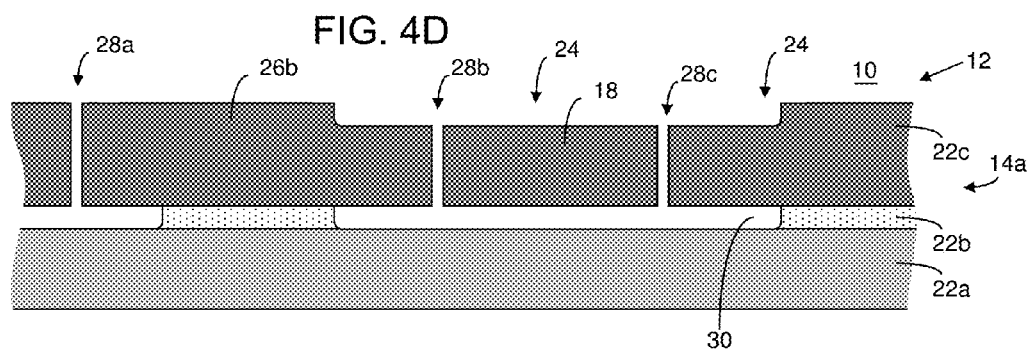

With reference to FIGS. 4C and 4D, thereafter, moveable electrode 18 and contact area 26 are formed in semiconductor layer 22c and moveable electrode 18 is "released" from insulation layer 22b. In this regard, trenches 28a-c are formed in semiconductor layer 22c to define moveable electrode 18 and contact area 26 therefrom. (See, FIG. 4C). The trenches 28a-c may be formed using well-known deposition and lithographic techniques. Notably, all techniques for forming or fabricating trenches 28a-c, whether now known or later developed, are intended to be within the scope of the present inventions.

After moveable electrode 18 is defined via trenches 28b and 28c, moveable electrode 18 may be "released" by etching portions of insulation layer 22b that are disposed under moveable electrode 18. For example, in one embodiment, where insulation layer 22b is comprised of silicon dioxide, selected portions may be removed/etched using well-known wet etching techniques and buffered HF mixtures (i.e., a buffered oxide etch) or well-known vapor etching techniques using vapor HF. The trenches 28b and 28c, in addition to defining the features of moveable electrode 18, may also permit etching and/or removal of at least selected portions of insulation layer 22b thereby providing a void or cavity 30 beneath moveable electrode 18. (See, FIG. 4D). Proper design of mechanical structures 12 (and in particular moveable electrode 18) and control of the HF etching process parameters may permit insulation layer 22b to be sufficiently removed or etched to release moveable electrode 18 and permit proper operation of micromachined mechanical structure 12 and microelectromechanical system 10. Notably, cavities 24 and 30 form the chamber in which the mechanical structure, for example, moveable electrode 18, resides.

Figure 4E:
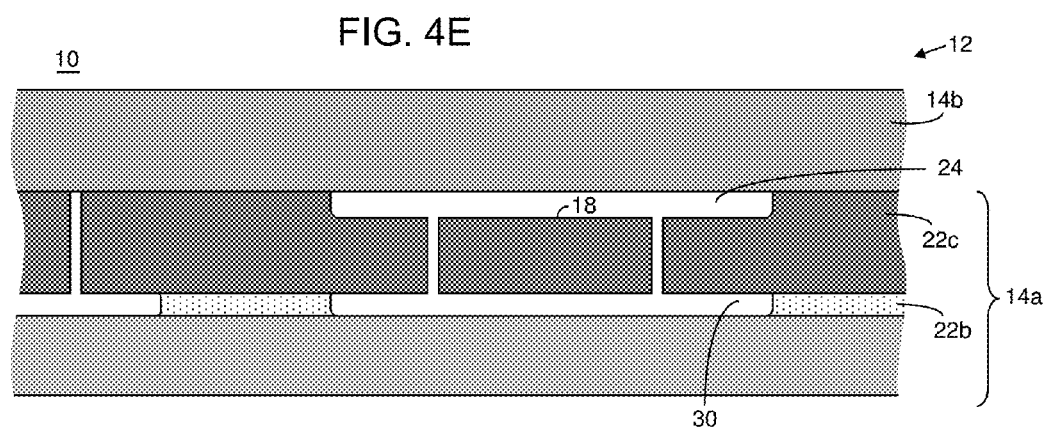

With reference to FIG. 4E, second substrate 14b may be fixed to the exposed portion(s) of semiconductor layer 22c. The second substrate 14b may be secured to the exposed portion(s) of semiconductor layer 22c using, for example, well-known bonding techniques such as fusion bonding, anodic-like bonding and/or silicon direct bonding. Other bonding technologies are suitable including soldering (for example, eutectic soldering), thermo compression bonding, thermo-sonic bonding, laser bonding and/or glass reflow, and/or combinations thereof. Indeed, all forms of bonding, whether now known or later developed, are intended to fall within the scope of the present invention.

In conjunction with securing second substrate 14b to the exposed portion(s) of semiconductor layer 22c, the atmosphere (including its characteristics) in which moveable electrode 18 operates may also be defined. In this regard, the chamber in which the moveable electrode 18 reside may be defined when second substrate 14b is secured and/or fixed to the exposed portion(s) of semiconductor layer 22c or after further processing (for example, an annealing step may be employed to adjust the pressure). Notably, all techniques of defining the atmosphere, including the pressure thereof, during the process of securing second substrate 14b to semiconductor layer 22c, whether now known or later developed, are intended to be within the scope of the present inventions.

For example, second substrate 14b may be secured to the exposed portion(s) of semiconductor layer 22c in a nitrogen, oxygen and/or inert gas environment (for example, helium). The pressure of the fluid (gas or vapor) may be selected, defined and/or controlled to provide a suitable and/or predetermined pressure of the fluid in the chamber immediately after fixing substrate 14b to the exposed portion(s) of semiconductor layer 22c (in order to avoid damaging portions of micromachined mechanical structure 12), after one or more subsequent processing steps (for example, an annealing step) and/or after completion of micromachined mechanical structure 12 and/or microelectromechanical system 10.

Notably, the gas(es) employed during these processes may provide predetermined reactions (for example, oxygen molecules may react with silicon to provide a silicon oxide). All such techniques are intended to fall within the scope of the present inventions.

The second substrate 14b may be formed from any material now known or later developed. In a preferred embodiment, second substrate 14b includes or is formed from, for example, materials in column IV of the periodic table, for example silicon, germanium, carbon; also combinations of these, for example silicon germanium, or silicon carbide; also of III-V compounds for example gallium phosphide, aluminum gallium phosphide, or other III-V combinations; also combinations of III, IV, V, or VI materials, for example silicon nitride, silicon oxide, aluminum carbide, or aluminum oxide; also metallic silicides, germanides, and carbides, for example nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

Figure 4F:
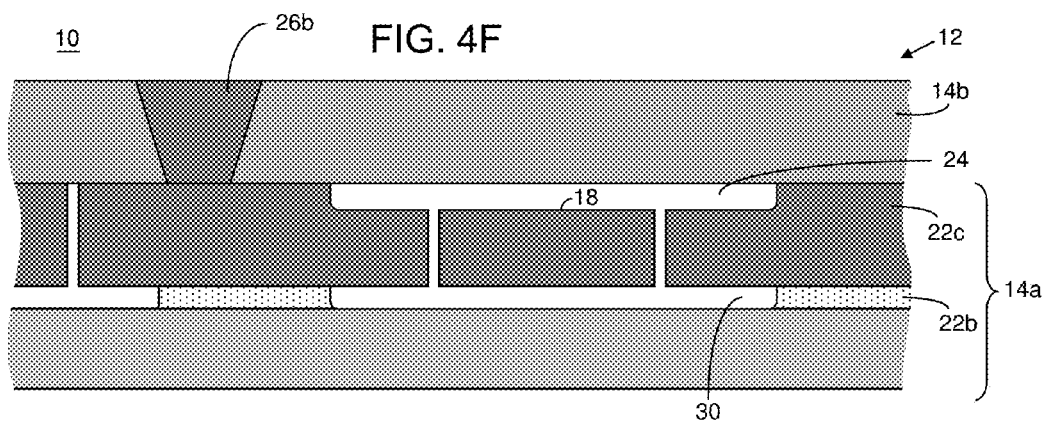

Before or after second substrate 14b is secured to the exposed portion(s) of semiconductor layer 22c, contact area 26b may be formed in a portion of second substrate 14b to be aligned with, connect to or overlie contact area 26a in order to provide suitable, desired and/or predetermined electrical conductivity (for example, N-type or P-type) with contact area 26a when second substrate 14b is secured to first substrate 14a. (See, FIG. 4F). The contact area 26b may be formed in second substrate 14b using well-known lithographic and doping techniques. In this way, contact area 26b may be a highly doped region of second substrate 14b which provides enhanced electrical conductivity with contact area 26a.

Notably, contact area 26b may be a counter-doped region or heavily counter-doped region of second substrate 14b which includes a conductivity that is different from the conductivity of the other portions of second substrate 14b. In this way, contact areas 26a and 26b are electrically isolated from the other portions of second substrate 14b. Thus, in this embodiment, semiconductor layer 22c may be a first conductivity type (for example, an N-type conductivity which may be provided, for example, via introduction of phosphorous and/or arsenic dopant(s), among others) and second substrate 14b may be a second conductivity type (for example, a P-type conductivity which may be provided, for example, via introduction of boron dopant(s), among others). As such, contact area 26b may be a counter-doped region or heavily counter-doped N-type region which provides suitable, desired and/or predetermined electrical conductivity characteristics when second substrate 14b is secured to first substrate 14a and contact areas 26a and 26b are in physical and electrical contact.

With reference to FIG. 4G, microelectromechanical system 10 may be completed by depositing, forming and/or growing insulation layer 32 and a contact opening may be etched to facilitate electrical contact/connection to contact area 26b, via conductive layer 34 (for example, a heavily doped polysilicon, metal (such as aluminum, chromium, gold, silver, molybdenum, platinum, palladium, tungsten, titanium, and/or copper), metal stacks, complex metals and/or complex metal stacks) may then be deposited (and/or formed) to provide the appropriate electrical connection to contact areas 26 (which includes, in this example, contacts areas 26a and 26b).

Notably, insulation layer 32 and/or conductive layer 34 may be formed, grown and/or deposited before or after second substrate 14b is secured to the exposed portion(s) of semiconductor layer 22c. Under these circumstances, when second substrate 14b is secured to first substrate 14a, the microelectromechanical system 10 may be completed.

The insulating layer 32 may be, for example, silicon dioxide, silicon nitride, BPSG, PSG, or SOG, or combinations thereof. It may be advantageous to employ silicon nitride because silicon nitride may be deposited in a more conformal manner than silicon oxide. Moreover, silicon nitride is compatible with CMOS processing, in the event that microelectromechanical system 10 includes CMOS integrated circuits.

Figure 5I:
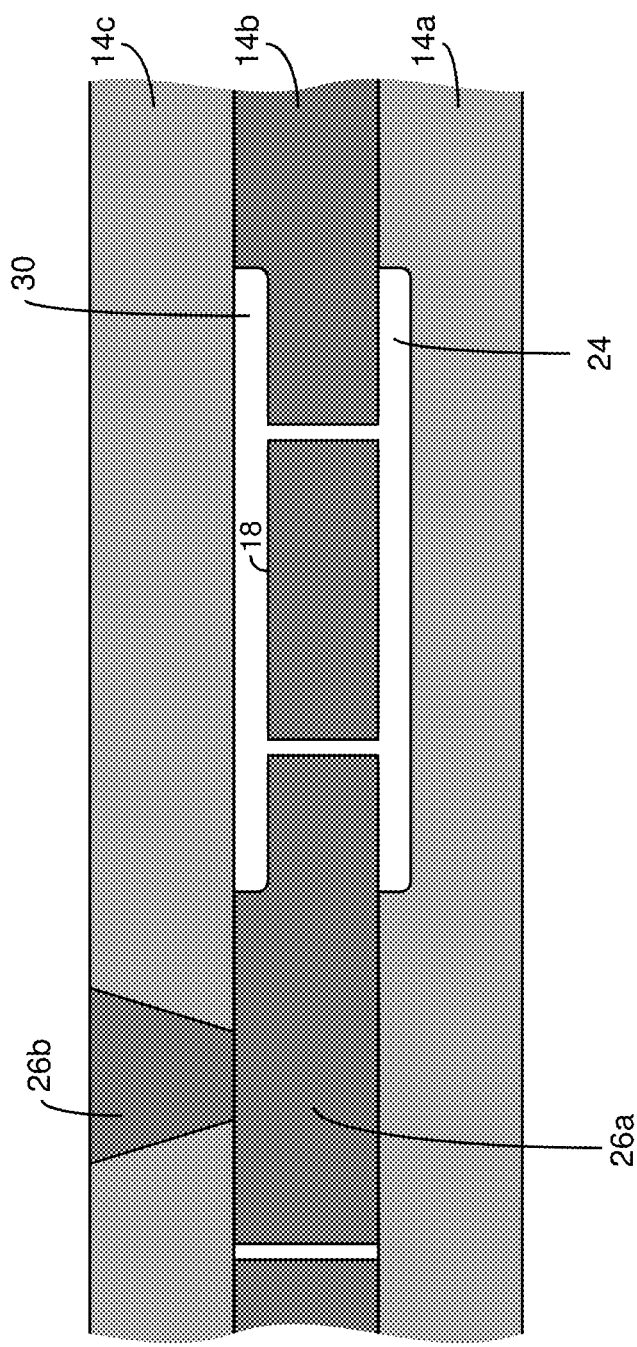
FIG. 5 illustrates a cross-sectional view (sectioned along dotted line A-A' of FIG. 2) of a portion of the moveable electrode, fixed electrode, and the contact of FIG. 2, wherein microelectromechanical system includes electronic or electrical circuitry in conjunction with micromachined mechanical structure of FIG. 2, in accordance with an exemplary embodiment of the present inventions.
Figure 51J:
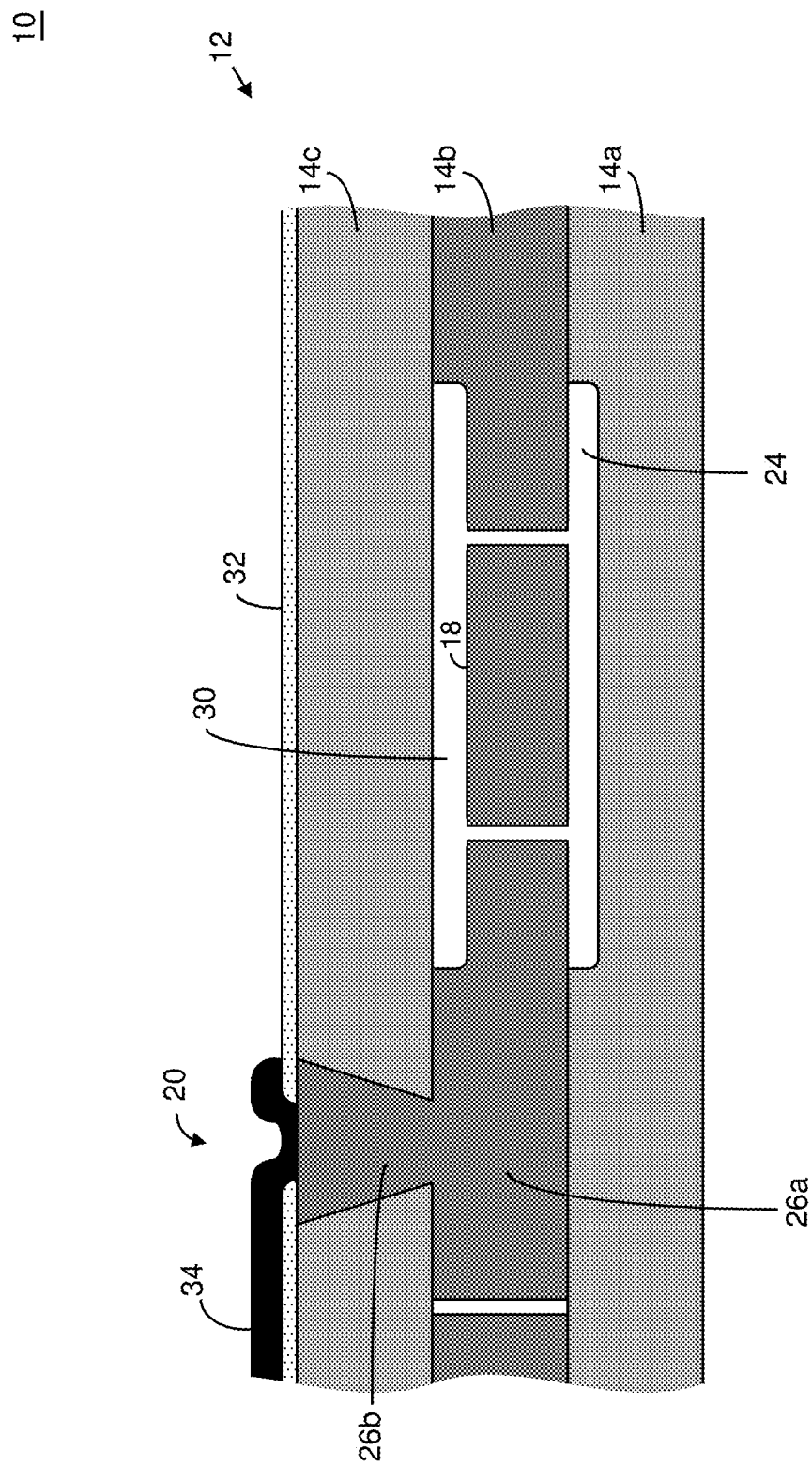

Notably, prior to formation, deposition and/or growth of insulation layer 32 and/or conductive layer 34, additional micromachined mechanical structures 12 and/or transistors of circuitry 16 may be formed and/or provided in second substrate 14b or in other substrates that may be fixed to first substrate 14a and/or second substrate 14b. In this regard, the exposed surface of second substrate 14b may be a suitable base upon which integrated circuits (for example, CMOS transistors) and/or micromachined mechanical structures 12 may be fabricated on or in. Such integrated circuits may be fabricated using well-known techniques and equipment. For example, with reference to FIG. 5, in one embodiment, transistor regions 36, which may be integrated circuits (for example, CMOS transistors) of circuitry 16, may be provided in second substrate 14b. The transistor regions 36 may be formed before or after second substrate 14b is secured (for example, bonded) to first substrate 14a. In this regard, with reference to FIG. 6A, transistor implants 38 may be formed using well-known lithographic and implant processes, after second substrate 14b is secured to first substrate 14a and concurrently with the formation of contact area 26b.

Thereafter, conventional transistor processing (for example, formation of gate and gate insulator 40) may be employed to complete the transistors of circuitry 16. (See, FIG. 6B). The "back-end" processing of microelectromechanical system 10 (for example, formation, growth and/or deposition of insulation layer 32 and conductive layer 34) may be performed using the same processing techniques as described above. (See, for example, FIGS. 6C and 6D). In this regard, insulation layer 32 may be deposited, formed and/or grown and patterned and, thereafter, conductive layer 34 (for example, a heavily doped polysilicon, metal (such as aluminum, chromium, gold, silver, molybdenum, platinum, palladium, tungsten, titanium, and/or copper), metal stacks, complex metals and/or complex metal stacks) is deposited and/or formed. In the illustrative embodiments, contact 20 is accessed directly by the transistors of circuitry 16 via conductive layer 34. Here, conductive layer 34 may be a low resistance electrical path that is deposited and patterned to facilitate connection of micromachined mechanical structure 12 and circuitry 16.

Figure 7A:
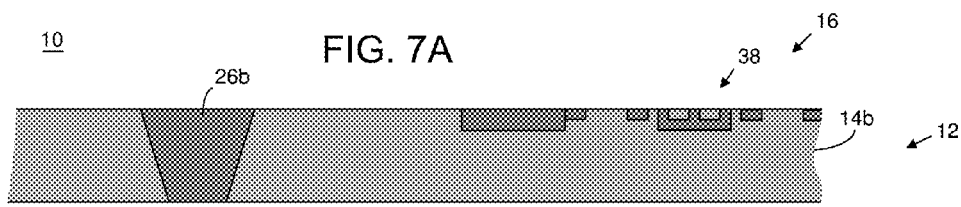
Figure 7B:
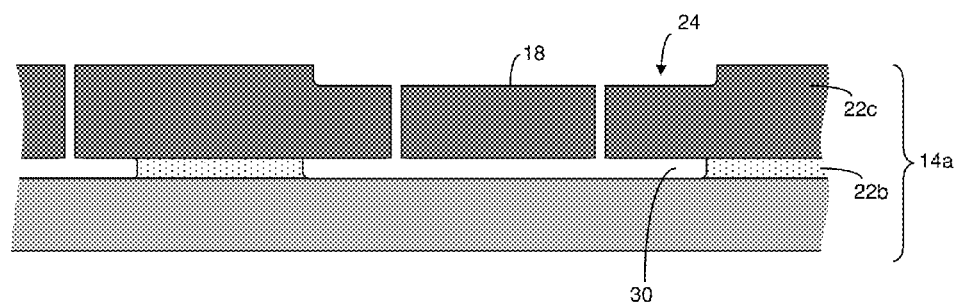
Figure 7C:
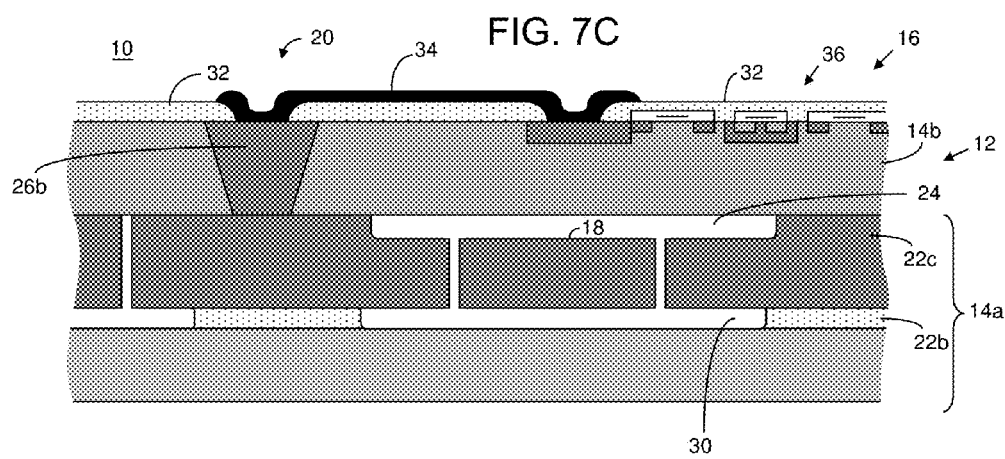
Figure 10A:
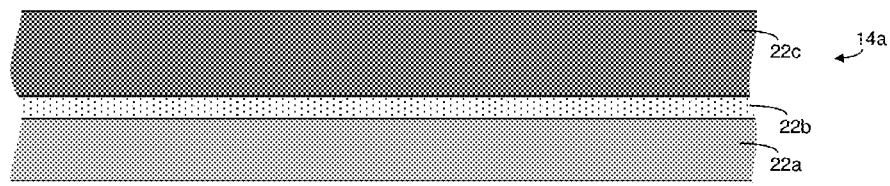
Figure 10B:
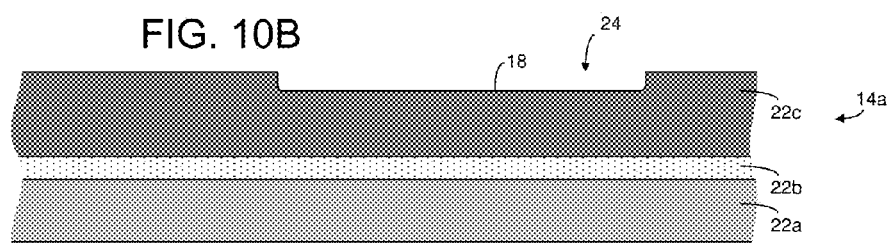
Figure 10C:
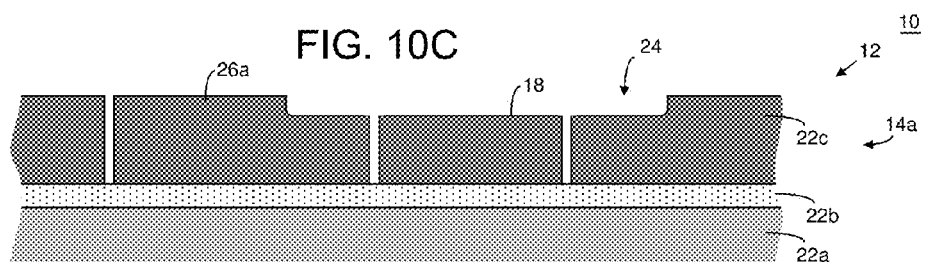
Figure 10D:
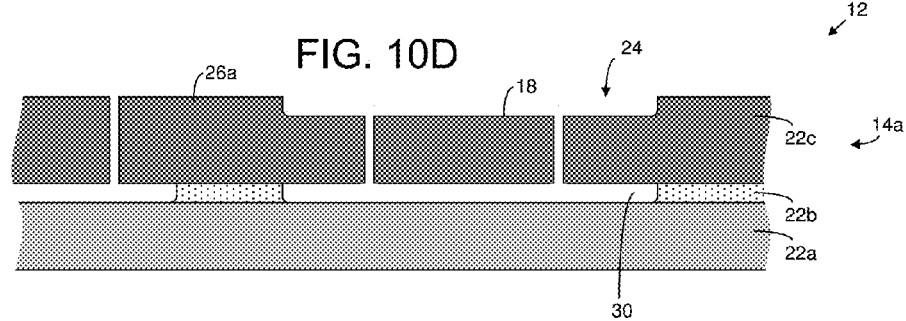
Figure 10E:
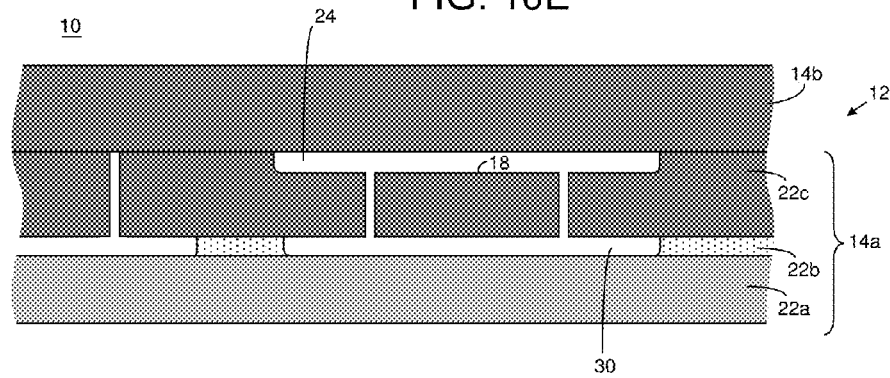
Figure 10F:
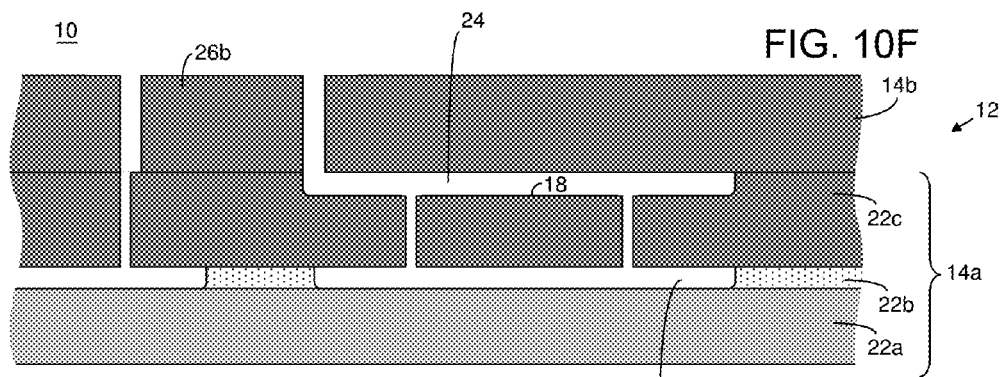
Figure 10G:
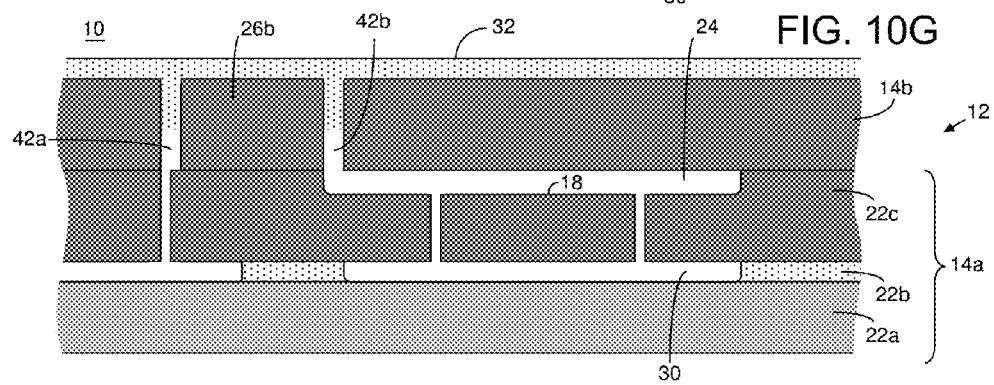
Figure 10H:
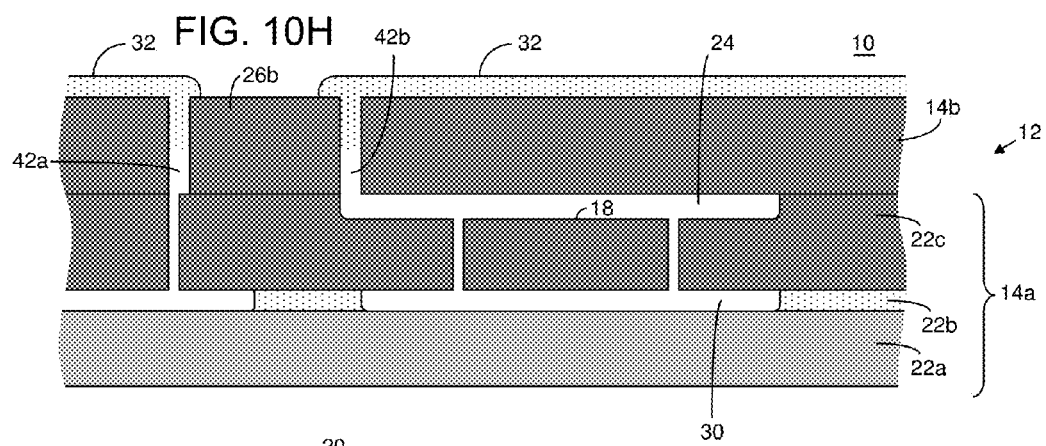
Figure 10I:
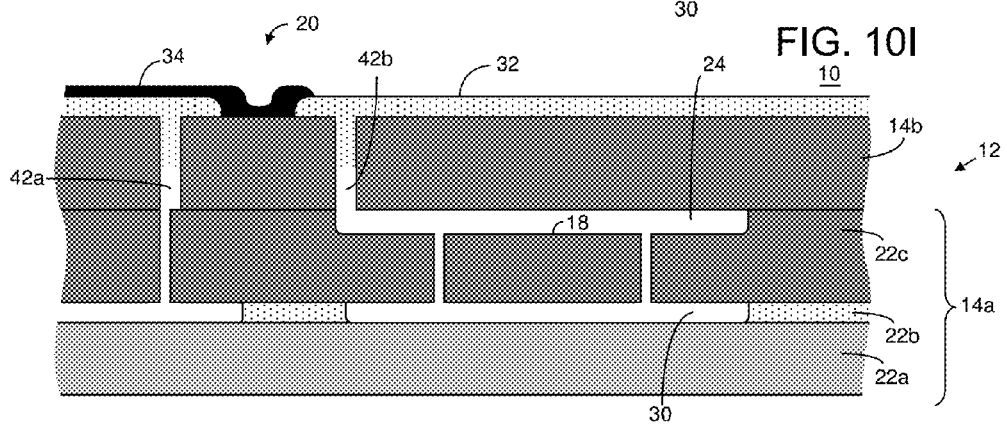

As noted above, the transistors of transistor region 36 may be formed prior to securing second substrate 14b to first substrate 14a. (See, for example, FIGS. 7A and 7B). Indeed, all of the "back-end" processing, in addition to formation of the transistors of transistor region 36, may be completed prior to securing second substrate 14b to first substrate 14a. (See, for example, FIGS. 8A and 8B).

With reference to FIGS. 9, 10A-10I, 11 and 12A-12J, in another embodiment of the present inventions, semiconductor layer 22c of SOI substrate 14a is the same conductivity as second substrate 14b. In these embodiments, micromachined mechanical structure 12 may include additional features to electrically isolate contact 20. For example, with reference to FIG. 9, in one embodiment, micromachined mechanical structure 12 includes isolation trenches 42a and 42b that isolates contact 20 (and contact areas 26a and 26b) from portions of second substrate 14b. The isolation trenches 42a and 42b may include an insulator material, for example, silicon dioxide or silicon nitride. Indeed, as illustrated, material that forms insulation layer 32 may also be deposited in isolation trenches 42a and 42b. Notably, FIGS. 10A-10I illustrate an exemplary process flow for fabricating microelectromechanical system 10 of FIG. 9.

With reference to FIG. 11, in another exemplary embodiment, isolation regions 44a and 44b are deposited and/or implanted into portions of semiconductor layer 22c of SOI substrate 14a in order to facilitate electrical isolation of contact 20 after second substrate 14b is secured or fixed (via, for example, bonding). The isolation regions 44a and 44b may be any material or structure that insulates contact 20, for example, an insulator material and/or an oppositely doped semiconductor region. FIGS. 12A-12J illustrate an exemplary process flow for fabricating microelectromechanical system 10 of FIG. 11 wherein isolation regions 44a and 44b are oppositely doped semiconductor regions and an insulation material is disposed in isolation trenches 42a and 42b.

FIG. 13A illustrates an exemplary microelectromechanical system 10 wherein the isolation regions 44a and 44b are oppositely doped semiconductor regions (relative to the conductivity of second substrate 14b) and a semiconductor, having a conductivity different from the conductivity of the semiconductor of second substrate 14b, is disposed (for example using epitaxial deposition techniques) in isolation trenches 42a and 42b. FIGS. 13B and 13C illustrate selected portions of an exemplary process flow for fabricating microelectromechanical system 10 of FIG. 13A.

Notably, the embodiments of FIGS. 9, 11 and 13A may also include circuitry 16 disposed in second substrate 14b. The fabrication techniques described above and illustrated in FIGS. 5-8B may be employed in the embodiments of FIGS. 9 and 11. Indeed, prior to or after formation, deposition and/or growth of insulation layer 32 and/or conductive layer 34, additional micromachined mechanical structures 12 and/or transistors of circuitry 16 may be formed and/or provided in second substrate 14b or in other substrates that may be fixed to first substrate 14a and/or second substrate 14b. For the sake of brevity, those discussions, in connection with the embodiments of FIGS. 9, 11 and 13A, will not be repeated.

The present inventions may also employ more than two substrates to form and encapsulate micromachined mechanical structure 12. For example, with reference to FIG. 14, in one embodiment, microelectromechanical system 10 includes first substrate 14a, second substrate 14b and third substrate 14c. Briefly, by way of overview, in this embodiment, micromachined mechanical structure 12 (including moveable electrode 18 and contact 20) is formed in second substrate 14b and encapsulated via third substrate 14c. In this regard, micromachined mechanical structure 12 is formed in a portion of substrate 14b. Thereafter, substrate 14c is secured (for example, bonded) to exposed surface of substrate 14b to encapsulate micromachined mechanical structure 12. In this embodiment, the portion of substrate 14b in which micromachined mechanical structure 12 is formed includes a conductivity that is different from the conductivity of the semiconductor of first substrate 14a and third substrate 14c.

Figure 15A:
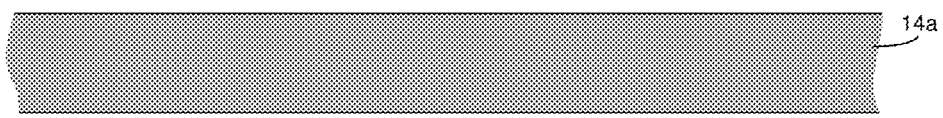
Figure 15B:
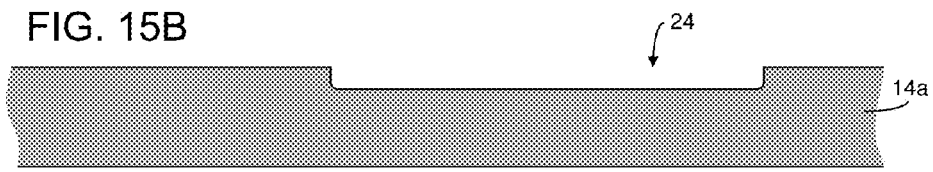

With reference to FIGS. 15A and 15B, an exemplary method of fabricating or forming micromachined mechanical structure 12 according to this embodiment of the present inventions may begin with forming first cavity 24 in first substrate 14a using well-known lithographic and etching techniques. In one exemplary embodiment, first cavity 24 includes a depth of about 1 μm.

Figure 15C:
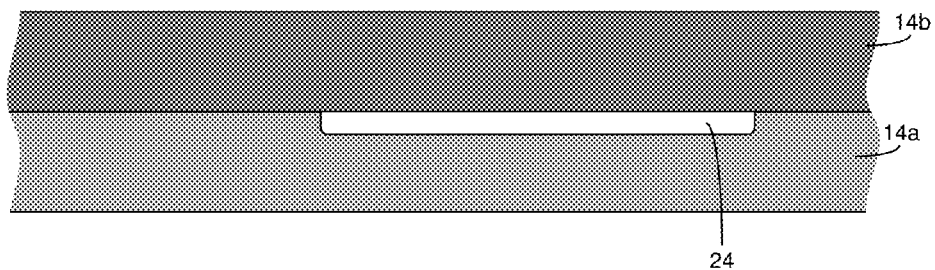
Figure 15D:
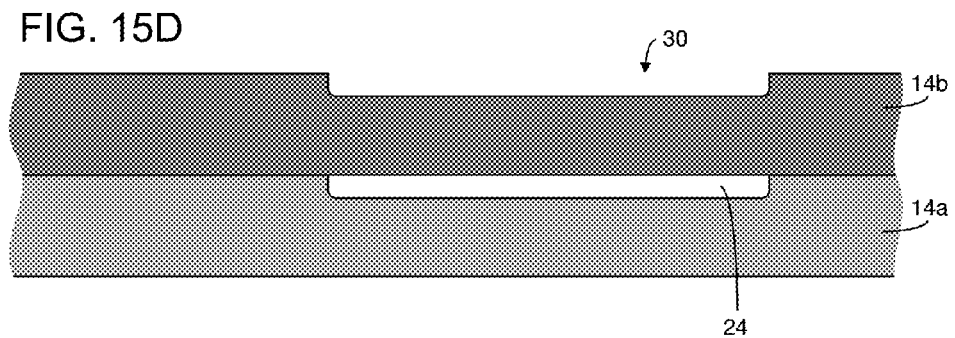

With reference to FIGS. 15C and 15D, second substrate 14b may be fixed to first substrate 14a. The second substrate 14b may be secured to the exposed portion(s) of first substrate 14a using, for example, well-known bonding techniques such as fusion bonding, anodic-like bonding and/or silicon direct bonding. As mentioned above, other bonding technologies are suitable including soldering (for example, eutectic soldering), thermo compression bonding, thermosonic bonding, laser bonding and/or glass reflow, and/or combinations thereof. Indeed, all forms of bonding, whether now known or later developed, are intended to fall within the scope of the present invention.

Before or after securing second substrate 14b to first substrate 14a, second cavity 30 may be formed in second substrate 14b—again using well-known lithographic and etching techniques. In one exemplary embodiment, second cavity 30 also includes a depth of about 1 μm. Thereafter, the thickness of second substrate 14b may be adjusted to accommodate further processing. For example, second substrate 14b may be grinded and polished (using, for example, well known chemical mechanical polishing ("CMP") techniques) to a thickness of between 10 μm-30 μm. Notably, cavities 24 and 30 form the chamber in which the mechanical structure, for example, moveable electrode 18, resides.

The second substrate 14b may be formed from any material now known or later developed. In a preferred embodiment, second substrate 14b includes or is formed from, for example, materials in column IV of the periodic table, for example silicon, germanium, carbon; also combinations of these, for example silicon germanium, or silicon carbide; also of III-V compounds for example gallium phosphide, aluminum gallium phosphide, or other III-V combinations; also combinations of III, IV, V, or VI materials, for example silicon nitride, silicon oxide, aluminum carbide, or aluminum oxide; also metallic silicides, germanides, and carbides, for example nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

With reference to FIG. 15E, moveable electrode 18 and contact area 26 are defined and formed in second substrate 14b. In this regard, trenches 28a-c are formed in second substrate 14b to define moveable electrode 18 and contact area 26 therefrom. (See, FIG. 15E). The trenches 28a-c may be formed using well-known deposition and lithographic techniques. Notably, all techniques for forming or fabricating trenches 28a-c, whether now known or later developed, are intended to be within the scope of the present inventions.

Thereafter, third substrate 14c may be fixed to the exposed portion(s) of second substrate 14b. (See, FIG. 15F). The third substrate 14c may also be secured to the exposed portion(s) of second substrate 14b using, for example, well-known bonding techniques such as fusion bonding, anodic-like bonding and/or silicon direct bonding. In conjunction with securing third substrate 14c to second substrate 14b, the atmosphere (including its characteristics) in which moveable electrode 18 operates may also be defined—for example, as described above. Notably, all techniques of defining the atmosphere, including the pressure thereof, during the process of securing third substrate 14c to second substrate 14b, whether now known or later developed, are intended to be within the scope of the present inventions.

The third substrate 14c may be formed from any material discussed above relative to second substrate 14b. For the sake of brevity, such discussions will not be repeated.

Before or after third substrate 14c is secured to second substrate 14b, contact area 26b may be formed in a portion of third substrate 14c to be aligned with, connect to or overlie contact area 26a. The contact area 26b may be a semiconductor region that includes a doping that provides the same conductivity as contact area 26a. In this way, a suitable, desired and/or predetermined electrical conductivity is provided with contact area 26a when third substrate 14c is secured to second substrate 14b. (See, FIG. 15G). Thus, contact area 26b may be a highly doped region of third substrate 14c which provides enhanced electrical conductivity with contact area 26a. The contact area 26b may be formed in third substrate 14c using well-known lithographic and doping techniques.

Notably, contact area 26b may be a counter-doped region or heavily counter-doped region of third substrate 14c which includes a conductivity that is different from the conductivity of the other portions of third substrate 14c. In this way, contact areas 26a and 26b are electrically isolated from the other portions of third substrate 14c. Thus, in this embodiment, second substrate 14b may be a first conductivity type (for example, an N-type conductivity) and third substrate 14c may be a second conductivity type (for example, a P-type conductivity). As such, contact area 26b may be a counter-doped region or heavily counter-doped N-type region which provides suitable, desired and/or predetermined electrical conductivity characteristics when third substrate 14c is secured to second substrate 14b and contact areas 26a and 26b are in physical contact.

With reference to FIG. 15H, microelectromechanical system 10 may be completed by depositing, forming and/or growing insulation layer 32 and a contact opening may be etched to facilitate electrical contact/connection to contact area 26b. The conductive layer 34 (for example, a heavily doped polysilicon, metal (such as aluminum, chromium, gold, silver, molybdenum, platinum, palladium, tungsten, titanium, and/or copper), metal stacks, complex metals and/or complex metal stacks) may then be deposited to provide the appropriate electrical connection to contact 26a and 26b.

Notably, insulation layer 32 and/or conductive layer 34 may be formed, grown and/or deposited before or after third substrate 14c is secured to second substrate 14b. Under these circumstances, when third substrate 14c is secured to second substrate 14b, the microelectromechanical system 10 may be completed.

The insulating layer 32 may be, for example, silicon dioxide, silicon nitride, BPSG, PSG, or SOG, or combinations thereof. It may be advantageous to employ silicon nitride because silicon nitride may be deposited in a more conformal manner than silicon oxide. Moreover, silicon nitride is compatible with CMOS processing, in the event that microelectromechanical system 10 includes CMOS integrated circuits.

As mentioned above with respect to other embodiments of the present inventions, prior to formation, deposition and/or growth of insulation layer 32 and/or conductive layer 34, additional micromachined mechanical structures 12 and/or transistors of circuitry 16 may be formed and/or provided in third substrate 14c or in other substrates that may be fixed to first substrate 14a and/or second substrate 14b. (See, for example, FIGS. 16, 17 and 18). In this regard, the exposed surface of third substrate 14c or another substrate disposed thereon may be a suitable base upon which integrated circuits (for example, CMOS transistors) (see, FIG. 16) and/or micromachined mechanical structures 12 (see, FIGS. 17 and 18). Such integrated circuits and micromachined mechanical structures 12 may be fabricated using the inventive techniques described herein and/or well-known fabrication techniques and equipment.

For example, with reference to FIG. 16, in one embodiment, transistor regions 36 (which may be integrated circuits (for example, CMOS transistors) of circuitry 16) may be provided in second substrate 14b. The transistor regions 36 may be formed before or after third substrate 14c is secured (for example, bonded) to second substrate 14b. The fabrication techniques described above and illustrated in FIGS. 5-8B may be employed in the embodiments of FIG. 14. Indeed, prior to or after formation, deposition and/or growth of insulation layer 32 and/or conductive layer 34, additional micromachined mechanical structures 12 and/or transistors of circuitry 16 may be formed and/or provided in second substrate 14b or in other substrates that may be fixed to first substrate 14a and/or second substrate 14b. For the sake of brevity, those discussions, in connection with the embodiments of FIG. 15, will not be repeated.

Notably, although second cavity 30 is described and illustrated in the previous embodiment as being formed in second substrate 14b, second cavity 30 may be formed in third substrate 14c, as illustrated in FIGS. 19 and 20A-20H. Indeed, a portion of second cavity 30 may be formed in second substrate 14b and a portion of second cavity 30 may be formed in third substrate 14c.

Similarly, first cavity 24 may be formed in second substrate 14b, as illustrated in FIG. 21. Indeed, first cavity 24 and second cavity 30 may both be formed in second substrate 14b. (See, for example, FIG. 22). Moreover, a portion of first cavity 24 may be formed in first substrate 14a and a portion of first cavity 24 may be formed in second substrate 14b. Indeed, all permutations of formation of first cavity 24 and second cavity 30 are intended to fall within the scope of the present inventions.

With reference to FIGS. 23-30I, in another embodiment of the present inventions, first substrate 14a and/or third substrate 14c are/is the same conductivity as second substrate 14b. In these embodiments, micromachined mechanical structure 12 may include additional features to electrically isolate contact 20. For example, with reference to FIG. 23, in one embodiment, second substrate 14b is a semiconductor having the same conductivity as the conductivity of third substrate 14c. In this embodiment, micromachined mechanical structure 12 includes isolation trenches 42a and 42b that isolates contact 20 (and contact areas 26a and 26b) from portions of third substrate 14c. In this exemplary embodiment, the isolation trenches are aligned with isolation regions 44a and 44b which are disposed in or on second substrate 14b.

The isolation trenches 42a and 42b may include a material that insulates contact 20 (and contact areas 26a and 26b) from portions of third substrate 14c. In the exemplary embodiment of FIG. 23, an insulating material, for example, silicon dioxide or silicon nitride, is deposited and/or grown in isolation trenches 42a and 42b. Indeed, as illustrated, material that forms insulation layer 32 may also be deposited in isolation trenches 42a and 42b. Notably, FIGS. 24A-24I illustrate an exemplary process flow for fabricating microelectromechanical system 10 of FIG. 23.

As mentioned above, isolation regions 44a and 44b which are disposed in or on second substrate 14b. The isolation regions 44a and 44b may be any material or structure that insulates contact 20, for example, an insulator material and/or an oppositely doped semiconductor region. In the exemplary embodiment of FIG. 23, isolation regions 44a and 44b includes oppositely doped semiconductor material.

With reference to FIG. 25, in another exemplary embodiment, first substrate 14a is a semiconductor having the same conductivity as the conductivity of second substrate 14b. In this embodiment, micromachined mechanical structure 12 includes an isolation region 44 that isolates contact 20 (and, in particular, contact area 26a) from portions of first substrate 14a. In this exemplary embodiment, the isolation region 44 is aligned with cavity 24 and trench 28a in order to provide suitable contact isolation. The isolation region 44 may include any material or structure that insulates contact 20, for example, an insulator material and/or an oppositely doped semiconductor region. In the exemplary embodiment of FIG. 25, isolation regions 44a and 44b includes oppositely doped semiconductor material. Notably, FIGS. 26A-26H illustrate an exemplary process flow for fabricating microelectromechanical system 10 of FIG. 25.

In another exemplary embodiment, first, second and third substrates 14a, 14b and 14c include semiconductor regions having the same conductivity. With reference to FIG. 27, in this embodiment, micromachined mechanical structure 12 includes an isolation trenches 42a and 42b as well as isolation regions 44a, 44b, and 44c. The isolation trenches 42a and 42b, and isolation regions 44a, 44b, and 44c, in combination, electrically isolate contact 20 (and, in particular, contact areas 26a and 26b) from contiguous portions of first substrate 14a and third substrates 14c. In this exemplary embodiment, the isolation region 44a is aligned with cavity 24 and trench 28a, and isolation trenches 42a and 42b are aligned with isolation regions 44b and 44c. In this way, contact 20 includes suitable contact isolation.

The isolation trenches 42a and 42b may include any material that insulates contact 20 (and contact areas 26a and 26b) from portions of third substrate 14c. In the exemplary embodiment of FIG. 27, an oppositely doped semiconductor is deposited and/or grown in isolation trenches 42a and 42b.

The isolation regions 44a, 44b and 44c may be disposed in or on first substrate 14a and/or second substrate 14b. In the exemplary embodiment of FIG. 27, isolation regions 44a and 44b includes oppositely doped semiconductor material.

Notably, FIGS. 28A-28I illustrate an exemplary process flow for fabricating microelectromechanical system 10 of FIG. 23.

As mentioned above, isolation trenches 42a and 42b may include any material or structure that insulates contact 20, for example, an insulator material and/or an oppositely doped semiconductor region. With reference to FIGS. 29 and 30A-30I, isolation trenches 42a and 42b may include an insulating material (for example, silicon dioxide or silicon nitride) which is deposited and/or grown in isolation trenches 42a and 42b. As illustrated, material that forms insulation layer 32 may also be deposited in isolation trenches 42a and 42b. In this regard, FIGS. 30A-30I illustrate an exemplary process flow for fabricating microelectromechanical system 10 of FIG. 29.

Figure 31C:
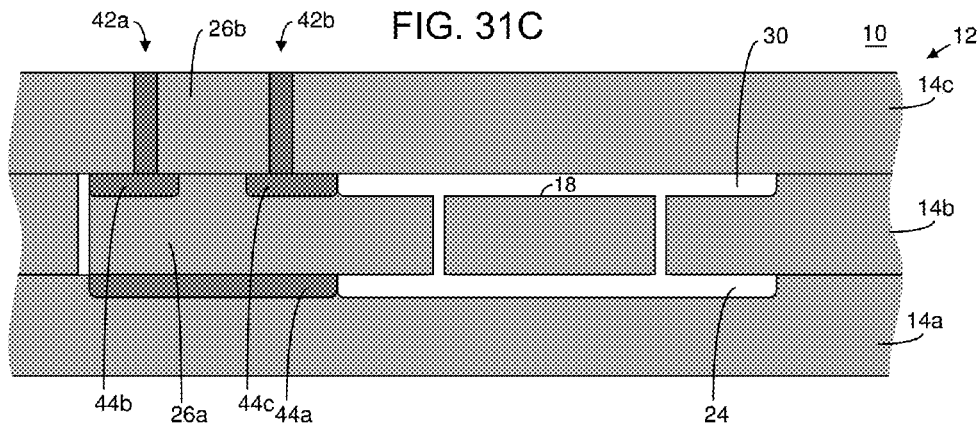
Figure 31D:
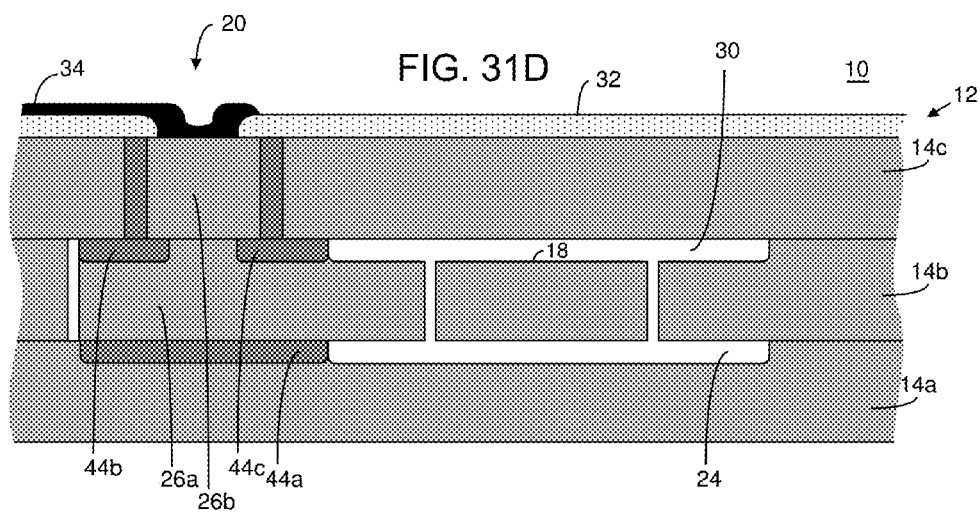

Although not previously illustrated, the present inventions may employ grinding and polishing (using, for example, well known chemical mechanical polishing ("CMP") techniques at various stages in order to, for example, provide a desired surface and/or thickness. For example, with reference to FIGS. 31A-31D, where material 46 is deposited and/or grown in isolation trenches 42a and 42b, the exposed surface may be subjected to grinding and polishing in order to remove a portion of the deposited and/or grown material from the upper surface of substrate 14c. With reference to FIG. 31C, after grinding and polishing, the surface is prepared for further processing, for example, "back-end" processing (see, for example, FIG. 31D) or incorporation of additional micromachined mechanical structures 12 and/or transistors of circuitry 16.

Notably, it may be advantageous to employ isolation trenches 42 and isolation regions 44 in the embodiments where substrates 14a and 14c include a conductivity that is different from the conductivity of substrate 14b. (See, for example, FIG. 32 and FIGS. 33A-33I). In this embodiment, isolation trenches 42 and isolation regions 44 provide additional electrical isolation for contact 20. All permutations and/or combinations of such features are intended to fall within the scope of the present inventions.

The embodiments of FIGS. 23, 25, 27, 29 and 32 may also include circuitry 16 disposed in third substrate 14c. The fabrication techniques described above and illustrated in FIGS. 5-8B may be employed in the embodiments of FIGS. 23, 25, 27, 29 and 32. Indeed, prior to or after formation, deposition and/or growth of insulation layer 32 and/or conductive layer 34, additional micromachined mechanical structures 12 and/or transistors of circuitry 16 may be formed and/or provided in third substrate 14c or in other substrates that may be fixed to first substrate 14a and/or second substrate 14b. For the sake of brevity, those discussions, in connection with the embodiments of FIGS. 23, 25, 27, 29 and 32, will not be repeated.

In another aspect, the present inventions may employ an insulative layer between the substrate in which the micromachined mechanical structures 12 resides and one or more opposing or juxtaposed substrates. Such a configuration may provide certain processing advantages as well as enhance the electrical isolation of the micromachined mechanical structures 12 from one or more opposing or juxtaposed substrates. For example, with reference to FIG. 34, in this exemplary embodiment, micromachined mechanical structure 12 (including moveable electrode 18 and contact 20) is formed in second substrate 14b and encapsulated via third substrate 14c. In this regard, micromachined mechanical structure 12 is formed in a portion of substrate 14b. Thereafter, substrate 14c is secured (for example, bonded) to exposed surface of substrate 14b to encapsulate micromachined mechanical structure 12. In this embodiment, insulative layers 48a (having a thickness of about 1 μm) is disposed and patterned on first substrate 14a to provide cavity 24 when second substrate 14b is disposed thereon. Similarly, insulative layer 48b (having a thickness of about 1 μm) is disposed and patterned on second substrate 14b to provide cavity 30 when third substrate 14c is disposed thereon. Notably, substrate 14a, 14b and 14c may include the same or different conductivities.

The insulative layers 48a and 48b may include, for example, an insulation material (for example, a silicon dioxide, nitride, BPSG, PSG, or SOG, or combinations thereof). It may be advantageous to employ silicon nitride because silicon nitride may be deposited, formed and/or grown in a more conformal manner than silicon oxide. Moreover, silicon nitride is compatible with CMOS processing, in the event that microelectromechanical system 10 includes CMOS integrated circuits in one or more of substrates 14 thereof.

Figure 35A:
Figure 35B:
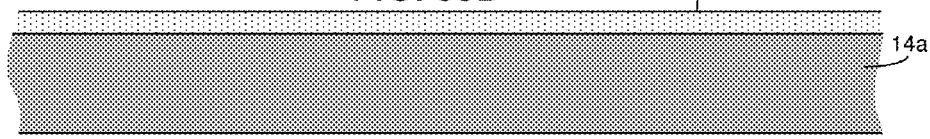
Figure 35C:
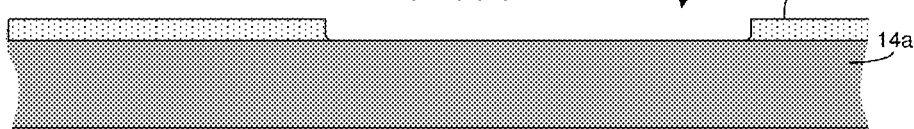
Figure 35D:
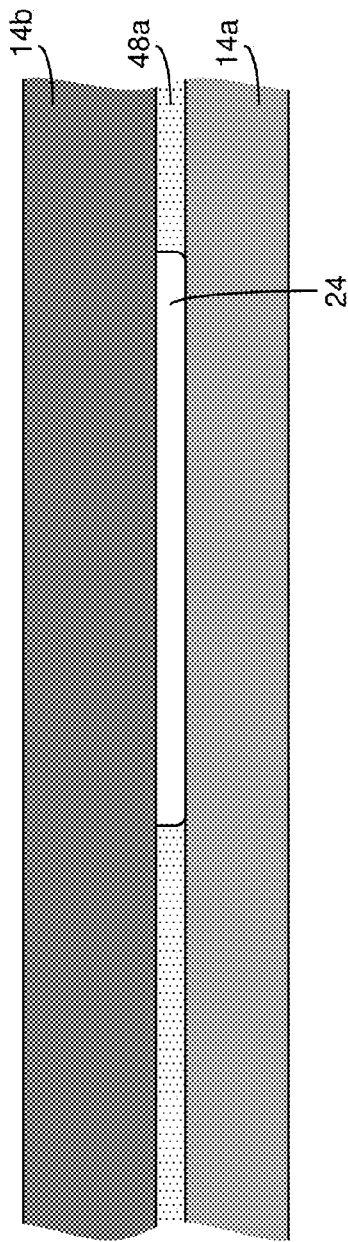
Figure 35E:
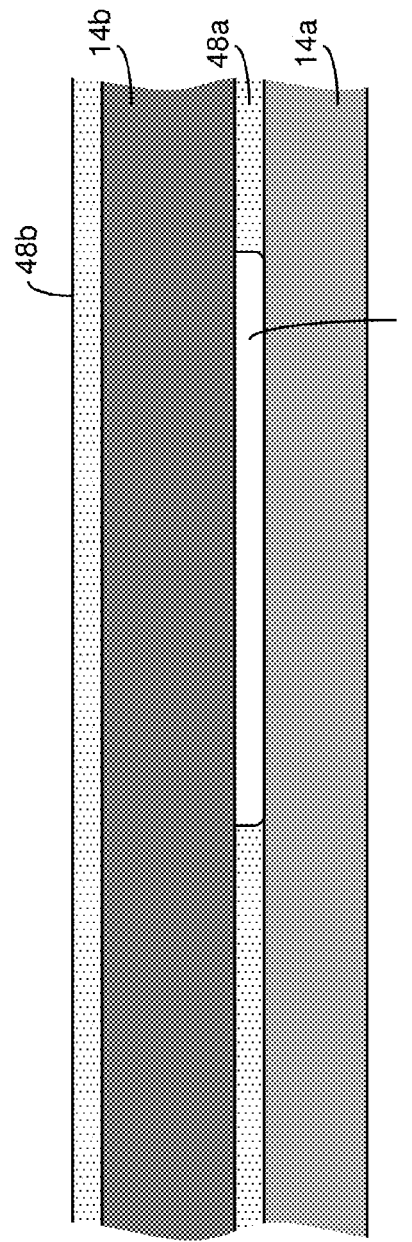
Figure 35F:
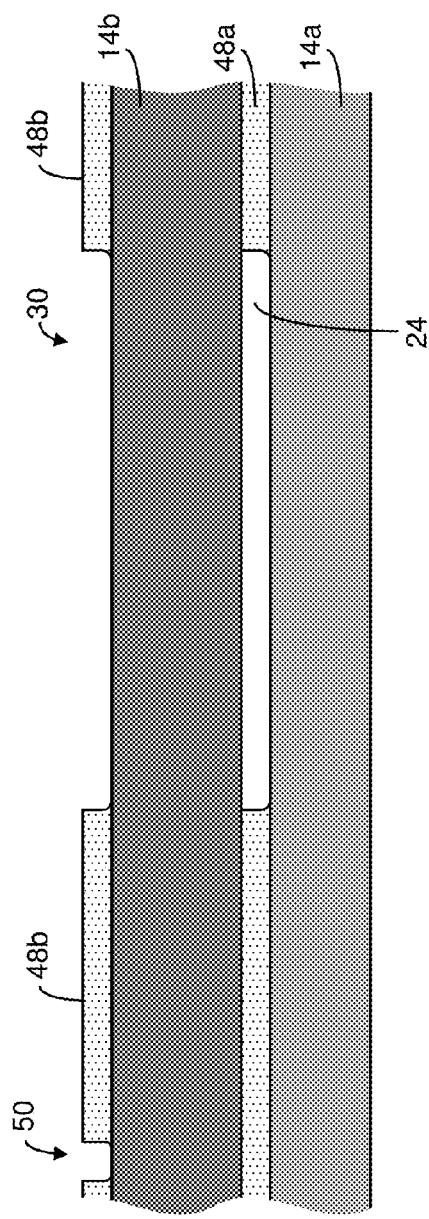
Figure 35G:
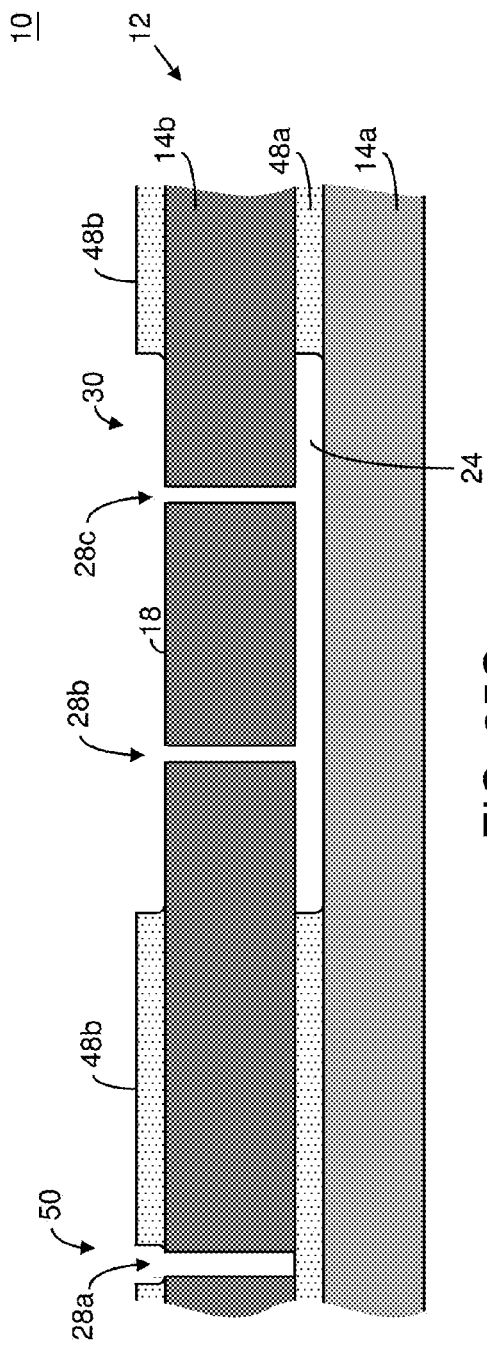
Figure 35H:
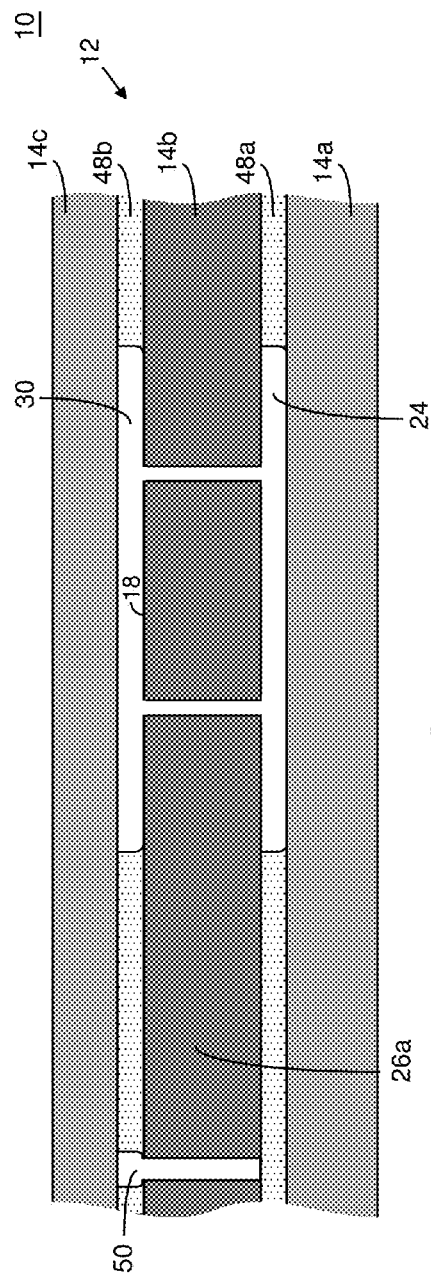

With reference to FIGS. 35A-35C, an exemplary method of fabricating or forming micromachined mechanical structure 12 according to this embodiment of the present inventions may begin with depositing, forming and/or growing insulative layer 48a on first substrate 14a. Thereafter, first cavity 24 is formed in insulative layer 48a using well-known lithographic and etching techniques. The thickness and characteristics of insulative layer 48a may be adjusted to accommodate further processing. For example, insulative layer 48a may be polished (using, for example, well known CMP techniques) to provide a smooth planar surface for receipt of second substrate 14b and provide a desired depth of first cavity 24. In one exemplary embodiment, first cavity 24 includes a depth of about 1 μm.

With reference to FIGS. 35D-35G, second substrate 14b may be fixed to insulative layer 48a using, for example, well-known bonding techniques such as fusion bonding and/or anodic-like bonding. The insulative layer 48b may then be deposited, formed and/or grown on first substrate 14b. The second cavity 30 may then be formed in insulative layer 48b—again using well-known lithographic and etching techniques. Thereafter, the thickness and characteristics of insulative layer 48b may be adjusted to accommodate further processing. For example, insulative layer 48b may be polished (using, for example, well known CMP techniques) to provide a smooth planar surface for receipt of second substrate 14c and provide a desired depth of second cavity 30. In one exemplary embodiment, second cavity 24 includes a depth of about 1 μm.

In addition to forming second cavity 24 in insulative layer 48b, contact trench window 50 is also formed therein. (See, FIG. 35G). In this way, trench 28a may be formed concurrently with providing trenches 28b and 28c which permits definition of contact are 26a and moveable electrode 18 simultaneously. The trenches 28a-c may be formed using well-known deposition and lithographic techniques. Notably, all techniques for forming or fabricating trenches 28a-c, whether now known or later developed, are intended to be within the scope of the present inventions.

Notably, the first and second substrates 14b may be formed from any material now known or later developed. In a preferred embodiment, second substrate 14b includes or is formed from, for example, materials in column IV of the periodic table, for example silicon, germanium, carbon; also combinations of these, for example silicon germanium, or silicon carbide; also of III-V compounds for example gallium phosphide, aluminum gallium phosphide, or other III-V combinations; also combinations of III, IV, V, or VI materials, for example silicon nitride, silicon oxide, aluminum carbide, or aluminum oxide; also metallic silicides, germanides, and carbides, for example nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

Thereafter, third substrate 14c may be secured to the exposed portion(s) of insulative layer 48b. (See, FIG. 35H). The third substrate 14b may be secured using, for example, well-known bonding techniques such as fusion bonding and/or anodic-like bonding. In conjunction with securing third substrate 14c to second substrate 14b, the atmosphere (including its characteristics) in which moveable electrode 18 operates may also be defined. Notably, all techniques of defining the atmosphere, including the pressure thereof, during the process of securing third substrate 14c to insulative layer 48b, whether now known or later developed, are intended to be within the scope of the present inventions.

The third substrate 14c may be formed from any material discussed above relative to first substrate 14a and/or second substrate 14b. For the sake of brevity, such discussions will not be repeated.

Figure 35I:
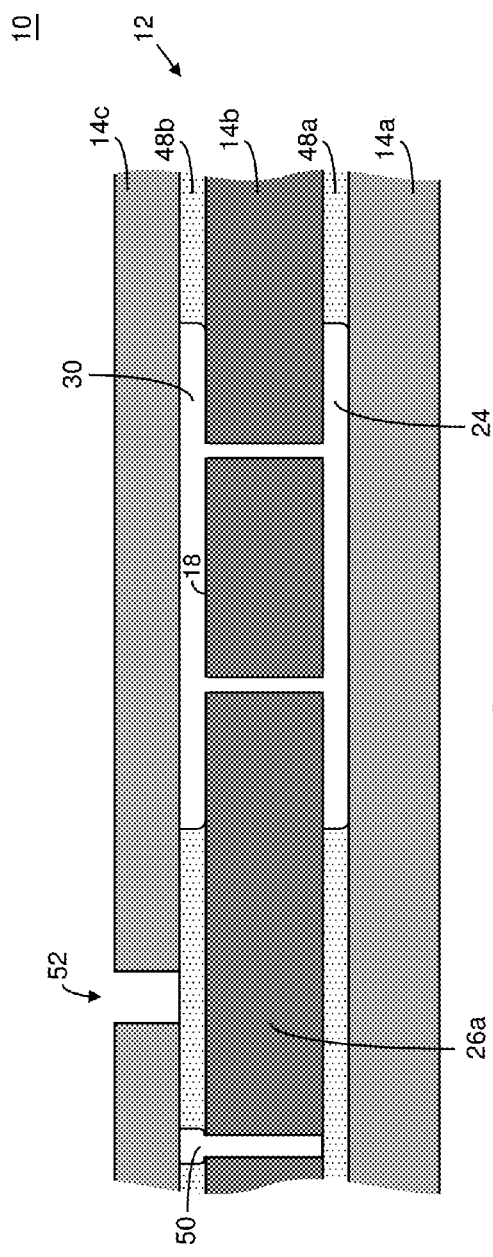

With reference to FIGS. 35I and 35J, after third substrate 14c is secured to insulative layer 48b, contact area 26b may be formed. In this regard, contact area window 52 is formed in third substrate 14c and insulative layer 48b to expose a portion of contact area 26a. Such processing may be performed using well-known lithographic and etching techniques. For example, in one embodiment, where third substrate 14c is a semiconductor material (for example silicon), a portion of may be removed using reactive ion etching. Thereafter, a portion of insulative layer 48b may be removed to expose contact area 26b. In this regard, where insulative layer 48b is comprised of silicon dioxide, selected portions may be removed/etched using well-known wet etching techniques and buffered HF mixtures (i.e., a buffered oxide etch) or well-known vapor etching techniques using vapor HF.

The contact area 26b may be deposited, formed and/or grown in contact area window 52. The contact area 26b may be an epitaxially deposited semiconductor that includes a doping that provides the same conductivity as contact area 26a. In this way, a suitable, desired and/or predetermined electrical conductivity is provided with contact area 26a when third substrate 14c is secured to second substrate 14b. (See, FIG. 35K). Thus, contact area 26b may be a highly doped polysilicon region which provides enhanced electrical conductivity with contact area 26a.

As mentioned above, although not illustrated, the present inventions may employ grinding and polishing (using, for example, well known chemical mechanical polishing ("CMP") techniques at various stages in order to, for example, provide a desired surface and/or thickness. (See, for example, FIGS. 31A-31D). The formation of contact area 26b will likely employ such processing in order to provide the cross-sectional view of FIG. 35K.

Figure 35L:
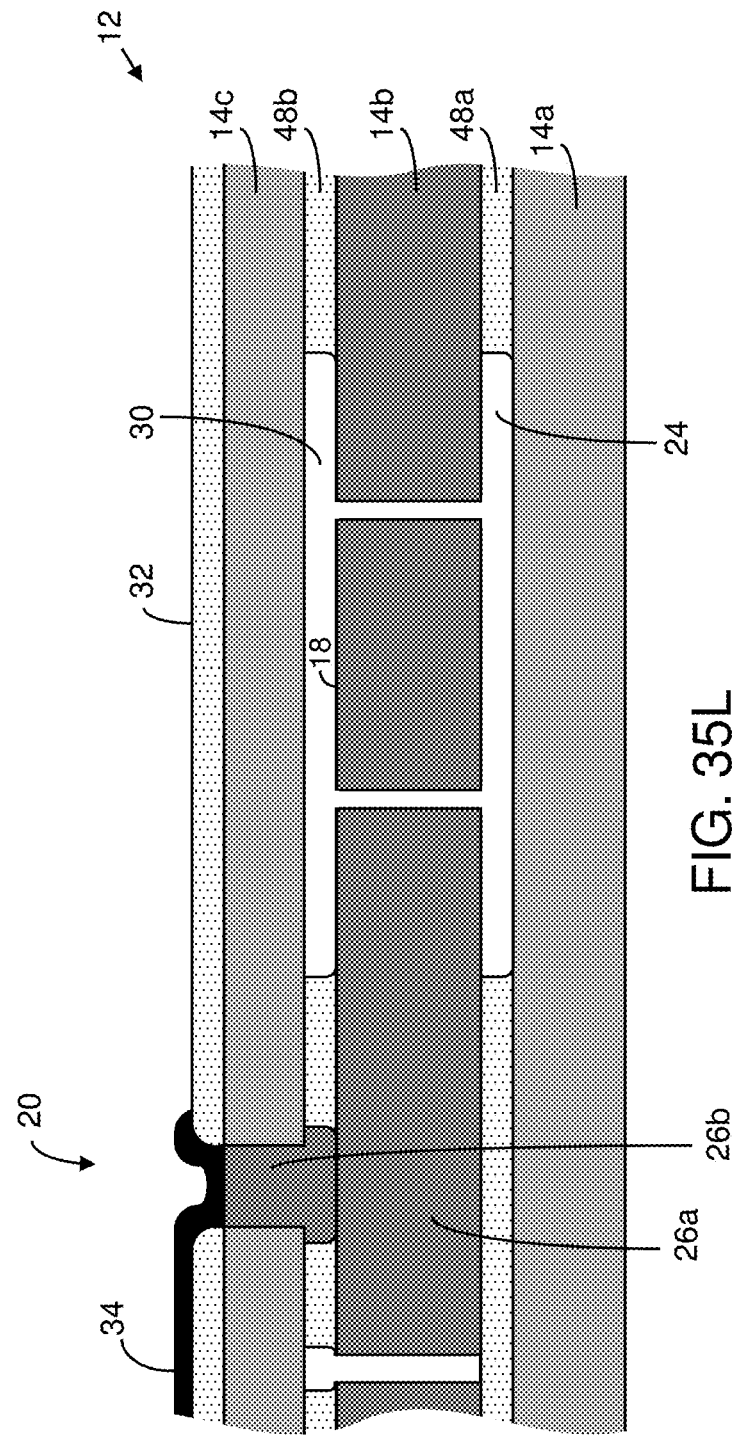

With reference to FIG. 35L, microelectromechanical system 10 may be completed by depositing, forming and/or growing insulation layer 32 and a contact opening may be etched to facilitate electrical contact/connection to contact area 26b. The conductive layer 34 (for example, a heavily doped polysilicon, metal (such as aluminum, chromium, gold, silver, molybdenum, platinum, palladium, tungsten, titanium, and/or copper), metal stacks, complex metals and/or complex metal stacks) may then be deposited to provide appropriate electrical connection to contact 26a and 26b.

Notably, insulation layer 32 and/or conductive layer 34 may be formed, grown and/or deposited before or after third substrate 14c is secured to second substrate 14b. Under these circumstances, when third substrate 14c is secured to second substrate 14b, the microelectromechanical system 10 may be completed.

The insulating layer 32 may be, for example, silicon dioxide, silicon nitride, BPSG, PSG, or SOG, or combinations thereof. It may be advantageous to employ silicon nitride because silicon nitride may be deposited in a more conformal manner than silicon oxide. Moreover, silicon nitride is compatible with CMOS processing, in the event that microelectromechanical system 10 includes CMOS integrated circuits.

As mentioned above with respect to other embodiments of the present inventions, prior to formation, deposition and/or growth of insulation layer 32 and/or conductive layer 34, additional micromachined mechanical structures 12 and/or transistors of circuitry 16 may be formed and/or provided in third substrate 14c or in other substrates that may be fixed to first substrate 14a and/or second substrate 14b. In this regard, the exposed surface of third substrate 14c or another substrate disposed thereon may be a suitable base upon which integrated circuits (for example, CMOS transistors) and/or micromachined mechanical structures 12. Such integrated circuits and micromachined mechanical structures 12 may be fabricated using the inventive techniques described herein and/or well-known fabrication techniques and equipment. For the sake of brevity, those discussions, in connection with the embodiments of FIGS. 34 and 35A-L, will not be repeated.

With reference to FIGS. 36 and 37A-37I, in another exemplary embodiment, microelectromechanical system 10 may be formed using at least three substrates 14a-c and insulative layer 48a disposed between substrates 14a and 14b. In this embodiment, the portion of substrate 14b in which micromachined mechanical structure 12 is formed includes a cavity (like that of previous embodiments) as well as a conductivity that is different from the conductivity of the semiconductor of third substrate 14c.

Briefly, with reference to FIGS. 35A-35C, an exemplary method of fabricating or forming micromachined mechanical structure 12 according to this embodiment of the present inventions may begin with depositing, forming and/or growing insulative layer 48a on first substrate 14a. As mentioned above, insulative layer 48a may include, for example, an insulation material (for example, a silicon dioxide, nitride, BPSG, PSG, or SOG, or combinations thereof).

Thereafter, first cavity 24 is formed in insulative layer 48a using well-known lithographic and etching techniques. (See, FIG. 37C). The thickness and characteristics of insulative layer 48a may be adjusted to accommodate further processing. For example, insulative layer 48a may be polished (using, for example, well known CMP techniques) to provide a smooth planar surface for receipt of second substrate 14b and provide a desired depth of first cavity 24. In one exemplary embodiment, first cavity 24 includes a depth of about 1 µm.

With reference to FIGS. 37D and 37E, second substrate 14b may be fixed to insulative layer 48a using, for example, well-known bonding techniques such as fusion bonding and/or anodic-like bonding. Before or after securing second substrate 14b to first substrate 14a, second cavity 30 may be formed in second substrate 14b using well-known lithographic and etching techniques. In one exemplary embodiment, second cavity 30 also includes a depth of about 1 µm. Thereafter, the thickness of second substrate 14b may be adjusted to accommodate further processing. For example, second substrate 14b may be grinded and polished (using, for example, well known chemical mechanical polishing ("CMP") techniques) to a thickness of between 10 µm-30 µm.

Figure 37A:
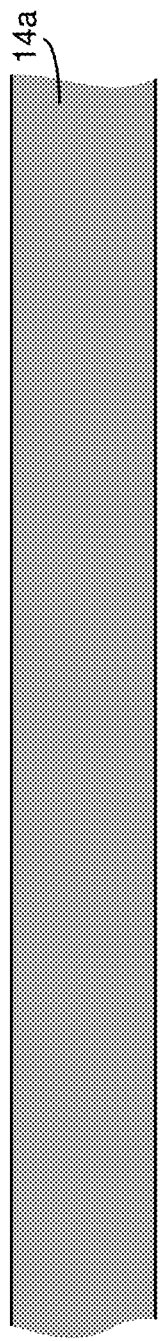
Figure 37B:
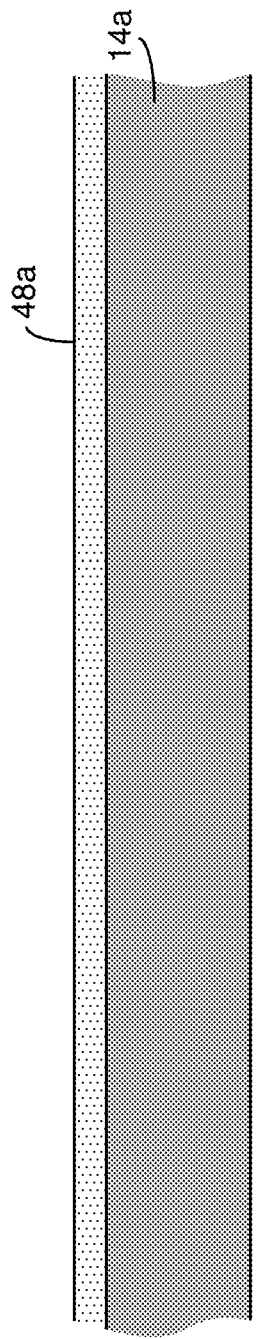
Figure 37C:
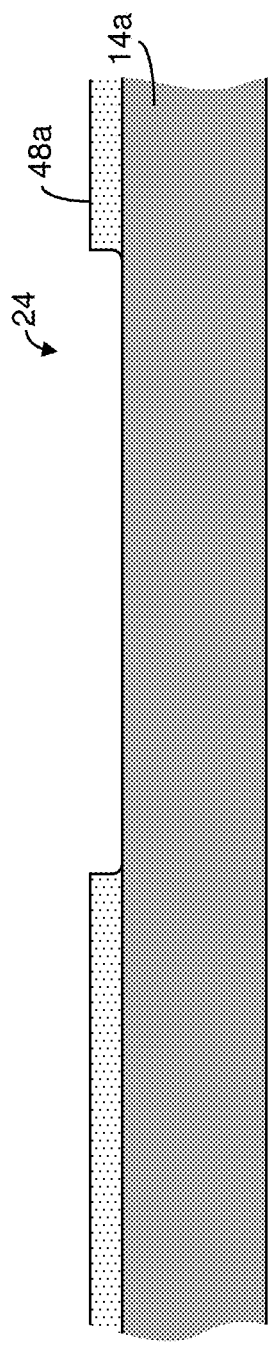
Figure 37F:
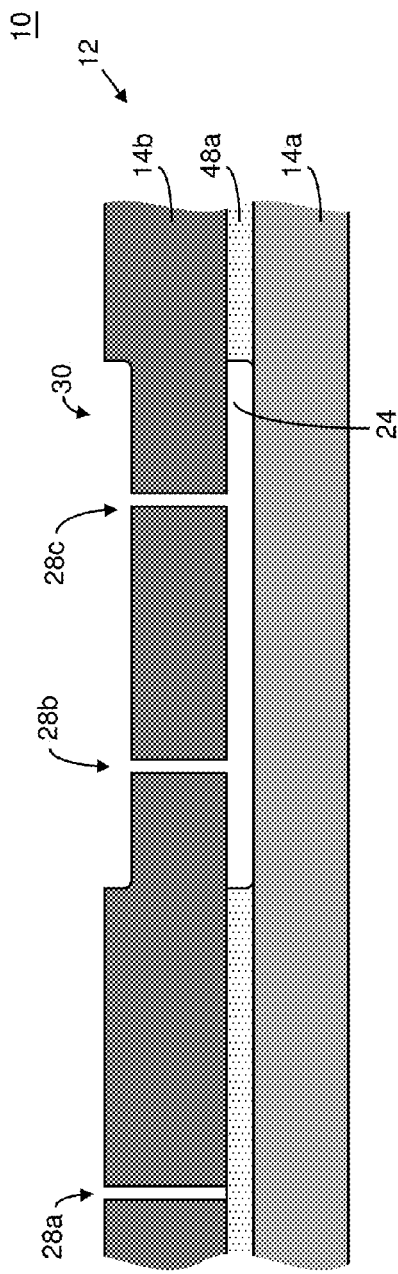
Figure 37G:
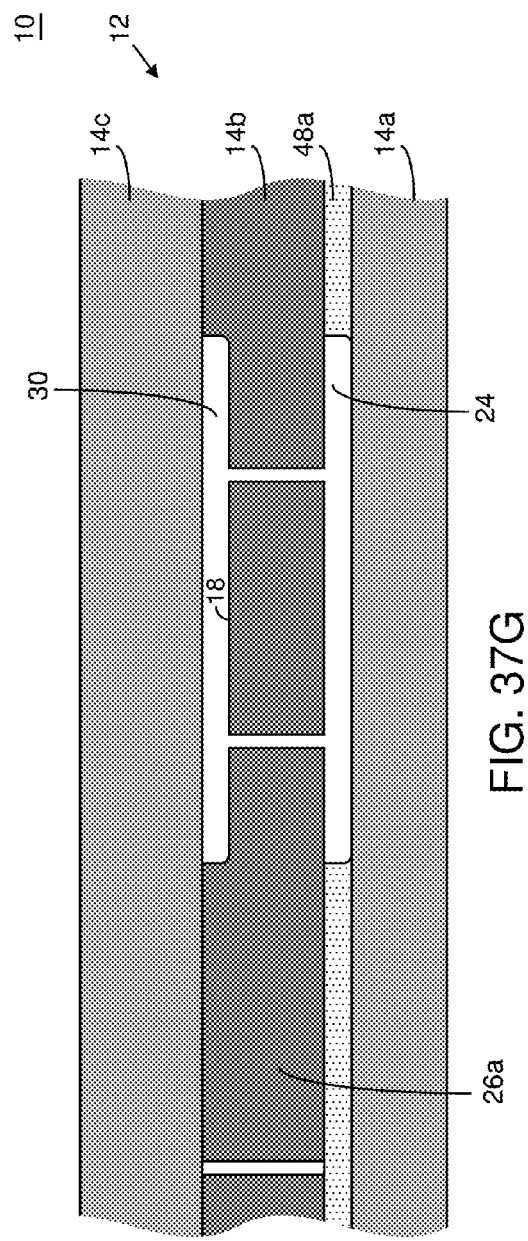
Figure 37H:
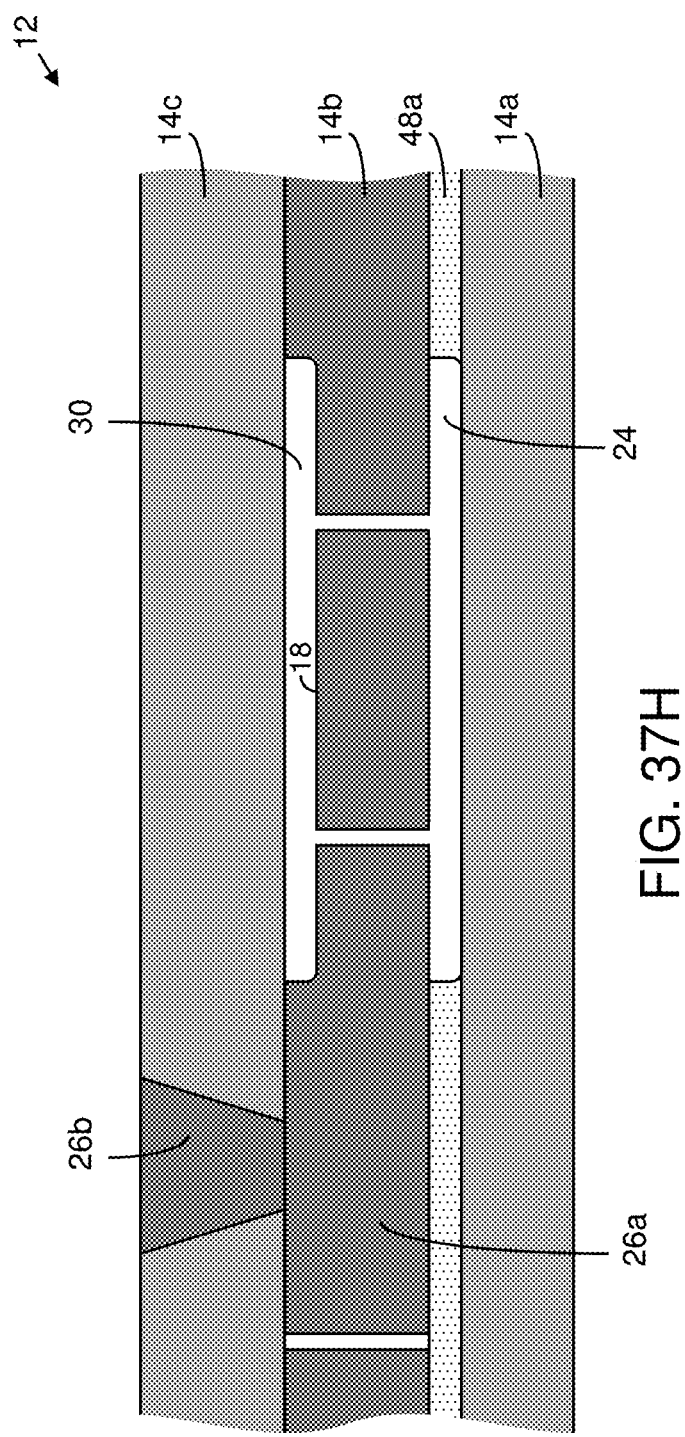

With reference to FIG. 37F, trenches 28a-c may be formed to define moveable electrode 18 and contact area 26a. The trenches may be formed using well-known deposition and lithographic techniques. Notably, all techniques for forming or fabricating trenches 28a-c, whether now known or later developed, are intended to be within the scope of the present inventions.

The first and second substrates 14a and 14b may be formed from any material discussed above relative to first substrate 14a and/or second substrate 14b of other embodiments. For the sake of brevity, such discussions will not be repeated.

Thereafter, third substrate 14c may be secured to the exposed portion(s) of second substrate 14b. (See, FIG. 35G). The third substrate 14b may be secured using, for example, well-known bonding techniques such as fusion bonding, anodic-like bonding and/or silicon direct bonding. In conjunction with securing third substrate 14c to second substrate 14b, the atmosphere (including its characteristics) in which moveable electrode 18 operates may also be defined. Notably, all techniques of defining the atmosphere, including the pressure thereof, during the process of securing third substrate 14c to second substrate 14b, whether now known or later developed, are intended to be within the scope of the present inventions.

Like first and second substrates 14a and 14b, third substrate 14c may be formed from any material discussed above relative to first, second and/or third substrates of other embodiments. For the sake of brevity, such discussions will not be repeated.

Before or after third substrate 14c is secured to second substrate 14b, contact area 26b may be formed in a portion of third substrate 14c to be aligned with, connect to or overlie contact area 26a. The contact area 26b may be a semiconductor region that includes a doping that provides the same conductivity as contact area 26a. In this way, a suitable, desired and/or predetermined electrical conductivity is provided with contact area 26a when third substrate 14c is secured to second substrate 14b. (See, FIG. 37H). Thus, contact area 26b may be a highly doped region of third substrate 14c which provides enhanced electrical conductivity with contact area 26a. The contact area 26b may be formed in third substrate 14c using well-known lithographic and doping techniques.

Notably, contact area 26b may be a heavily counter-doped region of third substrate 14c which includes a conductivity that is different from the conductivity of the other portions of third substrate 14c. In this way, contact areas 26a and 26b are electrically isolated from the other portions of third substrate 14c. Thus, in this embodiment, second substrate 14b may be a first conductivity type (for example, an N-type conductivity) and third substrate 14c may be a second conductivity type (for example, a P-type conductivity). As such, contact area 26b may be a heavily counter-doped N-type region which provides suitable, desired and/or predetermined electrical conductivity characteristics when third substrate 14c is secured to second substrate 14b and contact areas 26a and 26b are in physical contact.

Figure 37I:
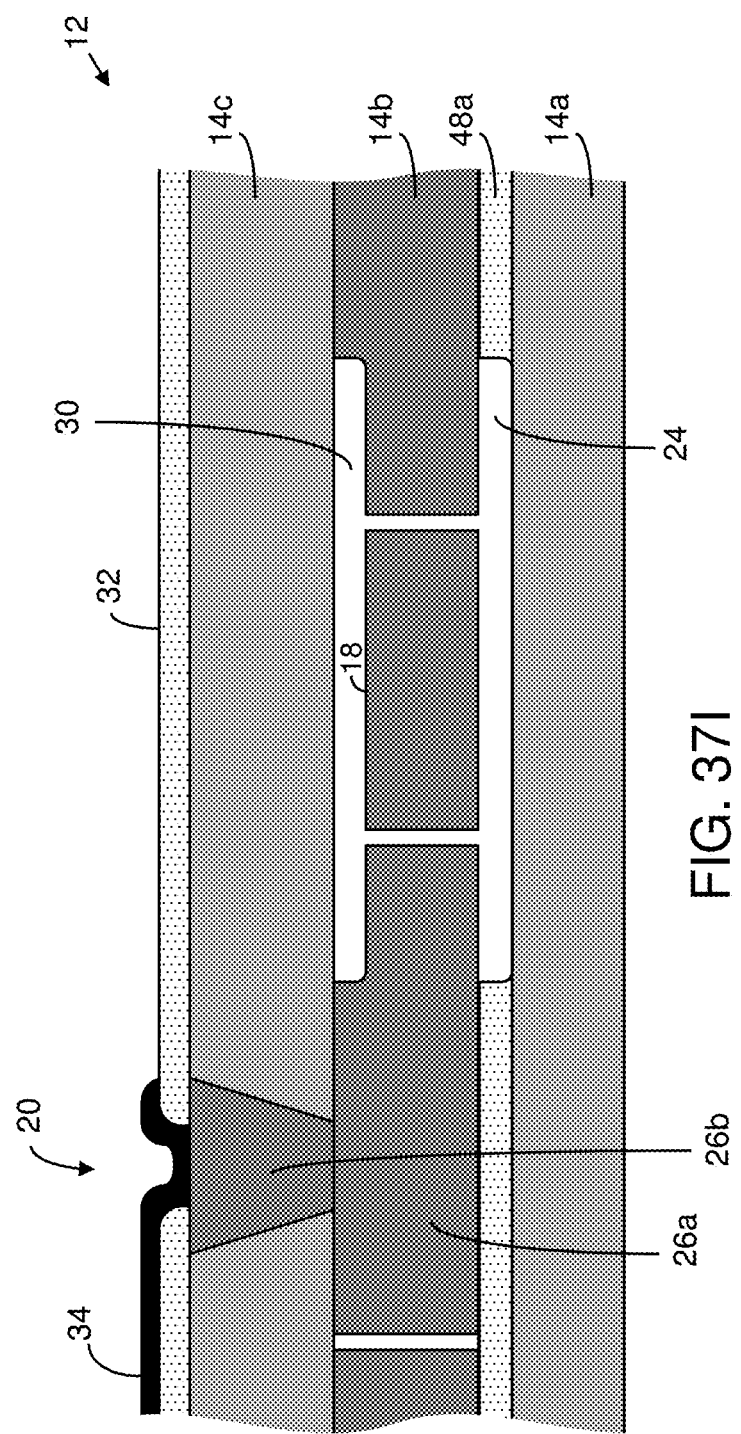

With reference to FIG. 37I, microelectromechanical system 10 may be completed by depositing, forming and/or growing insulation layer 32 and a contact opening may be etched to facilitate electrical contact/connection to contact area 26b. The conductive layer 34 (for example, a heavily doped polysilicon, metal (such as aluminum, chromium, gold, silver, molybdenum, platinum, palladium, tungsten, titanium, and/or copper), metal stacks, complex metals and/or complex metal stacks) may then be deposited to provide appropriate electrical connection to contact 26a and 26b.

Notably, insulation layer 32 and/or conductive layer 34 may be formed, grown and/or deposited before or after third substrate 14c is secured to second substrate 14b. Under these circumstances, when third substrate 14c is secured to second substrate 14b, the microelectromechanical system 10 may be completed.

The insulating layer 32 may be, for example, silicon dioxide, silicon nitride, BPSG, PSG, or SOG, or combinations thereof. It may be advantageous to employ silicon nitride because silicon nitride may be deposited in a more conformal manner than silicon oxide. Moreover, silicon nitride is compatible with CMOS processing, in the event that microelectromechanical system 10 includes CMOS integrated circuits.

As mentioned above with respect to other embodiments of the present inventions, prior to formation, deposition and/or growth of insulation layer 32 and/or conductive layer 34, additional micromachined mechanical structures 12 and/or transistors of circuitry 16 may be formed and/or provided in third substrate 14c or in other substrates that may be fixed to first substrate 14a and/or second substrate 14b. In this regard, the exposed surface of third substrate 14c or another substrate disposed thereon may be a suitable base upon which integrated circuits (for example, CMOS transistors) and/or micromachined mechanical structures 12. Such integrated circuits and micromachined mechanical structures 12 may be fabricated using the inventive techniques described herein and/or well-known fabrication techniques and equipment. For the sake of brevity, those discussions, in connection with the embodiments of FIGS. 36 and 37A-I, will not be repeated.

In this embodiment, the portion of substrate 14b in which micromachined mechanical structure 12 is formed includes a conductivity that is the same as the conductivity of the semiconductor of third substrate 14c. In this embodiment, micromachined mechanical structure 12 includes an isolation trenches 42a and 42b as well as isolation regions 44a and 44b. The isolation trenches 42a and 42b, and isolation regions 44a and 44b, in combination, electrically isolate contact 20 (and, in particular, contact areas 26a and 26b) from contiguous portions of third substrate 14c. In this exemplary embodiment, isolation region 44a is aligned with cavity 24 and trench 28a, and isolation trenches 42a and 42b are aligned with isolation regions 44b and 44c. In this way, contact 20 includes suitable contact isolation.

Briefly, with reference to FIGS. 39A-39D and 39F, an exemplary method of fabricating or forming micromachined mechanical structure 12 according to this embodiment of the present inventions may be substantially the same as with the previous embodiment. For the sake of brevity those discussions will not be repeated.

With reference to FIG. 39E, in this embodiment, isolation regions 44a and 44b are deposited and/or implanted into portions of substrate 14b in order to facilitate electrical isolation of contact 20 after second substrate 14b is secured or fixed (via, for example, bonding). The isolation regions 44a and 44b may be any material or structure that insulates contact 20, for example, an insulator material and/or an oppositely doped semiconductor region. In the illustrative example, isolation regions 44a and 44b are oppositely doped semiconductor region (relative to the conductivity of substrate 14c).

With reference to FIG. 39F, trenches 28a-c may be formed to define moveable electrode 18 and contact area 26a. The trenches may be formed using well-known deposition and lithographic techniques. Notably, all techniques for forming or fabricating trenches 28a-c, whether now known or later developed, are intended to be within the scope of the present inventions.

Thereafter, third substrate 14c may be secured to the exposed portion(s) of second substrate 14b. (See, FIG. 39G). The third substrate 14b may be secured using, for example, well-known bonding techniques such as fusion bonding, anodic-like bonding and/or silicon direct bonding. In conjunction with securing third substrate 14c to second substrate 14b, the atmosphere (including its characteristics) in which moveable electrode 18 operates may also be defined. Notably, all techniques of defining the atmosphere, including the pressure thereof, during the process of securing third substrate 14c to second substrate 14b, whether now known or later developed, are intended to be within the scope of the present inventions.

Thereafter, isolation trenches 42a and 42b are formed in portions of third substrate 14c. (See, FIG. 39H). The isolation trenches 42a and 42b may be formed using well-known lithographic and etching techniques. In this exemplary embodiment, the isolation trenches are aligned with isolation regions 44a and 44b which are disposed in or on second substrate 14b.

Figure 39C:
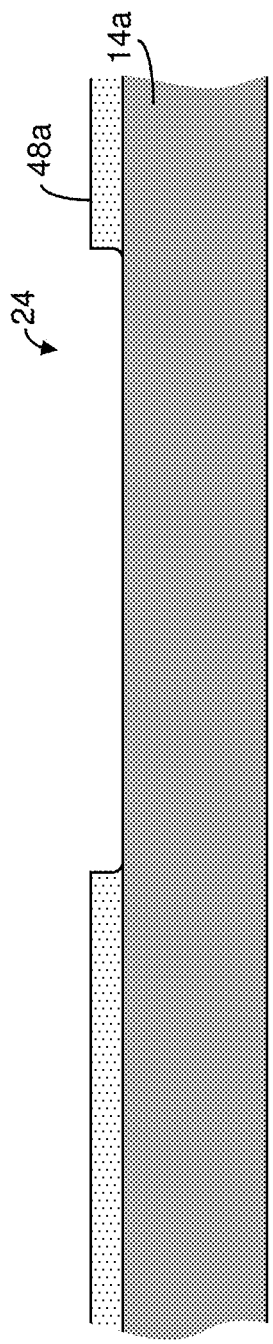
Figure 39H:
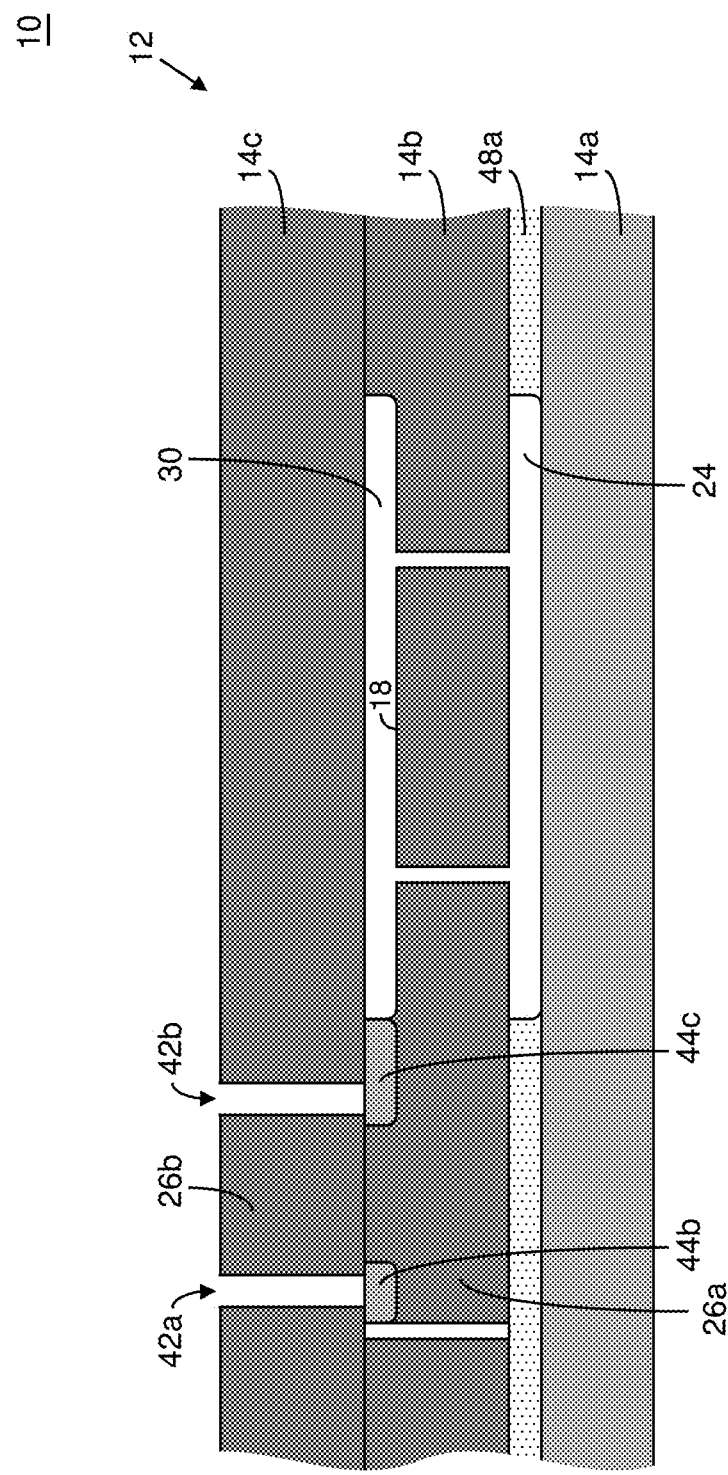
Figure 39I:
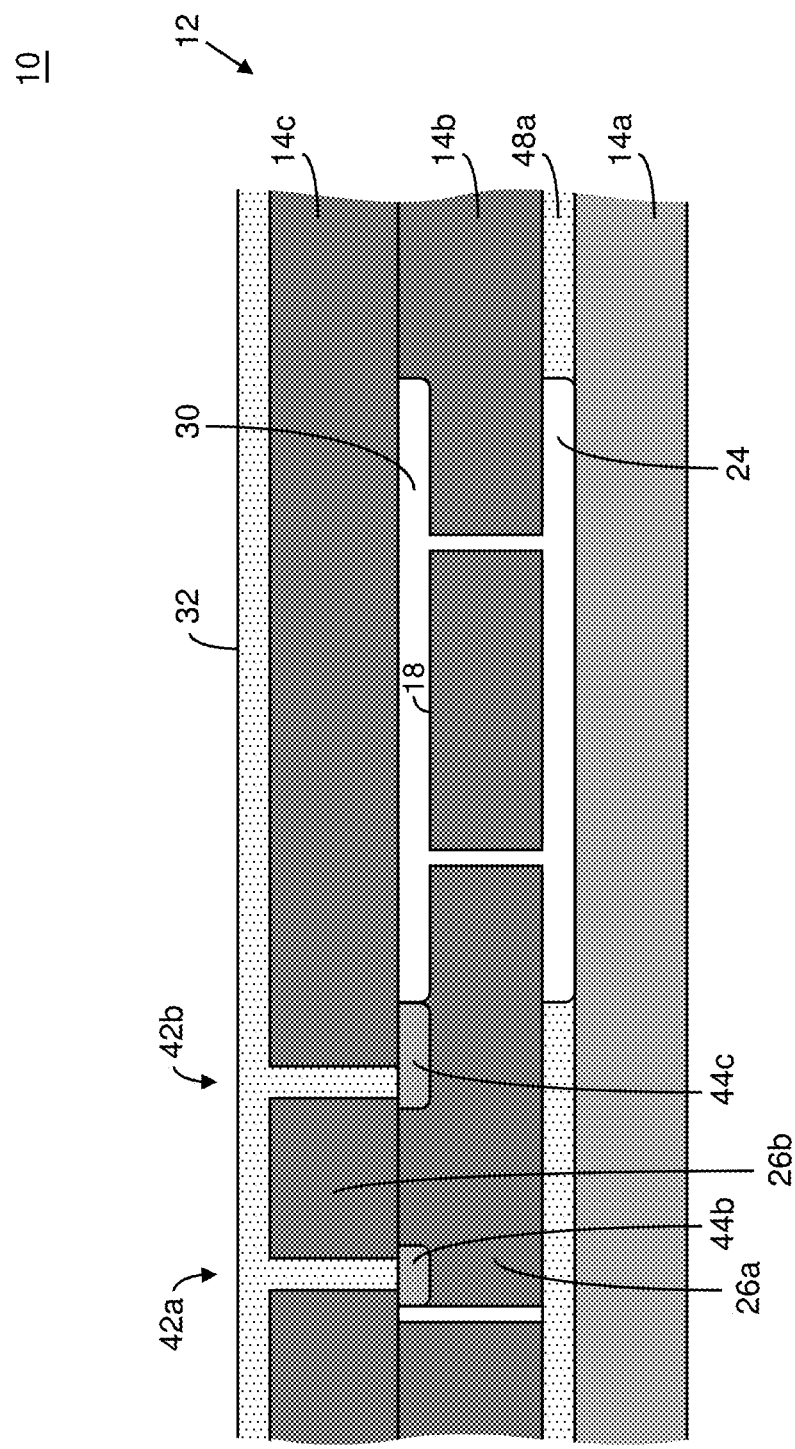

With reference to FIG. 39I, isolation trenches 42a and 42b may include a material that insulates contact 20 (and contact areas 26a and 26b) from portions of third substrate 14c. In the exemplary embodiment, an insulating material, for example, silicon dioxide or silicon nitride, is deposited and/or grown in isolation trenches 42a and 42b. Indeed, as illustrated, material that forms insulation layer 32 may also be deposited in isolation trenches 42a and 42b. Notably, isolation trenches 42a and 42b may include any material that insulates contact 20 (and contact areas 26a and 26b) from portions of third substrate 14c.

Figure 39J:
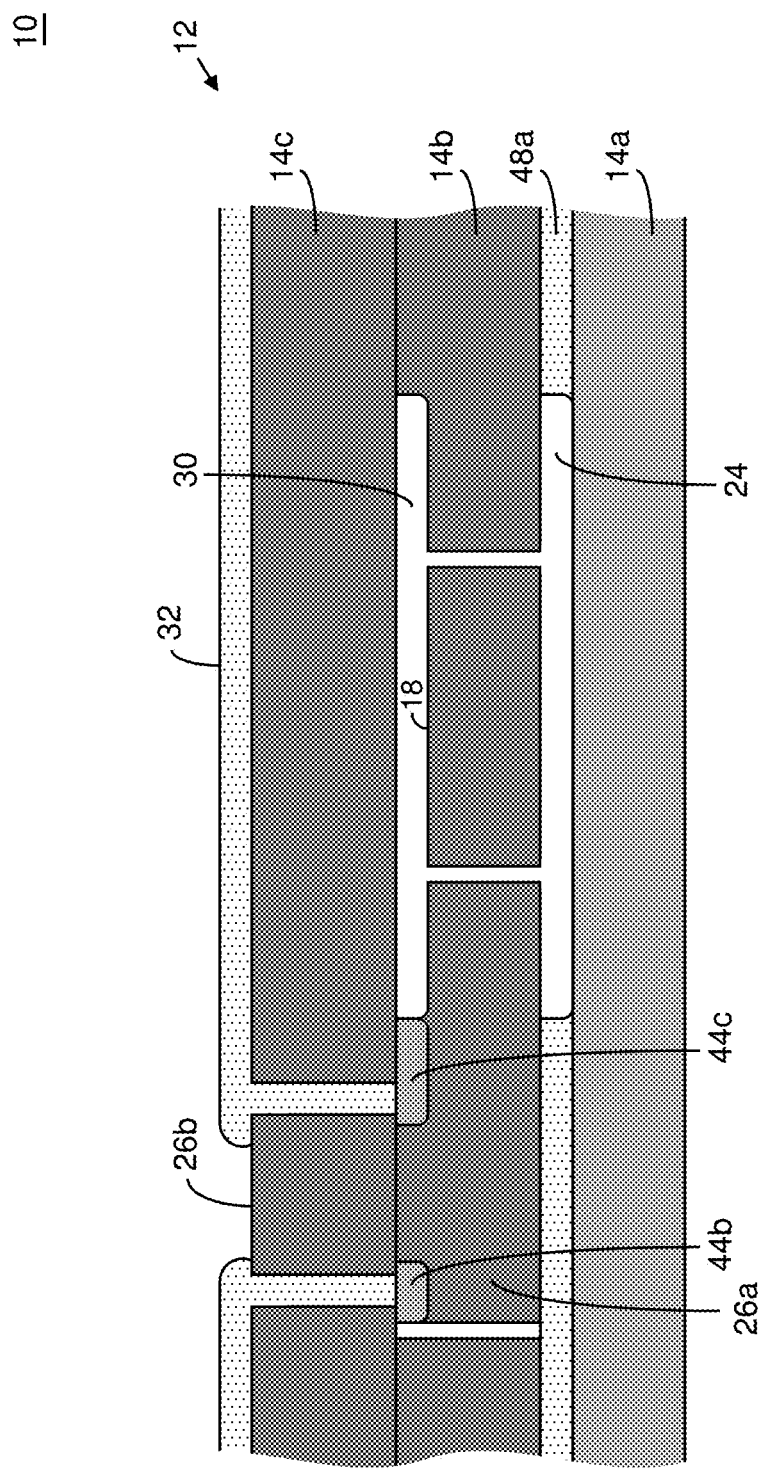
Figure 39K:
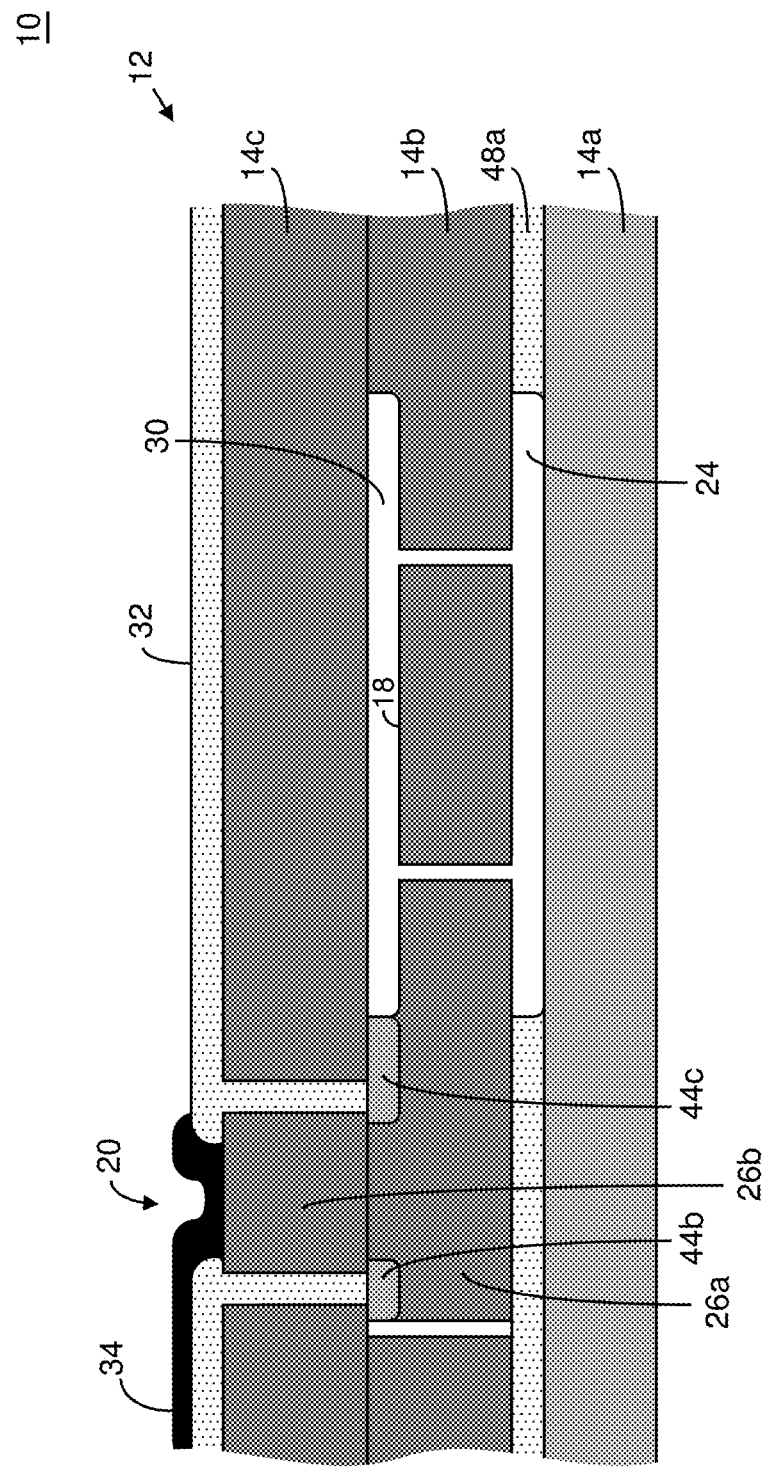

With reference to FIG. 39I-39K, microelectromechanical system 10 may be completed by depositing, forming and/or growing insulation layer 32 and a contact opening may be etched to facilitate electrical contact/connection to contact area 26b. The processing may be the same or similar to that described herein with any of the other embodiments. For the sake of brevity, those discussions will not be repeated.

Moreover, as mentioned above with respect to other embodiments of the present inventions, prior to formation, deposition and/or growth of insulation layer 32 and/or conductive layer 34, additional micromachined mechanical structures 12 and/or transistors of circuitry 16 may be formed and/or provided in third substrate 14c or in other substrates that may be fixed to first substrate 14a and/or second substrate 14b. In this regard, the exposed surface of third substrate 14c or another substrate disposed thereon may be a suitable base upon which integrated circuits (for example, CMOS transistors) and/or micromachined mechanical structures 12. Such integrated circuits and micromachined mechanical structures 12 may be fabricated using the inventive techniques described herein and/or well-known fabrication techniques and equipment. For the sake of brevity, those discussions, in connection with the embodiments of FIGS. 38 and 39A-K, will not be repeated.

In another embodiment, with reference to FIG. 40, after formation of cavity 18 in first substrate 14a, intermediate layer 54 is deposited or grown before second substrate 148 is secured to first substrate 14a. In one embodiment, intermediate layer 54 may be a native oxide. In another embodiment, a thin insulating layer is deposited. In this way, first substrate 14a is electrically isolated from second substrate 14b. Thereafter, second substrate 14b may be fixed to intermediate layer 54 using, for example, well-known bonding techniques such as fusion bonding and/or anodic-like bonding. Before or after securing second substrate 14b to first substrate 14a, second cavity 30 may be formed in second substrate 14b using well-known lithographic and etching techniques. In one exemplary embodiment, second cavity 30 also includes a depth of about 1 μm. Thereafter, the thickness of second substrate 14b may be adjusted to accommodate further processing. For example, second substrate 14b may be grinded and polished (using, for example, well known chemical mechanical polishing ("CMP") techniques) to a thickness of between 10 μm-30 μm.

FIGS. 41A-41H illustrate an exemplary process flow for fabricating microelectromechanical system 10 of FIG. 23. For the sake of brevity, the exemplary process flow will not be discussed in detail; reference however, is made to the discussions above.

The embodiment including intermediate layer 54 may be employed in conjunction with any of the embodiments described herein. (See, for example, FIGS. 42A and 42B, 43A-43K). For the sake of brevity, the exemplary process flow will not be discussed in detail; reference however, is made to the discussions above.

There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, illustration and claims (are possible by one skilled in the art after consideration and/or review of this disclosure). As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present inventions.

Each of the aspects of the present inventions, and/or embodiments thereof, may be employed alone or in combination with one or more of such aspects and/or embodiments. (See, for example, FIGS. 42A and 42B, 43A-43K). For the sake of brevity, those permutations and combinations will not be discussed separately herein. As such, the present inventions are not limited to any single aspect or embodiment thereof nor to any combinations and/or permutations of such aspects and/or embodiments.

Notably, it may be advantageous to adjust the alignment and etch processes to enhance electrical isolation of portions of micromachined mechanical structure 12, for example, contact 20 (including contact areas 26a and 26b). For example, with reference to FIG. 44, trench 28a may be aligned to provide suitable or predetermined overlap of isolation region 44a and 44b as well as include suitable or predetermined over etch into isolation region 44a. Further, isolation region 44c may include dimensions such that when cavity 30 is formed, a portion of isolation region 44c is removed. (See, FIGS. 45C and 45D). Moreover, with reference to FIG. 46A, isolation trenches 42a and 42b may include suitable or predetermined over etch into isolation regions 44a and 44b. Indeed, isolation trench 28a may be substantially larger and/or have considerably different tolerances than trenches 28b and 28c given that the dimensions of the trench are insignificant relative to trenches 28b and 28c which may largely define the mechanical structure of the system 10. (See, FIG. 46B). Such processing techniques may be applied to any of the embodiments described and/or illustrated herein.

Further, the processing flows described and illustrated herein are exemplary. These flows, and the order thereof, may be modified. All process flows, and orders thereof, to provide microelectromechanical system 10 and/or micromachined mechanical structure 12, whether now known or later developed, are intended to fall within the scope of the present inventions. For example, there are many techniques to form moveable electrode 18 and contact 20 (and in particular contact area 26a). With reference to FIG. 47A-47D, in one embodiment, mask 56a may be deposited and patterned. Thereafter, cavity 30 may be formed (See, FIGS. 47A and 47B). Thereafter, mask 56b may be deposited and patterned in order to form and define moveable electrode 18 and contact area 26 (See, FIGS. 47C and 47D).

Figure 48C:
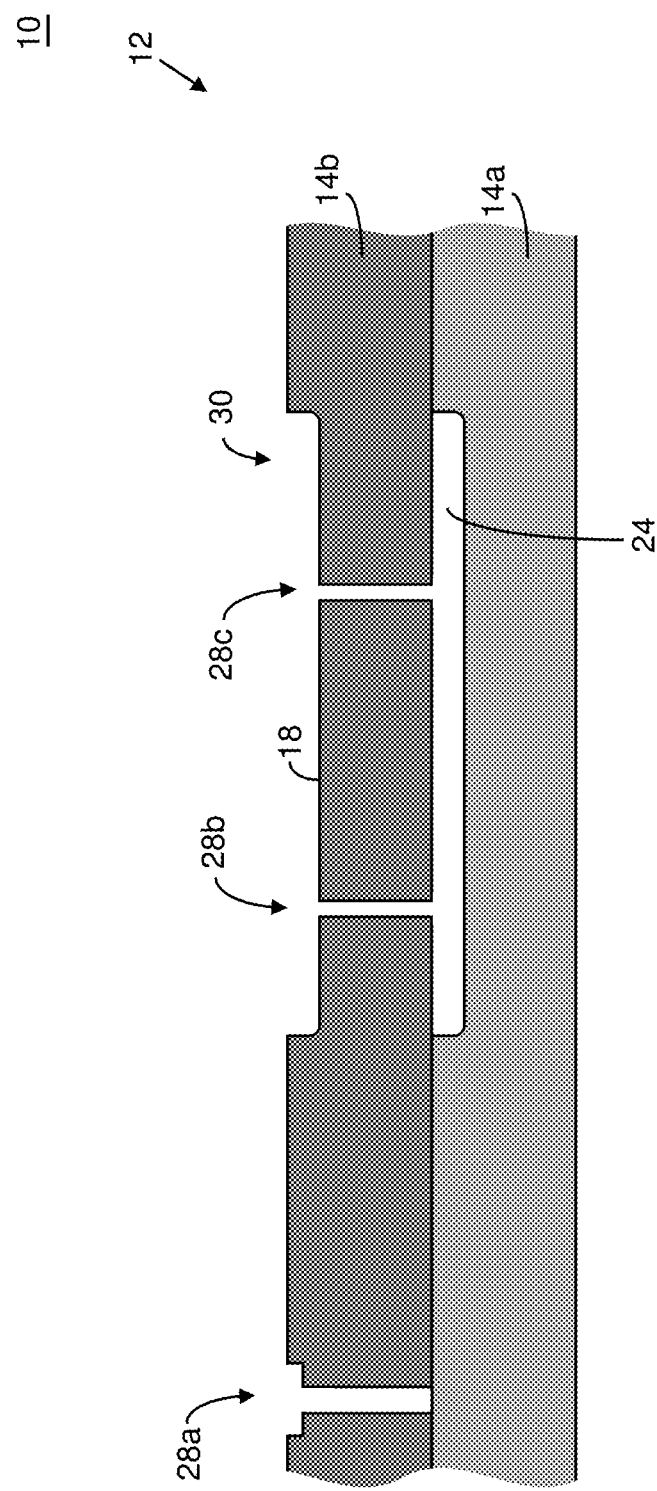
Figure 49A:
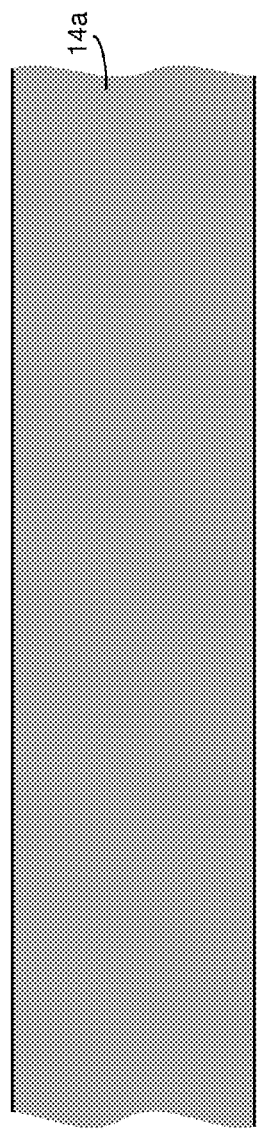
Figure 49B:
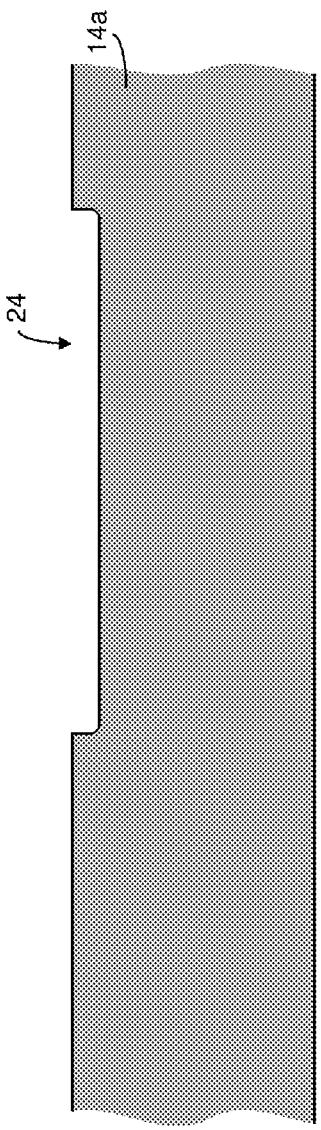
Figure 49C:
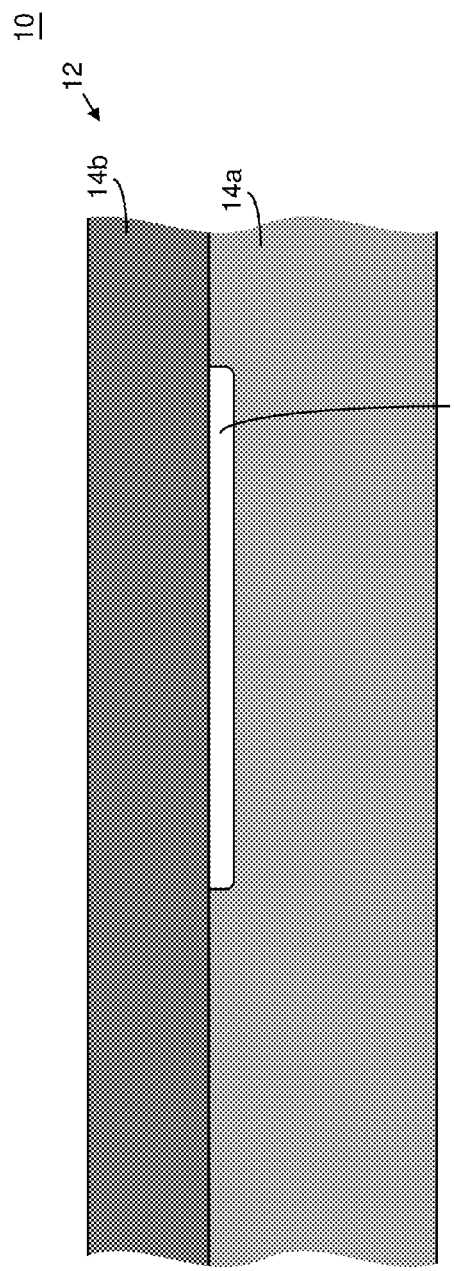
Figure 49D:
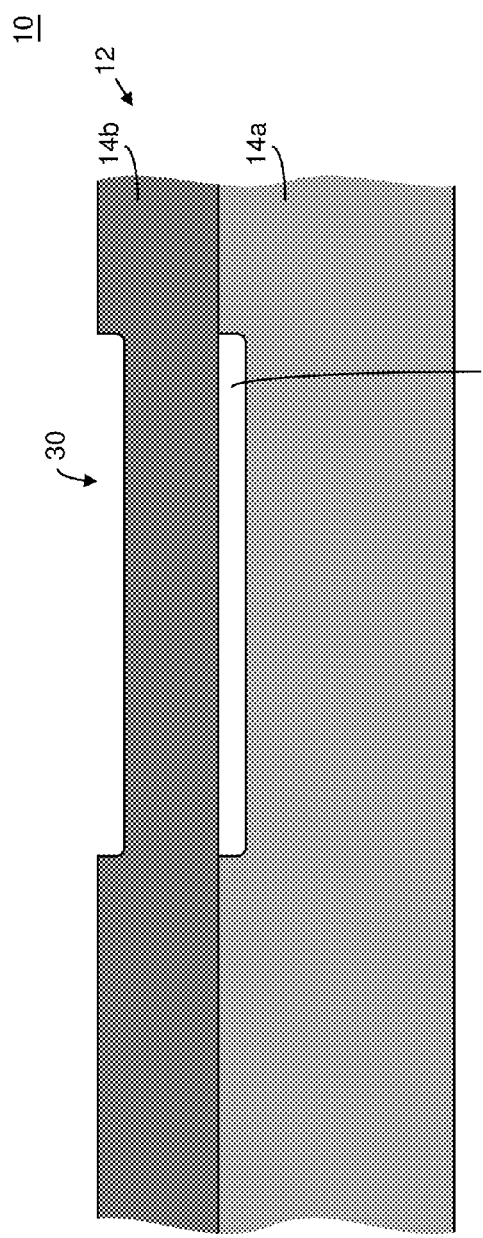
Figure 49E:
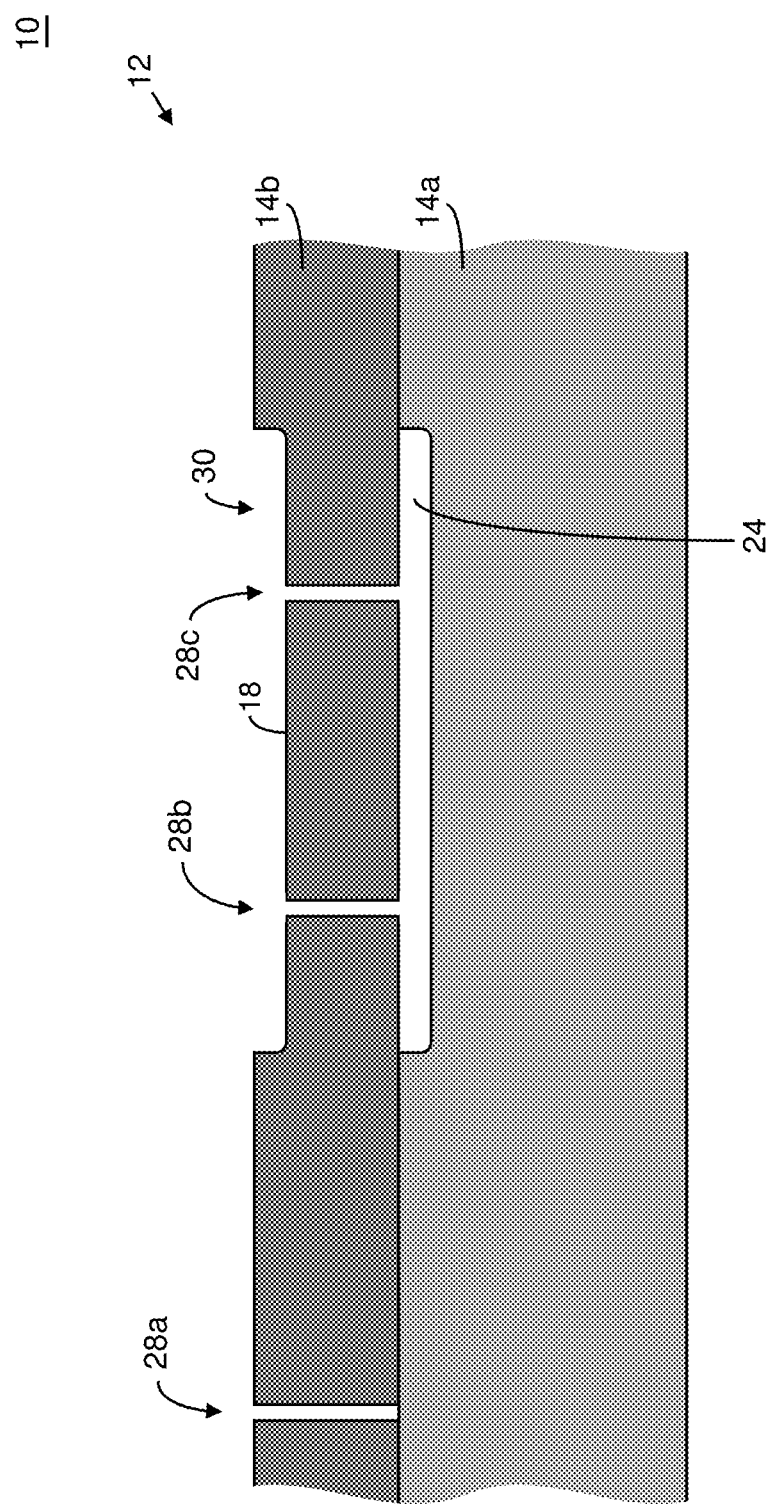
Figure 49F:
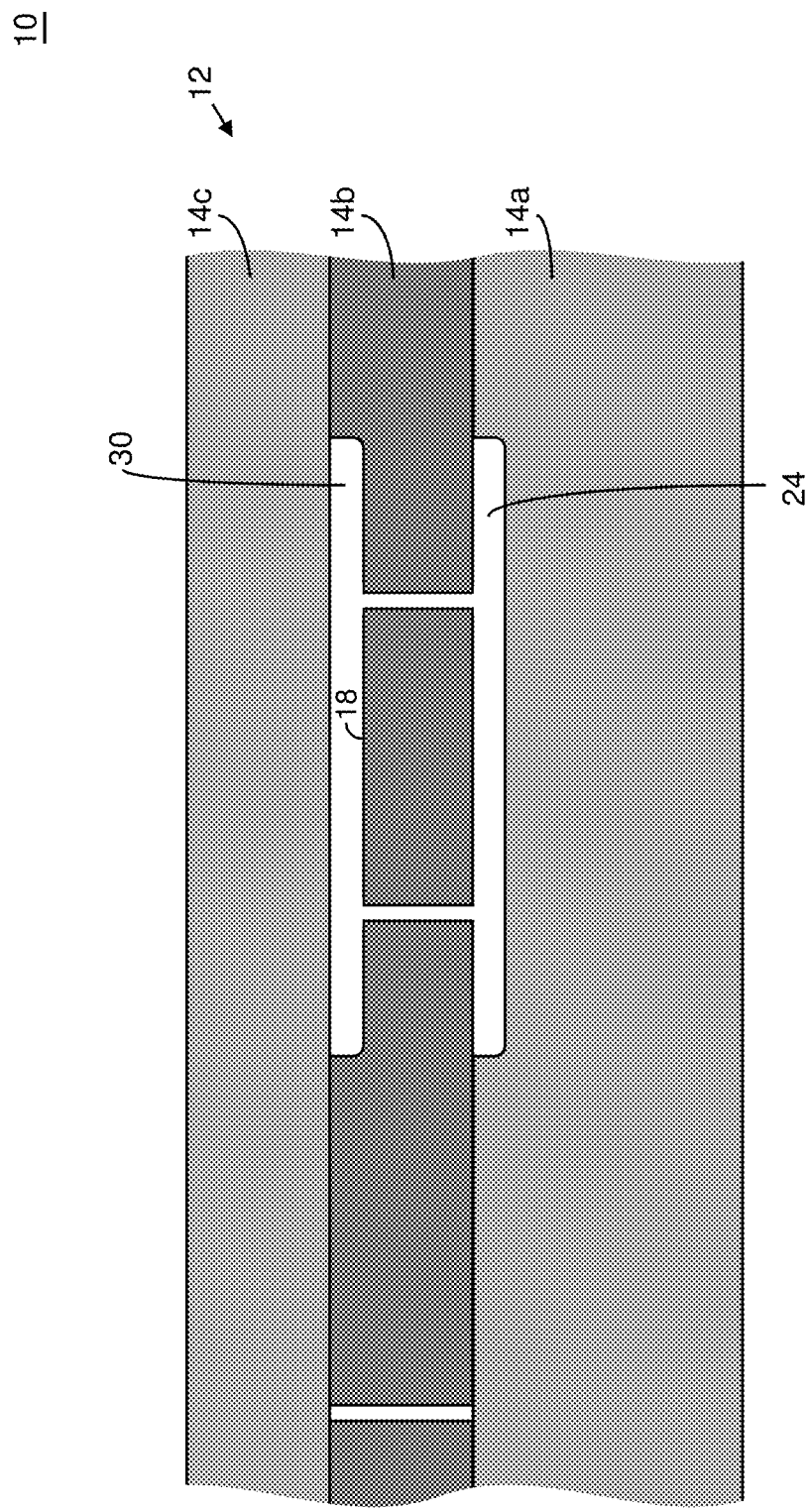
Figure 49G:
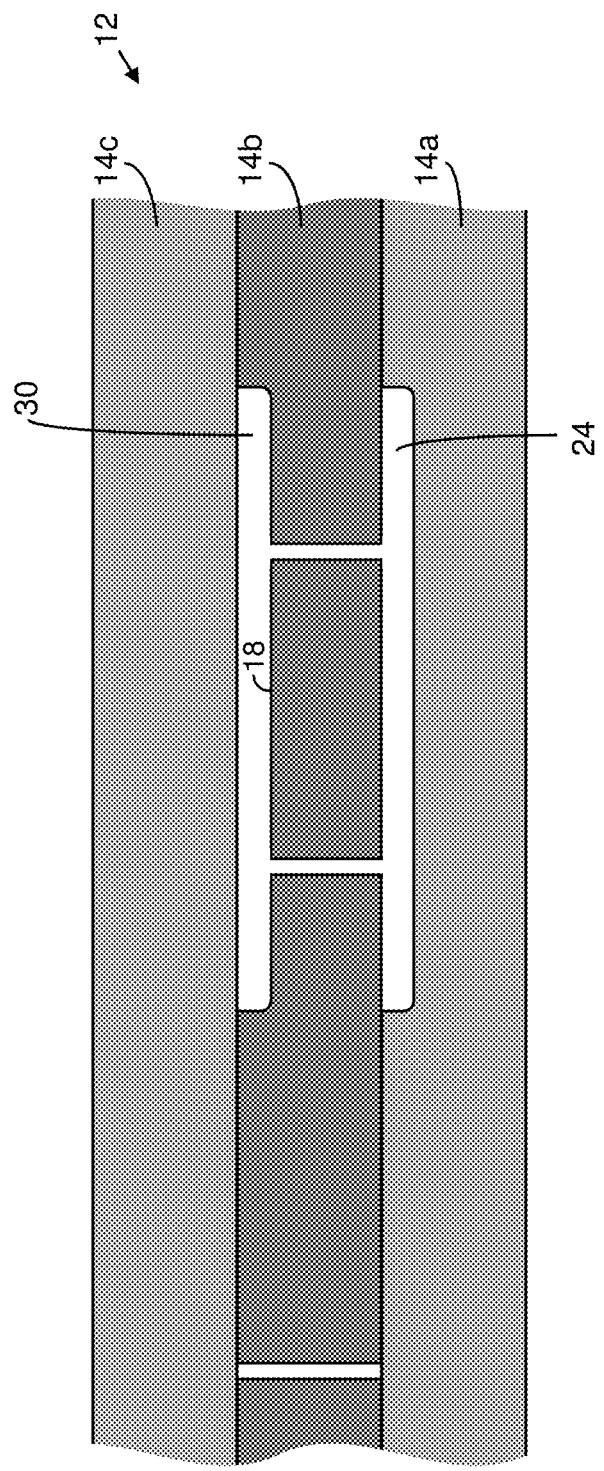
Figure 50A:
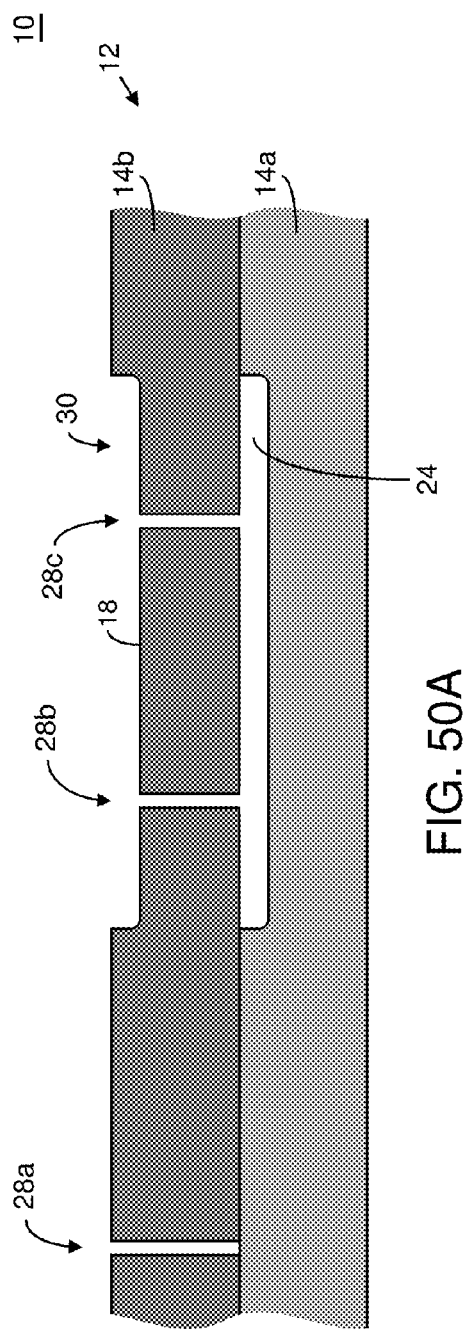
Figure 50B:
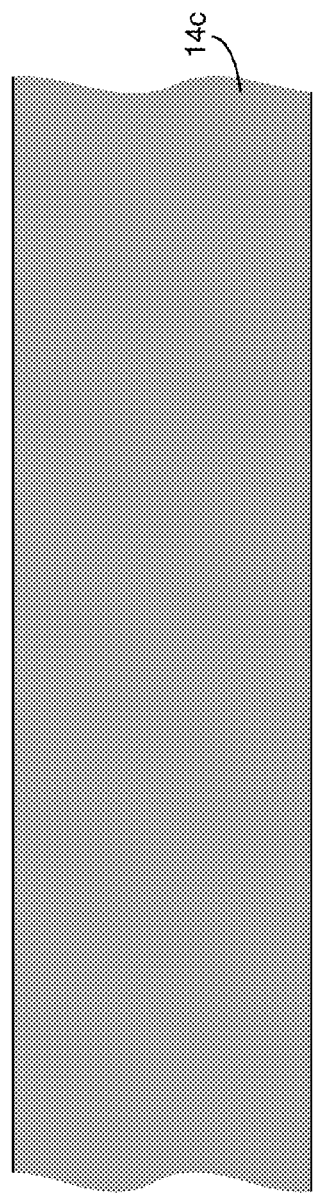
Figure 50C:
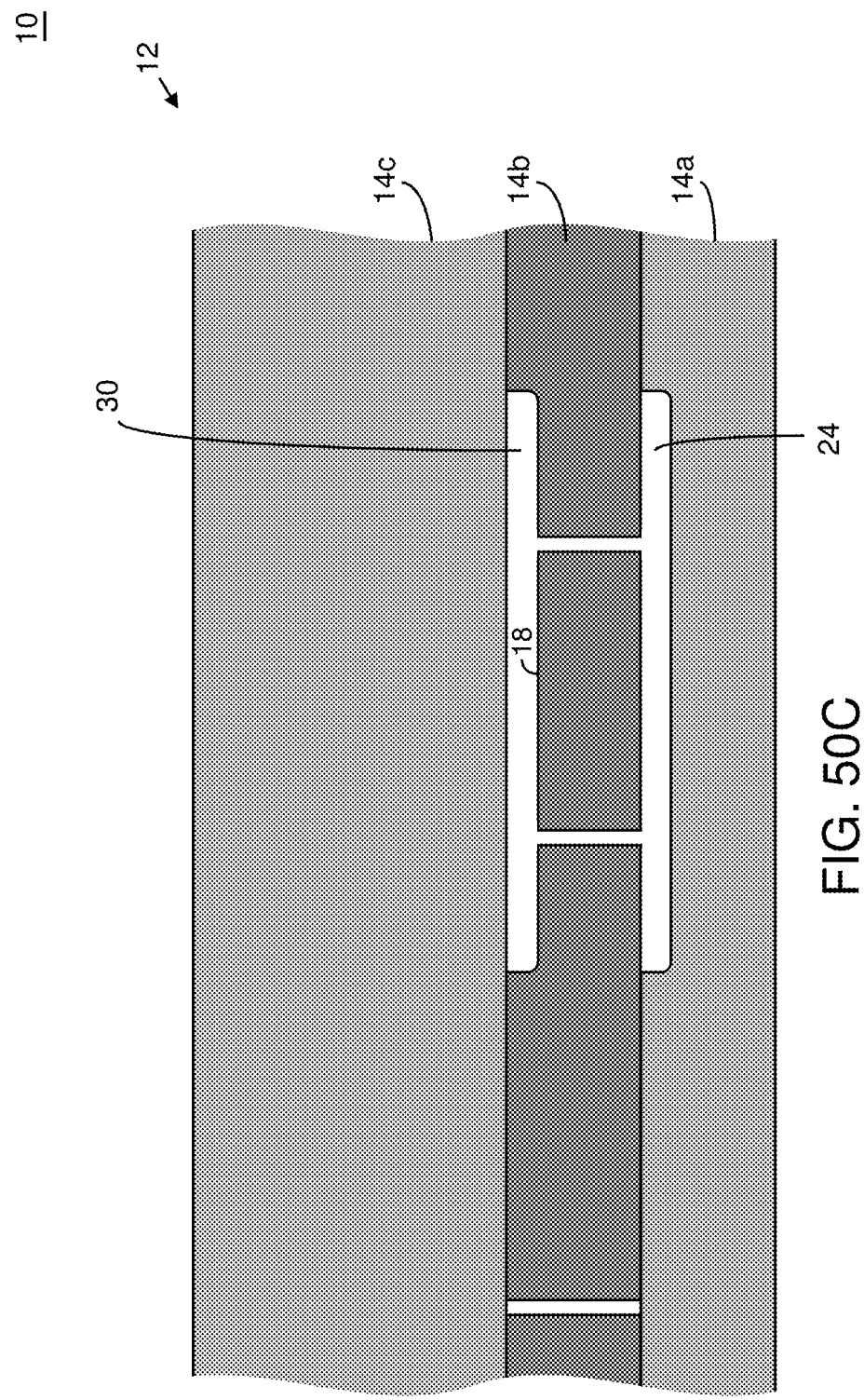
Figure 50D:
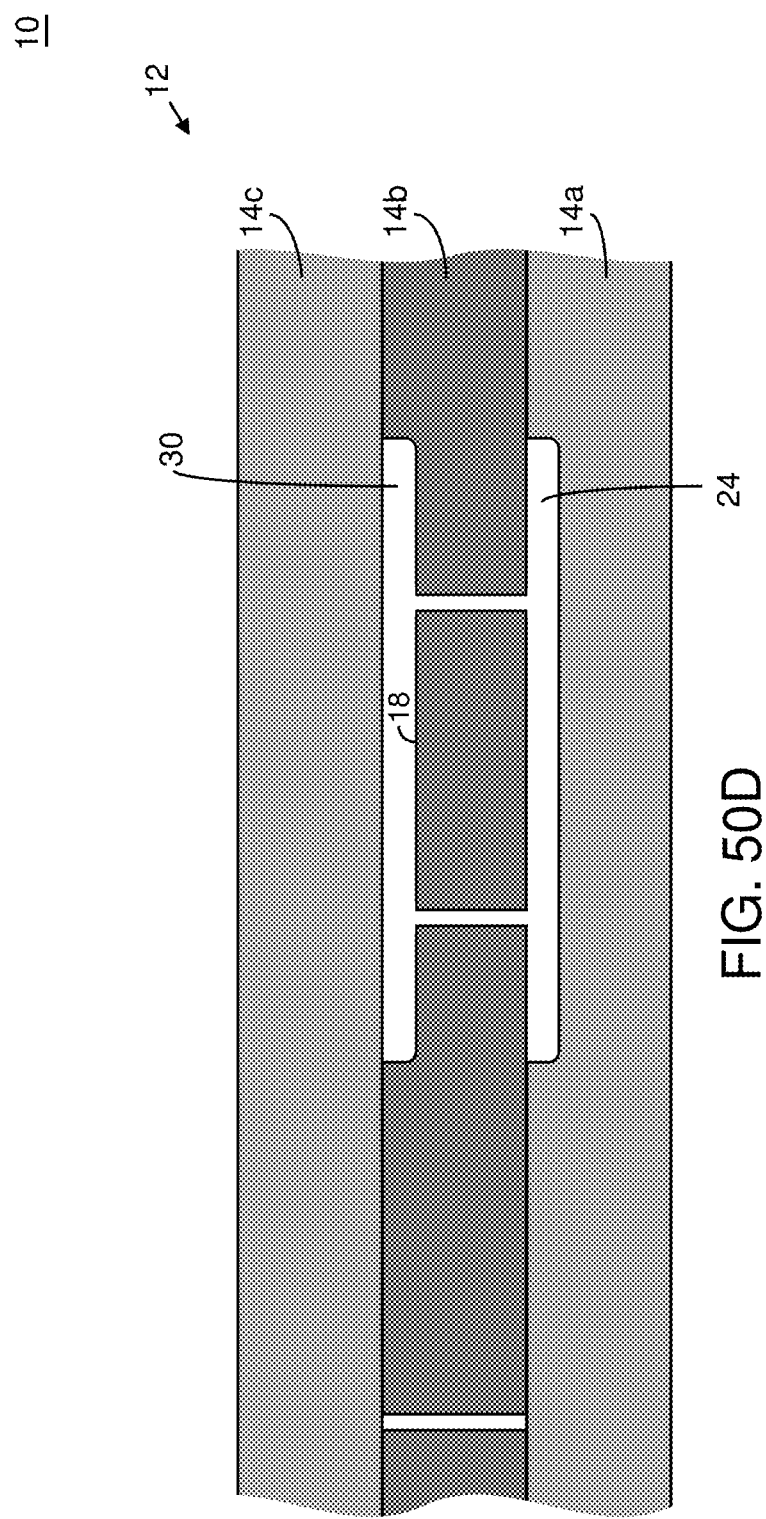
Figure 50E:
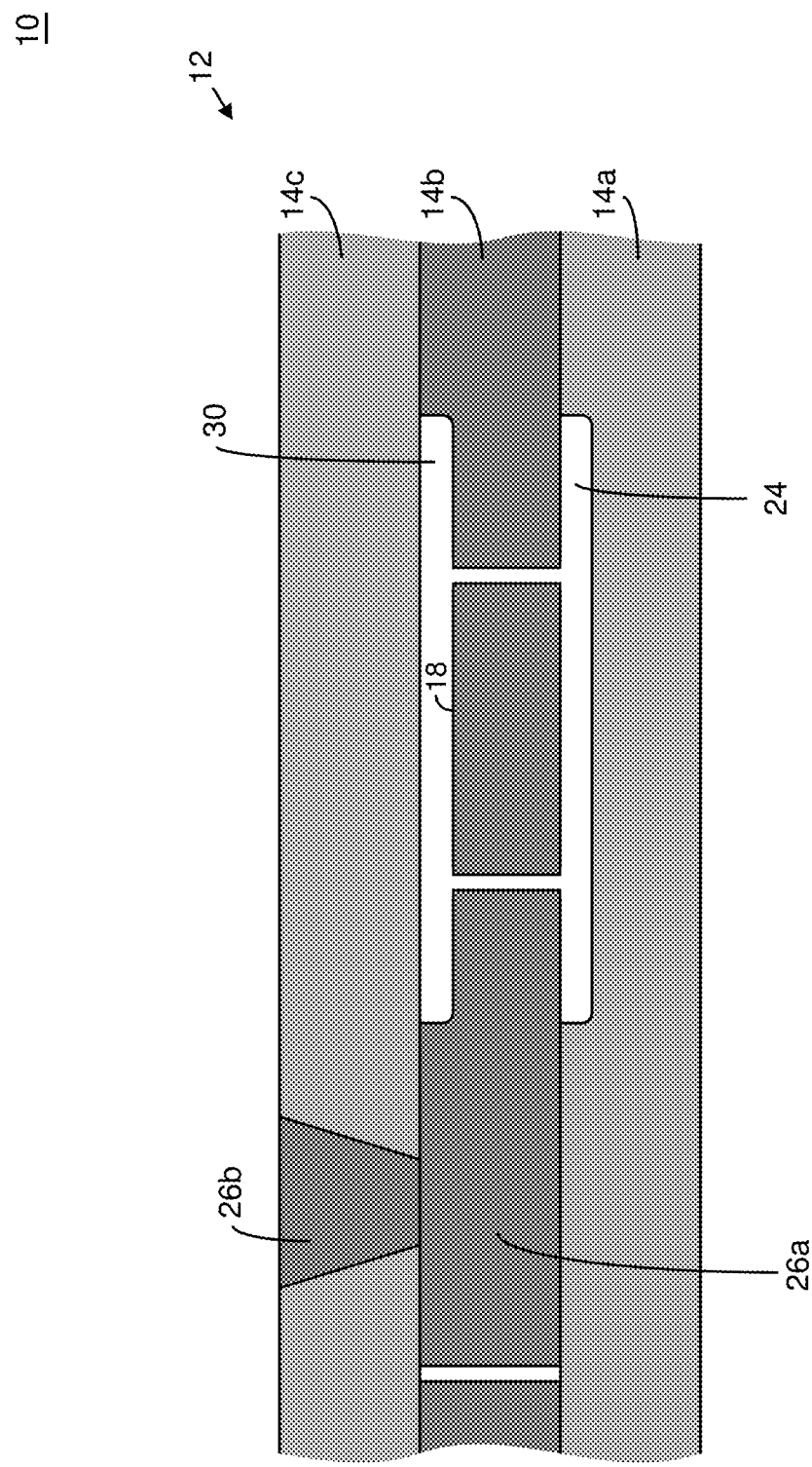
Figure 50F:
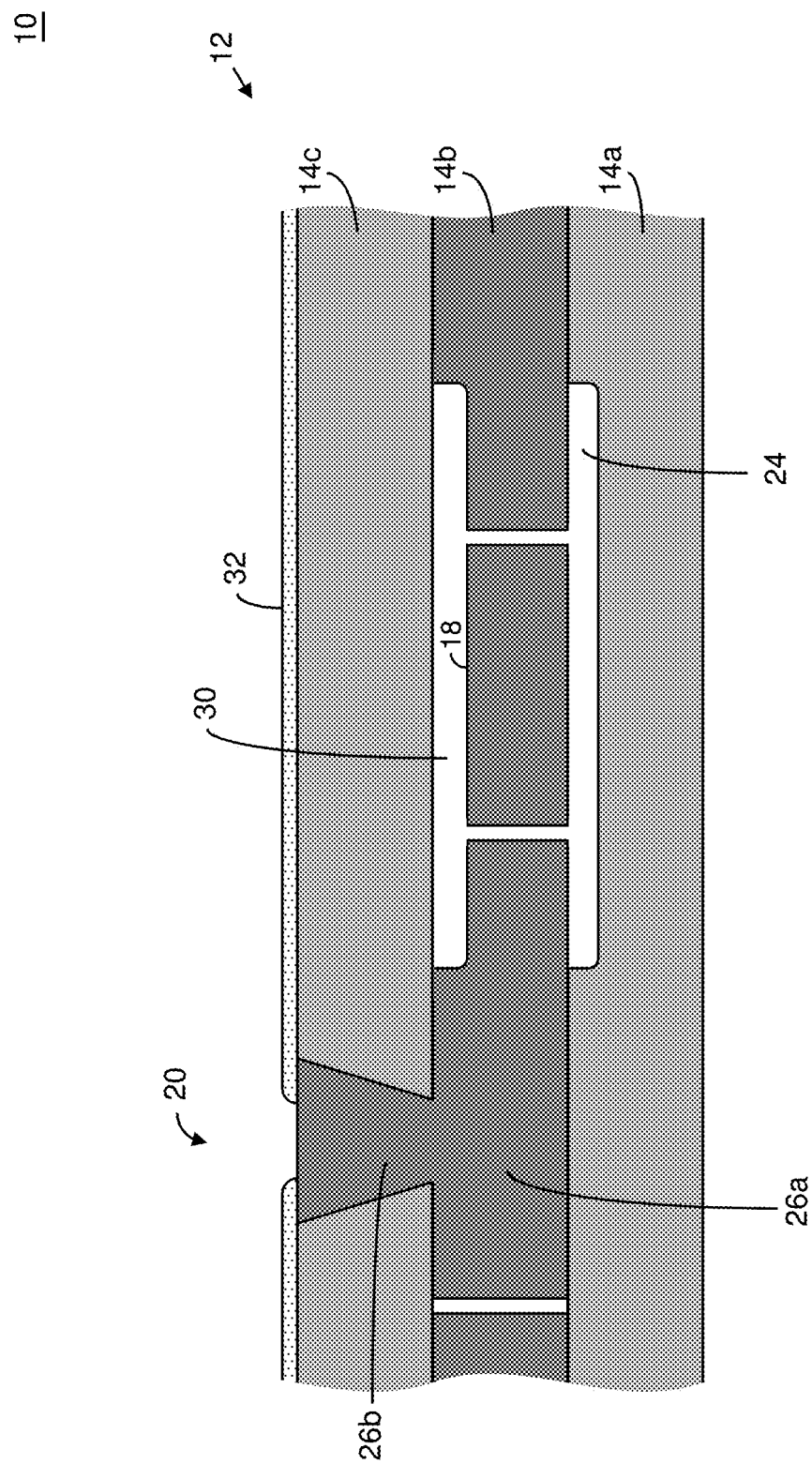
Figure 50G:
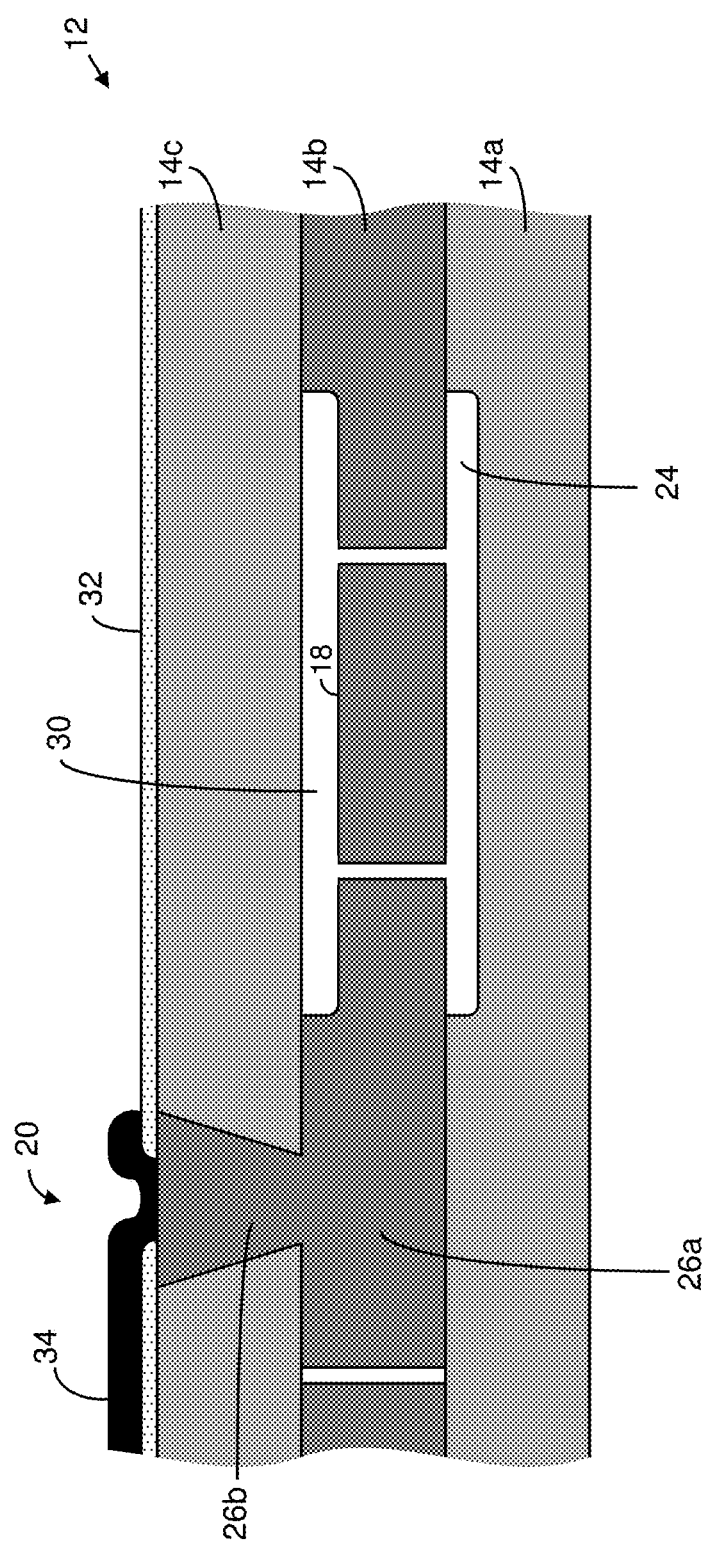
Figure 51E:
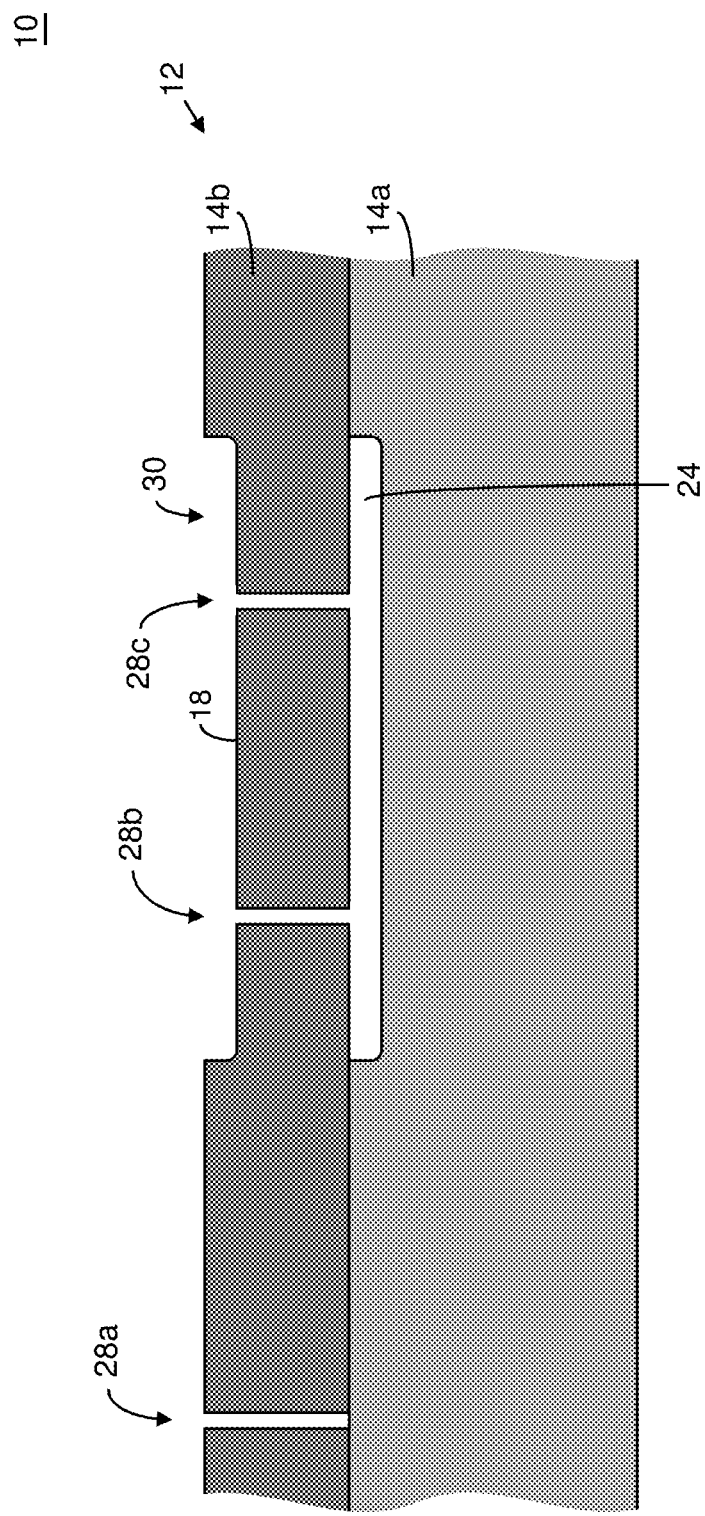
Figure 51F:
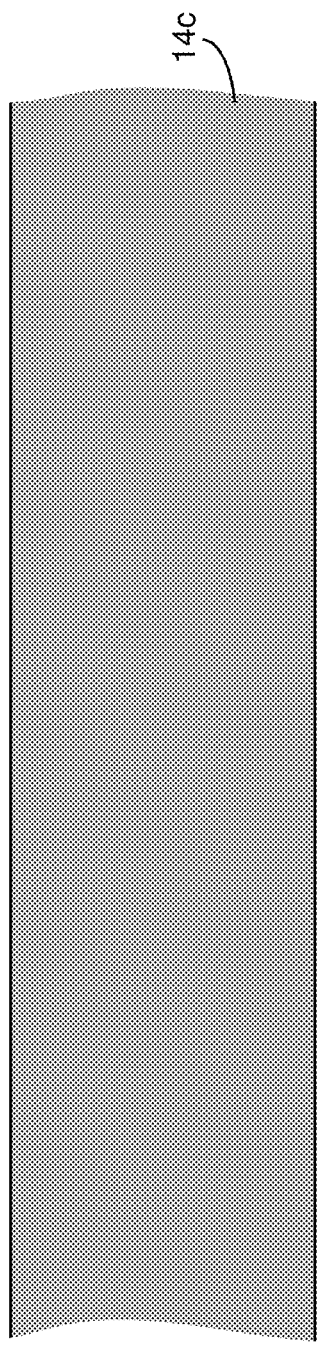
Figure 51G:
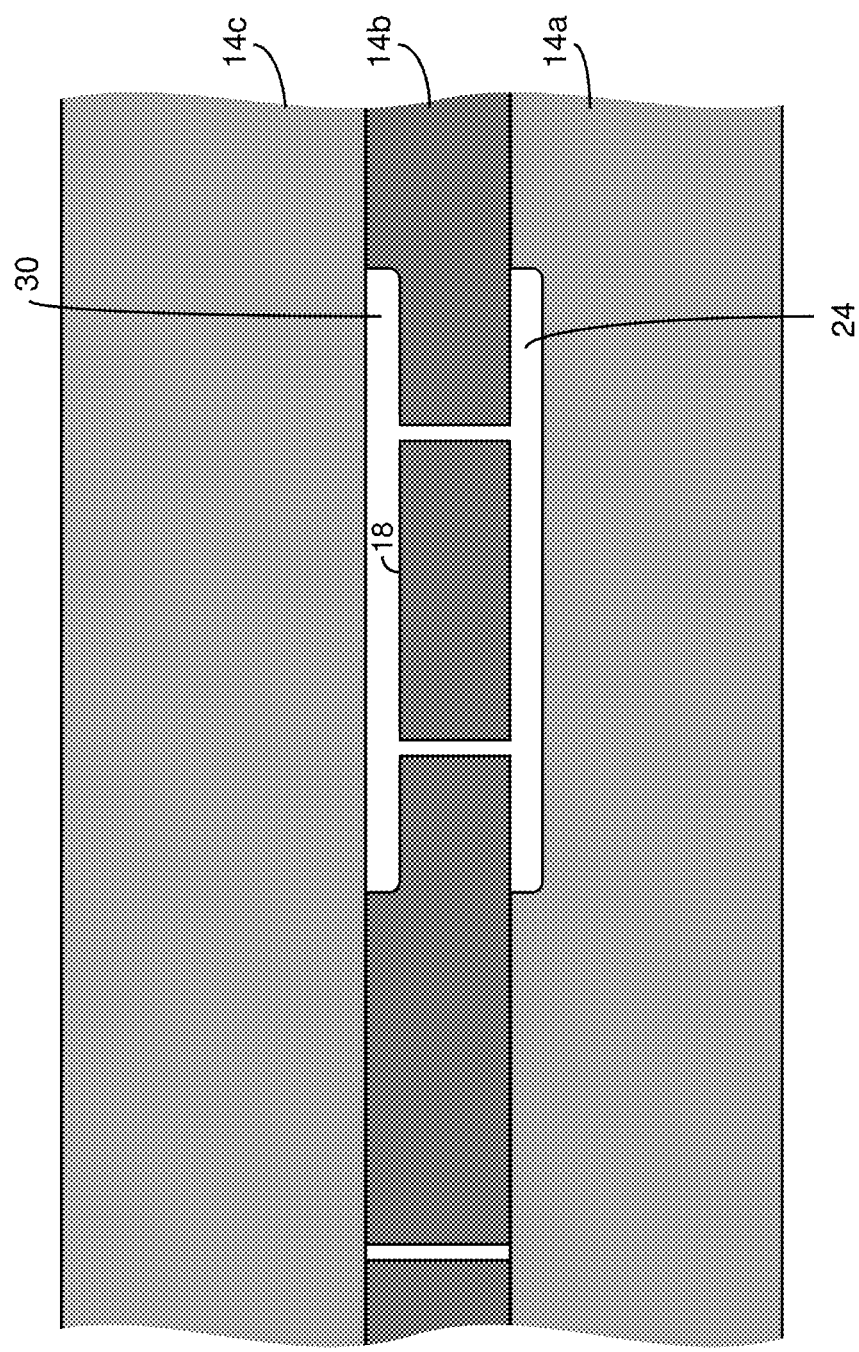
Figure 51H:
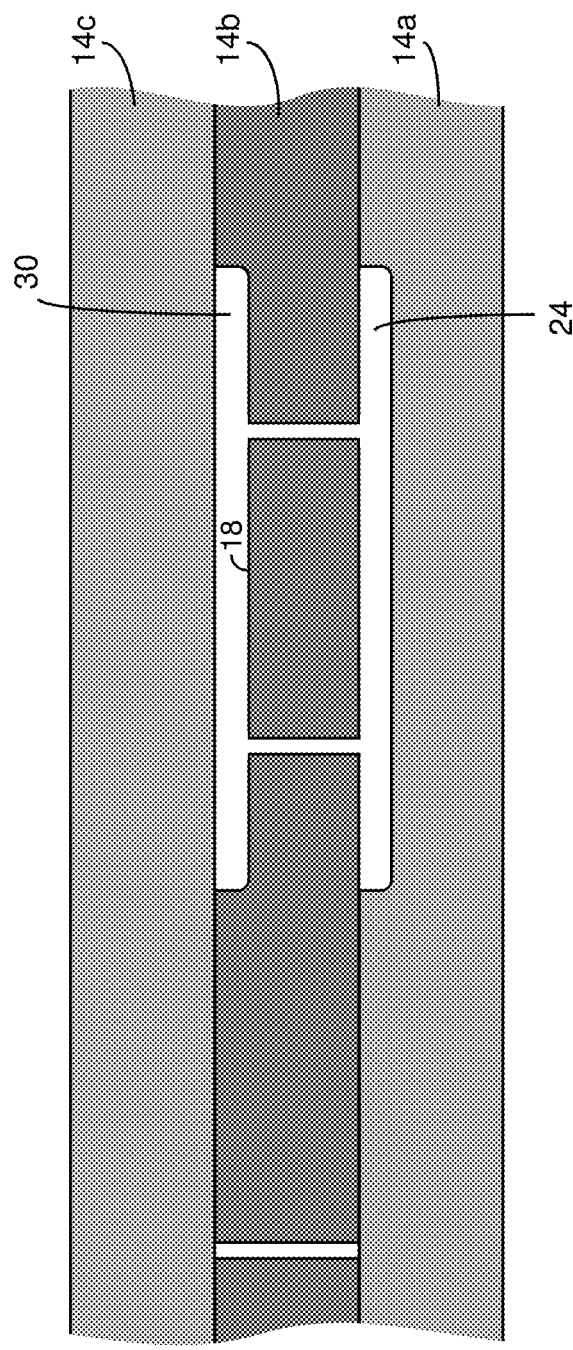

Alternatively, with reference to FIGS. 48A-48C, masks 56a and 56b may be deposited and patterned. After trenches 28a-28c are formed, mask 56b may be removed and cavity 30 may be formed.

Further, substrates 14 may be processed to a predetermined and/or suitable thickness before and/or after other processing during the fabrication of microelectromechanical system 10 and/or micromachined mechanical structure 12. For example, with reference to FIGS. 49A-49G, in one embodiment, first substrate 14a may be a relatively thick wafer which is grinded (and polished) after substrates 14b and 14c are secured to a corresponding substrate (for example, bonded) and processed to form, for example, micromachined mechanical structure 12. (Compare, for example, FIGS. 49A-G and 49H).

The processing flows described and illustrated with respect to substrate 14c may also be modified. For example, with reference to FIGS. 50A-50G, in one embodiment, substrate 14c may be a relatively thick wafer which is grinded (and polished) after secured to a corresponding substrate (for example, bonded). In this exemplary embodiment, substrate 14c is grinded and polished after being bonded to substrate 14b. (Compare, for example, FIGS. 50C and 50D) Thereafter, contact 20 may be formed. (See, for example, FIGS. 50E-50G).

Indeed, substrate 14a and 14c may be processed (for example, grinded and polished) after other processing. (See, for example, FIGS. 51A-51J). Notably, all processing flows with respect to substrates 14 are intended to fall within the scope of the present invention.

Further, as mentioned above, each of the aspects of the present inventions, and/or embodiments thereof, may be employed alone or in combination with one or more of such aspects and/or embodiments. For example, with reference to FIG. 52, microelectromechanical system 10 may include implant regions 58a and 58b in substrate 14c to facilitate electrically isolation of contact area 26b from other portions of substrate 14c. In this embodiment implant regions 58a and 58b may be any material or structure that insulates contact 20, for example, an oppositely doped semiconductor region. FIGS. 53A-53H illustrate an exemplary process flow for fabricating microelectromechanical system 10 of FIG. 52 wherein implant regions 58a and 58b are oppositely doped semiconductor regions.

Notably, implant regions 58a and 58b may be employed in any of the embodiments described and illustrated herein. For example, the implant regions 58a and 58b may be employed in conjunction with or in lieu of isolation trenches 42a and 42b.

In addition, as mentioned above, isolation regions 44a and 44b may be deposited and/or implanted into portions of substrate 14b in order to facilitate electrical isolation of contact 20 after third substrate 14c (or second substrate 14b where an SOI substrate 14a is employed (see, FIG. 11)) is secured or fixed (via, for example, bonding). The isolation regions 44a and 44b may be any material or structure that insulates contact 20, for example, an insulation material and/or an oppositely doped semiconductor region. FIGS. 55A-55K illustrate an exemplary process flow for fabricating microelectromechanical system 10 of FIG. 54 wherein isolation regions 44a and 44b are insulation material (for example, a silicon nitride or silicon dioxide) and an insulation material is disposed in isolation trenches 42a and 42b.

Figure 57C:
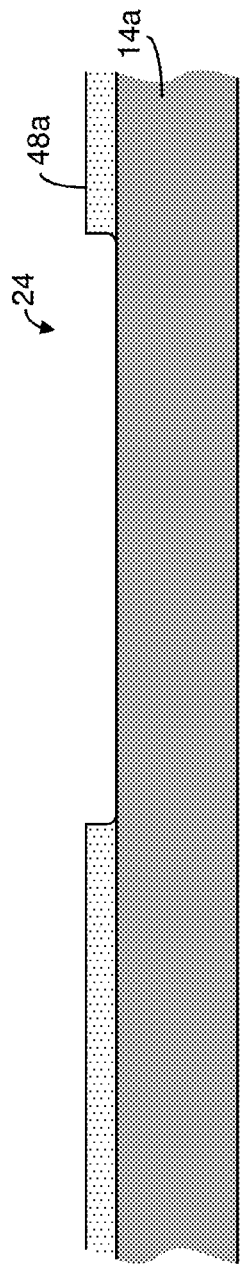
Figure 57D:
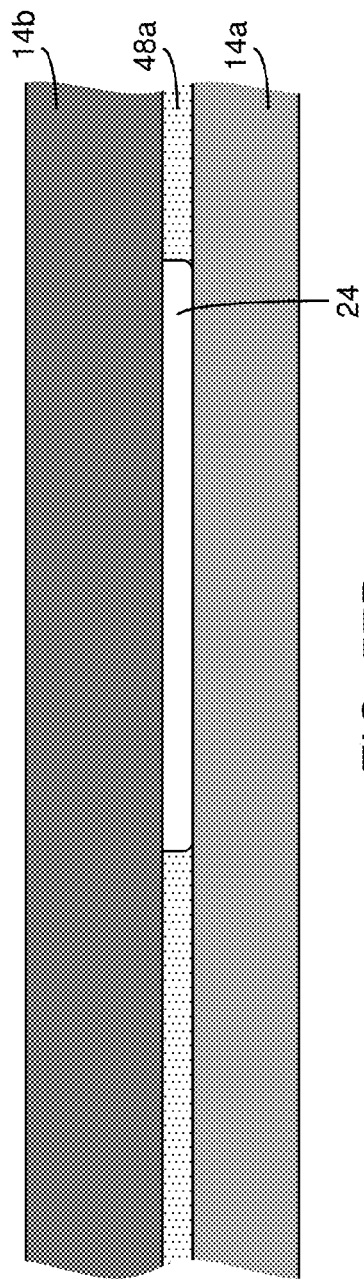
Figure 57E:
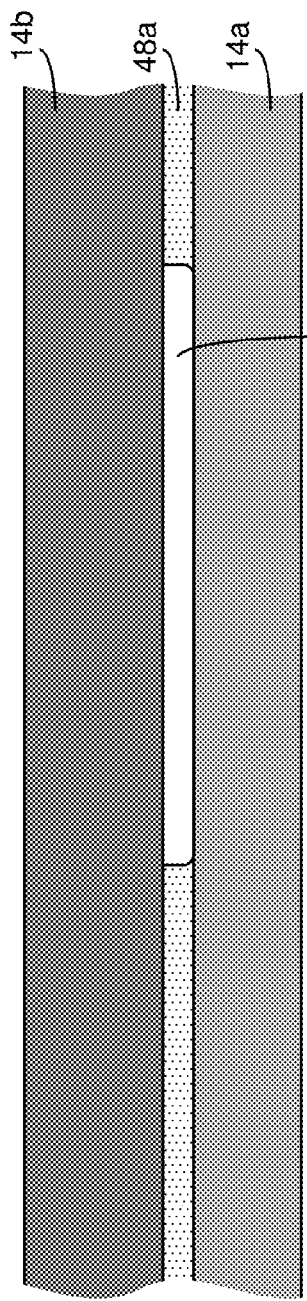
Figure 57F:
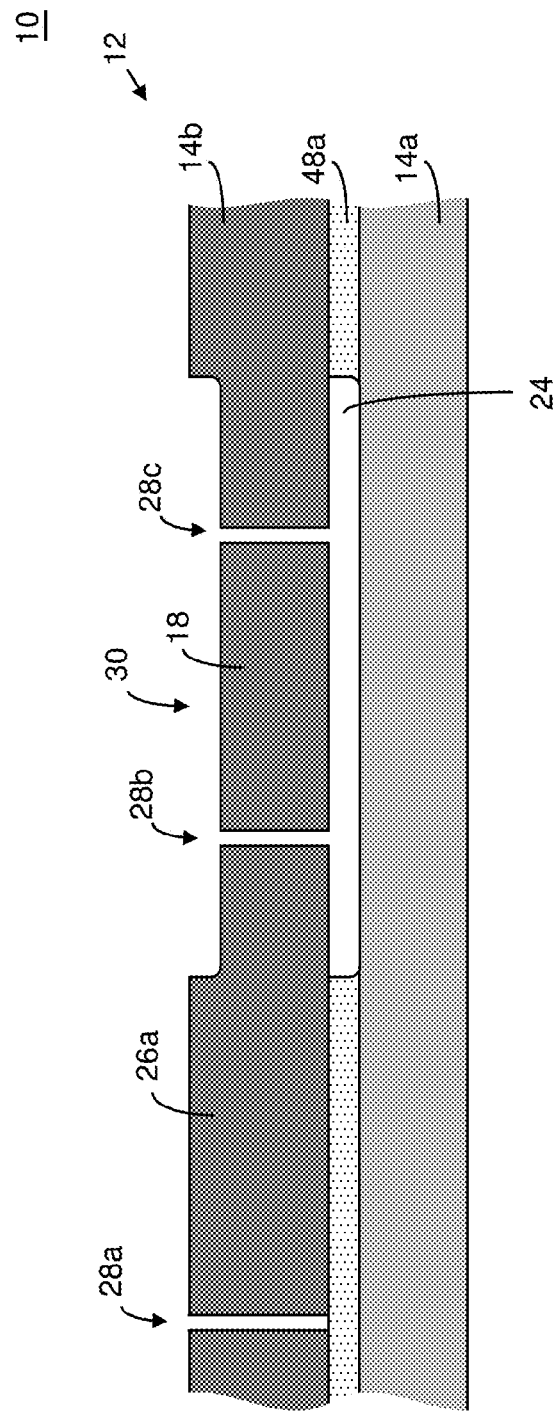
Figure 57G:
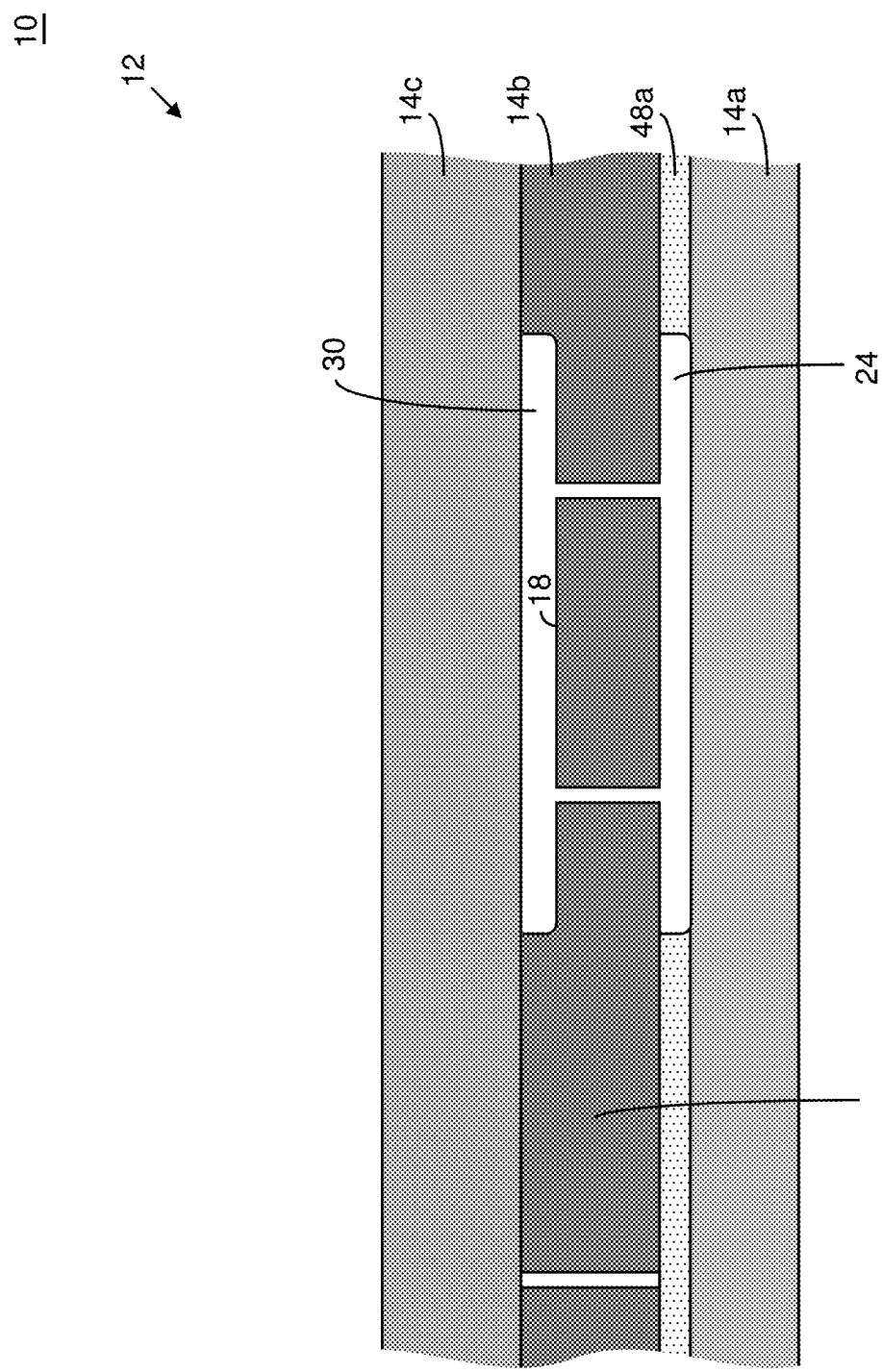
Figure 57H:
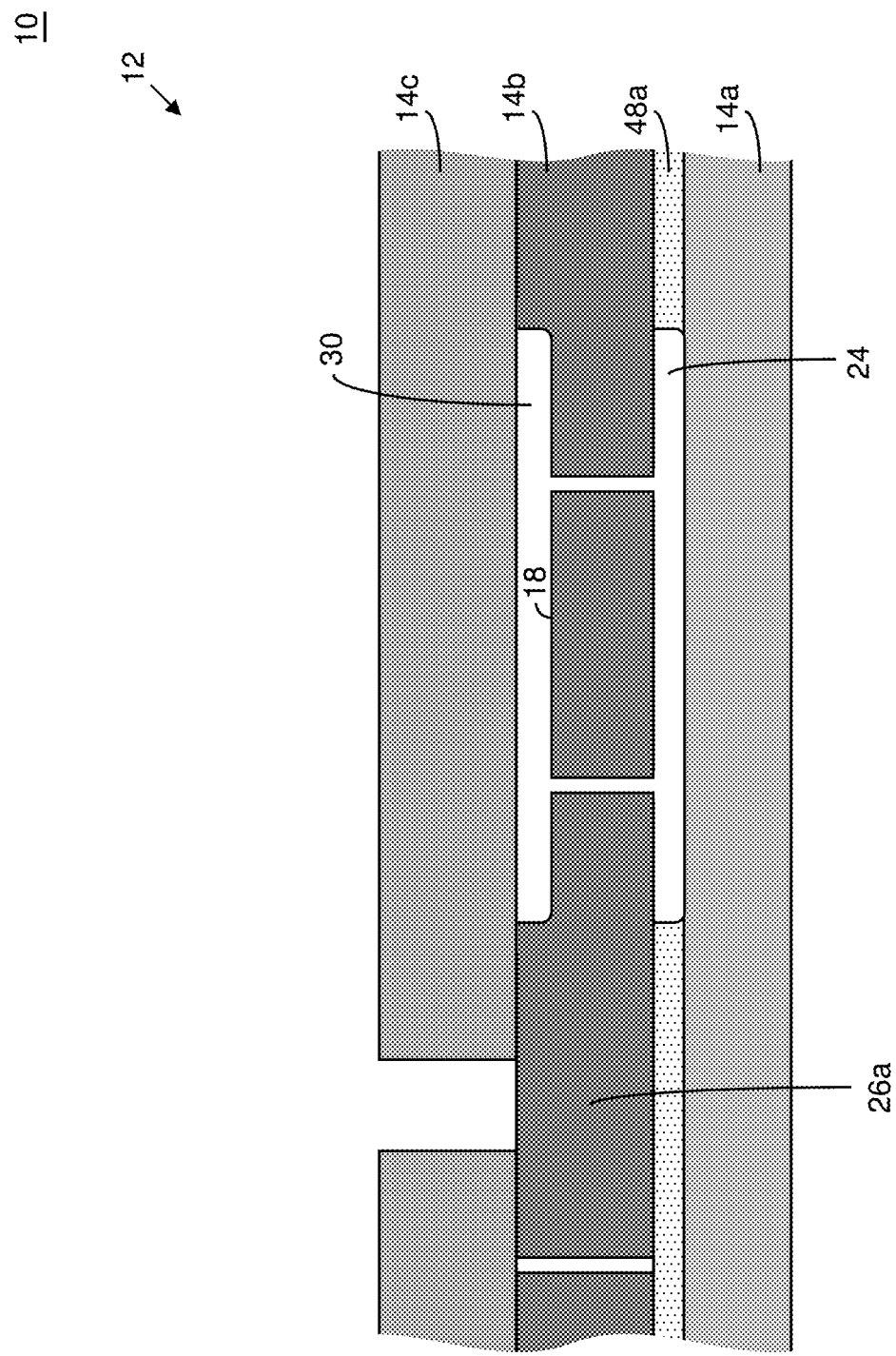
Figure 57I:
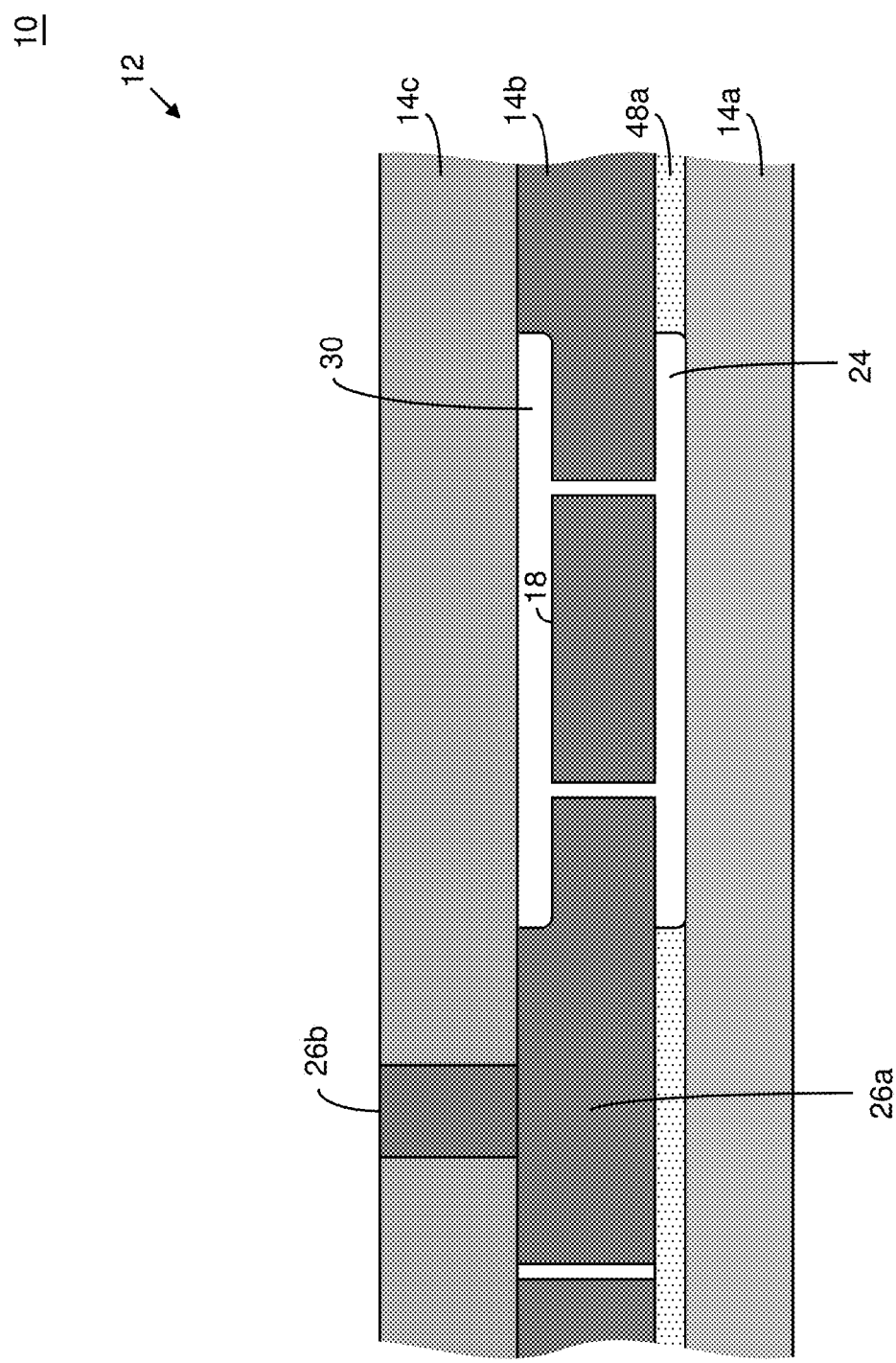
Figure 57J:
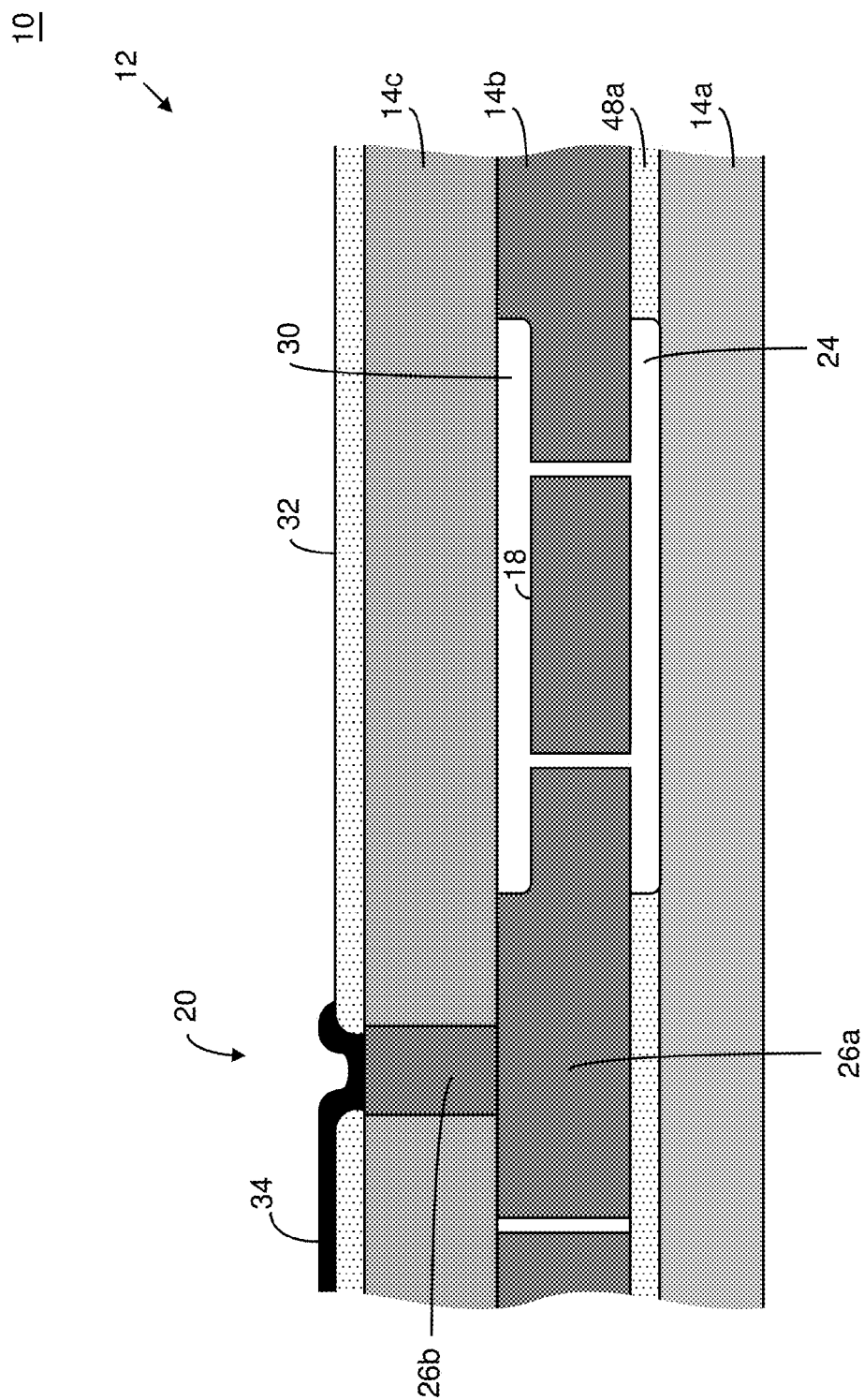

Further, as an alternative to counter-doping a region in substrate 14c to form contact area 26b, with reference to FIG. 56 and FIGS. 57A-57J, contact area 26b may be formed by providing a "window" in substrate 14c (for example, etching a portion of substrate 14c as illustrated in FIG. 57H) and thereafter depositing a suitable material to provide electrical conductivity with the underlying contact area 26a. Notably, the material (for example, a doped polysilicon) which forms contact area 26b may be deposited by epitaxial deposition and thereafter planarized to provide a suitable surface for contact 20 formation. (See, for example, FIGS. 57H and 57I).

As mentioned above, all forms of bonding, whether now known or later developed, are intended to fall within the scope of the present invention. For example, bonding techniques such as fusion bonding, anodic-like bonding, silicon direct bonding, soldering (for example, eutectic soldering), thermo compression, thermo-sonic bonding, laser bonding and/or glass reflow bonding, and/or combinations thereof.

Notably, any of the embodiments described and illustrated herein may employ a bonding material and/or a bonding facilitator material (disposed between substrates, for example, the second and third substrates) to, for example, enhance the attachment of or the "seal" between the substrates (for example, between the first and second substrates 14a and 14b, and/or the second and third substrates 14b and 14c), address/compensate for planarity considerations between substrates to be bonded (for example, compensate for differences in planarity between bonded substrates), and/or to reduce and/or minimize differences in thermal expansion (that is materials having different coefficients of thermal expansion) of the substrates and materials therebetween (if any). Such materials may be, for example, solder, metals, frit, adhesives, BPSG, PSG, or SOG, or combinations thereof.

With reference to FIG. 58, in one exemplary embodiment, bonding material or bonding facilitator material 60 may be disposed between substrates 14b and 14c. Such a configuration may provide certain advantages. For example, in this exemplary embodiment, micromachined mechanical structure 12 (including moveable electrode 18 and contact 20) is formed in second substrate 14b and encapsulated via third substrate 14c. In this regard, micromachined mechanical structure 12 is formed in a portion of substrate 14b. Thereafter, substrate 14c is secured (for example, bonded) to exposed surface of substrate 14b to encapsulate micromachined mechanical structure 12. In this embodiment, bonding material or bonding facilitator material 60 (for example, having a thickness of about 1 μm) is disposed and patterned on second substrate 14b to provide cavity 30 when third substrate 14c is disposed thereon and bonded thereto. Notably, substrates 14a, 14b and 14c may include the same or different conductivities.

As mentioned above, bonding material or bonding facilitator material 60 may include, for example, solder, metals, frit, adhesives, BPSG, PSG, or SOG, or combinations thereof. It may be advantageous to employ BPSG, PSG, or SOG in order to electrically isolate contact 20 from portions of substrates 14b and/or 14c. Moreover, BPSG, PSG, or SOG is compatible with CMOS processing, in the event that microelectromechanical system 10 includes CMOS integrated circuits in one or more of substrates 14 thereof.

Notably, FIGS. 59A-59J illustrate an exemplary process flow for fabricating microelectromechanical system 10 of FIG. 58. The process flow may employ a flow which is substantially similar to the process of FIGS. 35A-35L—with the exception that bonding material or bonding facilitator material 60 is employed (deposited and patterned) in addition to or in lieu of insulative layer 48b of FIGS. 35E-35L. For the sake of brevity, the discussion will not be repeated here.

An alternative embodiment employing bonding material or bonding facilitator material 60, and technique for fabricating such embodiment, is illustrated in FIGS. 60 and 61A-61K, respectively. In this embodiment, bonding material and/or a bonding facilitator material 60 is provided prior to formation of resonator 18 and contact area 26a (via contact area trench 28a and moveable electrode trenches 28b and 28c). As mentioned above, all process flows, and orders thereof, to provide microelectromechanical system 10 and/or micromachined mechanical structure 12, whether now known or later developed, are intended to fall within the scope of the present inventions.

The embodiments employing bonding material or bonding facilitator material 60 may be implemented in any of the embodiments described herein. For example, transistors of a transistor region may be formed prior to securing third substrate 14c to second substrate 14b. (See, for example, FIGS. 7A and 7B). Indeed, all of the "back-end" processing, in addition to formation of the transistors of transistor region, may be completed prior to securing third substrate 14c to second substrate 14b. (See, for example, FIGS. 8A and 8B).

Moreover, any of the bonding material or bonding facilitator materials 60 (may include, for example, solder, metals, frit, adhesives, BPSG, PSG, or SOG, or combinations thereof) may be implemented between the first and second substrates 14a and 14b, and/or the second and third substrates 14b and 14c, and/or any other substrates that are bonded. All such permutations are intended to fall within the scope of the present inventions.

Further, with respect to any of the embodiments described herein, circuitry 16 may be integrated in or on substrate 14, disposed in a separate substrate, and/or in one or more substrates that are connected to substrate 14 (for example, in one or more of the encapsulation wafer(s)). (See, for example, FIGS. 62-64). In this regard, microelectromechanical device 10 may include micromachined mechanical structure 12 and circuitry 16 as a monolithic-like structure including mechanical structure 12 and circuitry 16 in one substrate.

The micromachined mechanical structure 12 and/or circuitry 16 may also reside on separate, discrete substrates. (See, for example, FIGS. 65 and 66A-66F). In this regard, in one embodiment, such separate discrete substrate may be bonded to or on substrate 14, before, during and/or after fabrication of micromachined mechanical structure 12 and/or circuitry 16. (See, for example FIGS. 5, 6A-6D, 7A-7C and 8A).

For example, as mentioned above, the electronics or electrical circuitry may be clock alignment circuitry, for example, one or more phase locked loops (PLLs), delay locked loops (DLLs), digital/frequency synthesizer (for example, a direct digital synthesizer ("DDS"), frequency synthesizer, fractional synthesizer and/or numerically controlled oscillator) and/or frequency locked loops (FLLs). In this regard, the output of mechanical structure 12 (for example, an microelectromechanical oscillator or microelectromechanical resonator) is employed as a reference input signal (i.e., the reference clock). The PLL, DLL, digital/frequency synthesizer and/or FLL may provide frequency multiplication (i.e., increase the frequency of the output signal of the microelectromechanical oscillator). The PLL, DLL, digital/frequency synthesizer and/or FLL may also provide frequency division (i.e., decrease the frequency of the output signal of the microelectromechanical oscillator). Moreover, the PLL, DLL, digital/frequency synthesizer and/or FLL may also compensate using multiplication and/or division to adjust, correct, compensate and/or control the characteristics (for example, the frequency, phase and/or jitter) of the output signal of the microelectromechanical resonator.

The multiplication or division (and/or phase adjustments) by compensation circuitry 18 may be in fine or coarse increments. For example, compensation circuitry 18 may include an integer PLL, a fractional PLL and/or a fine-fractional-N PLL to precisely select, control and/or set the output signal of compensated microelectromechanical oscillator. In this regard, the output of microelectromechanical resonator may be provided to the input of the fractional-N PLL and/or the fine-fractional-N PLL (hereinafter collectively "fractional-N PLL"), which may be pre-set, preprogrammed and/or programmable to provide an output signal having a desired, selected and/or predetermined frequency and/or phase.

Notably, in one embodiment, the parameters, references (for example, frequency and/or phase), values and/or coefficients employed by the compensation circuitry in order to generate and/or provide an adjusted, corrected and/or controlled output having, for example, a desired, selected and/or predetermined frequency and/or phase (i.e., the function of the compensation circuitry), may be externally provided to the compensation circuitry either before or during operation of compensated microelectromechanical oscillator. In this regard, a user or external circuitry/devices/systems may provide information representative of the parameters, references, values and/or coefficients to set, change, enhance and/or optimize the performance of the compensation circuitry and/or compensated microelectromechanical oscillator.

Finally, it should be further noted that while the present inventions will be described in the context of microelectromechanical systems including micromechanical structures or elements, the present inventions are not limited in this regard. Rather, the inventions described herein are applicable to other electromechanical systems including, for example, nanoelectromechanical systems. Thus, the present inventions are pertinent, as mentioned above, to electromechanical systems, for example, gyroscopes, resonators, temperatures sensors, accelerometers and/or other transducers.

The term "depositing" and other forms (i.e., deposit, deposition and deposited) in the claims, means, among other things, depositing, creating, forming and/or growing a layer of material using, for example, a reactor (for example, an epitaxial, a sputtering or a CVD-based reactor (for example, APCVD, LPCVD, or PECVD)).

Further, in the claims, the term "contact" means a conductive region, partially or wholly disposed outside the chamber, for example, the contact area and/or contact via.

It should be further noted that the term "circuit" may mean, among other things, a single component or a multiplicity of components (whether in integrated circuit form or otherwise), which are active and/or passive, and which are coupled together to provide or perform a desired function. The term "circuitry" may mean, among other things, a circuit (whether integrated or otherwise), a group of such circuits, one or more processors, one or more state machines, one or more processors implementing software, or a combination of one or more circuits (whether integrated or otherwise), one or more state machines, one or more processors, and/or one or more processors implementing software. The term "data" may mean, among other things, a current or voltage signal(s) whether in an analog or a digital form.

The embodiments of the inventions described herein may include one or more of the following advantages, among others:

- embodiments presenting mechanically robust encapsulation;
- embodiments presenting clean environment for micromachined mechanical structure 12 (and the electrodes thereof);
- embodiments presenting relatively less expensive fabrication in comparison to conventional techniques;
- embodiments presenting relatively smaller footprint in comparison to conventional techniques;
- embodiments presenting one or more surfaces compatible with/for CMOS circuitry/integration;
- embodiments presenting single crystal surfaces (where one or more substrates are single crystal);
- embodiments presenting diffused contacts;
- embodiments eliminating epitaxial depositions;
- embodiments eliminating SOI substrates;
- embodiments presenting improved CMOS compatibility;
- embodiments providing enhanced atmosphere/environment control and characteristics (for example, improved vacuum and lower/no chlorine;
- improved gap control for definition of micromachined mechanical structure;
- embodiments eliminating timed release of moveable electrodes (for example, timed HF (vapor) etch);
- embodiments eliminating oxide stress in substrates;
- embodiments providing enhanced stiction characteristics (for example, less vertical stiction); and
- embodiments eliminating vents in the resonator and the attendant shortcomings of thin film encapsulation.

The above embodiments of the present inventions are merely exemplary embodiments. They are not intended to be exhaustive or to limit the inventions to the precise forms, techniques, materials and/or configurations disclosed. Many modifications and variations are possible in light of the above teaching. It is to be understood that other embodiments may be utilized and operational changes may be made without departing from the scope of the present inventions. As such, the foregoing description of the exemplary embodi-

What is claimed is:

1. A method of fabricating a microelectromechanical system (MEMS) device, the method comprising:
    forming a MEMS resonator within an opening in a semiconductor layer;
    disposing the semiconductor layer between first and second substrate layers such that the MEMS resonator is encapsulated within the opening; and
    forming, at least in part within the semiconductor layer and at least in part within the first substrate layer, an electrical contact that extends from the opening to an exterior of the MEMS device.

2. The method of claim 1 wherein the first substrate layer comprises interior and exterior surfaces, the interior surface being disposed adjacent the semiconductor layer, and wherein forming the electrical contact comprises forming an electrical contact that extends at least from the exterior surface of the first substrate layer to a region of the semiconductor layer adjacent the MEMS resonator.

3. The method of claim 1 wherein forming a MEMS resonator within an opening in a semiconductor layer comprises freeing a portion of the semiconductor layer sufficiently from a remainder of the semiconductor layer to enable resonant motion of the freed portion relative to the remainder of the semiconductor layer, the freed portion forming at least part of the MEMS resonator.

4. The method of claim 1 further comprising disposing an insulator layer between the second substrate layer and the semiconductor layer, the semiconductor layer and insulator layer forming a semiconductor-on-insulator (SOI) structure.

5. The method of claim 1 wherein forming the MEMS resonator within the opening comprises forming an anchor structure that anchors the MEMS resonator to at least one of the semiconductor layer, the first substrate layer or the second substrate layer, the anchor structure permitting mechanical motion of the MEMS resonator relative to the semiconductor layer, first substrate layer and second substrate layer.

6. The method of claim 1 wherein forming the electrical contact comprises forming a drive contact that enables energy to be imparted to the MEMS resonator to effect mechanical oscillation thereof.

7. The method of claim 1 wherein forming the electrical contact comprises forming a sense contact that enables mechanical oscillation of MEMS resonator to be sensed.

8. The method of claim 1 wherein the perimeter of the opening in the semiconductor layer and interior surfaces of the first and second substrate layers define, at least in part, surfaces of a sealed chamber in which the MEMS resonator is disposed.

9. The method of claim 1 wherein forming the electrical contact at least in part within the semiconductor layer and at least in part within the first substrate layer comprises at least one of rendering a portion of the semiconductor layer electrically conductive by impurity doping, or rendering a portion of the first substrate layer electrically conductive by impurity doping.

10. The method of claim 1 forming the electrical contact further comprises disposing a metal structure in electrical contact with an impurity-doped portion of first substrate layer.

* * * * *